United States Patent
Cui et al.

(10) Patent No.: US 10,930,674 B2
(45) Date of Patent: Feb. 23, 2021

(54) THREE-DIMENSIONAL FLAT NAND MEMORY DEVICE HAVING CURVED MEMORY ELEMENTS AND METHODS OF MAKING THE SAME

(71) Applicant: SANDISK TECHNOLOGIES LLC, Addison, TX (US)

(72) Inventors: Zhixin Cui, Nagoya (JP); Masatoshi Nishikawa, Nagoya (JP); Yanli Zhang, San Jose, CA (US)

(73) Assignee: SANDISK TECHNOLOGIES LLC, Addison, TX (US)

(*) Notice: Subject to any disclaimer, the term of this patent is extended or adjusted under 35 U.S.C. 154(b) by 0 days.

(21) Appl. No.: 16/878,865

(22) Filed: May 20, 2020

(65) Prior Publication Data

US 2020/0286915 A1    Sep. 10, 2020

Related U.S. Application Data

(62) Division of application No. 16/278,426, filed on Feb. 18, 2019, now Pat. No. 10,700,090.

(51) Int. Cl.
*H01L 27/11582* (2017.01)
*H01L 27/11524* (2017.01)
(Continued)

(52) U.S. Cl.
CPC ...... *H01L 27/11582* (2013.01); *H01L 21/764* (2013.01); *H01L 21/8221* (2013.01);
(Continued)

(58) Field of Classification Search
CPC ......... H01L 27/11524; H01L 27/11529; H01L 27/11556; H01L 27/1157; H01L 27/11575;
(Continued)

(56) References Cited

U.S. PATENT DOCUMENTS 5,915,167 A    6/1999  Leedy
8,349,681 B2   1/2013  Alsmeier
(Continued)

OTHER PUBLICATIONS

H. Lue et al., "A 128Gb (MLC)/192Gb (TLC) single-gate vertical channel (SGVC) architecture 3D NAND using only 16 layers with robust read disturb, long-retention and excellent scaling capability," *2017 IEEE International Electron Devices Meeting (IEDM)*, San Francisco, CA, 2017, pp. 19.1.1-19.1.4.
(Continued)

*Primary Examiner* — Matthew E Warren
(74) *Attorney, Agent, or Firm* — The Marbury Law Group, PLLC

(57) ABSTRACT

A three-dimensional memory device includes alternating stacks of electrically conductive strips and spacer strips located over a substrate and laterally spaced apart among one another by memory stack assemblies. The spacer strips may include air gap strips or insulating strips. Each of the memory stack assemblies includes two two-dimensional arrays of lateral protrusion regions. Each of the lateral protrusion regions comprises a respective curved charge storage element. The charge storage elements may be discrete elements located within a respective lateral protrusion region, or may be a portion of a charge storage material layer that extends vertically over multiple electrically conductive strips. Each of the memory stack assemblies may include two rows of vertical semiconductor channels that laterally overlie a respective vertical stack of charge storage elements.

8 Claims, 91 Drawing Sheets

(51) Int. Cl.
| | |
|---|---|
| *H01L 27/11556* | (2017.01) |
| *H01L 21/764* | (2006.01) |
| *H01L 27/1157* | (2017.01) |
| *H01L 29/06* | (2006.01) |
| *H01L 21/822* | (2006.01) |
| *H01L 21/8234* | (2006.01) |
| *H01L 21/8239* | (2006.01) |
| *H01L 29/66* | (2006.01) |
| *H01L 21/28* | (2006.01) |
| *H01L 27/11578* | (2017.01) |
| *H01L 27/11575* | (2017.01) |
| *H01L 27/11519* | (2017.01) |
| *H01L 27/11529* | (2017.01) |

(52) U.S. Cl.
CPC .. *H01L 21/8239* (2013.01); *H01L 21/823487* (2013.01); *H01L 27/1157* (2013.01); *H01L 27/11519* (2013.01); *H01L 27/11524* (2013.01); *H01L 27/11529* (2013.01); *H01L 27/11556* (2013.01); *H01L 27/11575* (2013.01); *H01L 27/11578* (2013.01); *H01L 29/0649* (2013.01); *H01L 29/40114* (2019.08); *H01L 29/40117* (2019.08); *H01L 29/66833* (2013.01)

(58) Field of Classification Search
CPC ......... H01L 27/11578; H01L 27/11582; H01L 21/764; H01L 21/8221; H01L 21/823487; H01L 21/8239; H01L 29/0649; H01L 29/40114; H01L 29/40117; H01L 29/66833
See application file for complete search history.

(56) References Cited

U.S. PATENT DOCUMENTS

| | | | |
|---|---|---|---|
| 8,658,499 B2 | 2/2014 | Makala et al. | |
| 8,847,302 B2 | 9/2014 | Alsmeier et al. | |
| 9,252,151 B2 | 2/2016 | Chien et al. | |
| 9,356,031 B2 | 5/2016 | Lee et al. | |
| 9,397,093 B2 | 7/2016 | Makala et al. | |
| 9,401,371 B1 | 7/2016 | Lee et al. | |
| 9,419,012 B1 | 8/2016 | Shimabukuro et al. | |
| 9,449,982 B2 | 9/2016 | Lu et al. | |
| 9,455,267 B2 | 9/2016 | Zhang et al. | |
| 9,553,146 B2 | 1/2017 | Zhang et al. | |
| 9,576,975 B2 | 2/2017 | Zhang et al. | |
| 9,620,514 B2 | 4/2017 | Kai et al. | |
| 9,627,399 B2 | 4/2017 | Kanakamedala et al. | |
| 9,646,975 B2 | 5/2017 | Peri et al. | |
| 9,666,594 B2 | 5/2017 | Mizuno et al. | |
| 9,691,884 B2 | 6/2017 | Makala et al. | |
| 9,728,546 B2 | 8/2017 | Serov et al. | |
| 9,837,431 B2 | 12/2017 | Nishikawa et al. | |
| 9,842,907 B2 | 12/2017 | Makala et al. | |
| 9,875,929 B1 | 1/2018 | Shukla et al. | |
| 10,115,732 B2 | 10/2018 | Yu et al. | |
| 10,192,784 B1 | 1/2019 | Cui et al. | |
| 10,256,247 B1* | 4/2019 | Kanakamedala | H01L 21/28097 |
| 10,256,252 B1* | 4/2019 | Kanazawa | H01L 21/02164 |
| 10,290,648 B1* | 5/2019 | Zhou | H01L 27/11582 |
| 2002/0137290 A1 | 9/2002 | Wils et al. | |
| 2002/0137296 A1 | 9/2002 | Satoh et al. | |
| 2003/0022500 A1 | 1/2003 | Tang | |
| 2003/0080391 A1 | 5/2003 | Hirai et al. | |
| 2003/0143790 A1 | 7/2003 | Wu | |
| 2003/0143792 A1 | 7/2003 | Satoh et al. | |
| 2004/0014274 A1 | 1/2004 | Wils et al. | |
| 2004/0206982 A1 | 10/2004 | Lee et al. | |
| 2004/0258132 A1 | 12/2004 | Hong | |
| 2005/0036382 A1 | 2/2005 | Kato | |
| 2005/0068834 A1 | 3/2005 | Kim et al. | |
| 2005/0254293 A1 | 11/2005 | Horng et al. | |
| 2006/0001215 A1 | 1/2006 | Taghavi | |
| 2006/0120133 A1 | 6/2006 | Star Sung et al. | |
| 2006/0209495 A1 | 9/2006 | Lee et al. | |
| 2006/0267077 A1 | 11/2006 | Kato | |
| 2006/0284242 A1 | 12/2006 | Jo | |
| 2007/0015294 A1 | 1/2007 | Horng et al. | |
| 2007/0108498 A1 | 5/2007 | Lee et al. | |
| 2007/0161263 A1 | 7/2007 | Meisner | |
| 2007/0182914 A1 | 8/2007 | Hwang | |
| 2007/0187730 A1 | 8/2007 | Park et al. | |
| 2007/0252188 A1 | 11/2007 | Isobe | |
| 2008/0001209 A1 | 1/2008 | Cho et al. | |
| 2008/0018990 A1 | 1/2008 | Sridhar et al. | |
| 2008/0068896 A1 | 3/2008 | Perlegos et al. | |
| 2008/0112209 A1 | 5/2008 | Cho et al. | |
| 2008/0175031 A1 | 7/2008 | Park et al. | |
| 2008/0209159 A1 | 8/2008 | Kim et al. | |
| 2008/0290395 A1 | 11/2008 | Jeong | |
| 2009/0173934 A1 | 7/2009 | Jain | |
| 2010/0068857 A1 | 3/2010 | Isobe | |
| 2010/0190291 A1 | 7/2010 | Lee et al. | |
| 2010/0207194 A1 | 8/2010 | Tanaka et al. | |
| 2011/0183188 A1 | 7/2011 | Ogg | |
| 2011/0309430 A1 | 12/2011 | Purayath et al. | |
| 2013/0016557 A1 | 1/2013 | Kim | |
| 2013/0178012 A1 | 7/2013 | Wang et al. | |
| 2013/0178013 A1 | 7/2013 | Wang et al. | |
| 2013/0178014 A1 | 7/2013 | Wang et al. | |
| 2013/0309555 A1 | 11/2013 | Ogg | |
| 2013/0328005 A1 | 12/2013 | Shin et al. | |
| 2013/0333205 A1 | 12/2013 | Ogg | |
| 2015/0048293 A1 | 2/2015 | Park | |
| 2015/0102282 A1 | 4/2015 | Zhang et al. | |
| 2015/0104919 A1 | 4/2015 | Park | |
| 2015/0123191 A1 | 5/2015 | Purayath et al. | |
| 2015/0129827 A1 | 5/2015 | Chen et al. | |
| 2015/0263123 A1 | 9/2015 | Cheng et al. | |
| 2015/0357413 A1 | 12/2015 | Zhang et al. | |
| 2016/0020517 A1 | 1/2016 | Florek et al. | |
| 2016/0204117 A1 | 7/2016 | Liu et al. | |
| 2016/0225786 A1* | 8/2016 | Lee | H01L 29/42348 |
| 2016/0308069 A1 | 10/2016 | Tseng et al. | |
| 2017/0005849 A1 | 1/2017 | Hang et al. | |
| 2017/0221921 A1 | 8/2017 | Kanamori et al. | |
| 2017/0243879 A1 | 8/2017 | Yu et al. | |
| 2017/0263615 A1* | 9/2017 | Sakaike | H01L 27/11524 |
| 2017/0271402 A1 | 9/2017 | Chen et al. | |
| 2018/0012292 A1 | 1/2018 | Sugiyama et al. | |
| 2018/0012937 A1 | 1/2018 | Park et al. | |
| 2018/0033646 A1 | 2/2018 | Sharangpani et al. | |
| 2018/0040623 A1 | 2/2018 | Kanakamedala et al. | |
| 2019/0198509 A1 | 6/2019 | Kim | |
| 2019/0252405 A1 | 8/2019 | Tsutsumi | |
| 2020/0098767 A1 | 3/2020 | Morooka | |
| 2020/0098787 A1 | 3/2020 | Kaneko | |

OTHER PUBLICATIONS

F. K. LeGoues, et al., "Oxidation studies of SiGe", Journal of Applied Physics 65, 1724 (1989).
Notification of Transmittal of the International Search Report and Written Opinion of the International Search Authority for International Patent Application No. PCT/US2019/063472, dated Mar. 19, 2020, 12 pages.
U.S. Appl. No. 15/834,261, filed Dec. 7, 2017, Sandisk Technologies LLC.
U.S. Appl. No. 15/892,228, filed Feb. 8, 2018, Sandisk Technologies LLC.
U.S. Appl. No. 15/898,571, filed Feb. 17, 2018, Sandisk Technologies LLC.
U.S. Appl. No. 15/909,036, filed Mar. 1, 2018, Sandisk Technologies LLC.
U.S. Appl. No. 15/924,944, filed Mar. 19, 2018, Sandisk Technologies LLC.
U.S. Appl. No. 16/002,294, filed Jun. 7, 2018, Sandisk Technologies LLC.

(56) References Cited

OTHER PUBLICATIONS

U.S. Appl. No. 16/142,447, filed Sep. 26, 2018, Sandisk Technologies LLC.
U.S. Appl. No. 16/273,393, filed Feb. 12, 2019, Sandisk Technologies LLC.
U.S. Appl. No. 16/278,488, filed Feb. 18, 2019, Sandisk Technologies LLC.
USPTO Office Communication, Non-Final Office Action, for U.S. Appl. No. 16/879,903, dated May 21, 2020, 12 pages.

* cited by examiner

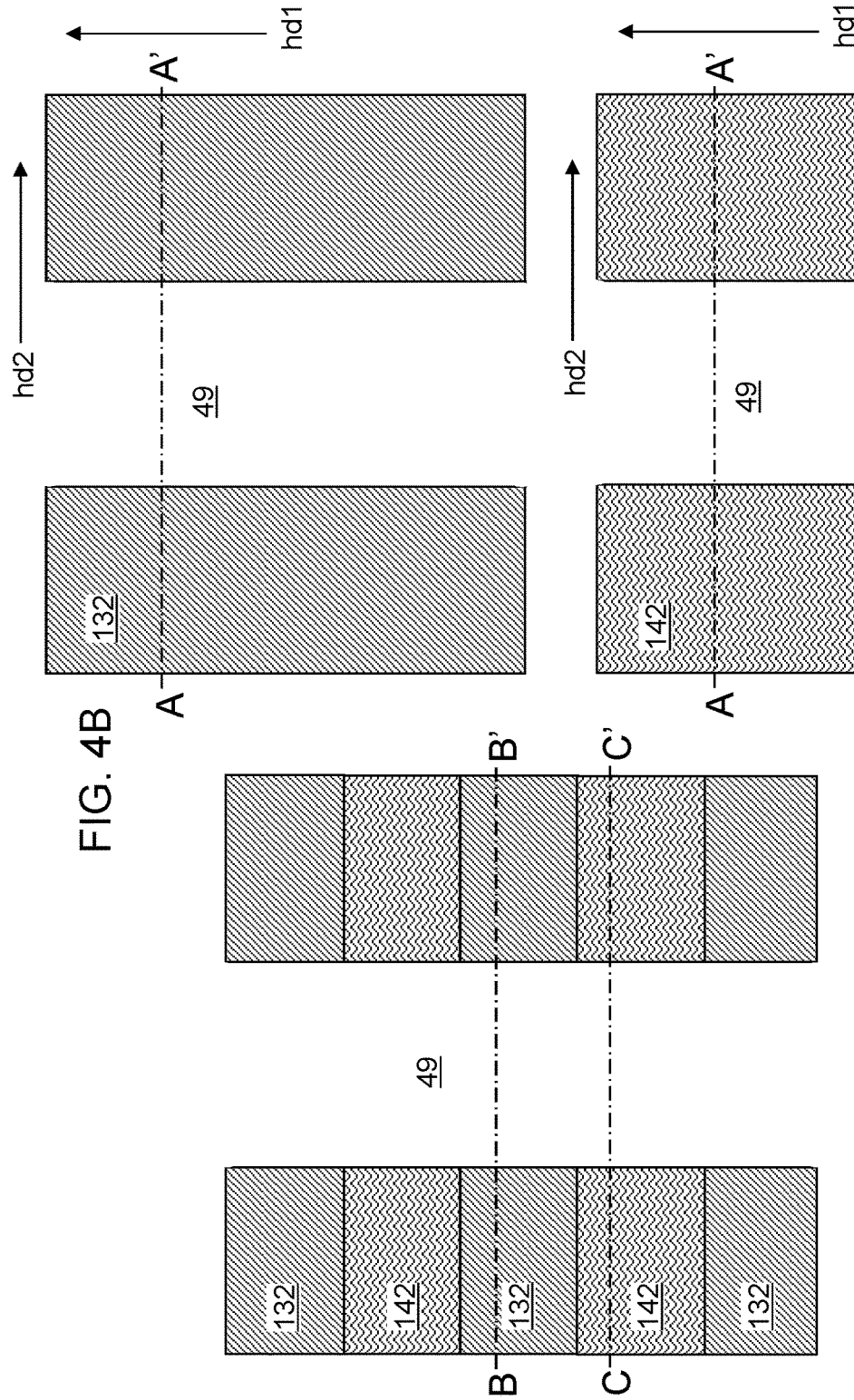

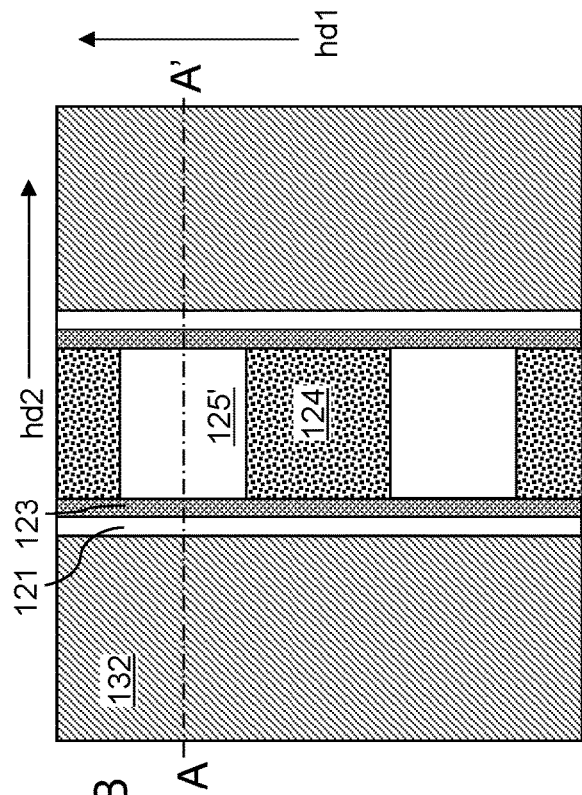
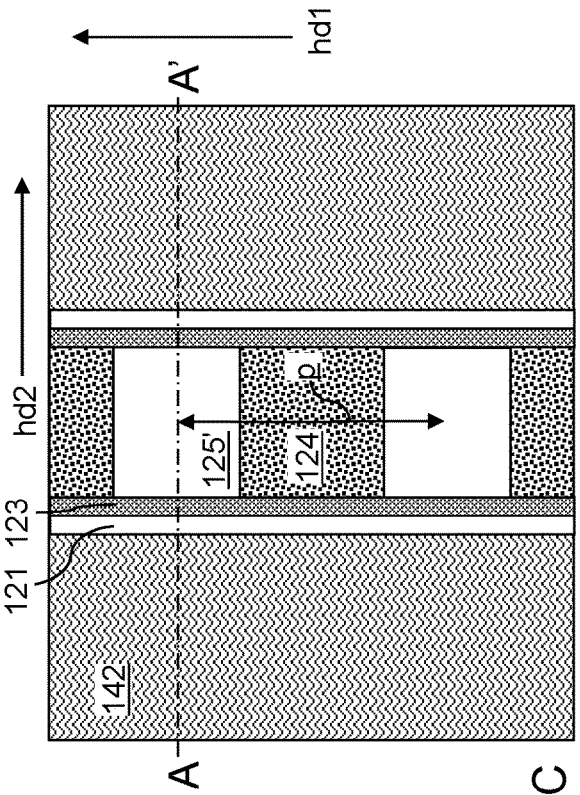
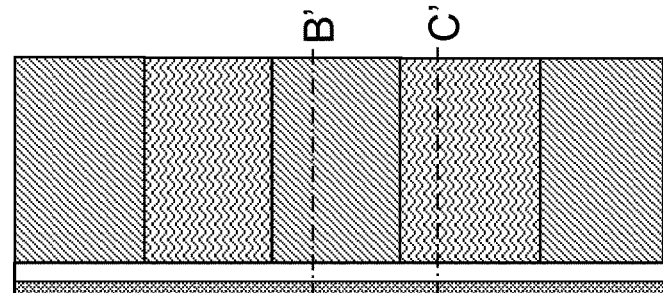
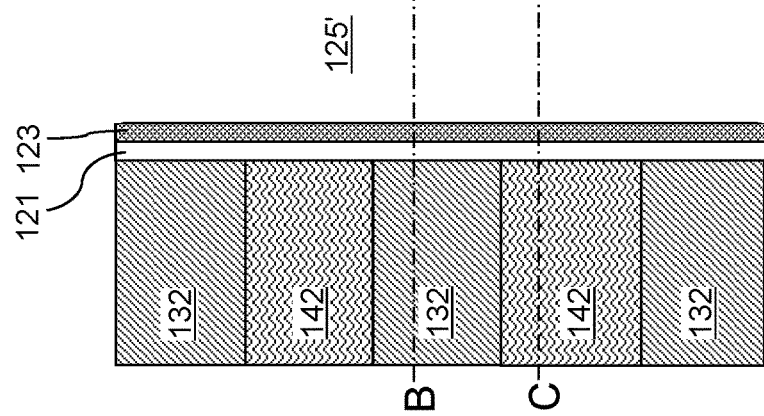
FIG. 6B    FIG. 6C    FIG. 6A

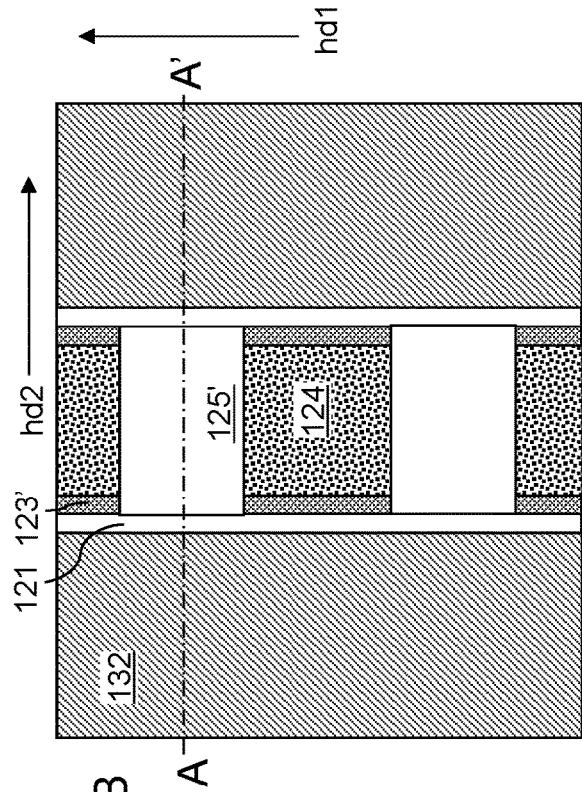
FIG. 7B
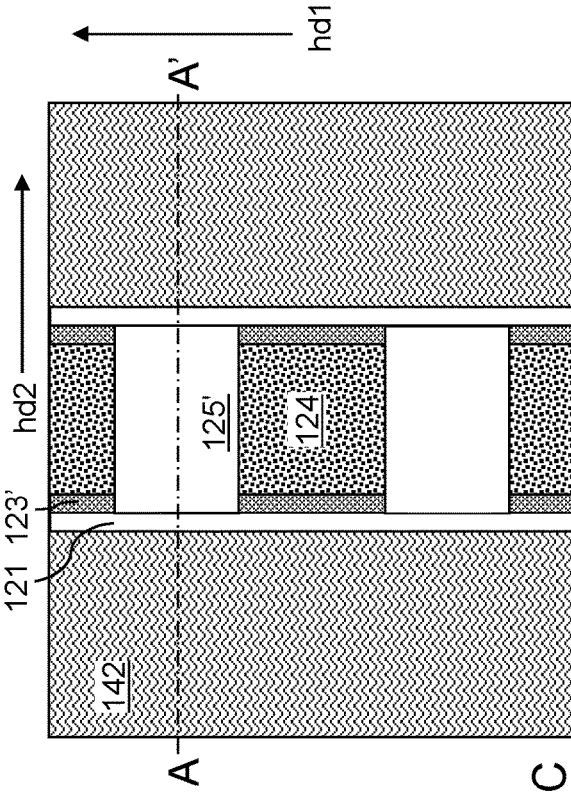
FIG. 7C
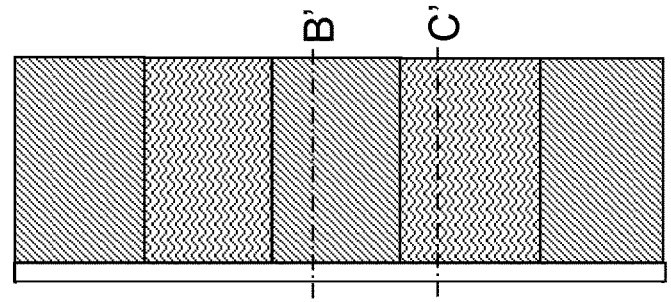
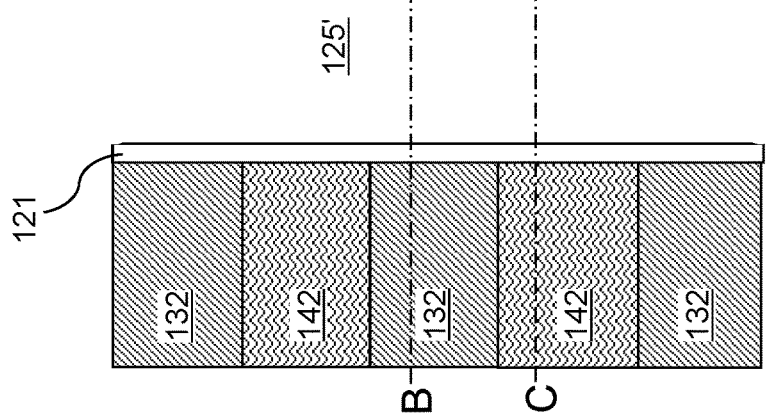
FIG. 7A

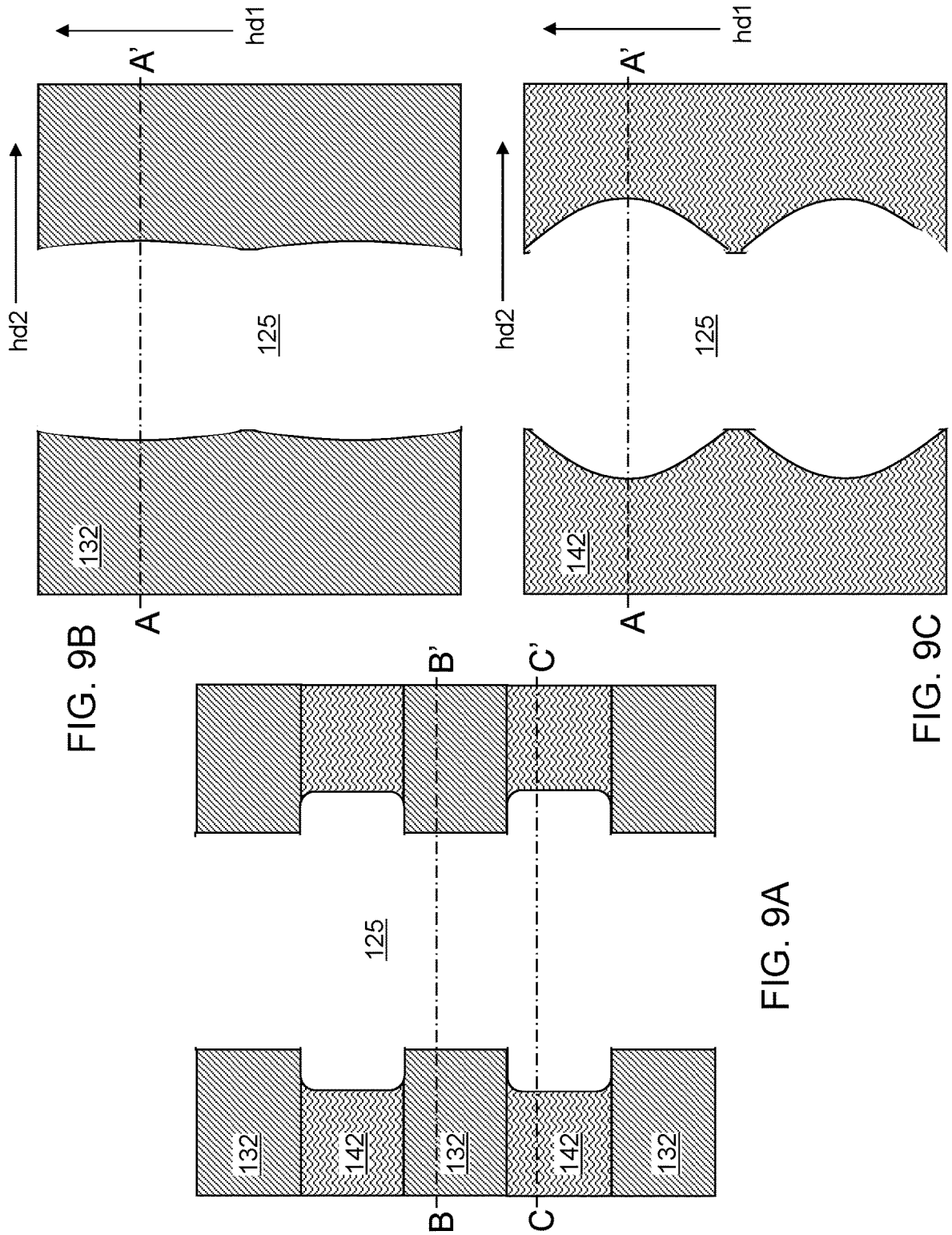

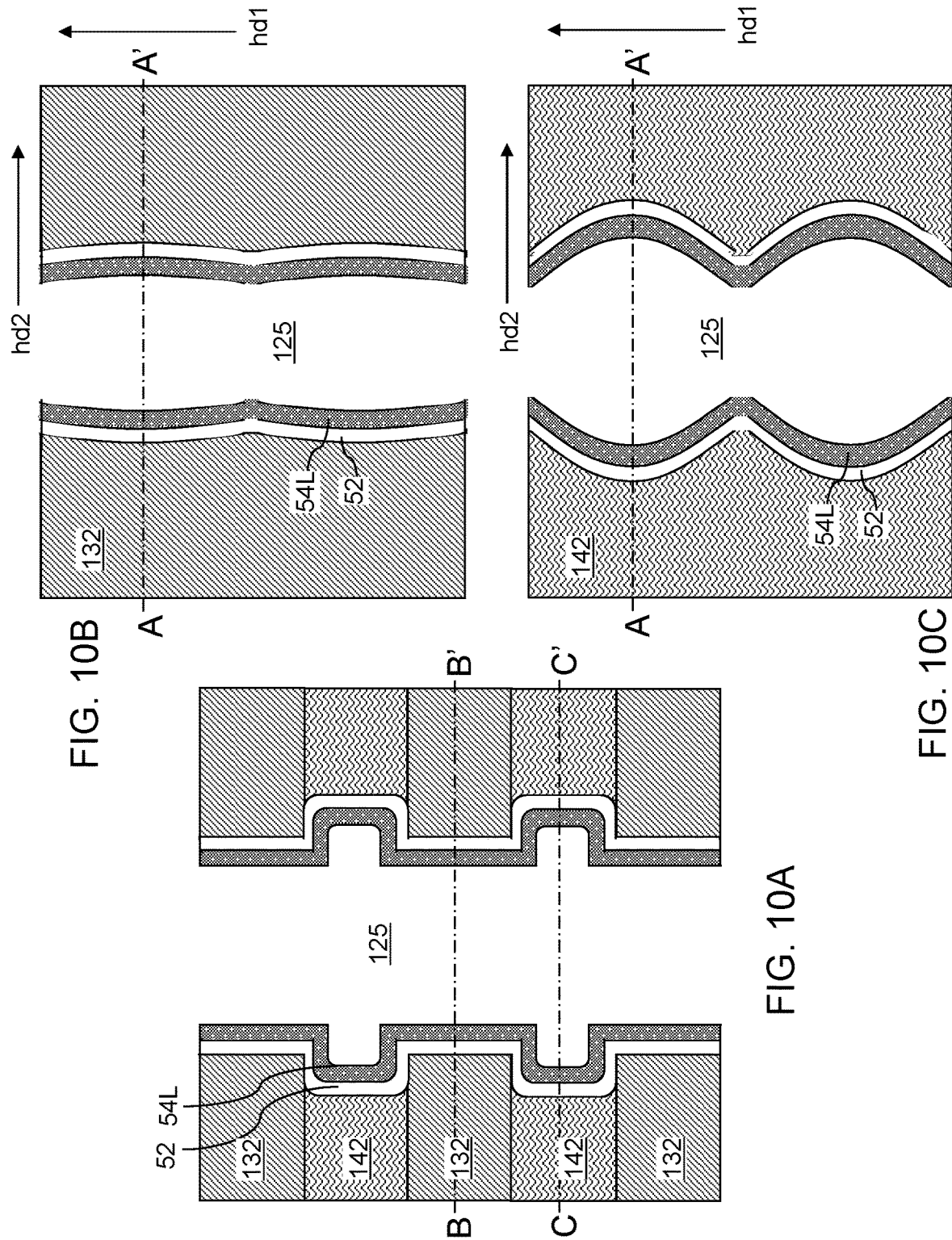

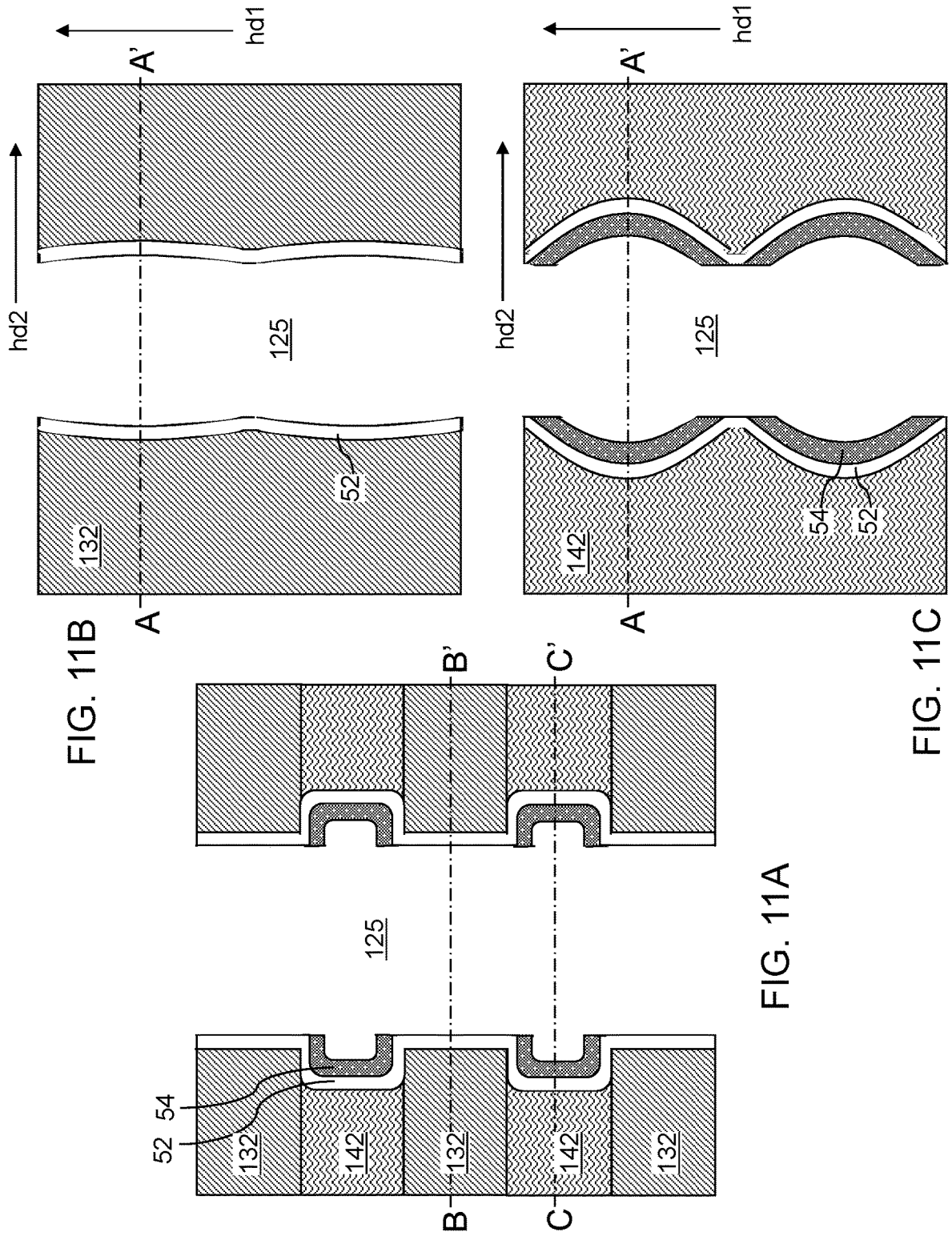

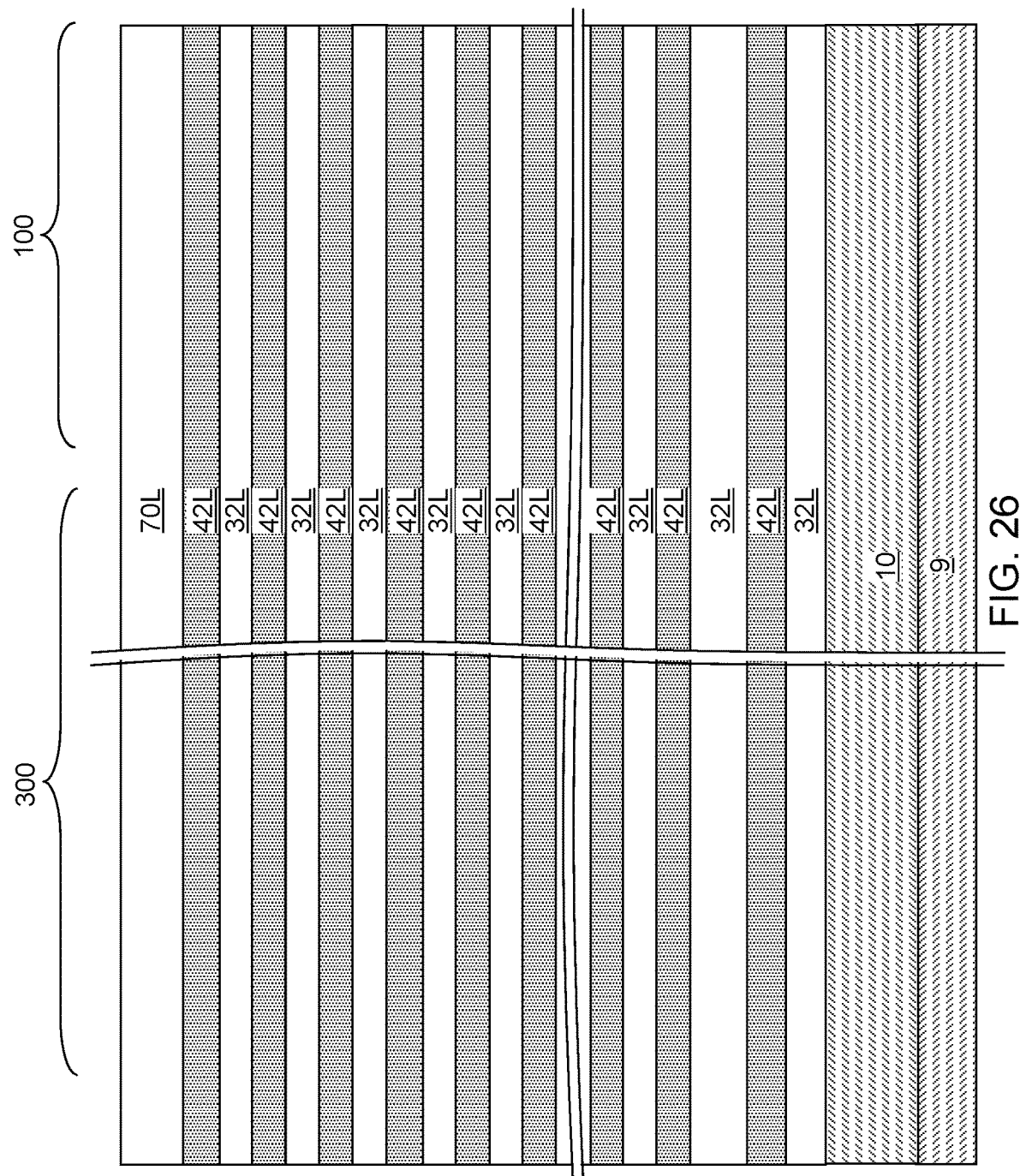

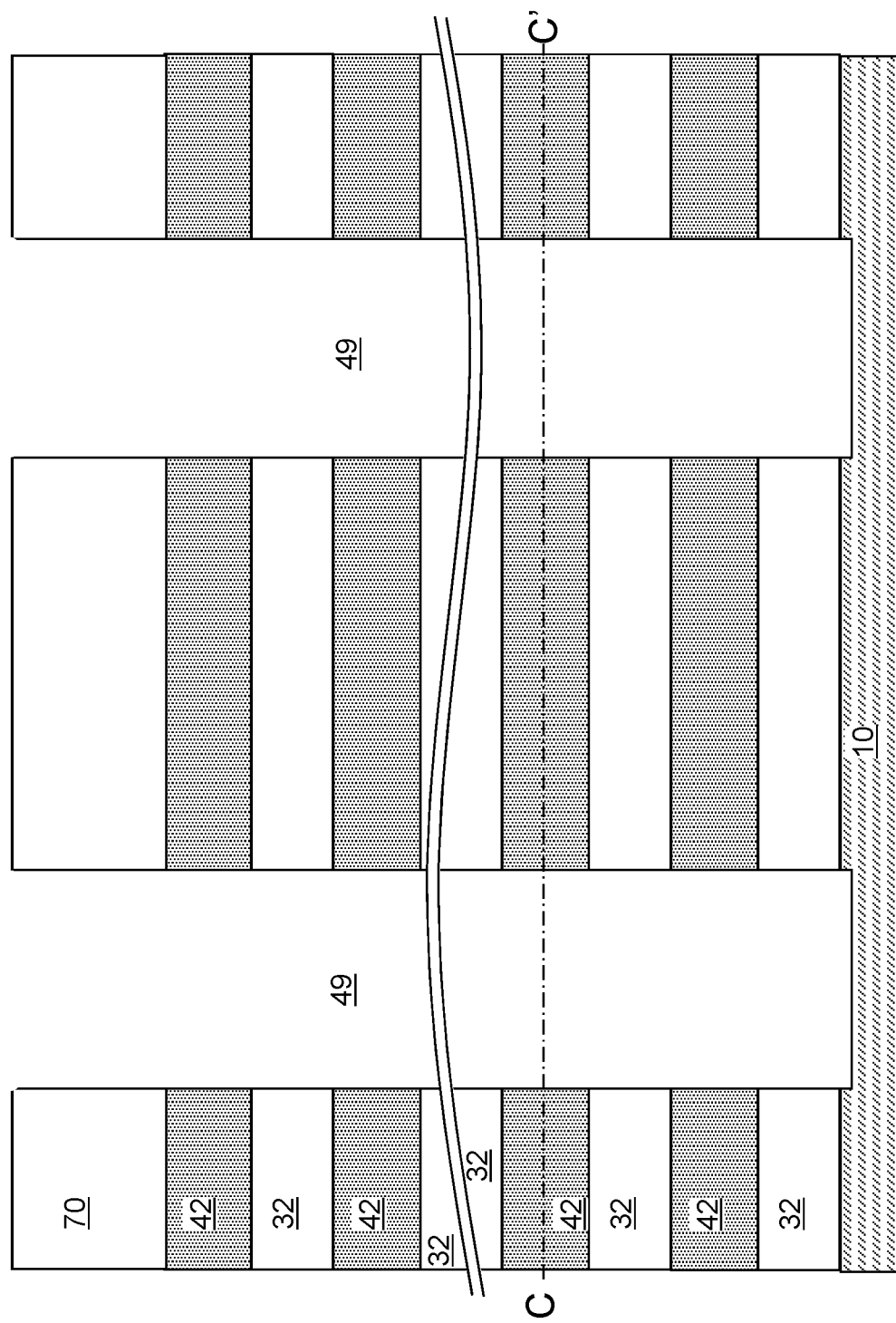

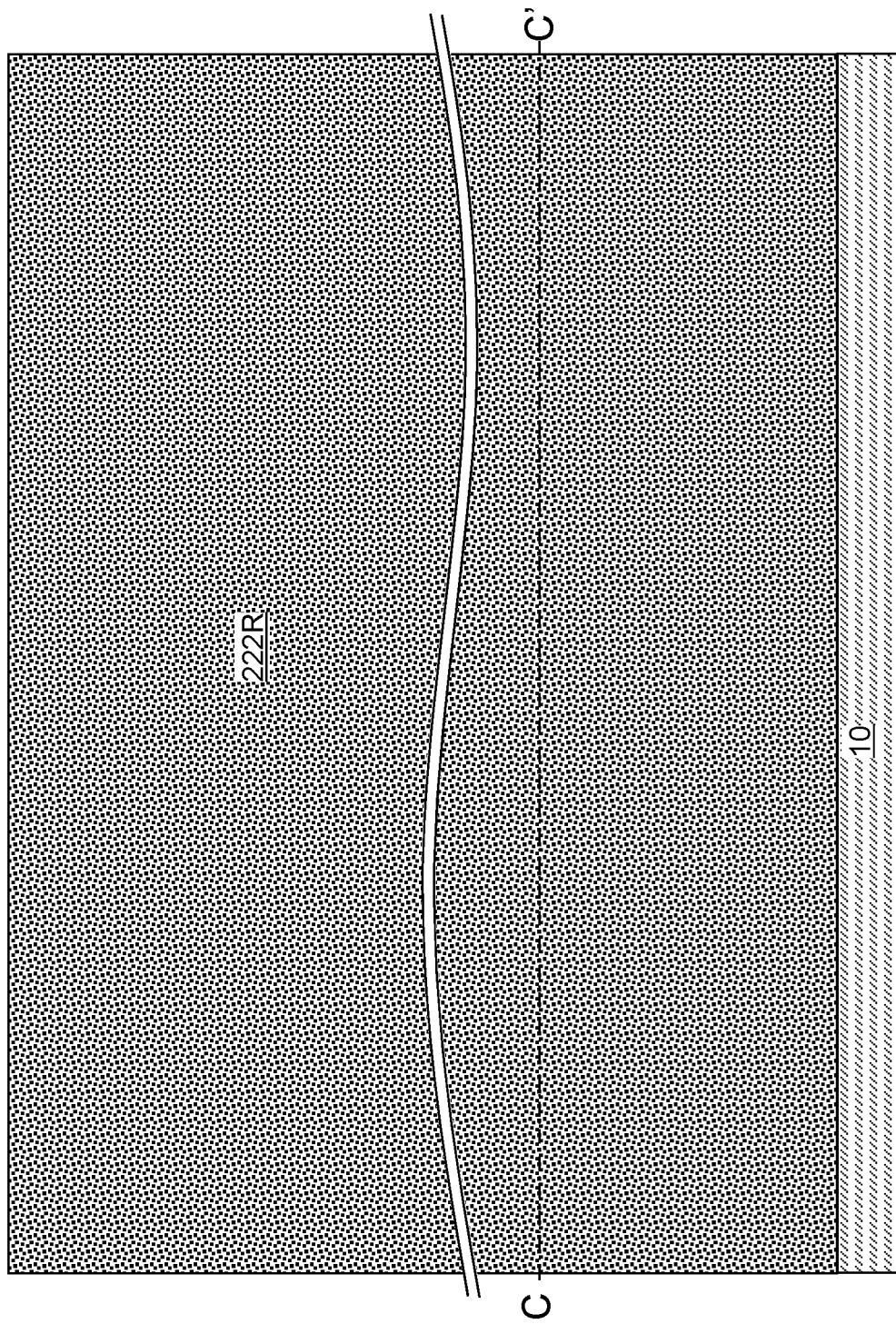

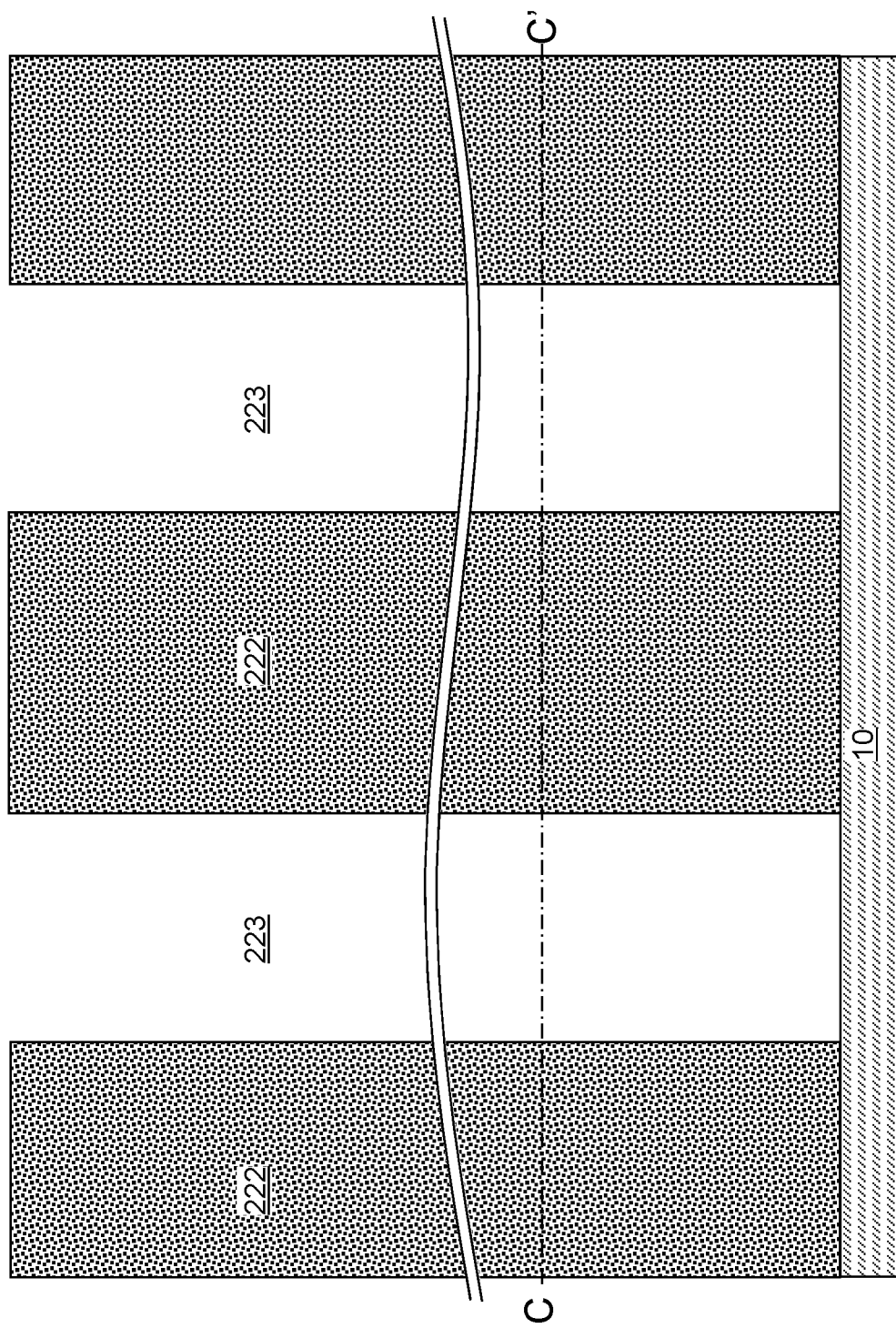

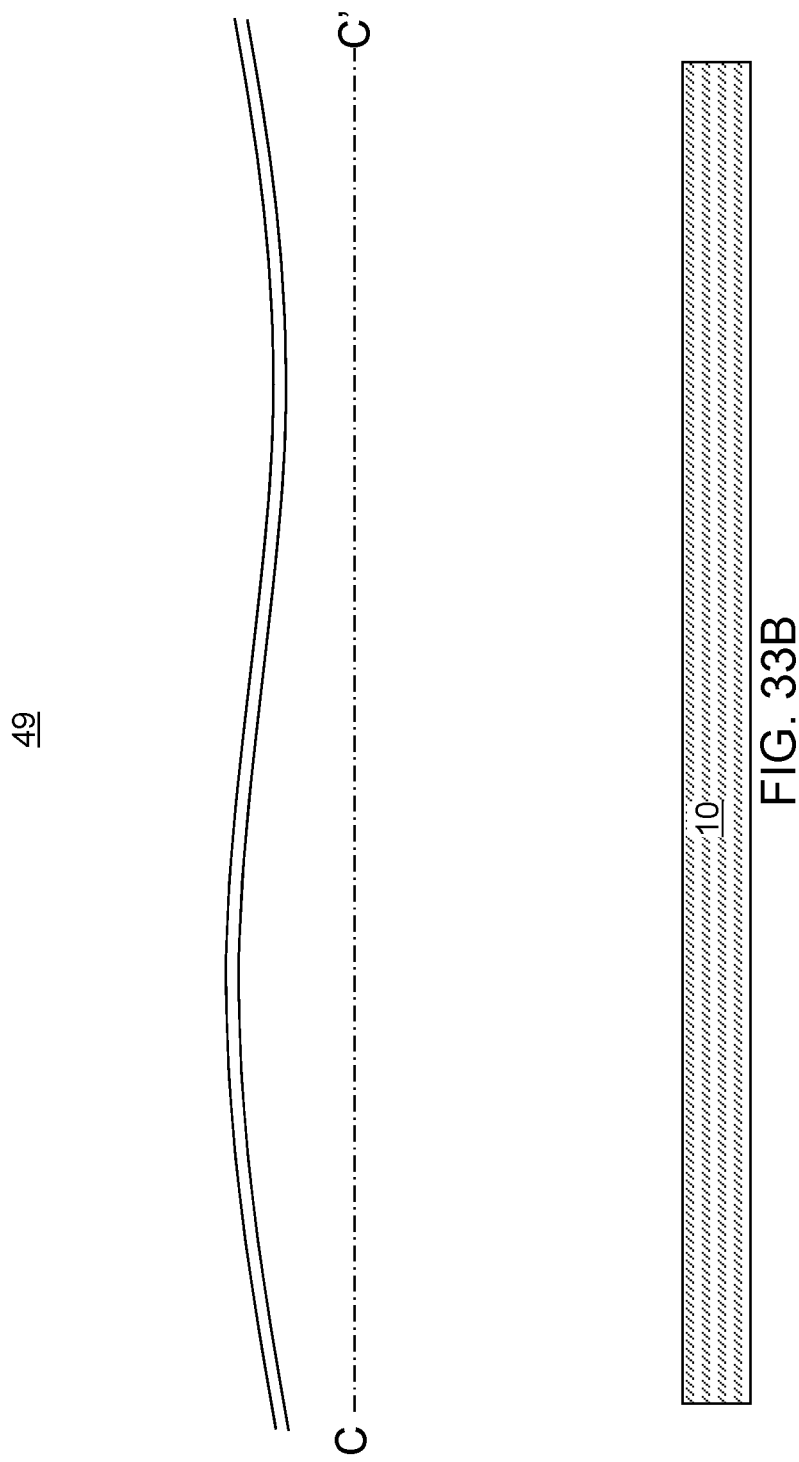

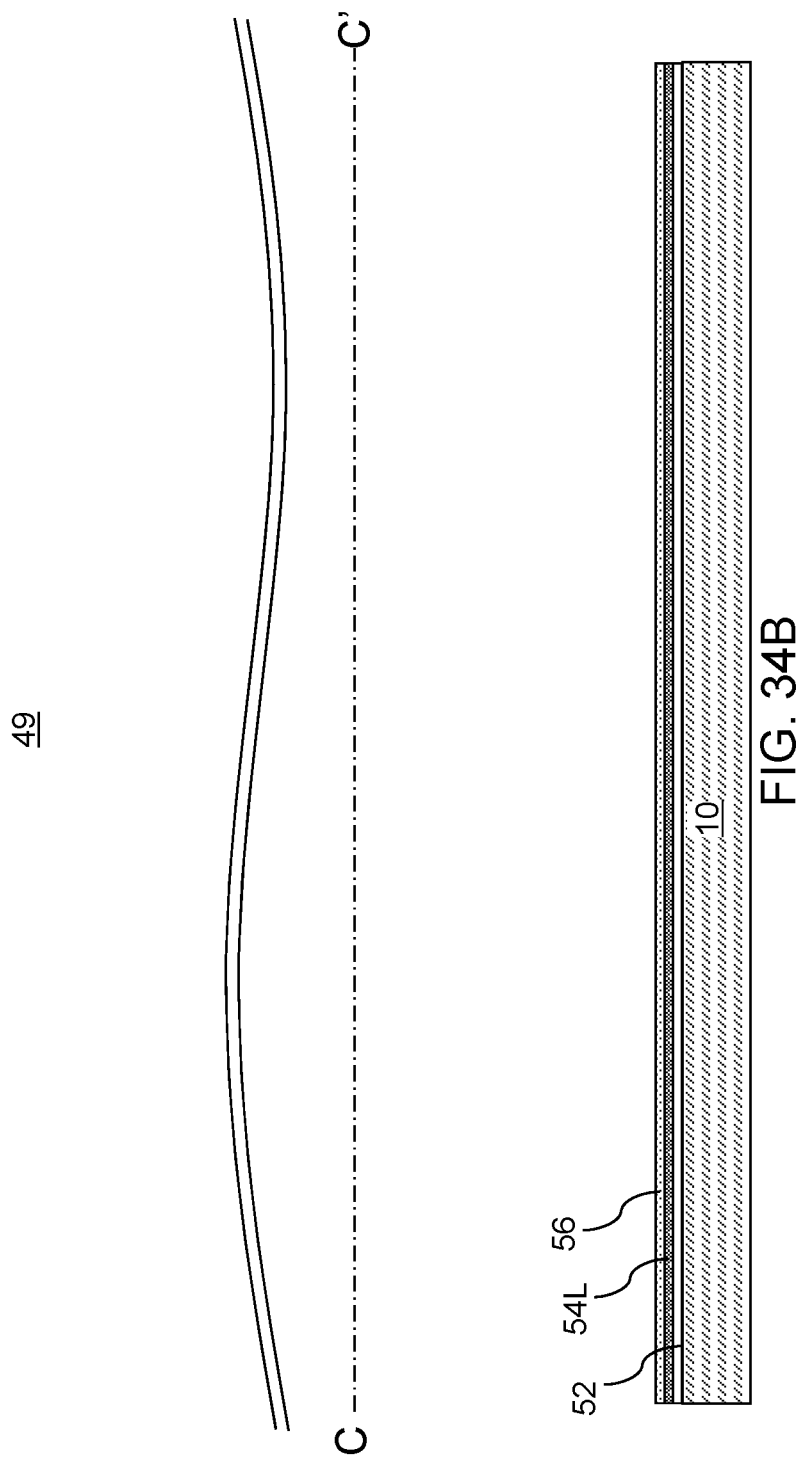

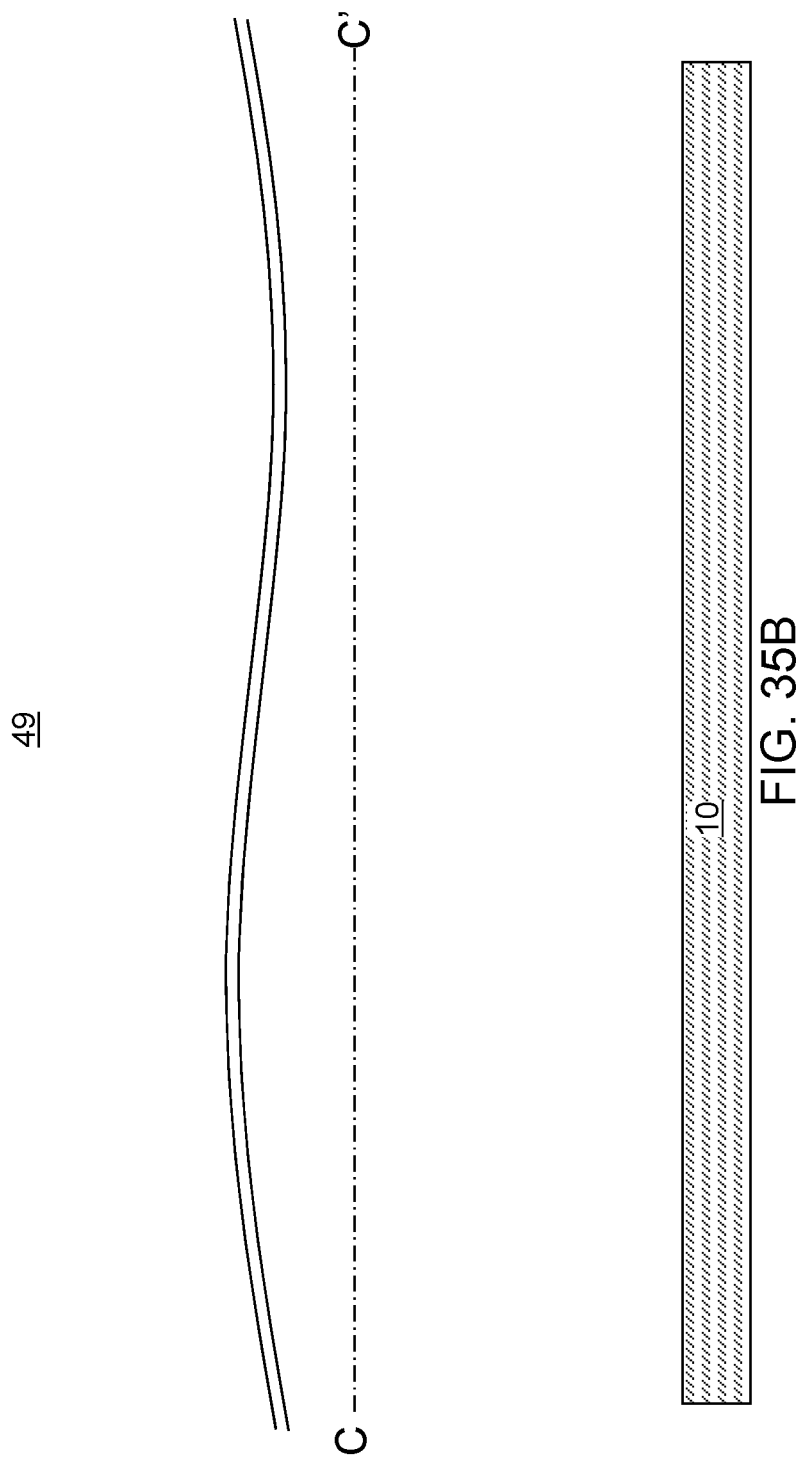

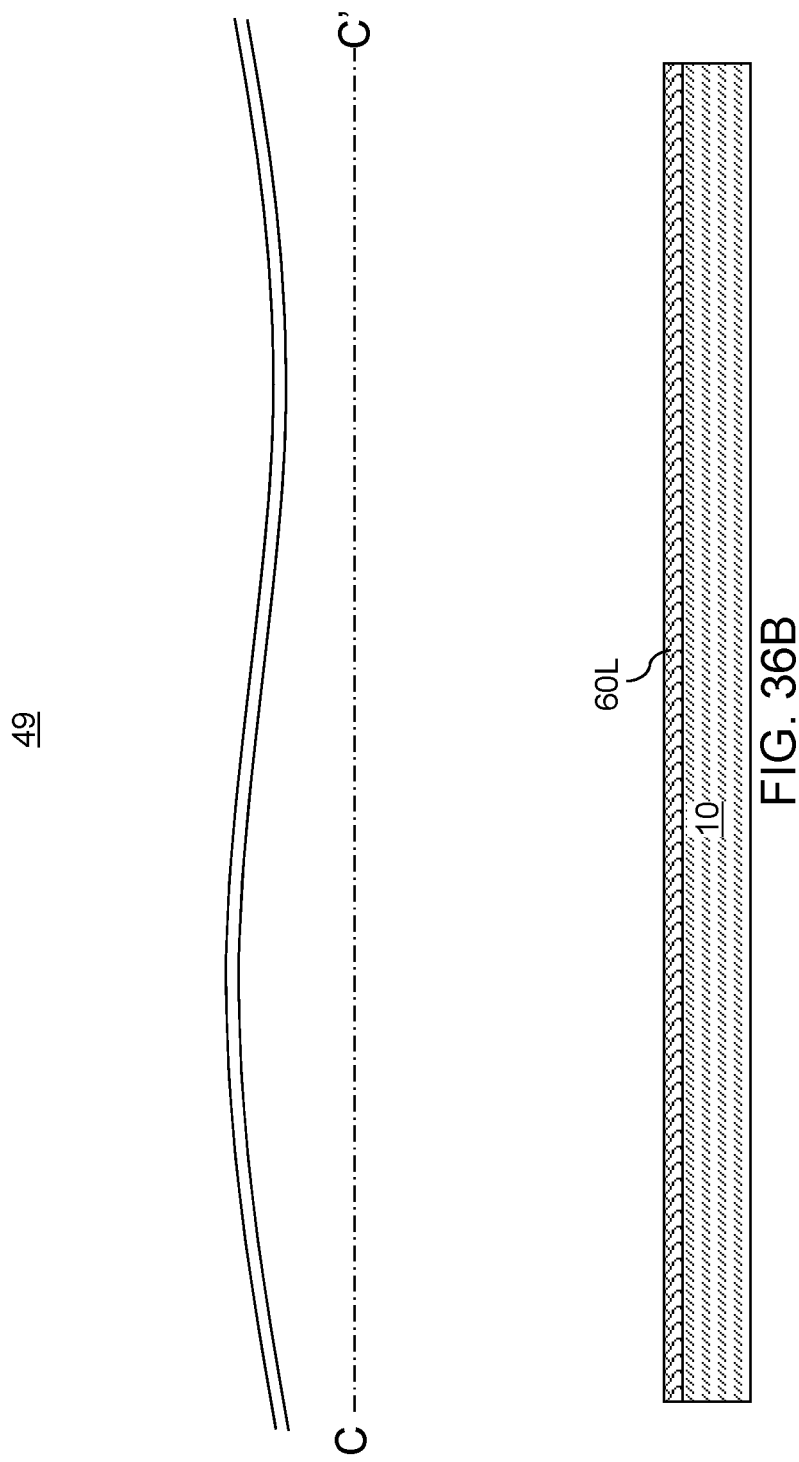

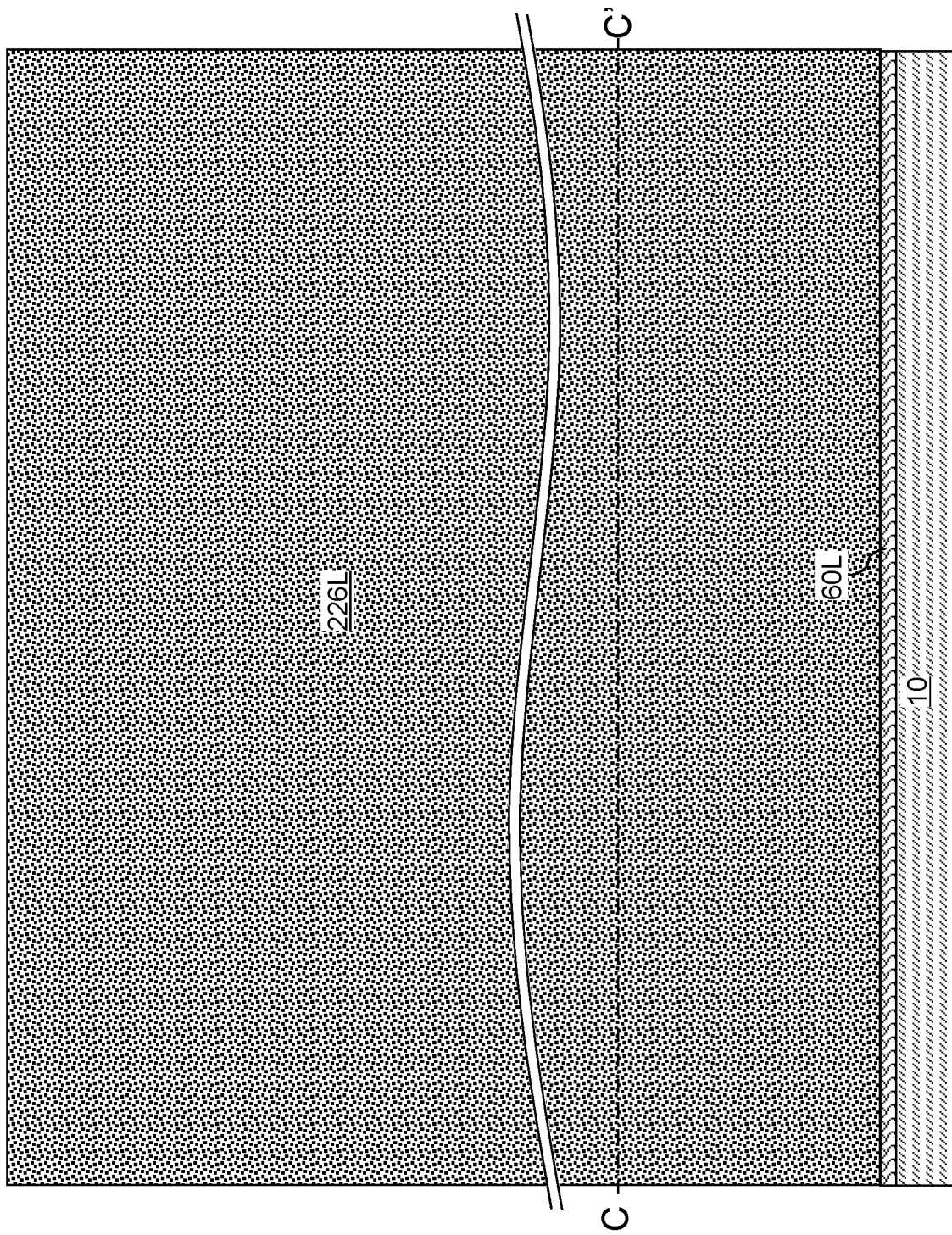

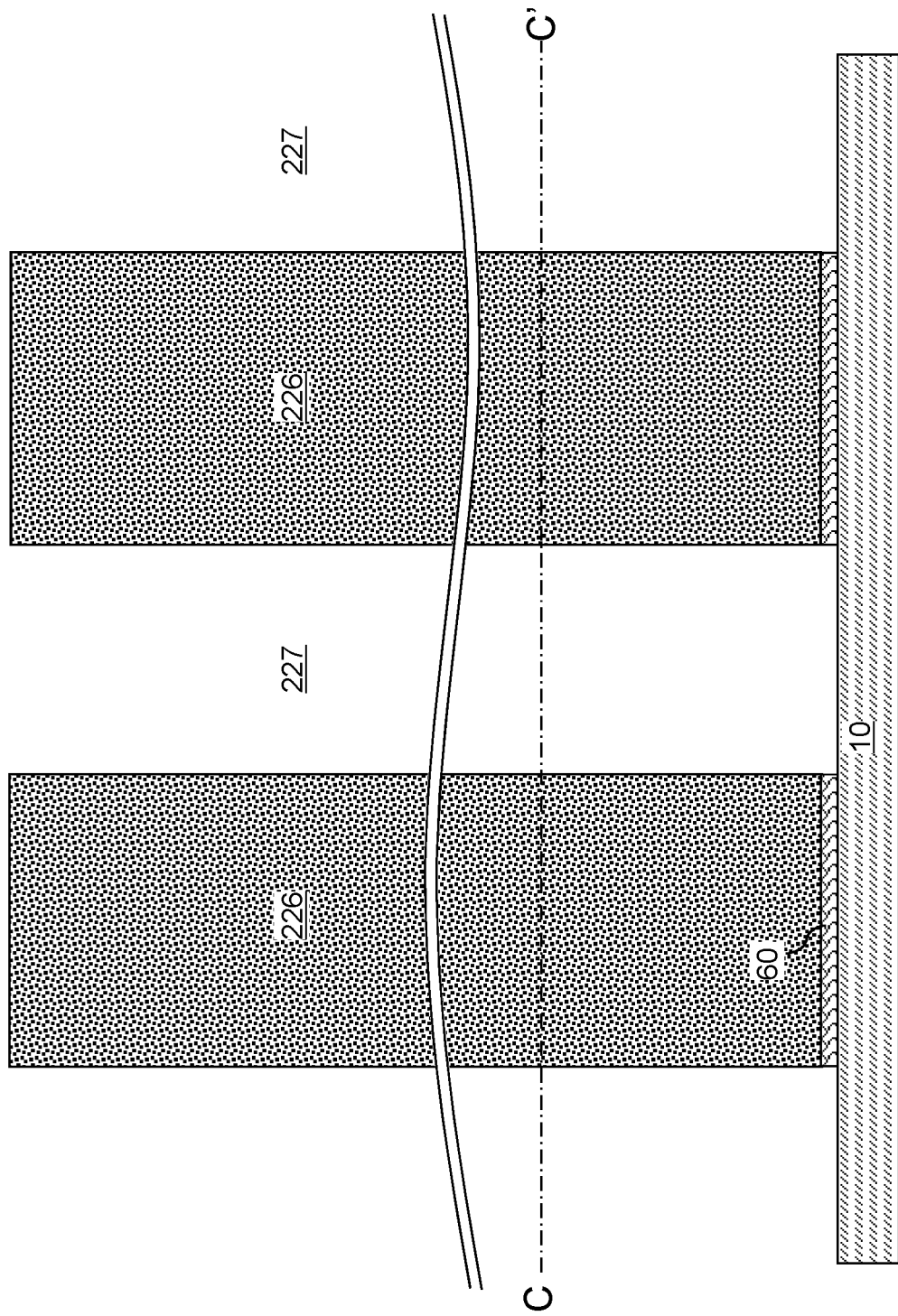

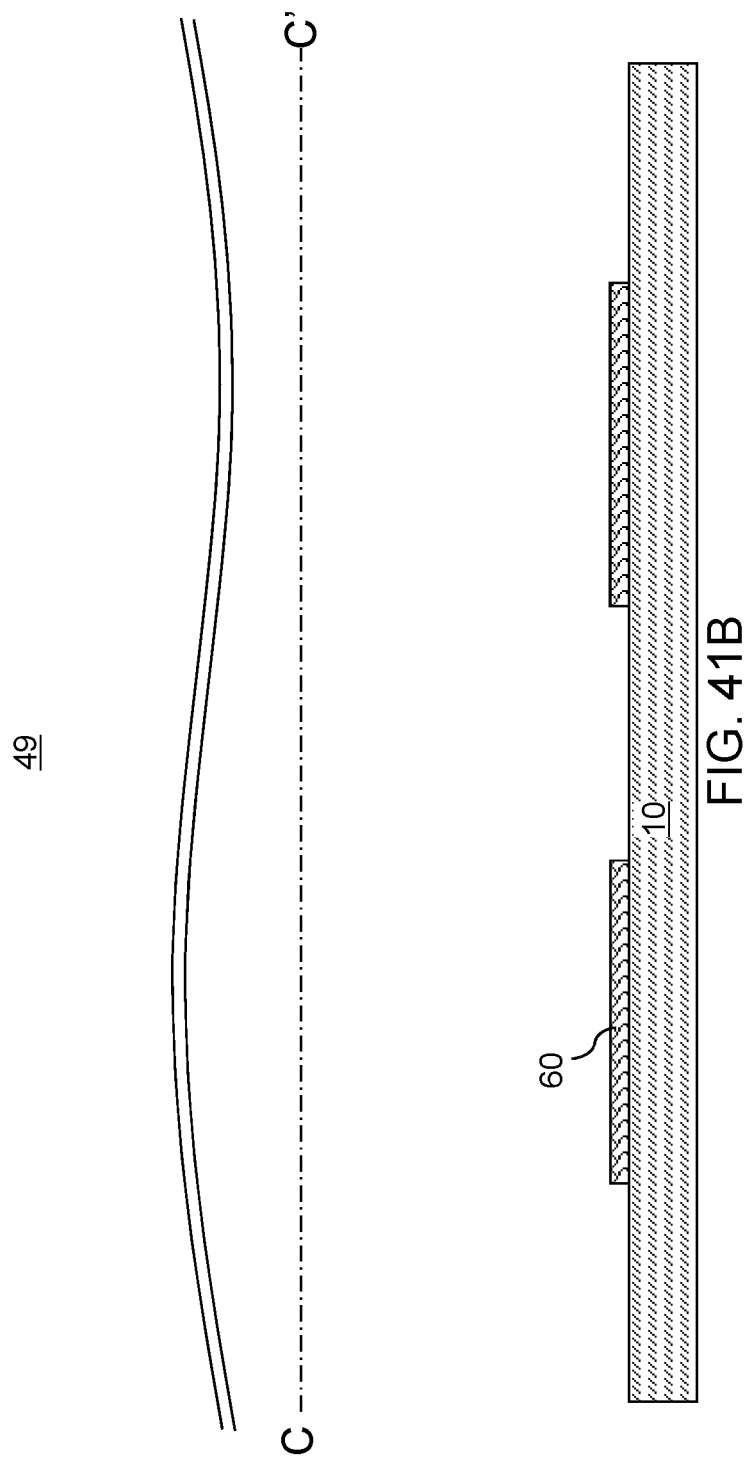

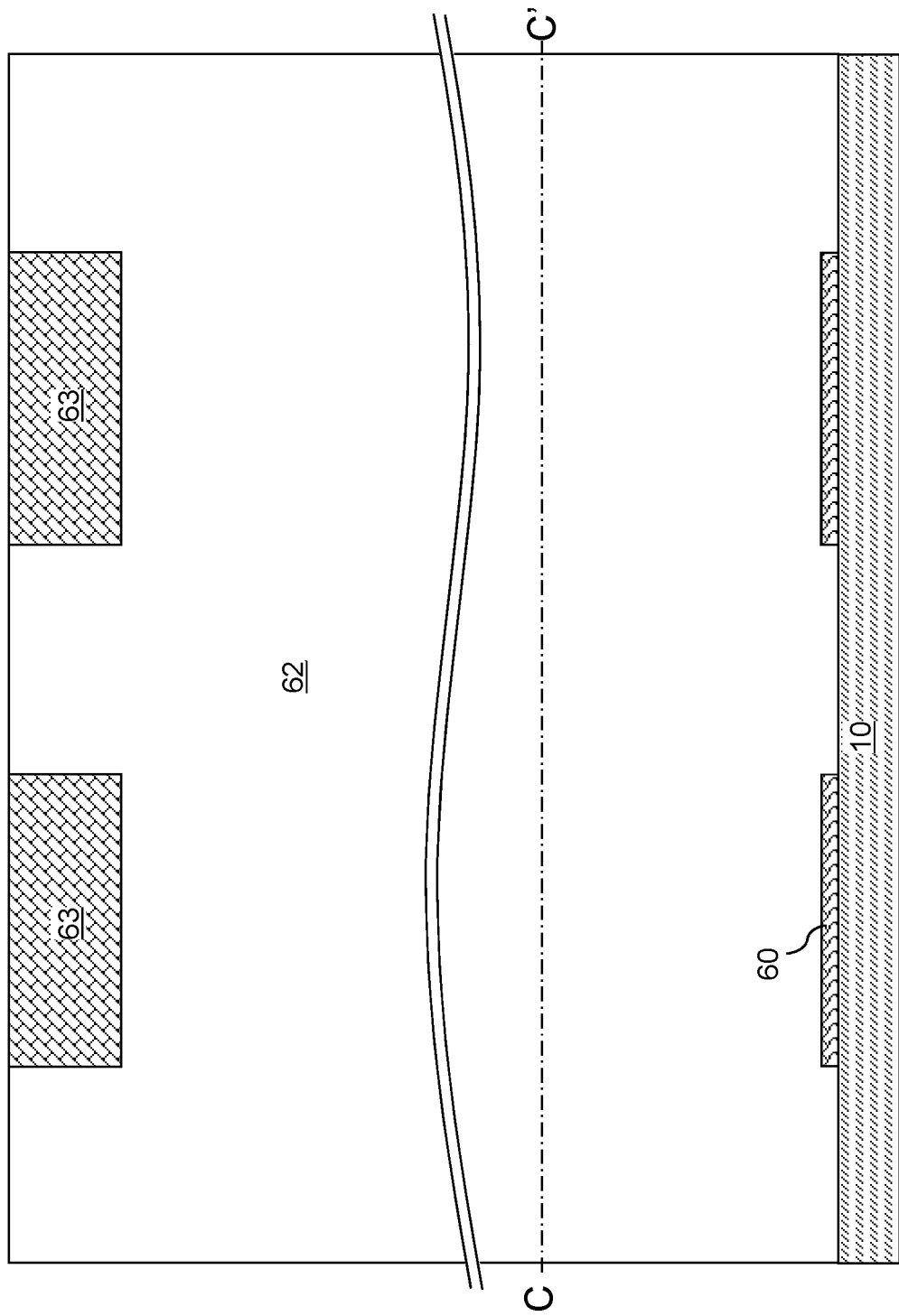

THREE-DIMENSIONAL FLAT NAND MEMORY DEVICE HAVING CURVED MEMORY ELEMENTS AND METHODS OF MAKING THE SAME

FIELD

The present disclosure relates generally to the field of semiconductor devices, and particular to three-dimensional flat NAND memory devices including curved memory elements and methods of manufacturing the same.

BACKGROUND

A configuration of a three-dimensional NAND memory device uses flat memory cells in which tunneling dielectrics have flat vertical surfaces. Such flat memory devices are described in an article by Hang-Ting Lue et al., titled "A 128 Gb (MLC)/192 Gb (TLC) Single-gate Vertical Channel (SGVC) Architecture 3D NAND using only 16 Layers with Robust Read Disturb, Long-Retention and Excellent Scaling Capability," IEDM Proceedings (2017) page 461.

SUMMARY

According to an embodiment of the present disclosure, a three-dimensional memory device is provided, which comprises: alternating stacks of electrically conductive strips and air gap strips located over a substrate and laterally spaced apart from one another by memory stack assemblies, wherein the memory stack assemblies laterally extend along a first horizontal direction and are spaced apart from one another along a second horizontal direction, wherein: each of the memory stack assemblies comprises two two-dimensional arrays of lateral protrusion regions; each lateral protrusion region laterally protrudes outward from a respective vertical plane including interfaces between a respective one of the memory stack assemblies and air gap strips within a respective one of the alternating stacks; each of the lateral protrusion regions comprises a respective curved charge storage element; each of the memory stack assemblies comprises two rows of vertical semiconductor channels; and each vertical semiconductor channel within the two rows of vertical semiconductor channels laterally overlies a respective vertical stack of charge storage elements.

According to another embodiment of the present disclosure, a method of forming a three-dimensional memory device is provided, which comprises: forming alternating stacks of first sacrificial material strips and second sacrificial material strips over a substrate, wherein the alternating stacks are laterally spaced apart from one another by line trenches laterally extending along a first horizontal direction; modifying the line trenches to provide a two-dimensional array of lateral recesses on each sidewall of the line trenches, wherein each two-dimensional array of lateral recesses is laterally bounded by a respective two-dimensional array of laterally-recessed surfaces of the second sacrificial material strips; forming memory stack assemblies in each volume that includes a combination of a volume of a line trench and volumes of two adjoining two-dimensional arrays of lateral recesses, wherein each of the memory stack assemblies comprises two two-dimensional arrays of lateral protrusion regions, and each of the lateral protrusion regions comprises a respective charge storage element; replacing remaining portions of the second sacrificial material strips with electrically conductive strips; and forming air gap strips by removing the first sacrificial material strips.

According to yet another embodiment of the present disclosure, a three-dimensional memory device is provided, which comprises: alternating stacks of electrically conductive strips and insulating strips located over a substrate and laterally spaced apart from one another by memory stack assemblies, wherein the memory stack assemblies laterally extend along a first horizontal direction and are spaced apart from one another along a second horizontal direction, wherein: each of the memory stack assemblies comprises two two-dimensional arrays of lateral protrusion regions; the lateral protrusion regions laterally protrude outward from a respective vertical plane including interfaces between a memory stack assembly and a subset of the insulating strips; and each of the lateral protrusion regions comprises a respective charge storage element that has a pair of concave inner sidewall segments having a respective horizontally concave profile in a horizontal cross-sectional view and has a pair of convex outer sidewall segments having a respective horizontally convex profile in the horizontal cross-sectional view.

According to still another embodiment of the present disclosure, a method of forming a three-dimensional memory device is provided, which comprises: forming alternating stacks of insulating strips and sacrificial material strips over a substrate, wherein the alternating stacks are laterally spaced apart from one another by line trenches laterally extending along a first horizontal direction; modifying the line trenches to provide a two-dimensional array of lateral recesses on each sidewall of the line trenches, wherein each two-dimensional array of lateral recesses is laterally bounded by a respective two-dimensional array of laterally-recessed surfaces of the sacrificial material strips; forming memory stack assemblies in each volume that includes a combination of a volume of a line trench and volumes of two adjoining two-dimensional arrays of lateral recesses, wherein each of the memory stack assemblies comprises two rows of material stack strips that extend vertically and laterally overlie sidewalls of a respective one of the alternating stacks, and each row of material stack strips includes a respective plurality of material stack strips that are laterally spaced apart along a first horizontal direction, and each of the material stack strips comprises a respective charge storage material layer including charge storage elements within each a respective vertical stack of lateral recesses selected from the two-dimensional arrays of lateral recesses; and replacing the sacrificial material strips with electrically conductive strips.

BRIEF DESCRIPTION OF THE DRAWINGS

FIG. 4A is a vertical cross-sectional view of a portion of a line trench in the first exemplary structure of FIGS. 3A and 3B.

FIG. 4B is a horizontal cross-sectional view along the plane B-B' of the structure of FIG. 4A. The vertical plane A-A' corresponds to the plane of the vertical cross-sectional view of FIG. 4A.

FIG. 4C is a horizontal cross-sectional view along the plane C-C' of the structure of FIG. 4A. The vertical plane C-C' corresponds to the plane of the vertical cross-sectional view of FIG. 4A.

FIG. 6A is a vertical cross-sectional view of a portion of a line trench after formation of a two-dimensional array of masking material pillars according to the first embodiment of the present disclosure.

FIG. 6B is a horizontal cross-sectional view along the plane B-B' of the structure of FIG. 6A. The vertical plane A-A' corresponds to the plane of the vertical cross-sectional view of FIG. 6A.

FIG. 6C is a horizontal cross-sectional view along the plane C-C' of the structure of FIG. 6A. The vertical plane A-A' corresponds to the plane of the vertical cross-sectional view of FIG. 6A.

FIG. 7A is a vertical cross-sectional view of a portion of a line trench after formation of diffusion barrier strips according to the first embodiment of the present disclosure.

FIG. 7B is a horizontal cross-sectional view along the plane B-B' of the structure of FIG. 7A. The vertical plane A-A' corresponds to the plane of the vertical cross-sectional view of FIG. 7A.

FIG. 7C is a horizontal cross-sectional view along the plane C-C' of the structure of FIG. 7A. The vertical plane A-A' corresponds to the plane of the vertical cross-sectional view of FIG. 7A.

FIG. 9A is a vertical cross-sectional view of a portion of a line trench after removal of the diffusion barrier strips and the semiconductor oxide layer according to the first embodiment of the present disclosure.

FIG. 9B is a horizontal cross-sectional view along the plane B-B' of the structure of FIG. 9A. The vertical plane A-A' corresponds to the plane of the vertical cross-sectional view of FIG. 9A.

FIG. 9C is a horizontal cross-sectional view along the plane C-C' of the structure of FIG. 9A. The vertical plane A-A' corresponds to the plane of the vertical cross-sectional view of FIG. 9A.

FIG. 10A is a vertical cross-sectional view of a portion of a line trench after formation of a blocking dielectric layer and a charge storage material layer according to the first embodiment of the present disclosure.

FIG. 10B is a horizontal cross-sectional view along the plane B-B' of the structure of FIG. 10A. The vertical plane A-A' corresponds to the plane of the vertical cross-sectional view of FIG. 10A.

FIG. 10C is a horizontal cross-sectional view along the plane C-C' of the structure of FIG. 10A. The vertical plane A-A' corresponds to the plane of the vertical cross-sectional view of FIG. 10A.

FIG. 11A is a vertical cross-sectional view of a portion of a line trench after formation of discrete charge storage elements by anisotropically etching the charge storage material layer according to the first embodiment of the present disclosure.

FIG. 11B is a horizontal cross-sectional view along the plane B-B' of the structure of FIG. 11A. The vertical plane A-A' corresponds to the plane of the vertical cross-sectional view of FIG. 11A.

FIG. 11C is a horizontal cross-sectional view along the plane C-C' of the structure of FIG. 11A. The vertical plane A-A' corresponds to the plane of the vertical cross-sectional view of FIG. 11A.

FIG. 26 is a schematic vertical cross-sectional view of a second exemplary structure after formation of a vertically alternating sequence of insulating layers and sacrificial material layers and formation of an insulating cap layer according to a second embodiment of the present disclosure.

FIG. 29A is a first vertical cross-sectional view of a region of the second exemplary structure of FIGS. 28A and 28B.

FIG. 30B is a second vertical cross-sectional view of the region of the second exemplary structure of FIG. 30A.

FIG. 32B is a second vertical cross-sectional view of the region of the second exemplary structure of FIG. 32A.

FIG. 33B is a second vertical cross-sectional view of the region of the second exemplary structure of FIG. 33A.

FIG. 34B is a second vertical cross-sectional view of the region of the second exemplary structure of FIG. 34A.

FIG. 35B is a second vertical cross-sectional view of the region of the second exemplary structure of FIG. 35A.

FIG. 36B is a second vertical cross-sectional view of the region of the second exemplary structure of FIG. 36A.

FIG. 37B is a second vertical cross-sectional view of the region of the second exemplary structure of FIG. 37A.

FIG. 40B is a second vertical cross-sectional view of the region of the second exemplary structure of FIG. 40A.

FIG. 41B is a second vertical cross-sectional view of the region of the second exemplary structure of FIG. 41A.

FIG. 43B is a second vertical cross-sectional view of the region of the second exemplary structure of FIG. 43A.

FIG. 49A is a schematic vertical cross-sectional view of the second exemplary structure after formation of dielectric pillars in the backside via cavities according to the second embodiment of the present disclosure.

FIG. 49B is a top-down view of the second exemplary structure of FIG. 49A. The vertical plane A-A' is the plane of the cross-section for FIG. 49A.

DETAILED DESCRIPTION

Figure 1:
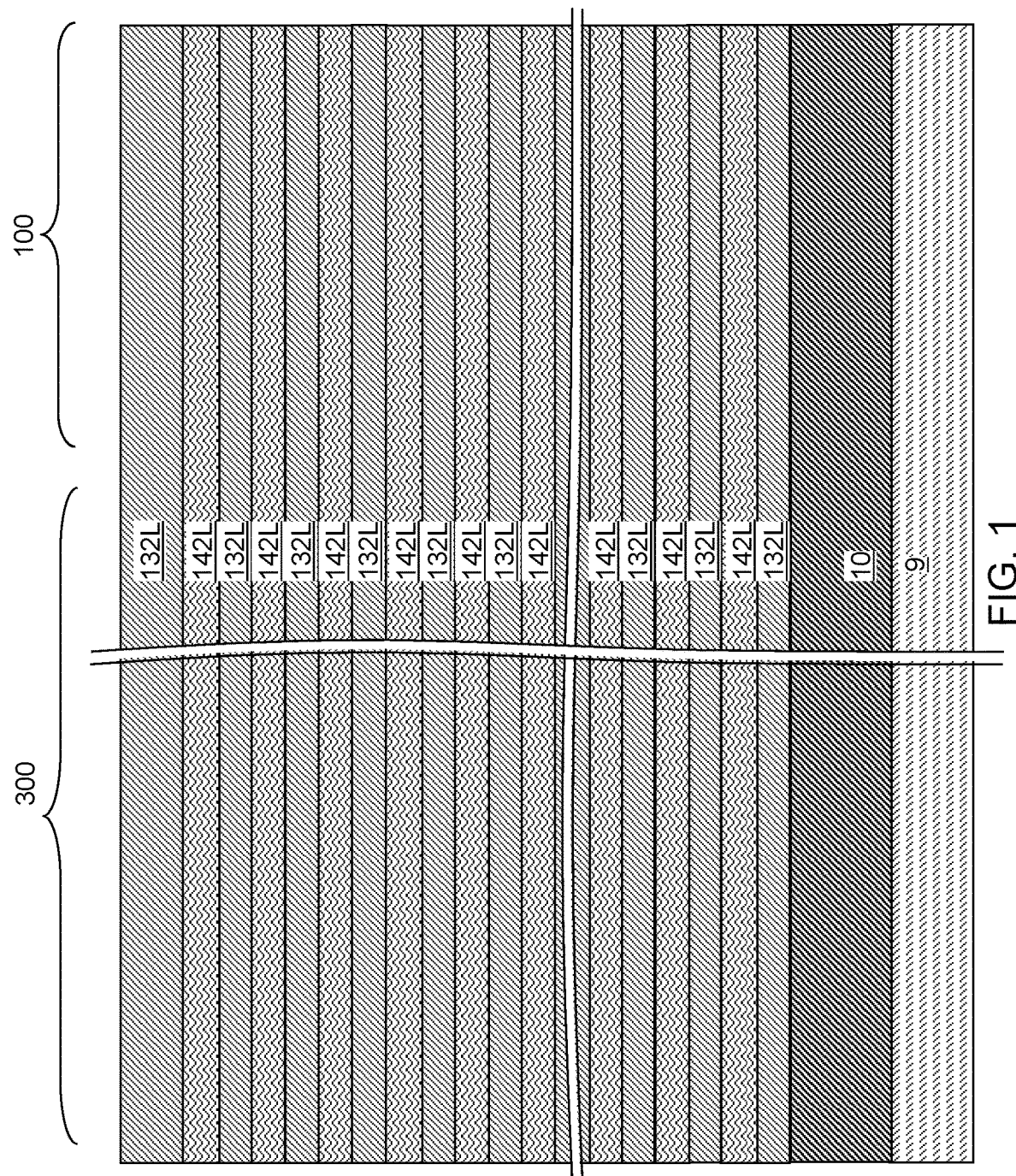
FIG. 1 is a schematic vertical cross-sectional view of a first exemplary structure after formation of a vertically alternating sequence of first sacrificial material layers and second sacrificial material layers and an insulating cap layer according to a first embodiment of the present disclosure.

As discussed above, the present disclosure is directed to three-dimensional flat NAND memory devices including high mobility vertical semiconductor channels and methods of manufacturing the same, the various embodiments of which are discussed herein in detail. In particular, in various embodiments disclosed herein, curved memory elements in flat memory devices may be desirable because geometrical effects reduce the required operational voltage for the flat memory devices by enhancing electrical field strengths.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. As used herein, a first element located "on" a second element may be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and may be fabricated using the various embodiments described herein.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, a first exemplary structure according to the first embodiment of the present disclosure is illustrated, which may be used, for example, to fabricate a device structure containing vertical NAND memory devices. The first exemplary structure includes a substrate (9, 10), which may be a semiconductor substrate. The substrate may include a substrate semiconductor layer 9 and an optional semiconductor material layer 10. The substrate semiconductor layer 9 maybe a semiconductor wafer or a semiconductor material layer, and may include at least one elemental semiconductor material (e.g., single crystal silicon wafer or layer), at least one III-V compound semiconductor material, at least one II-VI compound semiconductor material, at least one organic semiconductor material, or other semiconductor materials known in the art. In one embodiment, the semiconductor material layer 10 may have a doping of a first conductivity type, and the substrate semiconductor layer 9 may have a doping of a second conductivity type that is opposite of the first conductivity type. For example, if the first conductivity type is p-type, the second conductivity type is n-type, and vice versa.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A vertically alternating sequence of first sacrificial material layers 132L and second sacrificial material layers 142L may be formed over the substrate (9, 10). As used herein, a "vertically alternating sequence" refers to an alternating sequence of multiple instances of a first element and multiple instances of a second element that alternate vertically such that an instance of the second element overlies and/or underlies each instance of the first element, and an instance of the first element overlies and/or underlies each instance of the second element. The vertically alternating sequence may include a stack of an alternating plurality of first sacrificial material layers 132L and second sacrificial material layers 142L. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. Thus, a vertically alternating sequence of first elements and second elements may be an alternating plurality of the first elements and the second elements in which the alternating of the first elements and second elements occurs along the vertical direction. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The alternating plurality of first sacrificial material layers 132L and second sacrificial material layers 142L may constitute a prototype stack, or an in-process stack, of alternating layers comprising first sacrificial material layers 132L and second sacrificial material layers 142L. As used herein, a "prototype" structure or an "in-process" structure refers to a transient structure that is subsequently modified in the shape or composition of at least one component therein.

The second material of the second sacrificial material layers 142L is a sacrificial material that may be removed selective to the first material of the first sacrificial material layers 132L. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

In one embodiment, the first sacrificial material layers 132L may include a first sacrificial semiconductor material, and second sacrificial material layers 142L may include a second sacrificial semiconductor material that may be removed selective to the first sacrificial semiconductor material. In one embodiment, the first sacrificial semiconductor material may include, and/or consist essentially of, single crystalline silicon, polycrystalline silicon, or amorphous silicon, and the second sacrificial semiconductor material may include, and/or consist essentially of, a single crystalline silicon-germanium alloy, a polycrystalline silicon-germanium alloy, and an amorphous silicon-germanium alloy. The first sacrificial semiconductor material may include undoped silicon, i.e., silicon deposited without any intentional doping. In one embodiment, the first sacrificial semiconductor material may include undoped amorphous silicon. In one embodiment, the atomic concentration of germanium in the first sacrificial semiconductor material may be zero, and the atomic concentration of germanium in the second sacrificial semiconductor material may be in a range from 10% to 50%, such as from 20% to 40%, although lesser and greater atomic concentrations of germanium may also be used.

The first sacrificial material layers 132L and the second sacrificial material layers 142L may be deposited by chemical vapor deposition processes. The thicknesses of the first sacrificial material layers 132L and the second sacrificial material layers 142L may be in a range from 20 nm to 50 nm, although lesser and greater thicknesses may be used for each first sacrificial material layer 132L and for each second sacrificial material layer 142L. The number of repetitions of the pairs of a first sacrificial material layer 132L and a second sacrificial material layer (e.g., a control gate electrode or a sacrificial material layer) 142L may be in a range from 2 to 1,024, and typically from 8 to 256, although a greater number of repetitions may also be used. In one embodiment, each first sacrificial material layer 132L and each second sacrificial material layer 142L in the vertically alternating sequence (132L, 142L) may have a uniform thickness that is substantially invariant within each respective second sacrificial material layer 142L.

Figure 2:
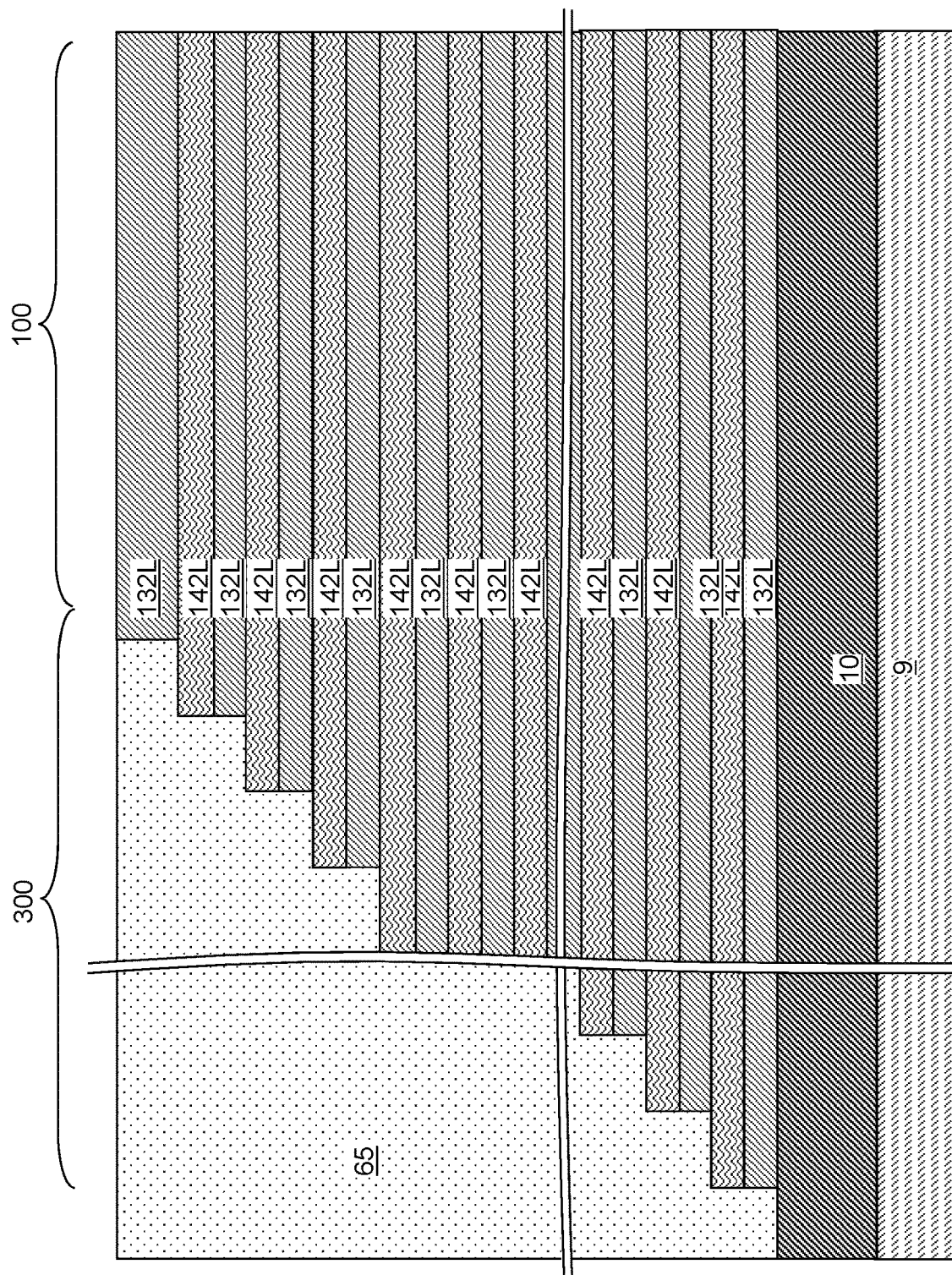
FIG. 2 is a schematic vertical cross-sectional view of the first exemplary structure after formation of stepped terraces and a retro-stepped dielectric material portion according to the first embodiment of the present disclosure.

Referring to FIG. 2, the vertically alternating sequence of the first sacrificial material layers 132L and the second sacrificial material layers 142L may be patterned to form stepped surfaces that continuously extend from a bottommost layer of the vertically alternating sequence (132L, 142L) to a topmost layer of the alternating sequence (132L, 142L) in the contact region 300. A stepped cavity may be formed within the contact region 300 which is located between the memory array region 100 and the peripheral device region (not shown) containing the at least one semiconductor device for the peripheral circuitry. The stepped cavity may have various stepped surfaces such that the horizontal cross-sectional shape of the stepped cavity changes in steps as a function of the vertical distance from the top surface of the substrate (9, 10). In one embodiment, the stepped cavity may be formed by repetitively performing a set of processing steps. The set of processing steps may include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Stepped surfaces are formed at a peripheral portion of the vertically alternating sequence (132L, 142L) through formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the vertically alternating sequence (132L, 142L). Each second sacrificial material layer 142L other than a topmost second sacrificial material layer 142L within the vertically alternating sequence (132L, 142L) laterally extends farther than any overlying second sacrificial material layer 142L within the vertically alternating sequence (132L, 142L). The terrace region includes stepped surfaces of the vertically alternating sequence (132L, 142L) that continuously extend from a bottommost layer within the vertically alternating sequence (132L, 142L) to a topmost layer within the vertically alternating sequence (132L, 142L).

A retro-stepped dielectric material portion 65 (i.e., an insulating fill material portion) may be formed in the stepped cavity by deposition of a dielectric material therein. For example, a dielectric material such as silicon oxide may be deposited in the stepped cavity. Excess portions of the deposited dielectric material may be removed from above the top surface of the topmost first sacrificial material layer 132L, for example, by chemical mechanical planarization (CMP). The remaining portion of the deposited dielectric material filling the stepped cavity may constitute the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is used for the retro-stepped dielectric material portion 65, the silicon oxide of the retro-stepped dielectric material portion 65 may, or may not, be doped with dopants such as B, P, and/or F.

Referring to FIGS. 3A, 3B, and 4A-4C, a lithographic material stack (not shown) including at least a photoresist layer may be formed over the topmost first sacrificial material layer 132L and the retro-stepped dielectric material portion 65, and may be lithographically patterned to form line-shaped openings therein. The line-shaped openings laterally extend along a first horizontal direction hd1, and have a uniform width along a second horizontal direction hd2 that is perpendicular to the first horizontal direction hd1. The pattern in the lithographic material stack may be transferred through the retro-stepped dielectric material portion 65 and through the vertically alternating sequence (132L, 142L) by at least one anisotropic etch that uses the patterned lithographic material stack as an etch mask. Portions of the vertically alternating sequence (132L, 142L) underlying the line-shaped openings in the patterned lithographic material stack may be etched to form line trenches 49. As used herein, a "line trench" refers to a trench that laterally extends straight along a horizontal direction.

The line trenches 49 laterally extend along the first horizontal direction hd1 through the vertically alternating sequence (132L, 142L). In one embodiment, the line trenches 49 have a respective uniform width that is invariant under translation along the first horizontal direction hd1. In one embodiment, the line trenches 49 may have the same width throughout, and the spacing between neighboring pairs of the line trenches 49 may be the same. In this case, the line trenches 49 may constitute a one-dimensional periodic array of line trenches 49 having a pitch along a second horizontal direction hd2 that is perpendicular to the first horizontal direction hd1. The width of the line trenches 49 along the second horizontal direction hd2 may be in a range from 30 nm to 500 nm, such as from 60 nm to 250 nm, although lesser and greater widths may also be used.

The line trenches 49 extend through each layer of the vertically alternating sequence (132L, 142L) and the retro-stepped dielectric material portion 65. The chemistry of the anisotropic etch process used to etch through the materials of the vertically alternating sequence (132L, 142L) may alternate to optimize etching of the first and second materials in the vertically alternating sequence (132L, 142L). The anisotropic etch may be, for example, a series of reactive ion etches. The sidewalls of the line trenches 49 may be substantially vertical, or may be tapered. The patterned lithographic material stack may be subsequently removed, for example, by ashing.

Figure 3A:
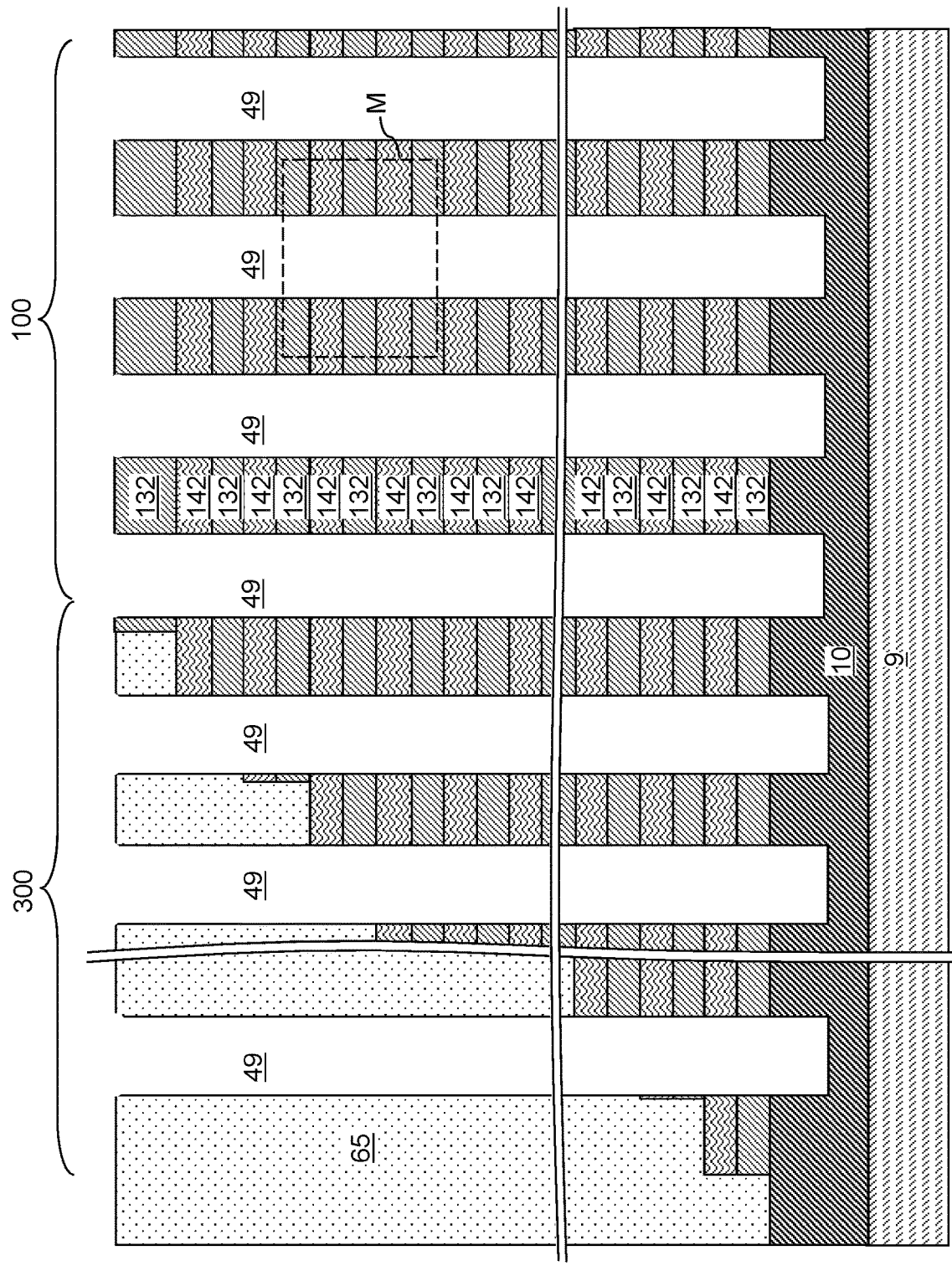
FIG. 3A is a schematic vertical cross-sectional view of the first exemplary structure after formation of line trenches according to the first embodiment of the present disclosure.
Figure 3B:
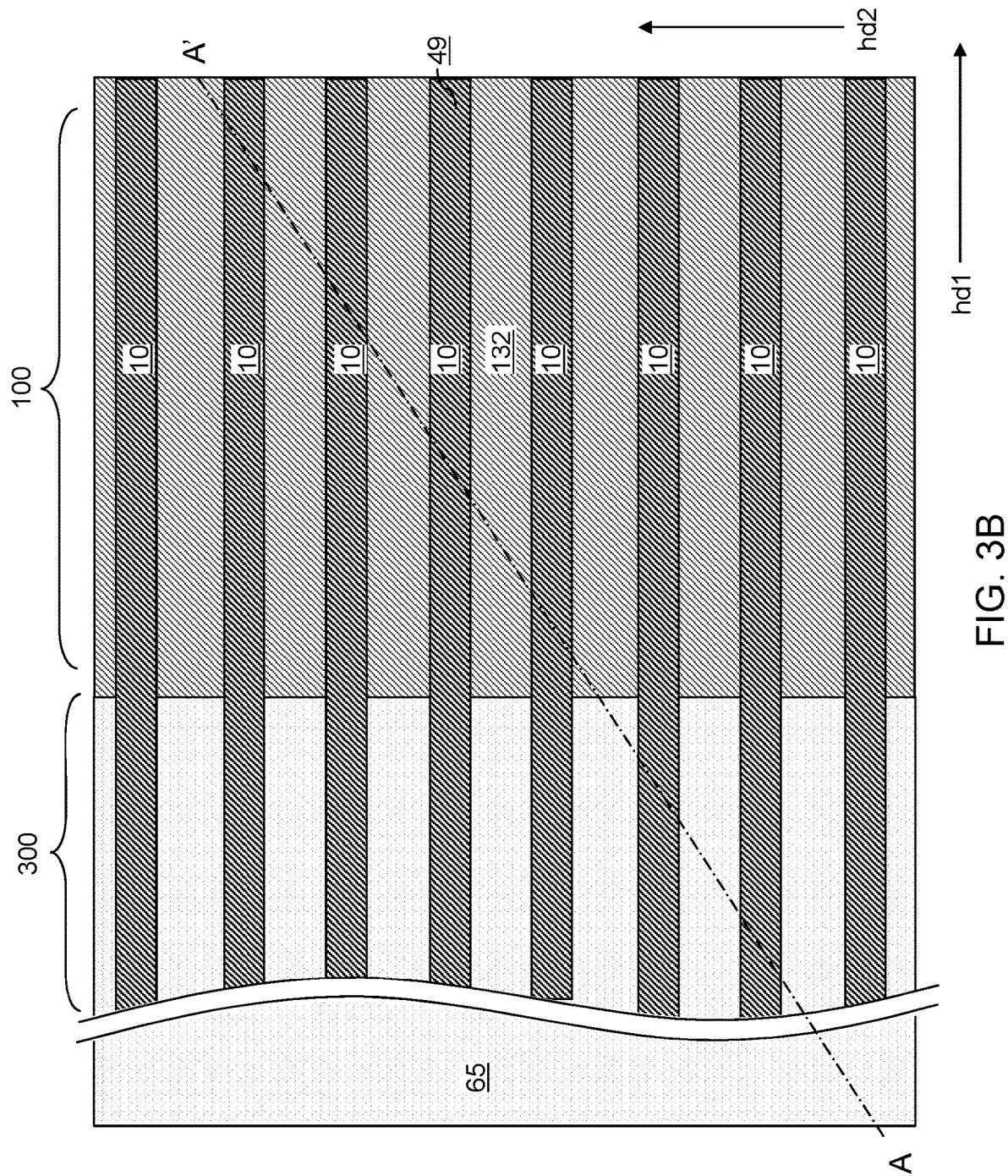
FIG. 3B is a top-down view of the first exemplary structure of FIG. 3A. The vertical plane A-A' is the plane of the cross-section for FIG. 3A.

The line trenches 49 may laterally extend through the entire memory array region 100, and may laterally extend into the contact region 300. The line trenches 49 may laterally extend through the entire contact region 300 along the first horizontal direction hd1, or may laterally extend only through part of a width, but not the entire width along the first horizontal direction hd1, of the contact region 300. In one embodiment, an over-etch into the semiconductor material layer 10 may be optionally performed after the top surface of the semiconductor material layer 10 is physically exposed at a bottom of each line trench 49. The over-etch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth may be, for example, in a range from 1 nm to 50 nm, although lesser and greater recess depths may also be used. The over-etch is optional, and may be omitted. If the overetch is not performed, the bottom surfaces of the line trenches 49 may be coplanar with the topmost surface of the semiconductor material layer 10. With reference to FIG. 3B, in embodiments using the optional overetch as well as embodiments that do not perform the overetch, the semiconductor material layer 10 may be exposed through the line trenches 49.

Each of the line trenches 49 may include a sidewall (or a plurality of sidewalls) that extends substantially perpendicular to the topmost surface of the substrate. The substrate semiconductor layer 9 and the semiconductor material layer 10 collectively constitute a substrate (9, 10), which may be a semiconductor substrate. Alternatively, the semiconductor material layer 10 may be omitted, and the line trenches 49 may be extend to a top surface of the substrate semiconductor layer 9. While FIG. 3B illustrates the exposed semiconductor material layer 10, in embodiments where the semiconductor material layer 10 may be omitted, the substrate semiconductor layer 9 may be exposed.

The vertically alternating sequence (132L, 142L) may be divided into discrete portions by the line trenches 49. Each remaining portion of the vertically alternating sequence (132L, 142L) between a pair of line trenches 49 constitutes an alternating stack of remaining portions of the first sacrificial material layers 132L and remaining portions of the second sacrificial material layers 142. Each remaining portion of the first sacrificial material layers 132L may have a rectangular strip shape that laterally extends along the first horizontal direction hd1 and has a uniform width along the second horizontal direction hd2, and is herein referred to as a first sacrificial material strip 132. Each remaining portion of the second sacrificial material layers 142L may have a rectangular strip shape that laterally extends along the first horizontal direction hd1 and has a uniform width along the second horizontal direction hd2, and is herein referred to as a second sacrificial material strip 142. An alternating stack of first sacrificial material strips 132 and second sacrificial material strips 142 may be formed between each neighboring pair of line trenches 49 over the substrate (9, 10). The alternating stacks (132, 142) may be laterally spaced apart from one another by the line trenches 49, which laterally extend along the first horizontal direction hd1.

Figure 5B:
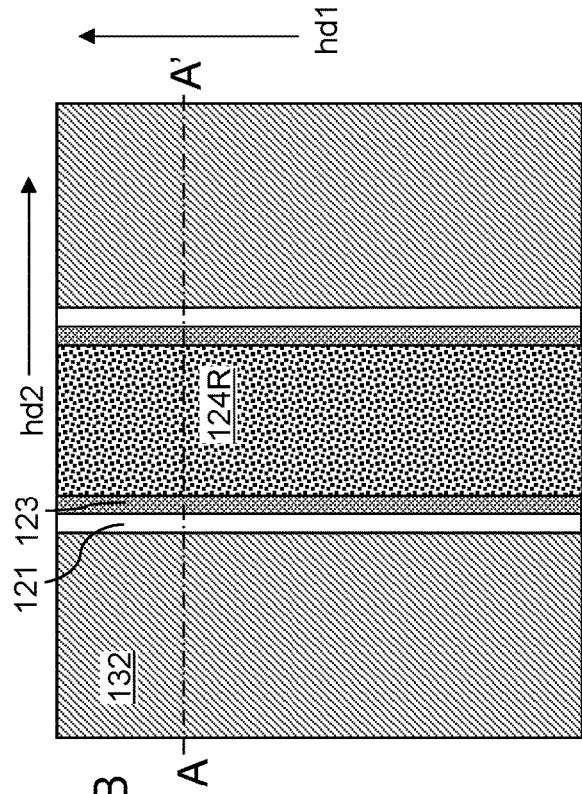
FIG. 5B is a horizontal cross-sectional view along the plane B-B' of the structure of FIG. 5A. The vertical plane A-A' corresponds to the plane of the vertical cross-sectional view of FIG. 5A.
Figure 5C:
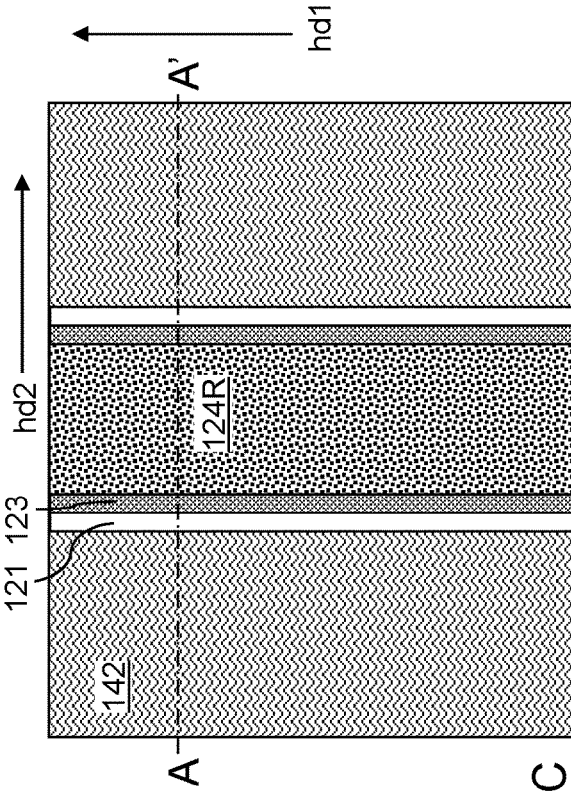
FIG. 5C is a horizontal cross-sectional view along the plane C-C' of the structure of FIG. 5A. The vertical plane C-C' corresponds to the plane of the vertical cross-sectional view of FIG. 5A.
Figure 5A:
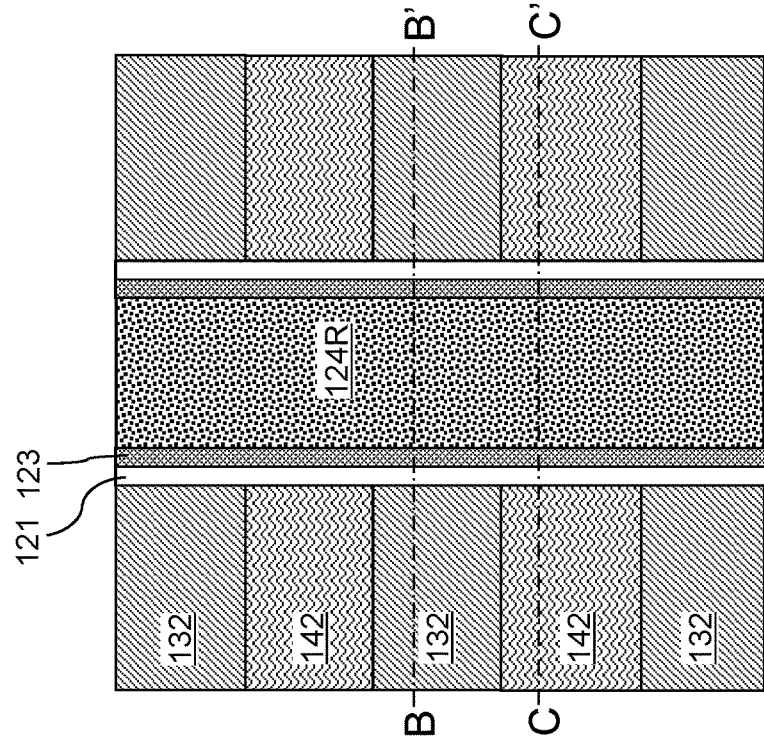
FIG. 5A is a vertical cross-sectional view of a portion of a line trench after formation of a silicon oxide layer, a diffusion barrier layer, and first masking material rails according to the first embodiment of the present disclosure.

Referring to FIGS. 5A-5C, a silicon oxide layer 121 and a diffusion barrier layer 123 may be sequentially deposited by conformal deposition processes. The silicon oxide layer 121 may have thickness in a range from 1 nm to 10 nm, although lesser and greater thicknesses may also be used. The diffusion barrier layer 123 may have a thickness in a range from 4 nm to 10 nm, although lesser and greater thicknesses may also be used. The diffusion barrier layer 123 includes a material that may block diffusion of oxygen in subsequent processing steps. In one embodiment, the diffusion barrier layer 123 may include silicon nitride.

A masking material may be deposited in remaining volumes of the line trenches 49. Excess portions of the masking material may be removed from above a top surface of a horizontal portion of the diffusion barrier layer 123 that overlies the alternating stacks (132, 142). Remaining portions of the masking material in the line trenches 49 constitute first masking material rails 124R. As used herein, a "rail" or a "rail structure" refers to a structure that laterally extends along a horizontal direction. In one embodiment, the first masking material rails 124R may have a uniform vertical cross-sectional shape within planes that are perpendicular to the lengthwise direction of the line trenches 49 (i.e., a first horizontal direction hd1). In one embodiment, the vertical cross-sectional shapes of the first masking material rails 124R may be rectangular or trapezoidal with a greater width at top than at bottom. In one embodiment, the first masking material rails 124R may include a carbon-based material. In one embodiment, the first masking material rails 124R may include spin-on-carbon that may be applied by spin coating and subsequently dried.

Referring to FIGS. 6A-6C, a photoresist layer (not shown) may be applied over the first exemplary structure and may be subsequently patterned to form an array of openings. In one embodiment, the array of openings in the photoresist layer may be a two-dimensional periodic array of discrete openings. In one embodiment, the two-dimensional periodic array of discrete openings may include rows of openings that overlie a respective one of the line trenches 49. The row-to-row pitch within the two-dimensional periodic array of discrete openings may be the same as the center-to-center pitch between the line trenches 49. Each row of openings may have a periodic one-dimensional array of openings with a regular pitch p, which is a center-to-center distance between neighboring pairs of openings in the photoresist layer. In one embodiment, the rows may be sequentially numbered with integers from one end to another end. Even numbered rows may be laterally offset relative to the odd-numbered rows by one-half of the regular pitch p in a top-down view.

An anisotropic etch process that etches the material of the first masking material rails 124R selective to the materials of the alternating stacks (132, 142), the silicon oxide layer 121, and the diffusion barrier layer 123 may be performed to transfer the pattern of the openings in the photoresist layer through the first masking material rails 124R. Each remaining portion of the first masking material rails 124R may have a rectangular pillar shape, and is herein referred to as a first masking material pillar 124. Neighboring pairs of first masking material pillars 124 in a line trench 49 may be laterally spaced apart by a first pillar-shaped cavity 125'. Each first pillar-shaped cavity 125' may have a rectangular horizontal cross-sectional shape. A two-dimensional array of first masking material pillars 124 may be formed within the line trenches 49.

Referring to FIGS. 7A-7C, an isotropic etch process that etches the material of the diffusion barrier layer 123 selective to the materials of the silicon oxide layer 121 and the first masking material pillars 124 may be performed. Physically exposed portions of the diffusion barrier layer 123 that are not masked by the two-dimensional array of masking material pillars 125' may be removed by the isotropic etch process. For example, if the diffusion barrier layer 123 includes silicon nitride, a wet etch using hot phosphoric acid may be performed to isotropically etch unmasked portions of the diffusion barrier layer 123. Each remaining portion of the diffusion barrier layer 123 extends vertically, and is herein referred to as a diffusion barrier strip 123'. A row of diffusion barrier strips 123' may be formed on each sidewall of the line trenches 49. Thus, two rows of diffusion barrier strips 123' may be formed within each line trench 49.

Figure 8B:
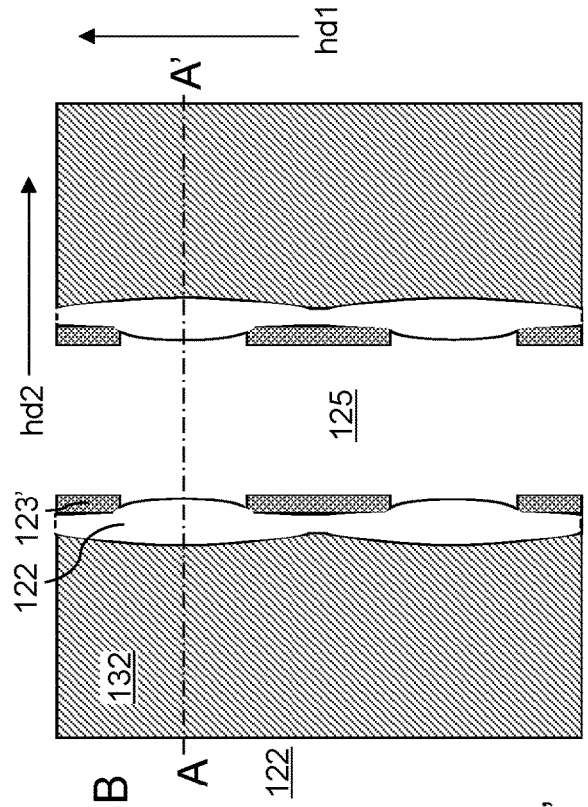
FIG. 8B is a horizontal cross-sectional view along the plane B-B' of the structure of FIG. 8A. The vertical plane A-A' corresponds to the plane of the vertical cross-sectional view of FIG. 8A.
Figure 8C:
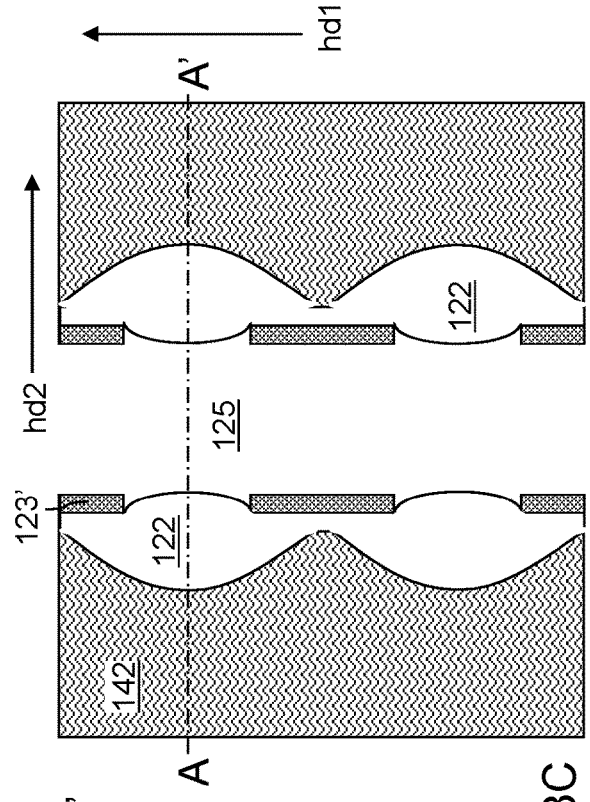
FIG. 8C is a horizontal cross-sectional view along the plane C-C' of the structure of FIG. 8A. The vertical plane A-A' corresponds to the plane of the vertical cross-sectional view of FIG. 8A.
Figure 8A:
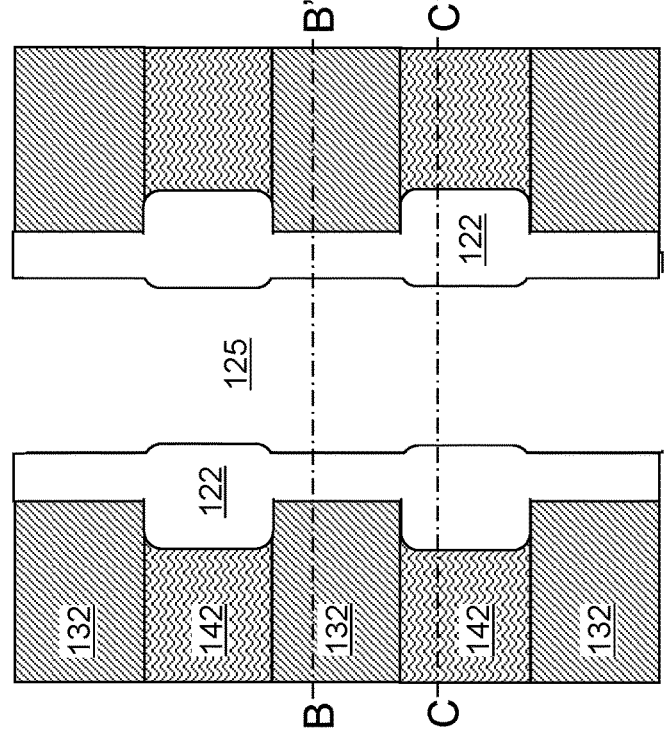
FIG. 8A is a vertical cross-sectional view of a portion of a line trench after removal of the two-dimensional array of masking material pillars and formation of a semiconductor oxide layer with two-dimensional arrays of thickened portions by an oxidation process according to the first embodiment of the present disclosure.

Referring to FIGS. 8A-8C, the first masking material pillar 124 may be removed selective to the diffusion barrier strips 123' and the silicon oxide layer 121. For example, the first masking material pillars 124 may be removed by performing an ashing process. A memory cavity 125 may be formed within each memory opening that results from the removal of the first masking pillar 124. Each memory cavity 125 may include volumes of the masking material pillars 125' and volumes of voids formed by removal of a row of first masking material pillar 124 within a line trench 49.

A thermal oxidation process (e.g., similar to a LOCOS process) may be performed to convert surface portions of the first sacrificial material strips 132 and the second sacrificial material strips 142 that are proximal to the portions of the silicon oxide layer 121 that are not covered by the diffusion barrier strips 123'. Oxygen atoms diffuse through the portions of the silicon oxide layer 121 that are not covered by the diffusion barrier strips 123' and into surface portions of the first sacrificial material strips 132 and the second sacrificial material strips 142. Surface portions of the first sacrificial material strips 132 and the second sacrificial material strips 142 that are adjacent to the gaps between the diffusion barrier strips 123' are oxidized at a higher oxidation rate than surface portions of the first sacrificial material strips 132 and the second sacrificial material strips 142 that are adjacent to the diffusion barrier strips 123'. Oxidized surface portions of the first sacrificial material strips 132 and the second sacrificial material strips 142 are added to the silicon oxide layer 121 to form a semiconductor oxide layer 122.

The semiconductor oxide layer 122 may include a semiconductor oxide material containing silicon, germanium, and oxygen with a compositional modulation. The semiconductor oxide layer 122 includes a higher atomic percentage of germanium atoms at thicker locations than at thinner locations (e.g., bird's beak locations). Because the diffusion barrier strips 123' prevent diffusion of oxygen therethrough, the semiconductor oxide layer 122 is formed with a lateral thickness modulation as illustrated in FIGS. 8B and 8C. Specifically, the semiconductor oxide layer 122 is thicker in regions without the diffusion barrier strips 123' than in regions located behind a diffusion barrier strip 123'. Further, a silicon-germanium alloy oxidizes faster than silicon under a same oxidation condition. Thus, the second sacrificial material strips 142 are oxidized faster than the first sacrificial material strips 132, and the semiconductor oxide layer 122 is thicker at the level of the second sacrificial material strips 142 than at the level of the first sacrificial material strips 132. Accordingly, the semiconductor oxide layer 122 has a vertical thickness modulation, i.e., a modulation of a lateral thickness along the vertical direction, such that the semiconductor oxide layer 122 is thicker at the levels of the second sacrificial material strips 142 than at the levels of the first sacrificial material strips 132.

The ratio of the maximum lateral thickness of the semiconductor oxide layer 122 at the levels of the second sacrificial material strips 142 to the maximum lateral thickness of the semiconductor oxide layer 122 at the levels of the first sacrificial material strips 132 may be in a range from 1.2 to 5.0, such as from 1.5 to 3.0, although lesser and greater ratios may also be used. The ratio of the maximum lateral thickness of the semiconductor oxide layer 122 at the levels of the second sacrificial material strips 142 to the minimum lateral thickness of the semiconductor oxide layer 122 at the levels of the second sacrificial material strips 142 may be in a range from 1.5 to 10, such as from 3 to 6, although lesser and greater ratios may also be used. The ratio of the maximum lateral thickness of the semiconductor oxide layer 122 at the levels of the first sacrificial material strips 132 to the minimum lateral thickness of the semiconductor oxide layer 122 at the levels of the first sacrificial material strips 132 may be in a range from 1.2 to 3, such as from 1.3 to 2, although lesser and greater ratios may also be used. The maximum lateral thickness of the semiconductor oxide layer 122 (which occur at the levels of the second sacrificial material strips 142) may be in a range from 10 nm to 60 nm, such as from 15 nm to 30 nm, although lesser and greater thicknesses may also be used. The interfaces between the semiconductor oxide layer 122 and the second sacrificial material strips 142 may be more contoured (i.e., has a greater curvature) than the interface between the semiconductor oxide layer 122 and the first sacrificial material strips 132. The semiconductor oxide layer 122 may be formed with two-dimensional arrays of thickened portions that are vertically stacked. The thickened portions occur at each level of the second sacrificial material strips 142.

Referring to FIGS. 9A-9C, the diffusion barrier strips 123' may be removed by performing an isotropic etch process such as a wet etch process using hydrofluoric acid. The semiconductor oxide layer 122 may be subsequently removed by another isotropic etch process such as a wet etch process using dilute hydrofluoric acid. The memory cavities 125 may be expanded by the volumes of the removed material portions of the diffusion barrier strips 123' and the semiconductor oxide layer 122. Thus, the line trenches 49 may be modified to provide a two-dimensional array of lateral recesses on each sidewall of the line trenches 49. Each two-dimensional array of lateral recesses may be laterally bounded by a respective two-dimensional array of laterally-recessed surfaces of the second sacrificial material strips 142. Each two-dimensional array of lateral recesses may extend along a lateral direction that is parallel to the lengthwise direction of the line trenches 49 and along a vertical direction.

Referring to FIGS. 10A-10C, a blocking dielectric layer 52 may be formed directly on sidewalls and bottom surfaces of the line trenches 49 by a conformal deposition process. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one other non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. Alternatively, or additionally, the blocking dielectric layer 52 may include a dielectric semiconductor compound such as silicon oxide, silicon oxynitride, silicon nitride, or a combination thereof. The thickness of blocking dielectric layer 52 may be in a range from 3 nm to 20 nm, although lesser and greater thicknesses may also be used.

Subsequently, a charge storage material layer 54L may be formed. The charge storage material layer 54L may be deposited over the blocking dielectric 52 after formation of the two-dimensional arrays of lateral recesses. In one embodiment, the charge storage material layer 54L may be a dielectric charge trapping material, which may be, for example, silicon nitride. The charge storage material layer 54L may be formed, for example, by chemical vapor deposition (CVD), atomic layer deposition (ALD), physical vapor deposition (PVD), or any suitable deposition technique for storing electrical charges therein. The thickness of the charge storage material layer 54L may be in a range from 2 nm to 20 nm, although lesser and greater thicknesses may also be used.

Referring to FIGS. 11A-11C, an anisotropic etch process may be performed to remove vertical portions of the charge storage material layer 54L that are not covered by the blocking dielectric layer 52. Portions of the charge storage material layer 54L located outside the two-dimensional arrays of lateral recesses are removed using the anisotropic etch process. Each remaining portion of the charge storage material layer 54L constitutes a discrete charge storage element 54. A two-dimensional array of discrete charge storage elements 54 may be formed on each lengthwise sidewall of the line trenches 49. Each two-dimensional array of discrete charge storage elements 54 may be formed within a respective two-dimensional array of lateral recesses into a vertical stack of second sacrificial material strips 142 within a respective alternating stack (132, 142). Each discrete charge storage element 54 may have a shape of a curved platelet that has a curvature in a horizontal cross-sectional view and a curvature in a vertical cross-sectional view. Each discrete charge storage element 54 may have a concave inner sidewall and a convex outer sidewall. Horizontal portions of the charge storage material layer 54L and the blocking dielectric layer 52 may be removed from the bottom of each line trench 49 during the anisotropic etch process.

Figure 12B:
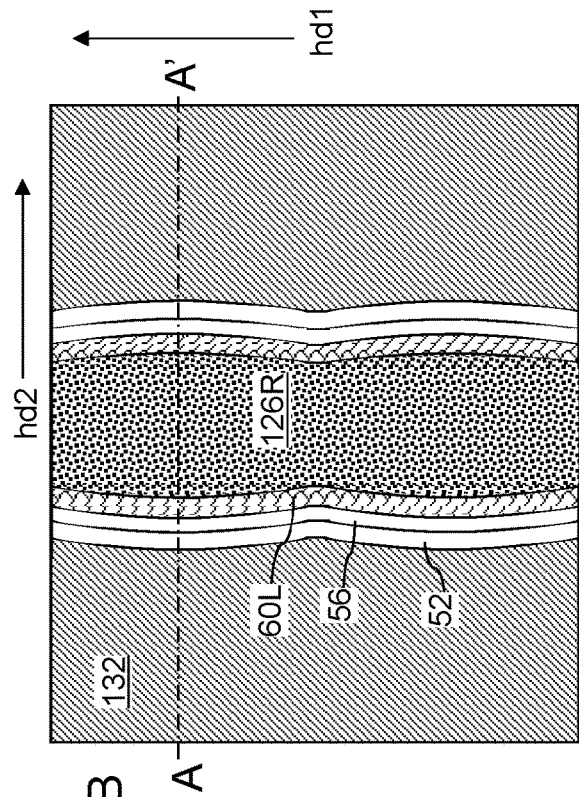
FIG. 12B is a horizontal cross-sectional view along the plane B-B' of the structure of FIG. 12A. The vertical plane A-A' corresponds to the plane of the vertical cross-sectional view of FIG. 12A.
Figure 12C:
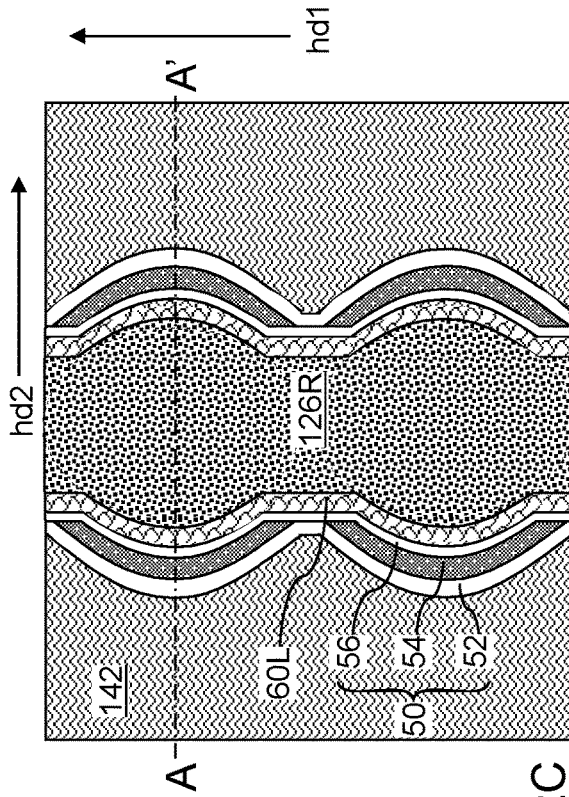
FIG. 12C is a horizontal cross-sectional view along the plane C-C' of the structure of FIG. 12A. The vertical plane A-A' corresponds to the plane of the vertical cross-sectional view of FIG. 12A.
Figure 12A:
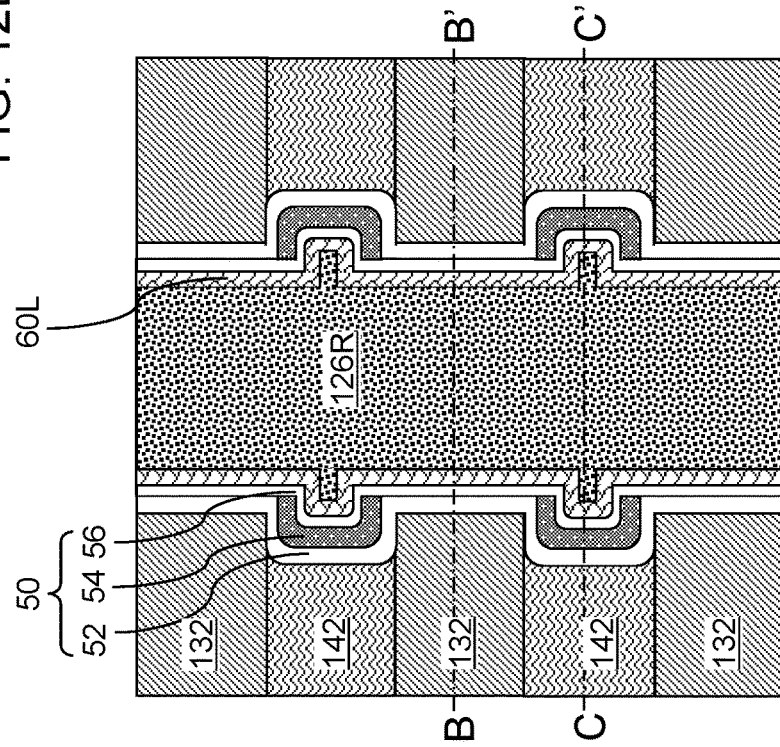
FIG. 12A is a vertical cross-sectional view of a portion of a line trench after formation of a tunneling dielectric layer, a semiconductor channel material layer, and second masking material rails according to the first embodiment of the present disclosure.

Referring to FIGS. 12A-12C, a tunneling dielectric layer 56 may be formed on the physically exposed surfaces of the blocking dielectric layer 52 and the discrete charge storage elements 54. The tunneling dielectric layer 56 includes a dielectric material through which charge tunneling may be performed under suitable electrical bias conditions. The charge tunneling may be performed by Fowler-Nordheim tunneling. The tunneling dielectric layer 56 may include silicon oxide, silicon nitride, silicon oxynitride, dielectric metal oxides (such as aluminum oxide or hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The set of the blocking dielectric layer 52, the discrete charge storage elements 54, and the tunneling dielectric layer 56 constitutes a memory film 50.

The tunneling dielectric layer 56 may be formed over each two-dimensional array of discrete charge storage elements located within a respective two-dimensional array of lateral recesses. Horizontal portions of the tunneling dielectric layer 56 may be removed from the bottom portion of each line trench 49 by an anisotropic etch process. A sacrificial cover material layer (not shown) may be used to protect the vertical portions of the tunneling dielectric layer 56 during the anisotropic etch process, and may be subsequently removed.

Subsequently, a semiconductor channel material layer 60L may be optionally formed on the memory film 50. The semiconductor channel material layer 60L may directly contact physically exposed top surfaces of the semiconductor material layer 10. The semiconductor channel material layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L includes amorphous silicon or polysilicon. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. In one embodiment, the semiconductor channel material layer 60L may have a doping of the first conductivity type, which is the same conductivity type as the conductivity type of the doping of the semiconductor material layer 10. In one embodiment, the semiconductor channel material layer 60L may comprise a semiconducting material including electrical dopants at an atomic concentration in a range from $1.0 \times 10^{14}/cm^3$ to $1.0 \times 10^{18}/cm^3$.

A masking material may be deposited in remaining volumes of the line trenches 49. Excess portions of the masking material may be removed from above a top surface of a horizontal portion of the semiconductor channel material layer 60L that overlies the alternating stacks (132, 142). Remaining portions of the masking material in the line trenches 49 constitute second masking material rails 126R. The second masking material rails 126R may have a laterally-modulating horizontal cross-sectional profile in horizontal cross-sectional views and a laterally-modulating vertical cross-sectional profile in vertical cross-sectional views that are perpendicular to the lengthwise direction of the second masking material rails 126R. In one embodiment, the second masking material rails 126R may include a carbon-based material. In one embodiment, the second masking material rails 126R may include spin-on-carbon that may be applied by spin coating and subsequently dried.

Figure 13B:
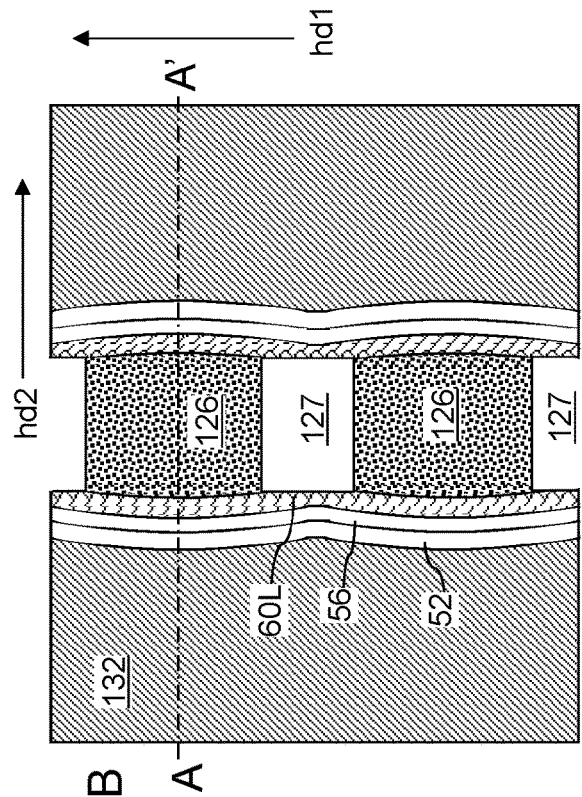
FIG. 13B is a horizontal cross-sectional view along the plane B-B' of the structure of FIG. 13A. The vertical plane A-A' corresponds to the plane of the vertical cross-sectional view of FIG. 13A.
Figure 13C:
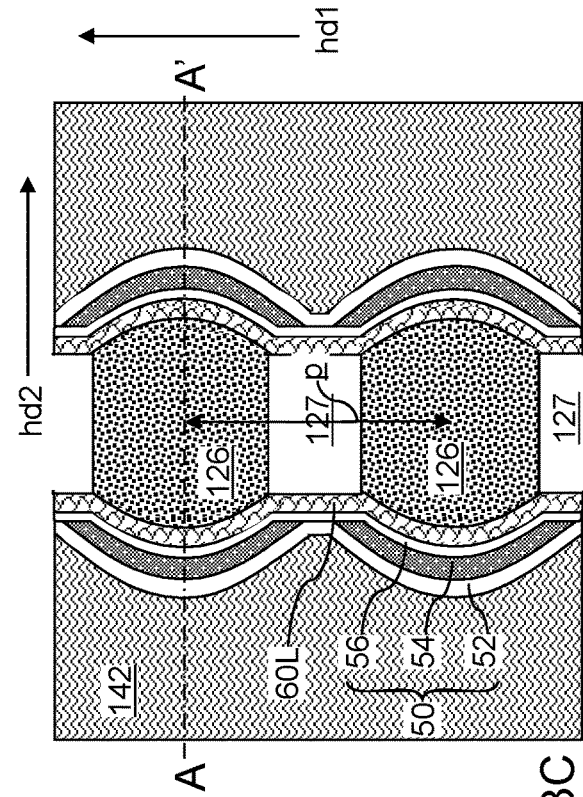
FIG. 13C is a horizontal cross-sectional view along the plane B-B' of the structure of FIG. 13A. The vertical plane A-A' corresponds to the plane of the vertical cross-sectional view of FIG. 13A.
Figure 13A:
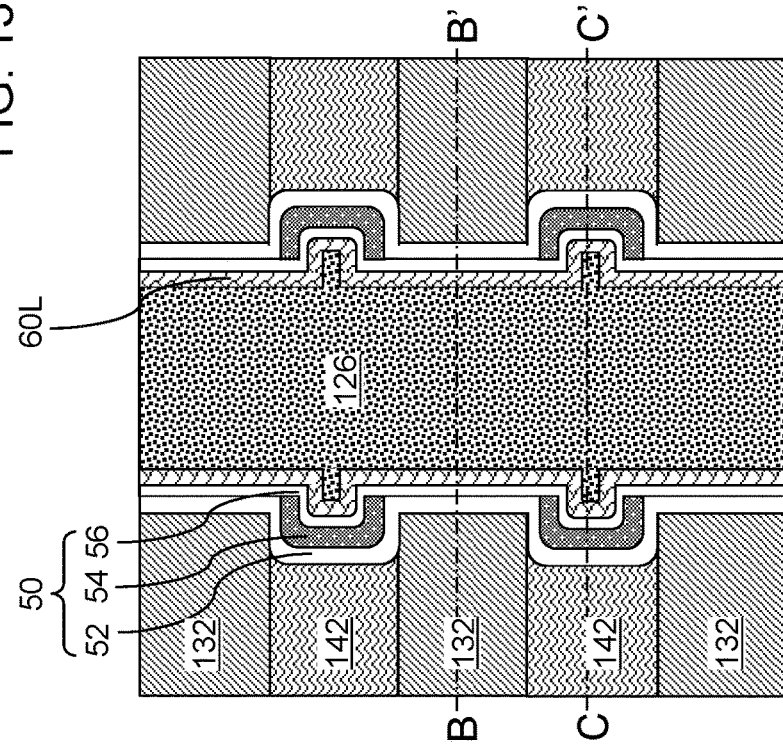
FIG. 13A is a vertical cross-sectional view of a portion of a line trench after formation of a two-dimensional array of masking material pillars according to the first embodiment of the present disclosure.

Referring to FIGS. 13A-13C, a photoresist layer (not shown) may be applied over the first exemplary structure and may be subsequently patterned to form an array of openings. In one embodiment, the array of openings in the photoresist layer may be a two-dimensional periodic array of discrete openings. In one embodiment, the two-dimensional periodic array of discrete openings may include rows of openings that overlie a respective one of the line trenches 49. The row-to-row pitch within the two-dimensional periodic array of discrete openings may be the same as the center-to-center pitch between the line trenches 49. Each row of openings may have a periodic one-dimensional array of openings with the regular pitch p, which is the lateral distance between center points of a two-dimensional array of lateral recesses within the second sacrificial material strips 142 in an alternating stack (132, 142). In one embodiment, the locations of the openings in the photoresist layer may be laterally offset from the locations of opening in the photoresist layer used at the processing steps of FIGS. 6A-6C by one half of the regular pitch p.

An anisotropic etch process that etches the material of the second masking material rails 124R selective to the materials of the alternating stacks (132, 142), the memory film 50, and the semiconductor channel material layer 60L may be performed to transfer the pattern of the openings in the photoresist layer through the second masking material rails 126R. Each remaining portion of the second masking material rails 126R may have a rectangular pillar shape, and is herein referred to as a second masking material pillar 126. A two-dimensional array of second masking material pillars 126 may be formed. Neighboring pairs of second masking material pillars 126 in a line trench 49 are laterally spaced apart by a second pillar-shaped cavity 127. Each second pillar-shaped cavity 127 may have a rectangular horizontal cross-sectional shape. A row of second masking material pillars 126 is formed within each line trenches 49. Each row of second masking material pillars 126 may be interlaced with a row of second pillar-shaped cavities 127 within a respective line trench 49. The second masking material pillars 126 may be formed in areas in which a pair of concave sidewalls of two second sacrificial material rails 142 facing a same line trench 49 is laterally spaced apart by a maximum lateral spacing. The second pillar-shaped cavities 127 may be formed in gap areas between neighboring pairs of discrete charge storage elements 54.

Figure 14B:
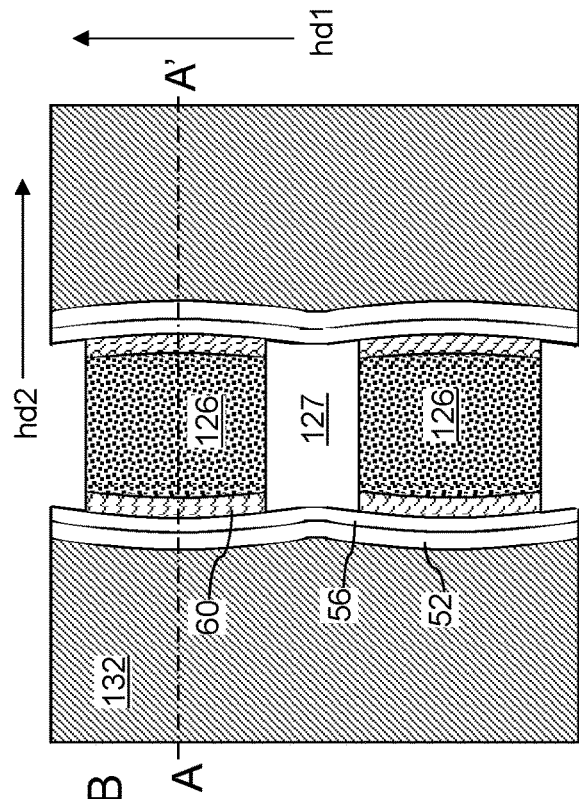
FIG. 14B is a horizontal cross-sectional view along the plane B-B' of the structure of FIG. 14A. The vertical plane A-A' corresponds to the plane of the vertical cross-sectional view of FIG. 14A.
Figure 14C:
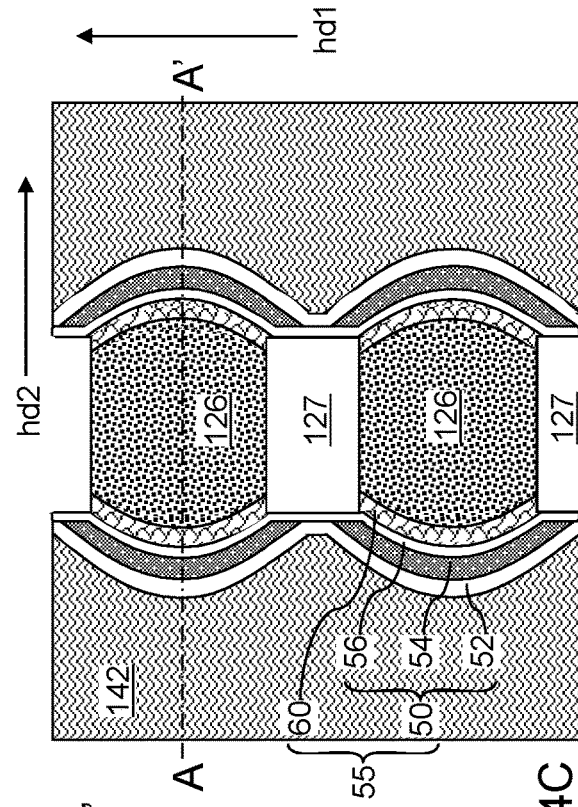
FIG. 14C is a horizontal cross-sectional view along the plane B-B' of the structure of FIG. 14A. The vertical plane A-A' corresponds to the plane of the vertical cross-sectional view of FIG. 14A.
Figure 14A:
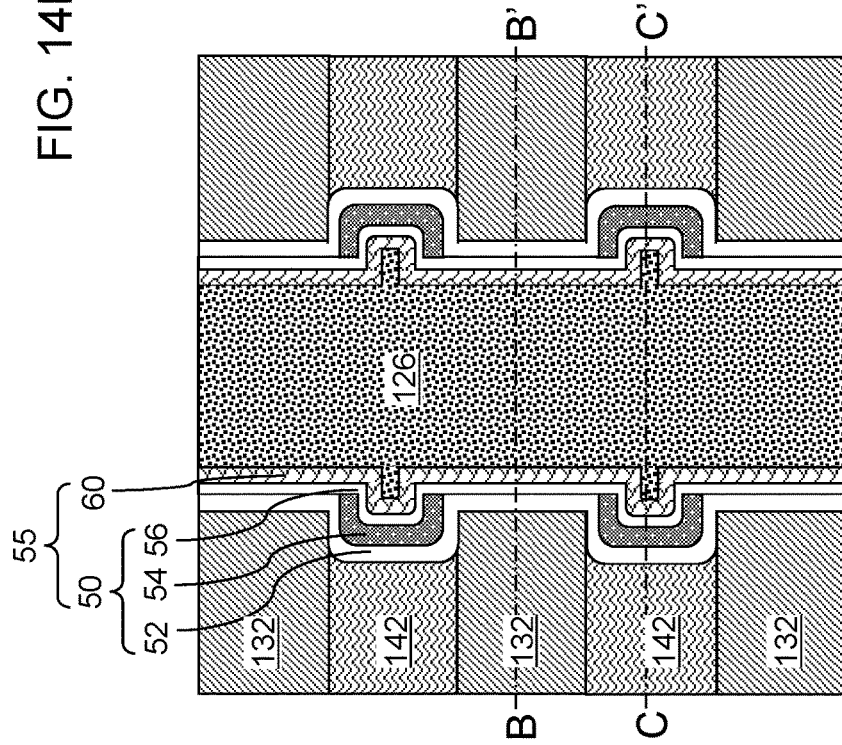
FIG. 14A is a vertical cross-sectional view of a portion of a line trench after dividing the semiconductor channel material layer into vertical semiconductor channels according to the first embodiment of the present disclosure.

Referring to FIGS. 14A-14C, an isotropic etch process may be performed to etch physically exposed portions of the semiconductor channel material layer 60L around each second pillar-shaped cavity 127. For example, a wet etch process using tetramethyl ammonium hydroxide (TMAH) may be performed to etch the semiconductor materials of the semiconductor channel material layer 60L. Each remaining portion of the semiconductor channel material layer 60L covered by the second masking material pillar 126 constitutes a vertical semiconductor channel 60. Each combination of a vertical semiconductor channel 60 and an adjacent portion of the memory film 50 constitutes a memory stack structure 55. Each memory stack structure 55 include a vertical stack of memory elements embodied as a vertical stack of discrete charge storage elements 54. A row of vertical semiconductor channels 60 is formed over each tunneling dielectric layer 56. Each vertical semiconductor channel 60 within the two rows of vertical semiconductor channels 60 laterally overlie a respective vertical stack of discrete charge storage elements 54.

Figure 15B:
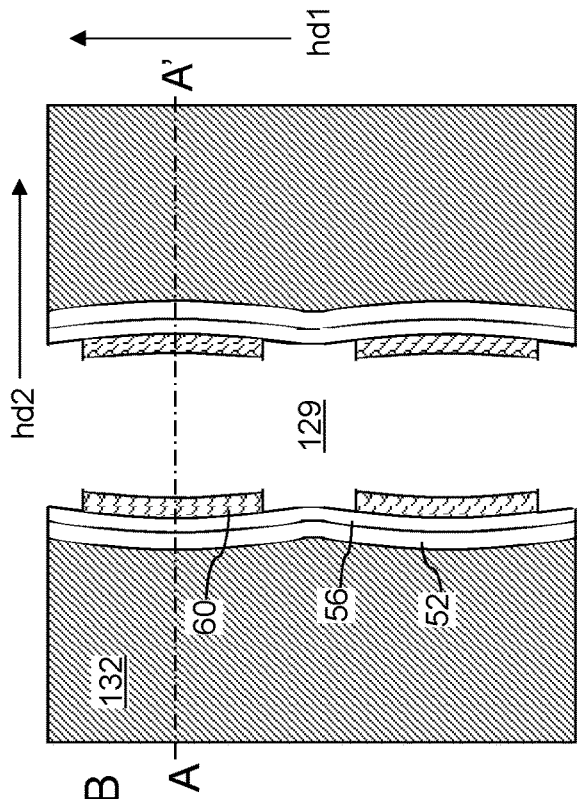
FIG. 15B is a horizontal cross-sectional view along the plane B-B' of the structure of FIG. 15A. The vertical plane A-A' corresponds to the plane of the vertical cross-sectional view of FIG. 15A.
Figure 15C:
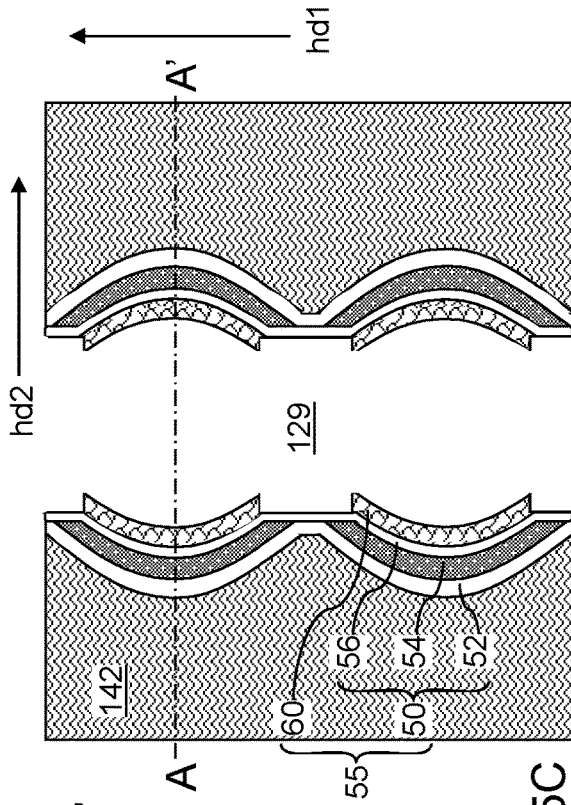
FIG. 15C is a horizontal cross-sectional view along the plane B-B' of the structure of FIG. 15A. The vertical plane A-A' corresponds to the plane of the vertical cross-sectional view of FIG. 15A.
Figure 15A:
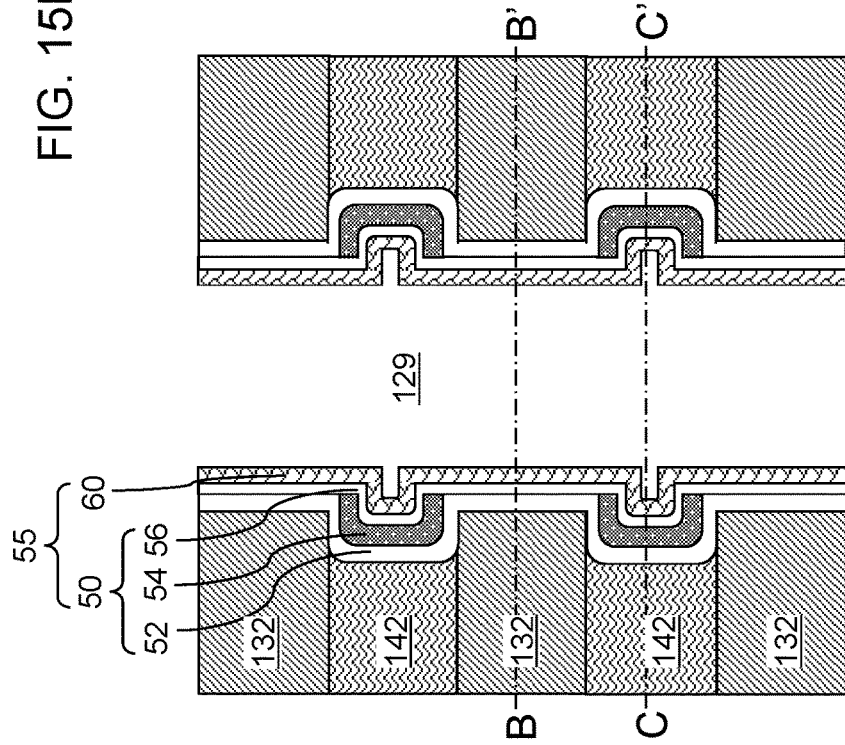
FIG. 15A is a vertical cross-sectional view of a portion of a line trench after removal of the two-dimensional array of masking material pillars according to the first embodiment of the present disclosure.
Figure 16B:
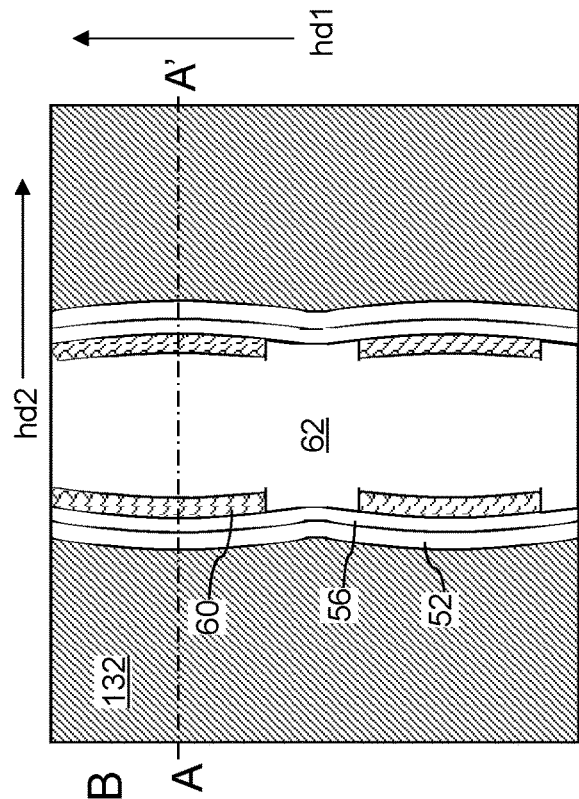
FIG. 16B is a horizontal cross-sectional view along the plane B-B' of the structure of FIG. 16A. The vertical plane A-A' corresponds to the plane of the vertical cross-sectional view of FIG. 16A.
Figure 16C:
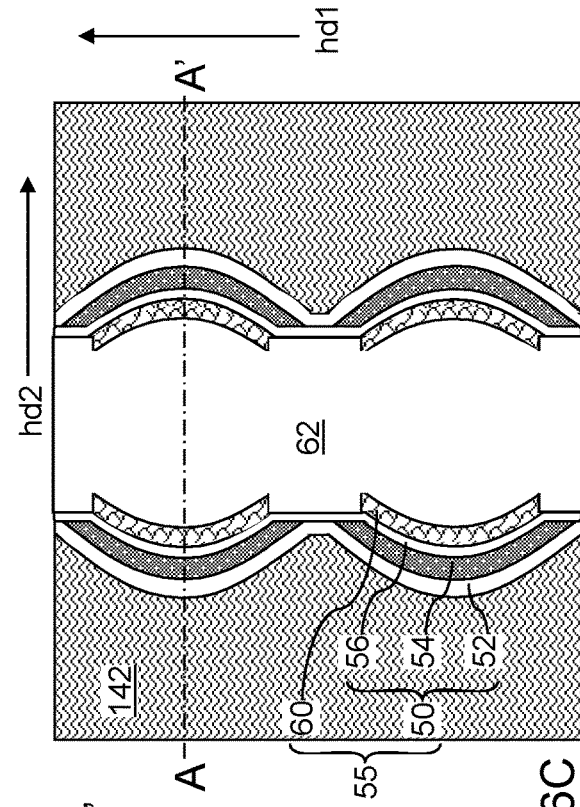
FIG. 16C is a horizontal cross-sectional view along the plane B-B' of the structure of FIG. 16A. The vertical plane A-A' corresponds to the plane of the vertical cross-sectional view of FIG. 16A.
Figure 16A:
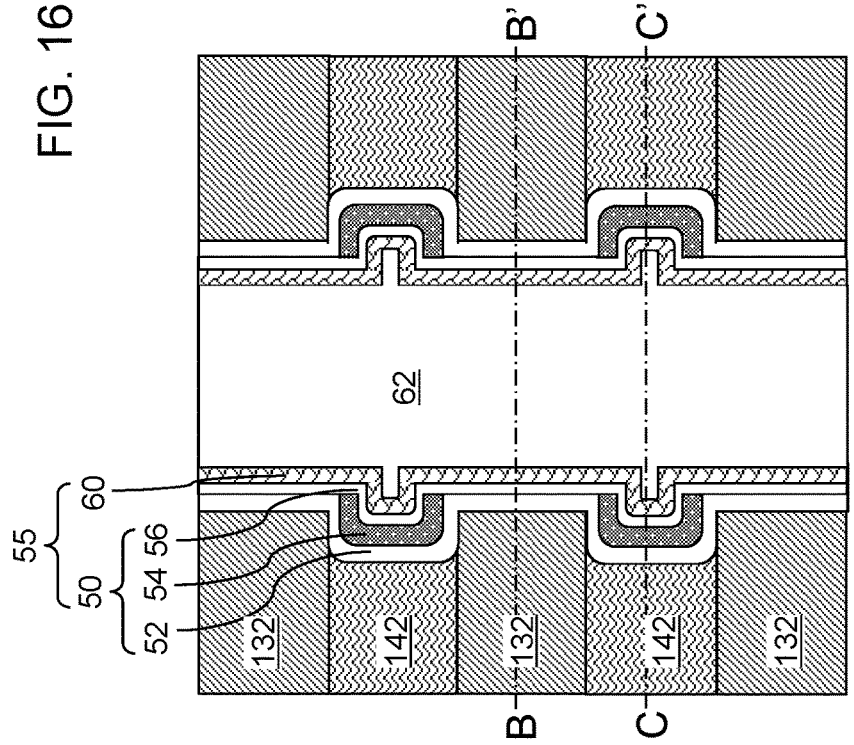
FIG. 16A is a vertical cross-sectional view of a portion of a line trench after formation of dielectric cores according to the first embodiment of the present disclosure.
Figure 17A:
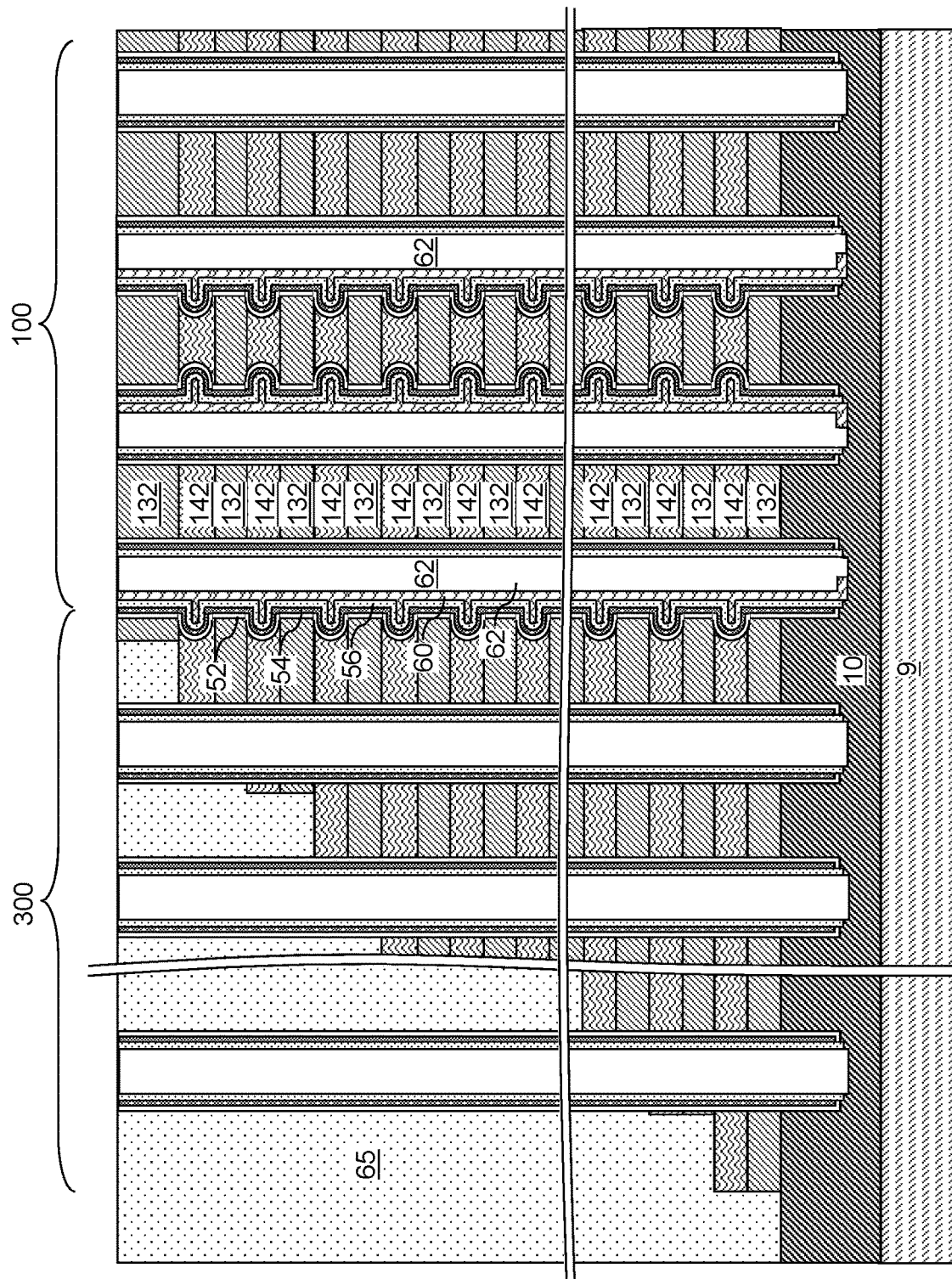
FIG. 17A is a vertical cross-sectional view of the first exemplary structure after the processing steps of FIGS. 16A-16C.
Figure 17B:
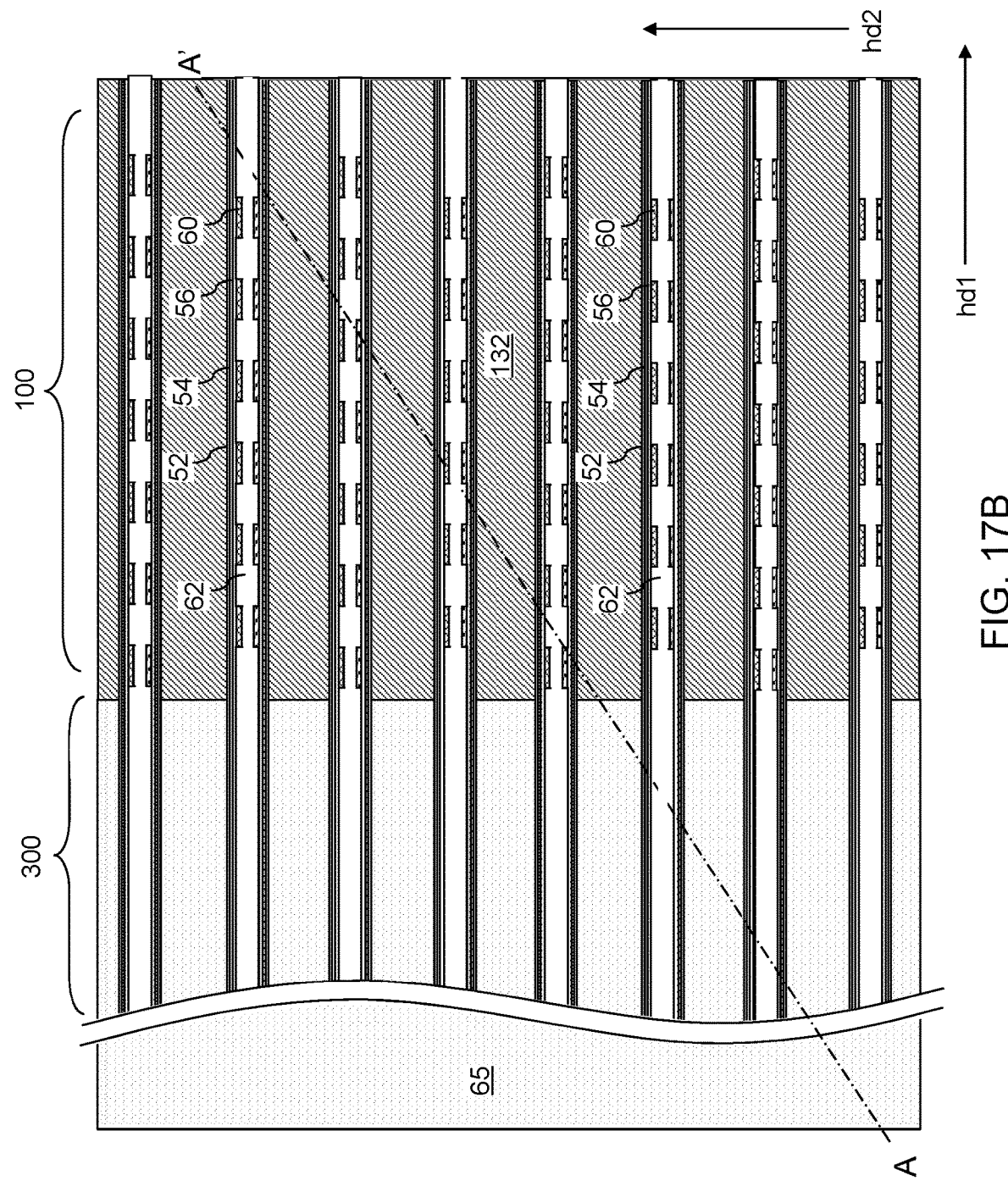
FIG. 17B is a top-down view of the first exemplary structure of FIG. 13A. The vertical plane A-A' is the plane of the cross-section for FIG. 13A.

Referring to FIGS. 15A-15C, the second masking material pillar 126 may be removed selective to the vertical semiconductor channels 60 and the memory film 50. For example, the second masking material pillars 126 may be removed by ashing. A line cavity 129 may be formed within each unfilled volume of the line trenches 49.

Referring to FIGS. 16A-16C, 17A, and 17B, a dielectric material such as undoped silicate glass or a doped silicate glass may be deposited in the remaining volumes of the line trenches 49. Excess portions of the dielectric material located above the horizontal plane including the topmost first sacrificial material strips 132 may be removed by a planarization process such as a recess etch or chemical mechanical planarization. Each remaining portion of the dielectric material constitutes a dielectric core 62. In one embodiment, each dielectric core 62 contacts two rows of vertical semiconductor channels 60 and two tunneling dielectric layers 56.

Figure 18A:
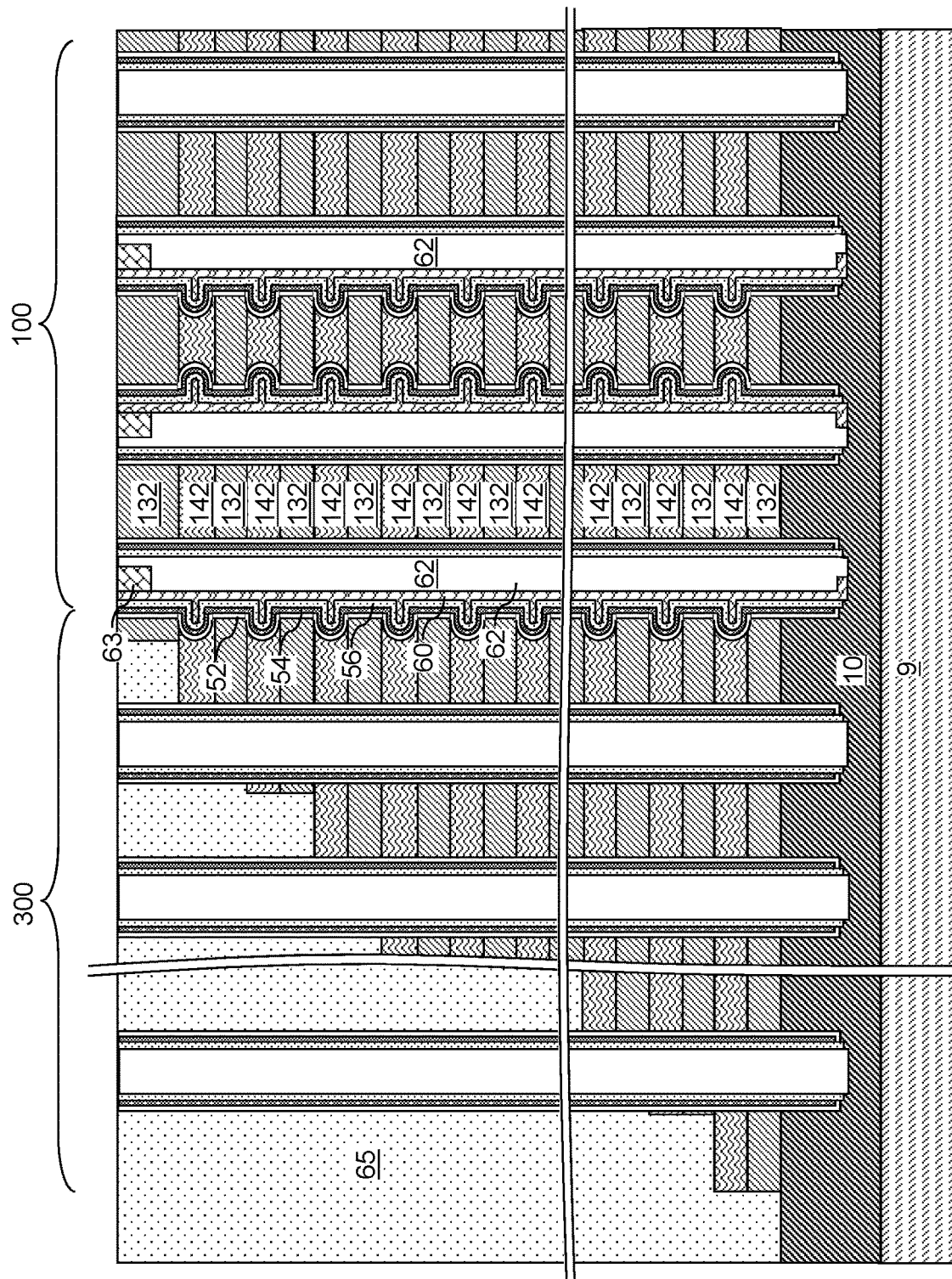
FIG. 18A is a vertical cross-sectional view of the first exemplary structure after formation of drain regions according to the first embodiment of the present disclosure.
Figure 18B:
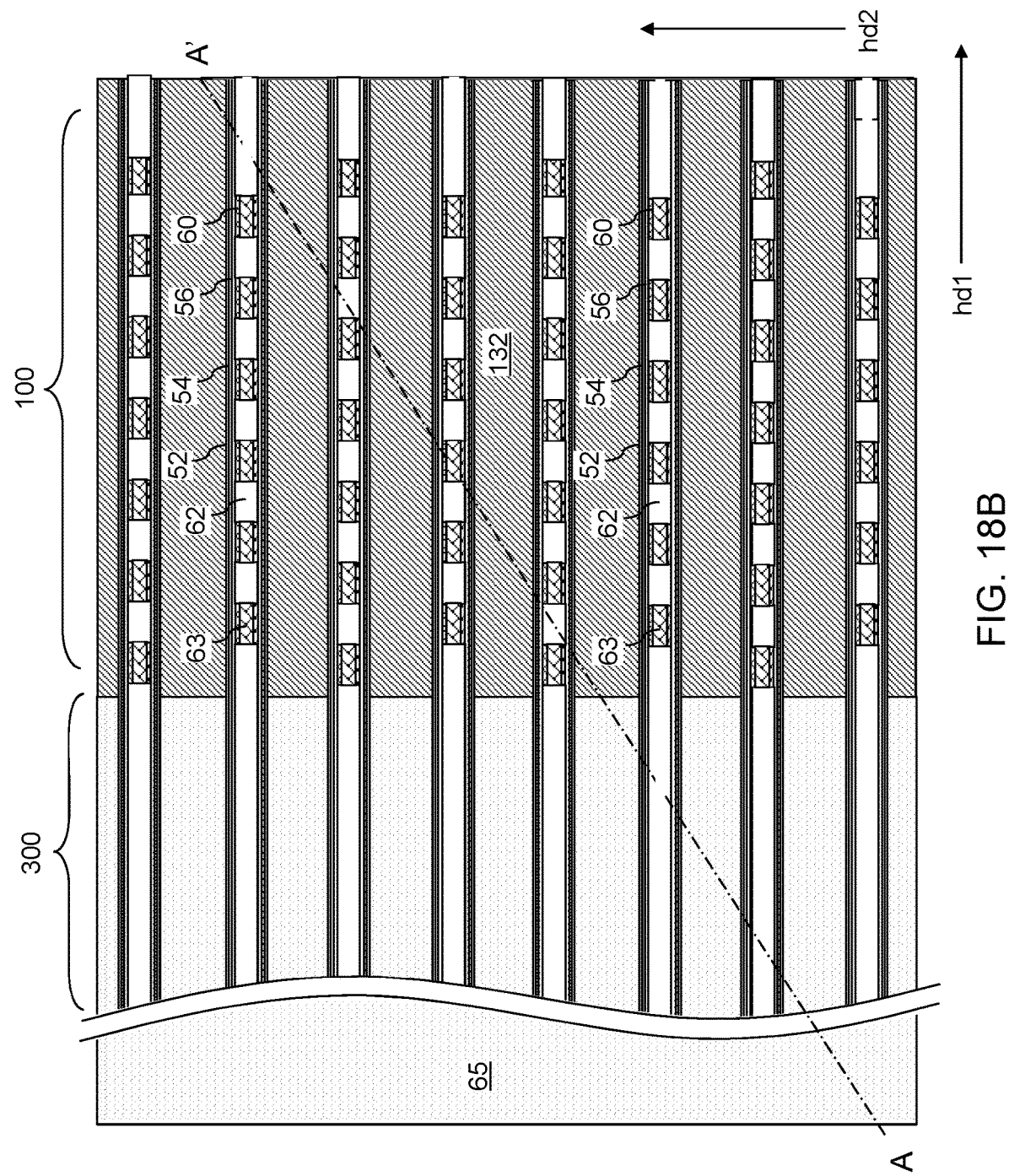
FIG. 18B is a top-down view of the first exemplary structure of FIG. 18A. The vertical plane A-A' is the plane of the cross-section for FIG. 18A.

Referring to FIGS. 18A-18B, an upper end of each dielectric core 62 may be vertically recessed, for example, by application and patterning of a photoresist layer over the first exemplary structure to form openings that overlie the dielectric cores 62, and by performing an etch process, which may be an anisotropic etch process or an isotropic etch process. The photoresist layer may be removed, and a doped semiconductor material having a doping of a second conductivity type may be deposited in the recesses to form drain regions 63. The second conductivity type may be the opposite of the first conductivity type, and the atomic concentration of dopants of the second conductivity type in the drain regions 63 may be in a range from $5.0 \times 10^{19}/cm^3$ to $2.0 \times 10^{21}/cm^3$, although lesser and greater atomic concentrations may also be used.

Figure 19A:
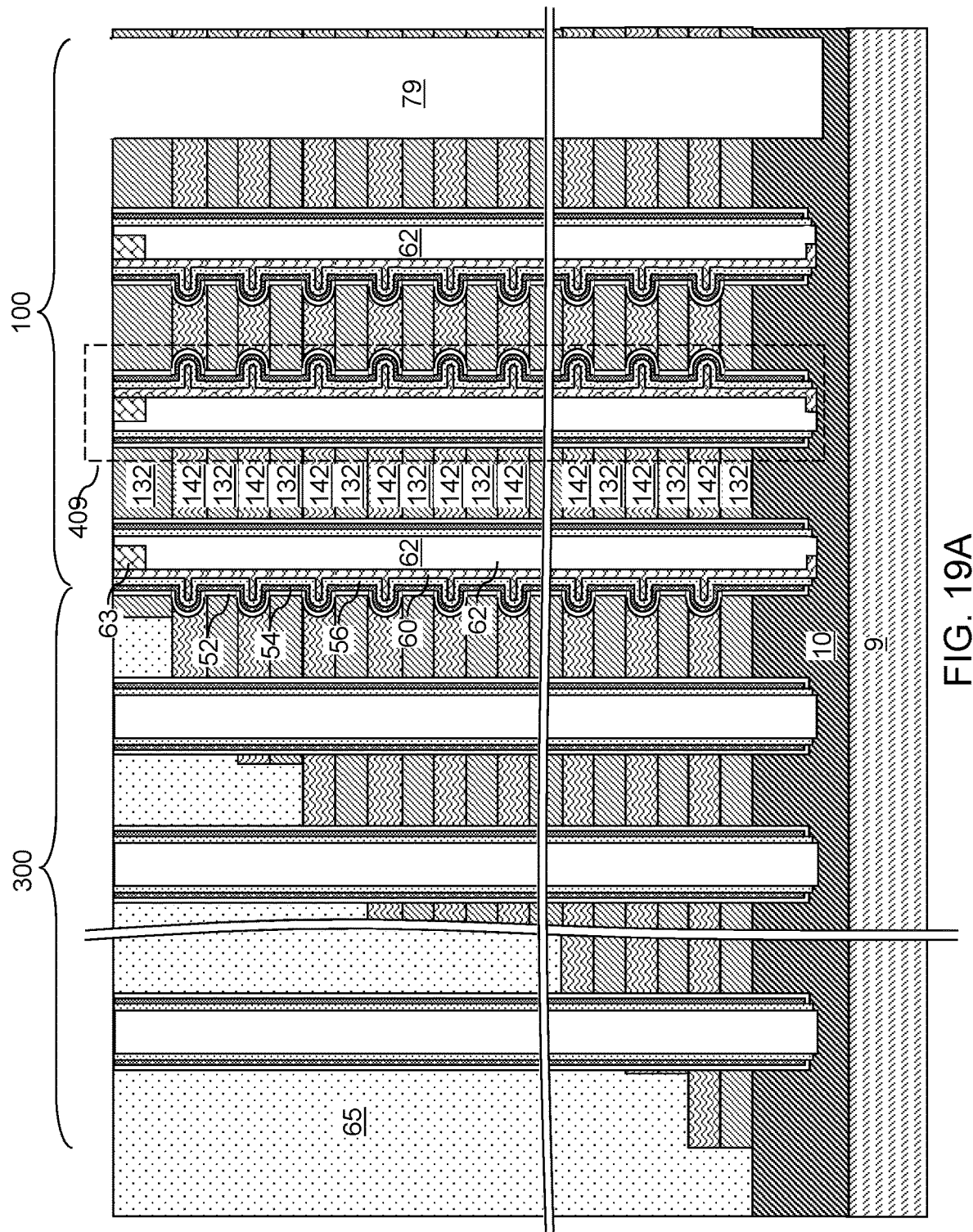
FIG. 19A is a vertical cross-sectional view of the first exemplary structure after formation of backside via cavities according to the first embodiment of the present disclosure.
Figure 19B:
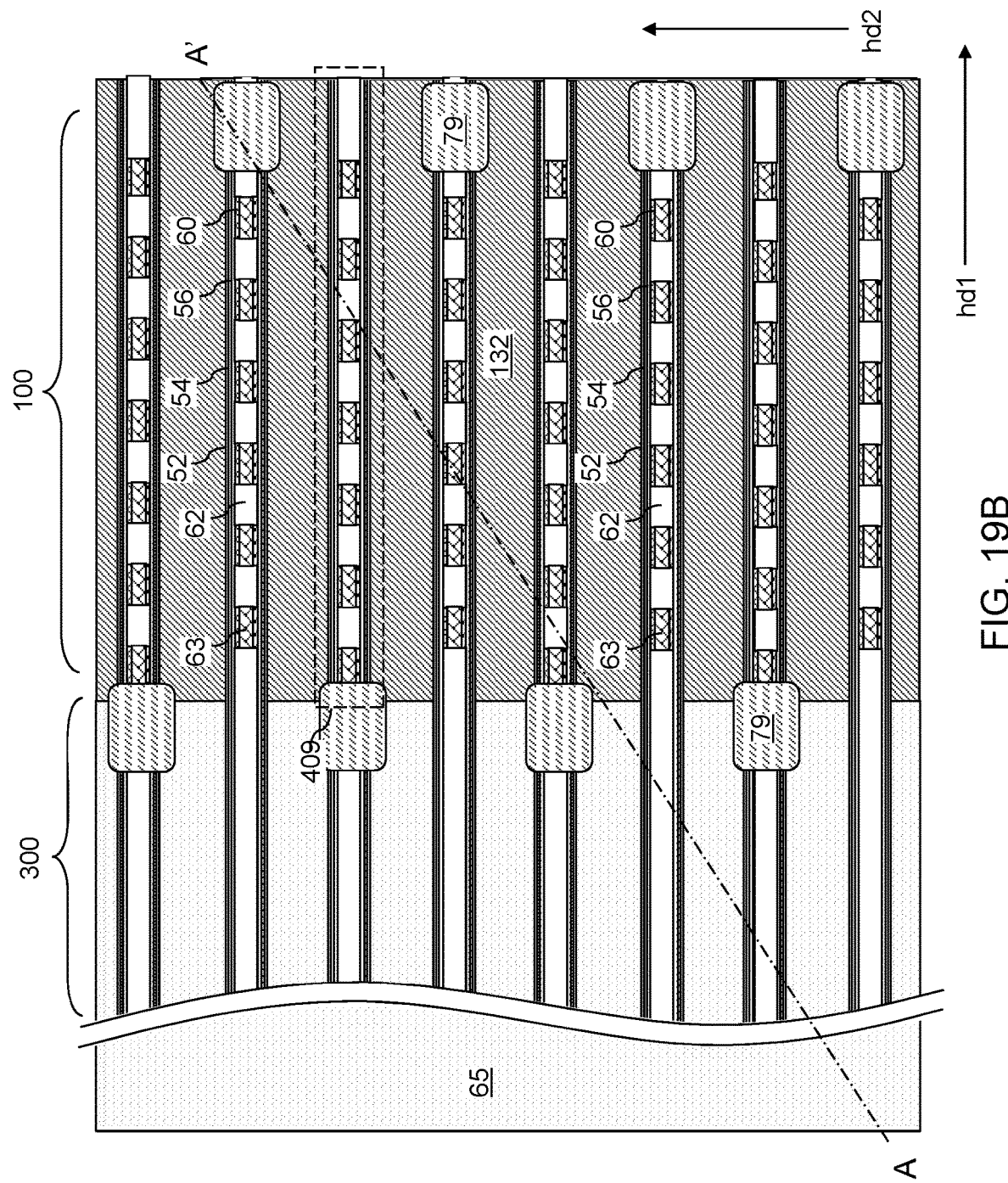
FIG. 19B is a top-down view of the first exemplary structure of FIG. 19A. The vertical plane A-A' is the plane of the cross-section for FIG. 19A.

Referring to FIGS. 19A and 19B, backside via cavities 79 may be formed through isolated regions of the dielectric cores 62 such that remaining material portions within each line trench 49 includes at least one memory stack assembly 409. Each memory stack assembly 409 includes two rows of vertical semiconductor channels 60 connected to a row of drain regions 63. The locations of the backside via cavities 79 may be selected such that each second sacrificial material strip 142 contacts at least one of the backside via cavities 79. Further, the locations of the backside via cavities 79 may be selected such that each point within the second sacrificial material strip 142 is laterally spaced from a most proximal one of the backside via cavities 79 by a lateral distance that does not exceed a lateral etch distance during a subsequent isotropic etch process.

The memory stack assemblies 409 are formed in each volume that includes a combination of a volume of a line trench 49 as originally formed and volumes of two adjoining two-dimensional arrays of lateral recesses formed over sidewalls of second sacrificial material strips 142. Each of the memory stack assemblies 409 comprises two two-dimensional arrays of lateral protrusion regions, and each of the lateral protrusion regions comprises a respective charge storage element, i.e., a discrete charge storage element 54. Each of the memory stack assemblies 409 comprises two rows of vertical semiconductor channels 60.

Figure 20:
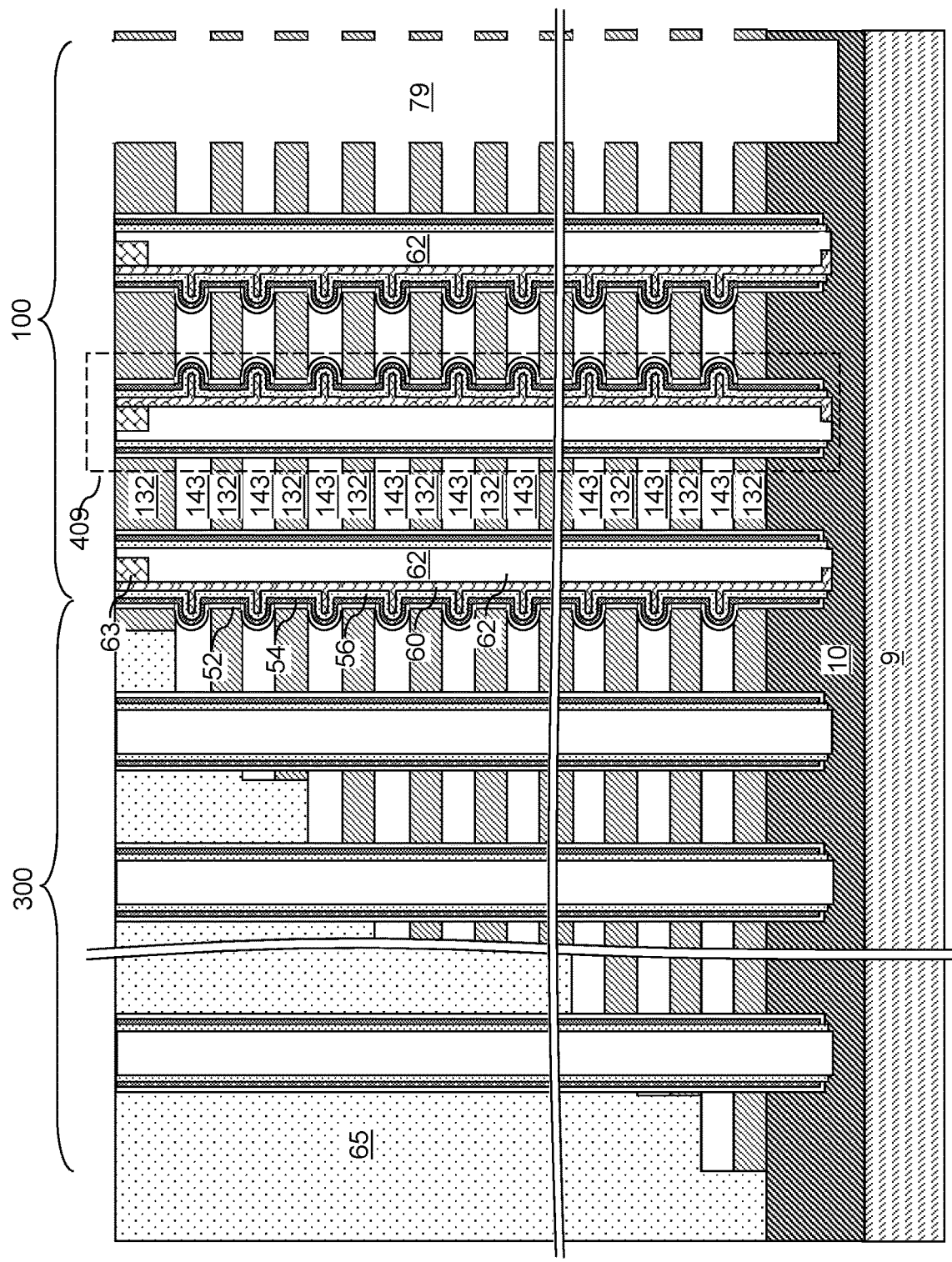
FIG. 20 is a schematic vertical cross-sectional view of the first exemplary structure after formation of backside recesses according to the first embodiment of the present disclosure.
Figure 21:
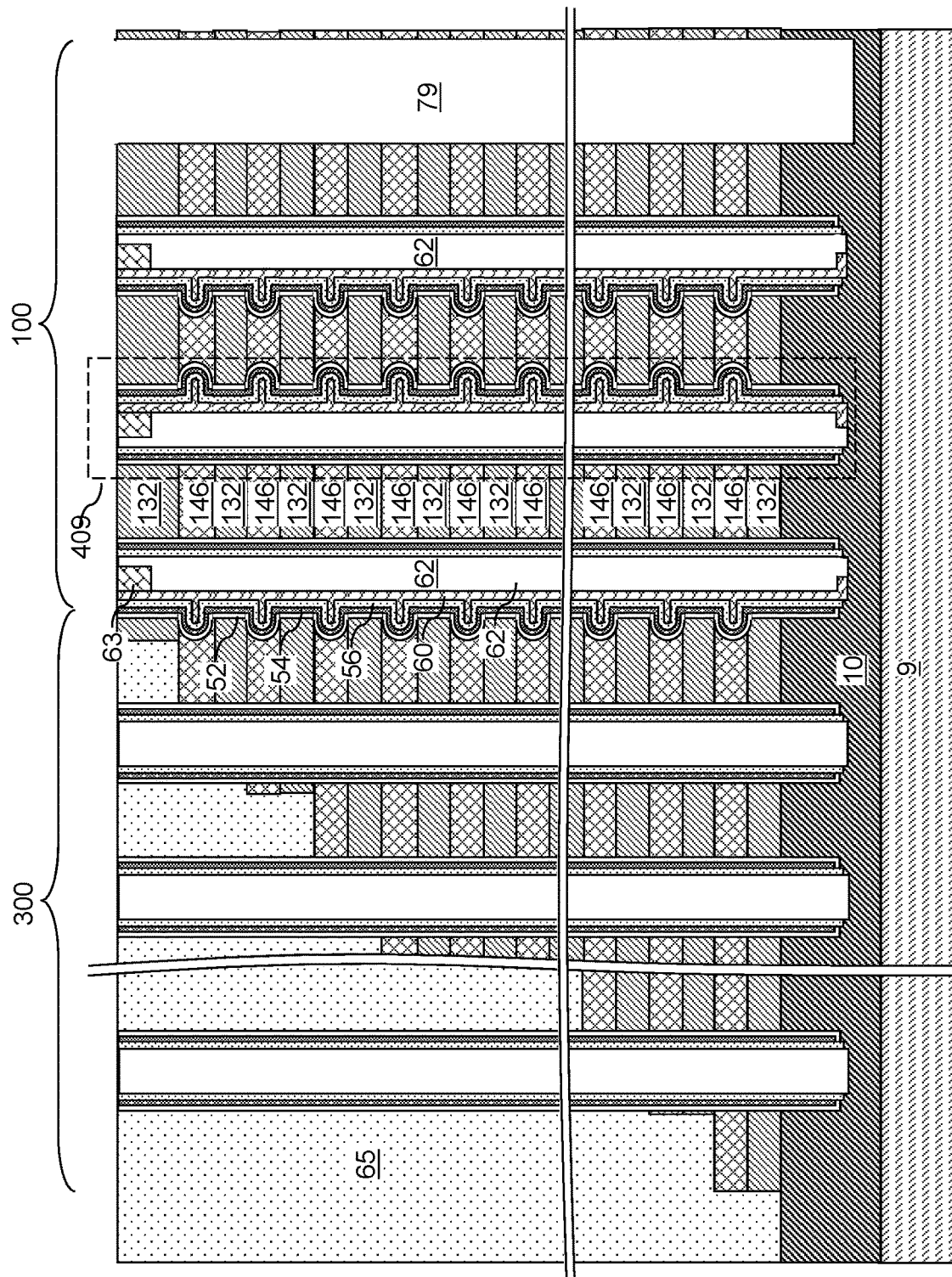
FIG. 21 is a schematic vertical cross-sectional view of the first exemplary structure after formation of electrically conductive strips in the backside recesses according to the first embodiment of the present disclosure.
Figure 22B:
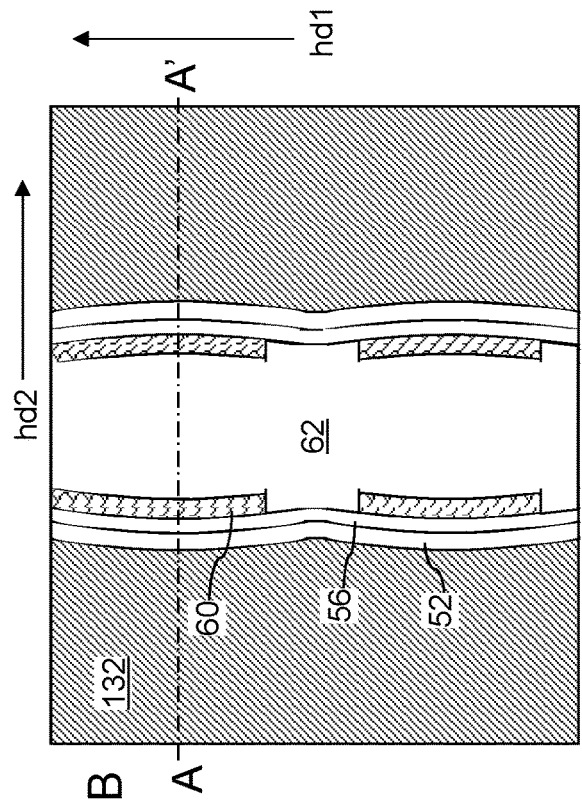
FIG. 22B is a horizontal cross-sectional view along the plane B-B' of the structure of FIG. 22A. The vertical plane A-A' corresponds to the plane of the vertical cross-sectional view of FIG. 22A.
Figure 22C:
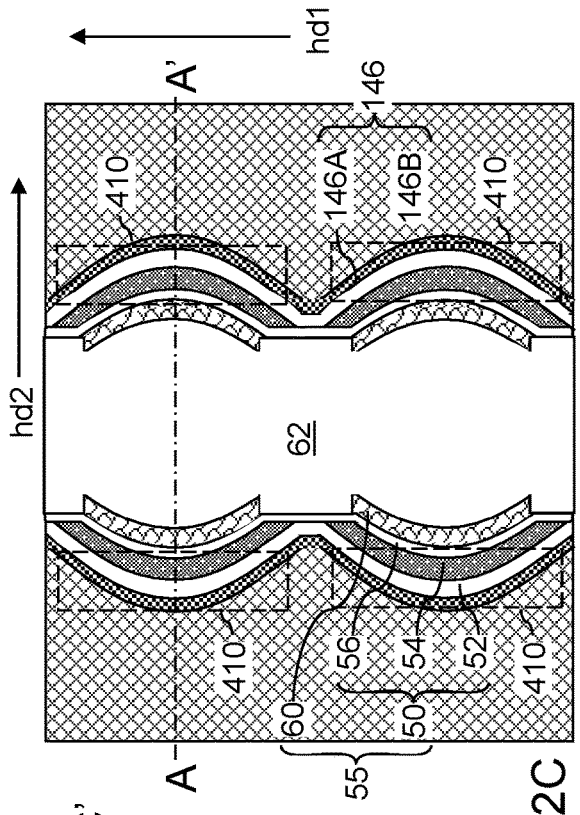
FIG. 22C is a horizontal cross-sectional view along the plane B-B' of the structure of FIG. 22A. The vertical plane A-A' corresponds to the plane of the vertical cross-sectional view of FIG. 22A.
Figure 22A:
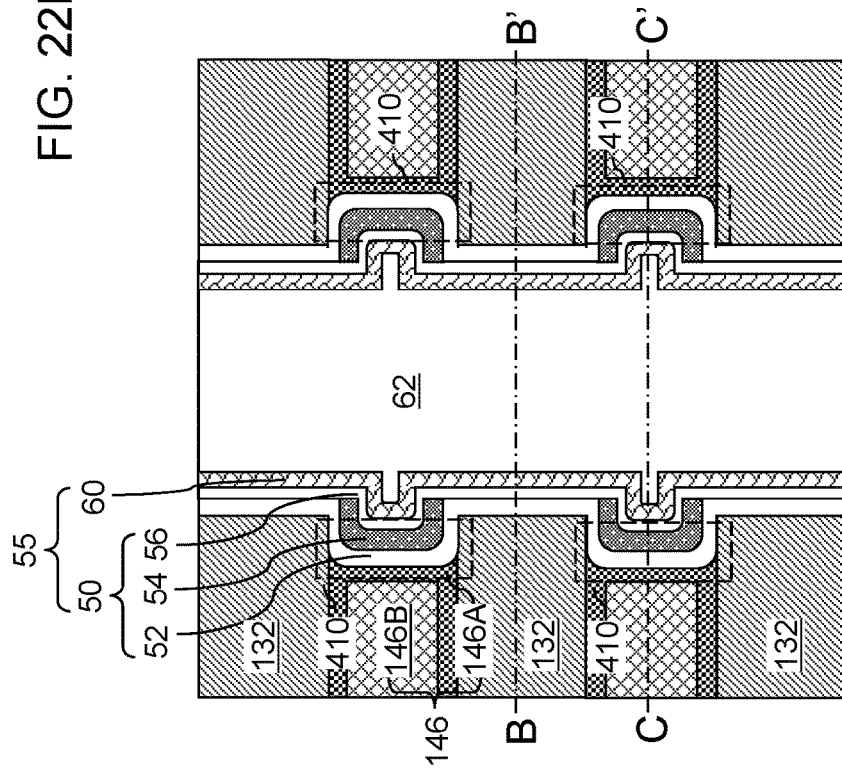
FIG. 22A is a vertical cross-sectional view of a portion of a line trench after the processing steps of FIG. 21.
Figure 23:
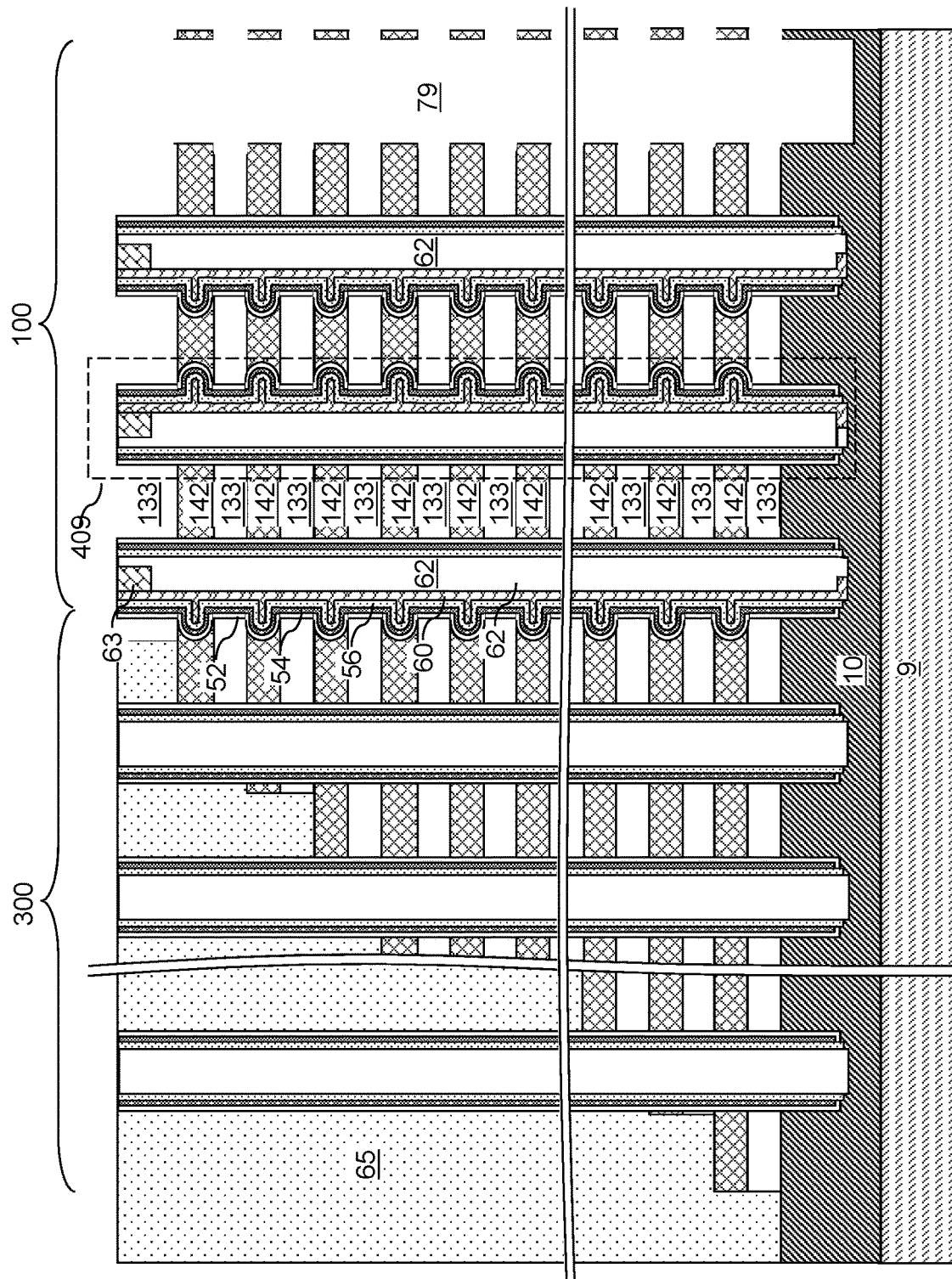
FIG. 23 is a schematic vertical cross-sectional view of the first exemplary structure after removal of the first sacrificial material strips and formation of air gap strips according to the first embodiment of the present disclosure.
Figures 24A, 24B, 24C:
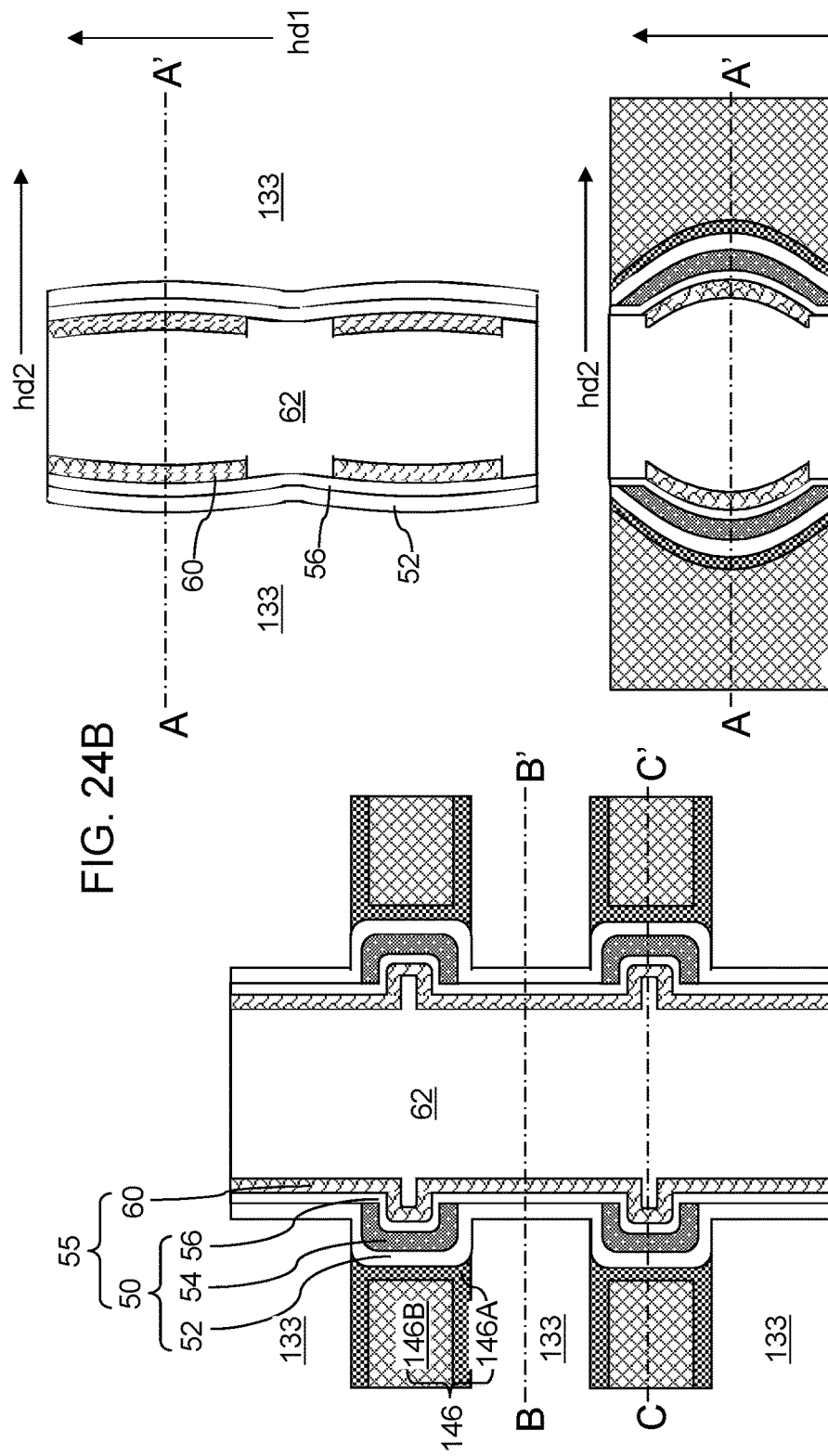
FIG. 24A is a vertical cross-sectional view of a portion of a line trench after the processing steps of FIG. 23.
FIG. 24B is a horizontal cross-sectional view along the plane B-B' of the structure of FIG. 24A. The vertical plane A-A' corresponds to the plane of the vertical cross-sectional view of FIG. 24A.
FIG. 24C is a horizontal cross-sectional view along the plane B-B' of the structure of FIG. 24A. The vertical plane A-A' corresponds to the plane of the vertical cross-sectional view of FIG. 24A.

Referring to FIG. 20, an etchant that selectively etches the material of the second sacrificial material strips 142 with respect to the material of the first sacrificial material strips 132, the blocking dielectric layers 52, and the dielectric cores 62 may be introduced into the backside via cavities 79, for example, using an isotropic etch process. Backside recesses 143 may be formed in volumes from which the second sacrificial material strips 142 are removed. In one embodiment, the second sacrificial material strips 142 may include a silicon-germanium alloy, and the materials of the first sacrificial material strips 132 may include silicon. In this case, the isotropic etch process may include a wet etch process using a combination of phosphoric acid and hydrogen peroxide.

The duration of the isotropic etch process may be selected such that the second sacrificial material strips 142 are completely removed from each alternating stack (132, 142) of first sacrificial material strips 132 and second sacrificial material strips 142. Each backside recess 143 may be a laterally extending cavity having a lateral dimension that is greater than the vertical extent of the cavity. In other words, the lateral dimension of each backside recess 143 may be greater than the height of the backside recess 143.

In one embodiment, the memory array region 100 comprises an array of three-dimensional NAND strings having a plurality of device levels disposed above the substrate (9, 10). In this case, each backside recess 143 may define a space for receiving a respective word line of the array of monolithic three-dimensional NAND strings. Each of the plurality of backside recesses 143 may extend substantially parallel to the top surface of the substrate (9, 10). A backside recess 143 may be vertically bounded by a top surface of an underlying first sacrificial material strip 132 and a bottom surface of an overlying first sacrificial material strip 132. In one embodiment, each backside recess 143 may have a uniform height throughout. The memory stack assemblies 409 provide structural support to the first exemplary structure during formation of the backside recesses 143.

Referring to FIGS. 21 and 22A-22C, a backside blocking dielectric layer (not shown) may be optionally formed in the backside recesses 143 by a conformal deposition process. For example, the backside blocking dielectric layer may include a dielectric metal oxide such as aluminum oxide. The conformal deposition process may include, for example, an atomic layer deposition (ALD) process. The thickness of the backside blocking dielectric layer may be in a range from 1 nm to 6 nm, although lesser and greater thicknesses may also be used.

At least one conductive material may be deposited in remaining volumes of the backside recesses 143. For example, a metallic barrier layer 146A may be deposited in the backside recesses 143 directly on the physically exposed surfaces of the backside blocking dielectric layer, or on the physically exposed surfaces of the blocking dielectrics 52 and the first sacrificial material strips 132 in case a backside blocking dielectric layer is not used. The metallic barrier layer 146A includes an electrically conductive metallic material that may function as a diffusion barrier layer and/or adhesion promotion layer for a metallic fill material to be subsequently deposited. The metallic barrier layer 146A may include a conductive metallic nitride material such as TiN, TaN, WN, or a stack thereof, or may include a conductive metallic carbide material such as TiC, TaC, WC, or a stack thereof. In one embodiment, the metallic barrier layer 146A may be deposited by a conformal deposition process such as chemical vapor deposition (CVD) or atomic layer deposition (ALD). The thickness of the metallic barrier layer 146A may be in a range from 2 nm to 8 nm, such as from 3 nm to 6 nm, although lesser and greater thicknesses may also be used. In one embodiment, the metallic barrier layer 146A may consist essentially of a conductive metal nitride such as TiN.

A metallic fill material 146B is deposited in remaining volumes of backside recesses 143, on the sidewalls of the at least one the backside via cavity 79, and over the topmost first sacrificial material strips 132. The metallic fill material 146B may be deposited by a conformal deposition method, which may be, for example, chemical vapor deposition (CVD), atomic layer deposition (ALD), electroless plating, electroplating, or a combination thereof. In one embodiment, the metallic fill material 146B may consist essentially of at least one elemental metal. The at least one elemental metal of the metallic fill material 146B may be selected, for example, from tungsten, cobalt, ruthenium, molybdenum titanium, and tantalum. In one embodiment, the metallic fill material 146B may consist essentially of a single elemental metal. In one embodiment, the metallic fill material 146B may be deposited using a fluorine-containing precursor gas such as $WF_6$. In one embodiment, the metallic fill material 146B may include tungsten including a residual level of boron, fluorine or silicon atoms as impurities.

A plurality of electrically conductive strips 146 (i.e., electrically conductive strips having strip shapes) may be formed in the plurality of backside recesses 143, and a continuous metallic material layer may be formed on the sidewalls of each backside via cavity 79 and over the topmost first sacrificial material strips 132. Each electrically conductive strip 146 includes a portion of the metallic barrier layer 146A and a metallic fill material 146B that are located between a vertically neighboring pair of first sacrificial material strips 132.

The deposited metallic material of the continuous electrically conductive material layer may be etched back from the sidewalls of each backside via cavity 79 and from above the topmost first sacrificial material strips 132, for example, by an isotropic wet etch, an anisotropic dry etch, or a combination thereof. Each remaining portion of the deposited metallic material in the backside recesses 143 constitutes an electrically conductive strip 146. Each electrically conductive strip 146 may be a conductive line structure. Thus, the second sacrificial material strips 142 may be replaced with the electrically conductive strips 146.

Each electrically conductive strip 146 may function as a combination of a plurality of control gate electrodes located at a same level and a word line electrically interconnecting, i.e., electrically shorting, the plurality of control gate electrodes located at the same level. The plurality of control gate electrodes within each electrically conductive strip 146 are the control gate electrodes for the NAND strings in the line trenches 49. In other words, each electrically conductive strip 146 may be a word line that functions as a common control gate electrode for the plurality of vertical memory devices. Each vertical semiconductor channel 60 has a laterally-undulating vertical cross-sectional profile, and includes a vertical stack of lateral bump portions located at levels of the electrically conductive strips 146 located within the lateral recesses into concave surfaces of the electrically conductive strips 146. A two-dimensional array of lateral protrusion regions 410 is provided on each lengthwise sidewall of the line trenches 49.

Referring to FIGS. 23 and 24A-24C, the first sacrificial material strips 132 may be removed selective to the electrically conductive strips 146, the semiconductor material layer 10, and the outermost layer of the memory films 50, i.e., the blocking dielectric layers 52. Cavities free of solid materials may be formed in volumes from which the first sacrificial material strips 132 are removed. Each of the cavities have a shape of a strip, and is herein referred to as an air gap strip 133. As used herein, an "air gap" element refers to any element that is free of any solid material therein. An air gap strip may be under vacuum, or may be filled with at least one gaseous phase material, which may be an inert backfill gas or dry air.

Figure 25A:
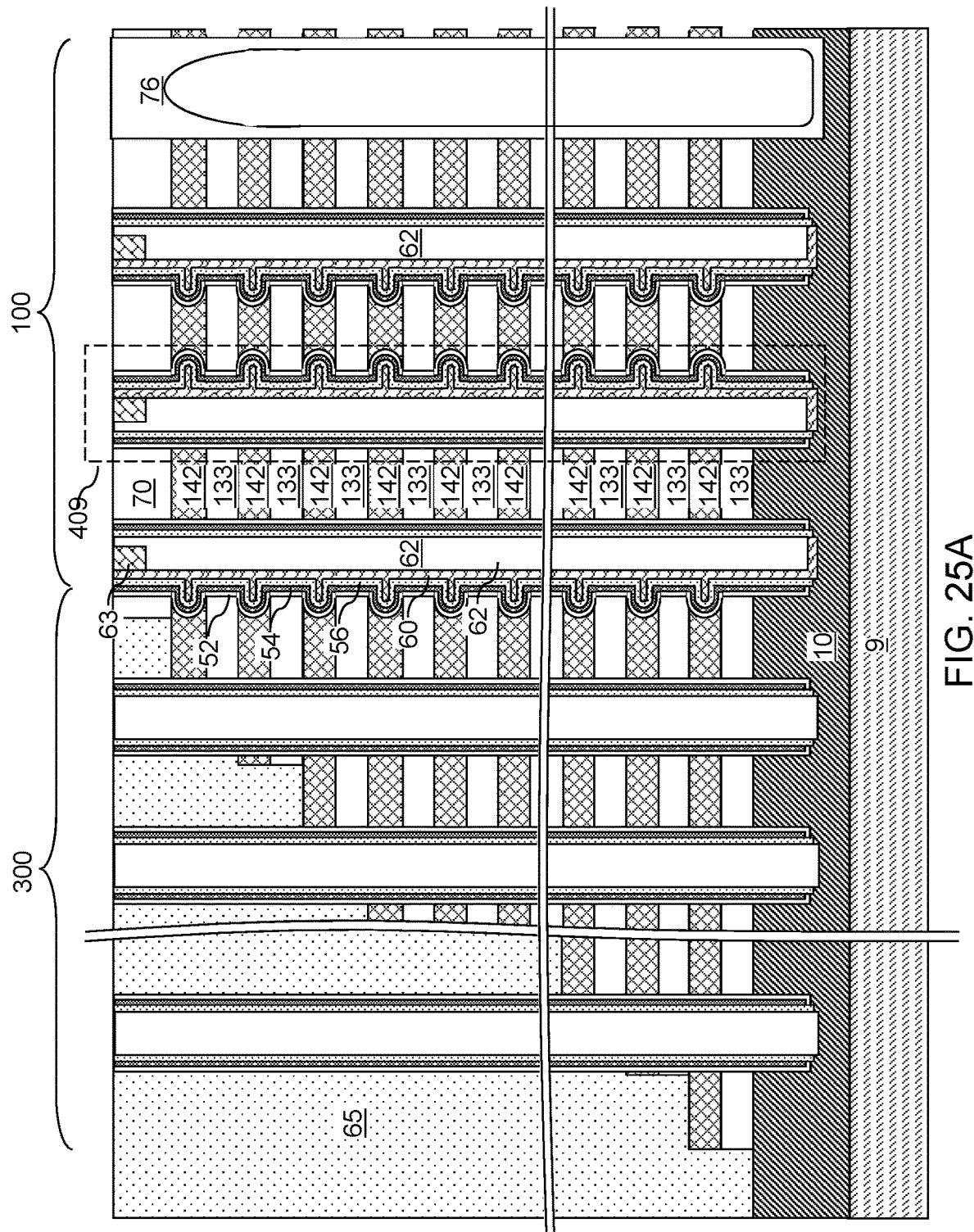
FIG. 25A is a schematic vertical cross-sectional view of the first exemplary structure after formation of air gap pillars in the backside via cavities according to the first embodiment of the present disclosure.
Figure 25B:
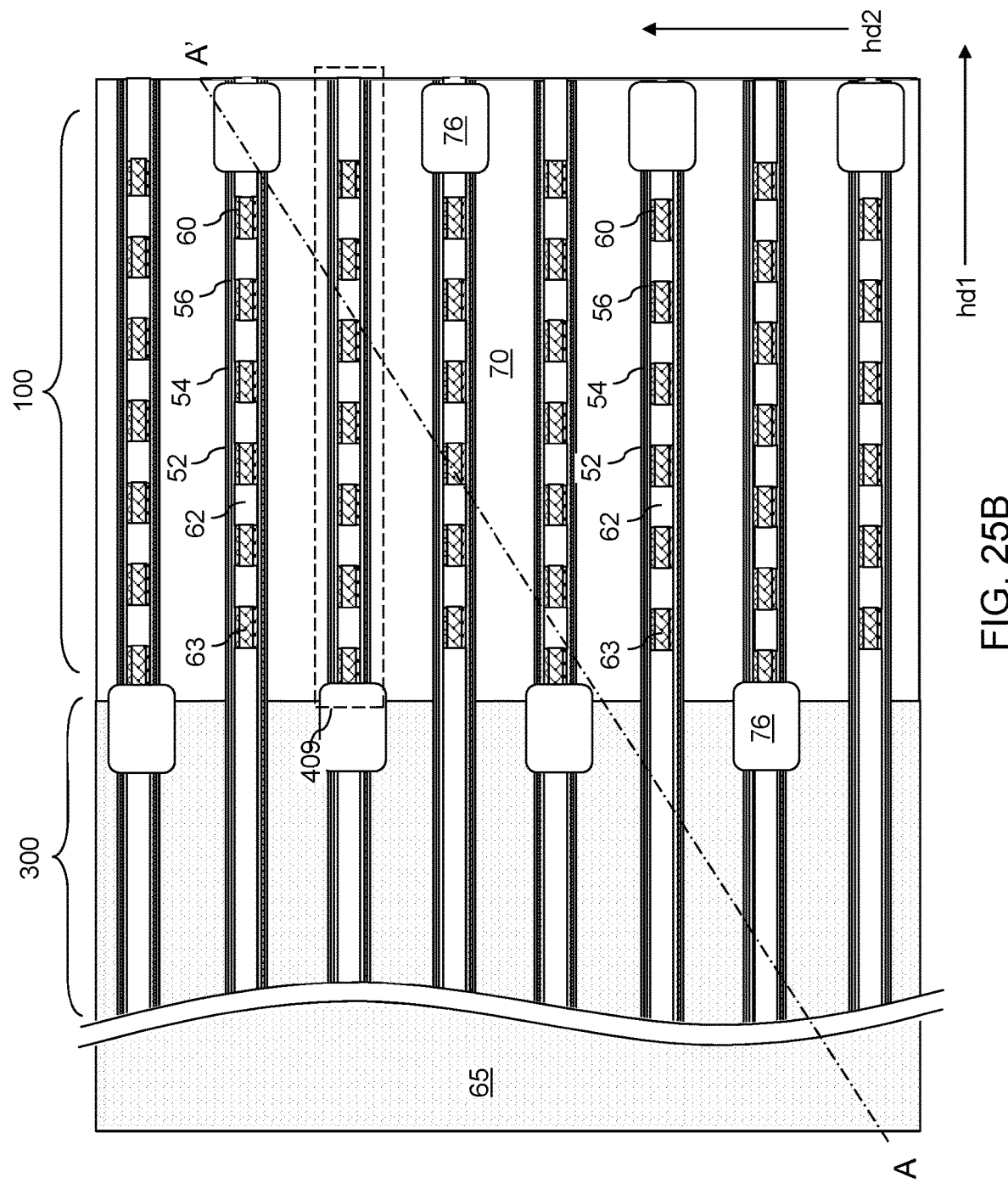
FIG. 25B is a top-down view of the first exemplary structure of FIG. 25A. The vertical plane A-A' is the plane of the cross-section for FIG. 25A.

Referring to FIGS. 25A and 25B, a dielectric material such as silicon oxide is anisotropically deposited within the backside via cavities 79 and in the volumes of the topmost air gap strips 133. The anisotropic deposition of the dielectric material may be performed by plasma enhanced chemical vapor deposition (PECVD) in which the dielectric material is directionally deposited. Excess portions of the deposited dielectric material may be removed from above the horizontal plane including the top surface of the retrostepped dielectric material portion 65. Each portion of the deposited dielectric material in the backside via cavities 79 forms an air gap pillar 76 that encapsulates a void therein. The voids in the air gap pillars 76 may be free of any solid phase material. The portion of the deposited dielectric material in the topmost air gap strip 133 constitutes an insulating cap layer 70. The curvature of the elements shown in the preceding close-up figures is not shown in FIG. 25B because it is an expanded top-down view in which the curvature is not visible at the scale of the figure.

Referring to FIGS. 1-25B and according to various embodiments of the present disclosure, a three-dimensional memory device is provided, which comprises alternating stacks of electrically conductive strips 146 and air gap strips 133 located over a substrate (9, 10) and laterally spaced apart from one another by memory stack assemblies 409. The memory stack assemblies 409 laterally extend along a first horizontal direction hd1 and are spaced apart from one another along a second horizontal direction hd2. Each of the memory stack assemblies 409 comprises two two-dimensional arrays (e.g., when viewed in vertical cross sectional view) of lateral protrusion regions 410. Each lateral protrusion region 410 laterally protrudes outward (i.e., away from a center of a memory stack assembly 409) from a respective vertical plane including interfaces between a respective one of the memory stack assemblies 409 and air gap strips within a respective one of the alternating stacks (146, 133). Each of the lateral protrusion regions 410 comprises a respective charge storage element 54, each of the memory stack assemblies 409 comprises two rows of vertical semiconductor channels 60, and each vertical semiconductor channel 60 within the two rows of vertical semiconductor channels 60 laterally overlies a respective vertical stack of charge storage elements 54.

In one embodiment, each of the memory stack assemblies 409 comprises two tunneling dielectric layers 56; and each of the two tunneling dielectric layers 56 contacts a respective row of vertical semiconductor channels 60 selected from the two rows of vertical semiconductor channels 60.

In one embodiment, each of the memory stack assemblies 409 comprises a dielectric core 62 that laterally extend along the first horizontal direction hd1 and contacting inner sidewalls of each vertical semiconductor channel 60 within the two rows of vertical semiconductor channels 60. In one embodiment, vertical semiconductor channels 60 within each row of vertical semiconductor channels 60 are laterally spaced apart along the first horizontal direction hd1 by vertically-extending areas in which the dielectric core 62 contacts one of the two tunneling dielectric layers 56.

In one embodiment, each of the two tunneling dielectric layers 56 contacts a two-dimensional array of charge storage elements 54 located in a two-dimensional array of lateral protrusion regions 410.

In one embodiment, each vertical semiconductor channel 60 within the two rows of vertical semiconductor channels 60 includes a vertical stack of lateral bump portions located at levels of the electrically conductive strips 146.

In one embodiment, each of the memory stack assemblies 409 comprises two blocking dielectric layers 52; and each of the two blocking dielectric layers 52 contacts a respective one of the two tunneling dielectric layers 56 at each level of the air gap strips 133 and between each neighboring pairs of vertical stacks of charge storage elements 54. In one embodiment, each of the electrically conductive strips 146 comprises a respective metallic barrier layer 146A and a respective portion of a metallic fill material 146B formed within the respective metallic barrier layer 146A; and each of the two blocking dielectric layers 52 contacts sidewalls of a subset of the metallic barrier layers 146A.

In one embodiment, the charge storage elements 54 comprise discrete floating gates or dielectric charge trapping material portions that do not contact one another. In one embodiment, each of the charge storage elements 54 comprises a concave inner sidewall that has a horizontally concave profile in a horizontal cross-sectional view and a convex outer sidewall that has a horizontally convex profile in the horizontal cross-sectional view.

In one embodiment, the concave inner sidewall has a vertically concave profile in a vertical cross-sectional view at an upper edge region and at a lower edge region of a respective charge storage element 54; and the convex outer sidewall has a vertically convex profile in the vertical cross-sectional view at the upper edge region and at the lower edge region of the respective charge storage element 54.

In one embodiment, each of the charge storage elements 54 is located between a first horizontal plane including a top surface of a respective one of the electrically conductive strips 146 and a second horizontal plane including a bottom surface of the respective one of the electrically conductive strips 146.

Referring to FIG. 26, a second exemplary structure according to the second embodiment of the present disclosure is illustrated, which includes a substrate (9, 10) that may be the same as the substrate (9, 10) of the first exemplary structure.

A vertically alternating sequence of first material layers (such as insulating layers 32L) and second material layers (such as spacer material layers) is formed over the substrate (9, 10). The vertically alternating sequence may include a stack of an alternating plurality of first material layers (which may be insulating layers 32L) and second material layers (which may be sacrificial material layer 42L). Each first material layer includes a first material, and each second material layer includes a second material that is different from the first material. In one embodiment, each first material layer may be an insulating layer 32L, and each second material layer may be a sacrificial material layer. In this case, the stack may include an alternating plurality of insulating layers 32L and sacrificial material layers 42L, and constitutes a prototype stack of alternating layers comprising insulating layers 32L and sacrificial material layers 42L.

In one embodiment, the vertically alternating sequence (32L, 42L) may include insulating layers 32L composed of the first material, and sacrificial material layers 42L composed of a second material different from that of insulating layers 32L. The first material of the insulating layers 32L may be at least one insulating material. As such, each insulating layer 32L may be an insulating material layer. Insulating materials that may be used for the insulating layers 32L include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32L may be silicon oxide. The second material of the sacrificial material layers 42L is a sacrificial material that may be removed selective to the first material of the insulating layers 32L.

The sacrificial material layers 42L may comprise an insulating material, a semiconductor material, or a conductive material. The second material of the sacrificial material layers 42L may be subsequently replaced with electrically conductive electrodes which may function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42L may be spacer material layers that comprise silicon nitride or a semiconductor material including at least one of silicon and germanium.

In one embodiment, the insulating layers 32L may include silicon oxide, and sacrificial material layers may include silicon nitride sacrificial material layers. The first material of the insulating layers 32L may be deposited, for example, by chemical vapor deposition (CVD). For example, if silicon oxide is used for the insulating layers 32L, tetraethyl orthosilicate (TEOS) may be used as the precursor material for the CVD process. The second material of the sacrificial material layers 42L may be formed, for example, CVD or atomic layer deposition (ALD).

The thicknesses of the insulating layers 32L and the sacrificial material layers 42L may be in a range from 20 nm to 50 nm, although lesser and greater thicknesses may be used for each insulating layer 32L and for each sacrificial material layer 42L. The number of repetitions of the pairs of an insulating layer 32L and a sacrificial material layer (e.g., a control gate electrode or a sacrificial material layer) 42L may be in a range from 2 to 1,024, and typically from 8 to 256, although a greater number of repetitions may also be used. The top and bottom gate electrodes in the stack may function as the select gate electrodes. In one embodiment, each sacrificial material layer 42L in the vertically alternating sequence (32L, 42L) may have a uniform thickness that is substantially invariant within each respective sacrificial material layer 42L.

Optionally, a continuous insulating cap layer 70L may be formed over the vertically alternating sequence (32L, 42L). The continuous insulating cap layer 70L includes a dielectric material that is different from the material of the sacrificial material layers 42L. In one embodiment, the continuous insulating cap layer 70L may include a dielectric material that may be used for the insulating layers 32L as described above. The continuous insulating cap layer 70L may have a greater thickness than each of the insulating layers 32L. The continuous insulating cap layer 70L may be deposited, for example, by chemical vapor deposition. In one embodiment, the continuous insulating cap layer 70L may be a silicon oxide layer.

Figure 27:
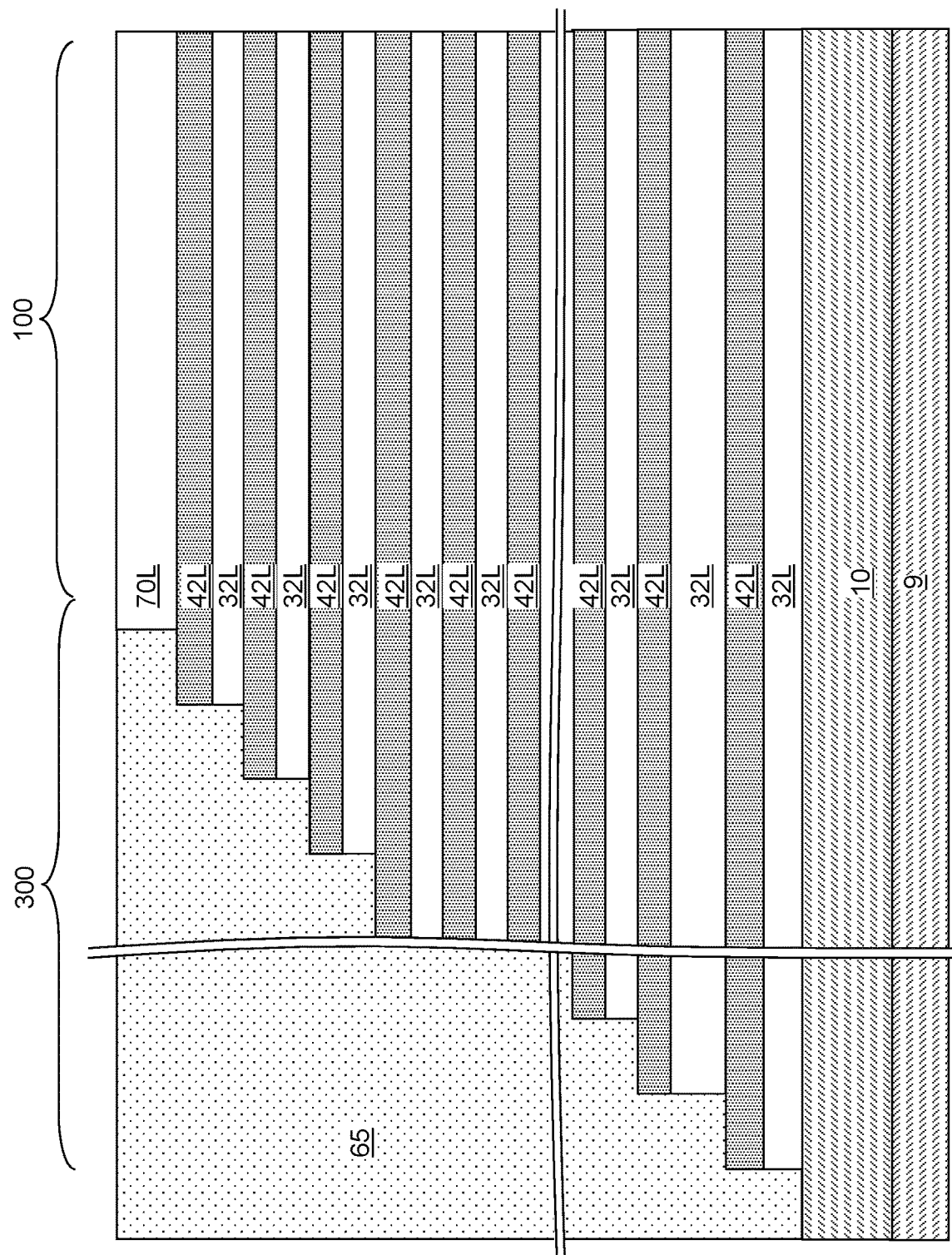
FIG. 27 is a schematic vertical cross-sectional view of the second exemplary structure after formation of stepped terraces and a retro-stepped dielectric material portion according to the second embodiment of the present disclosure.
Figure 28A:
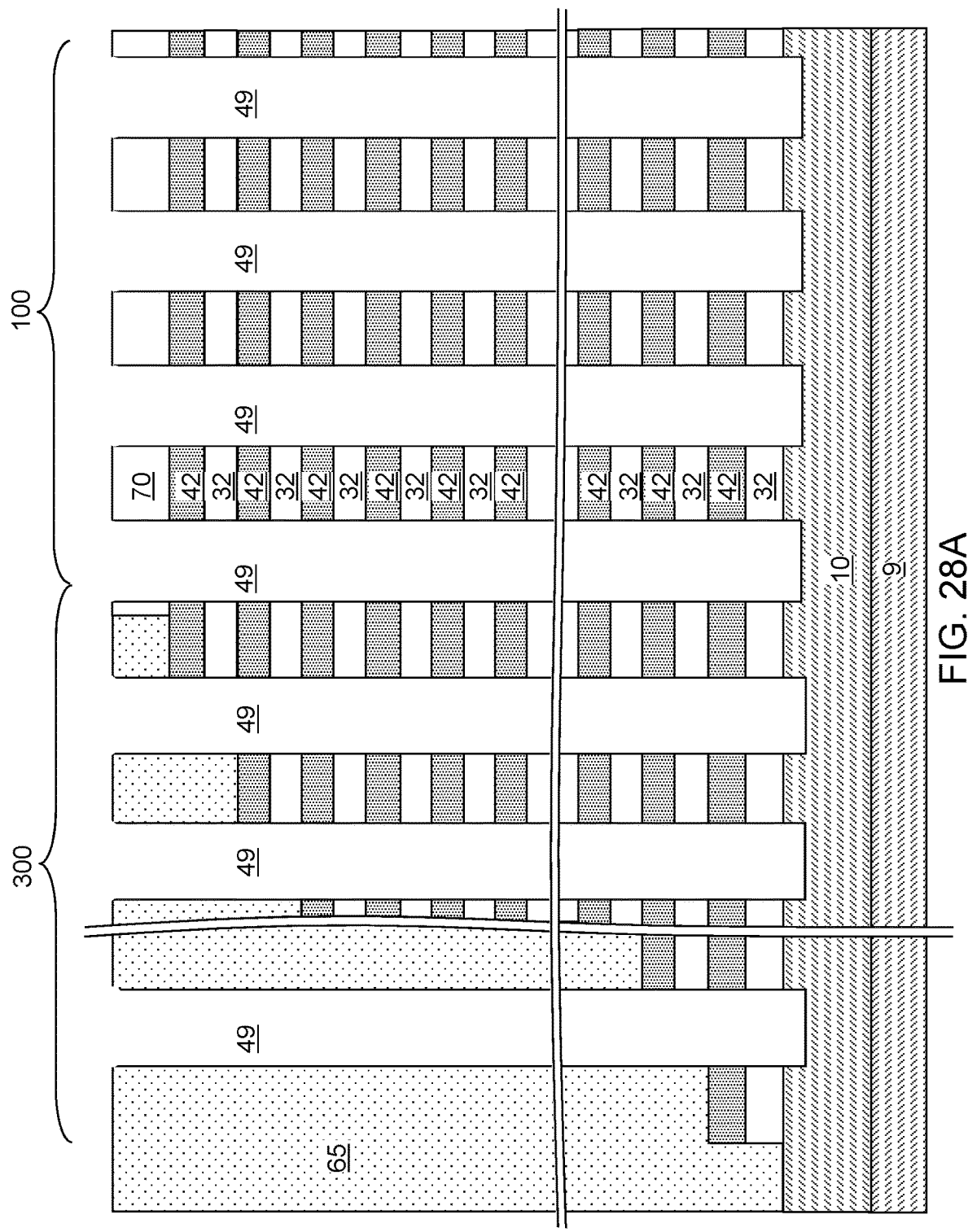
FIG. 28A is a schematic vertical cross-sectional view of the second exemplary structure after formation of line trenches according to the second embodiment of the present disclosure.
Figure 28B:
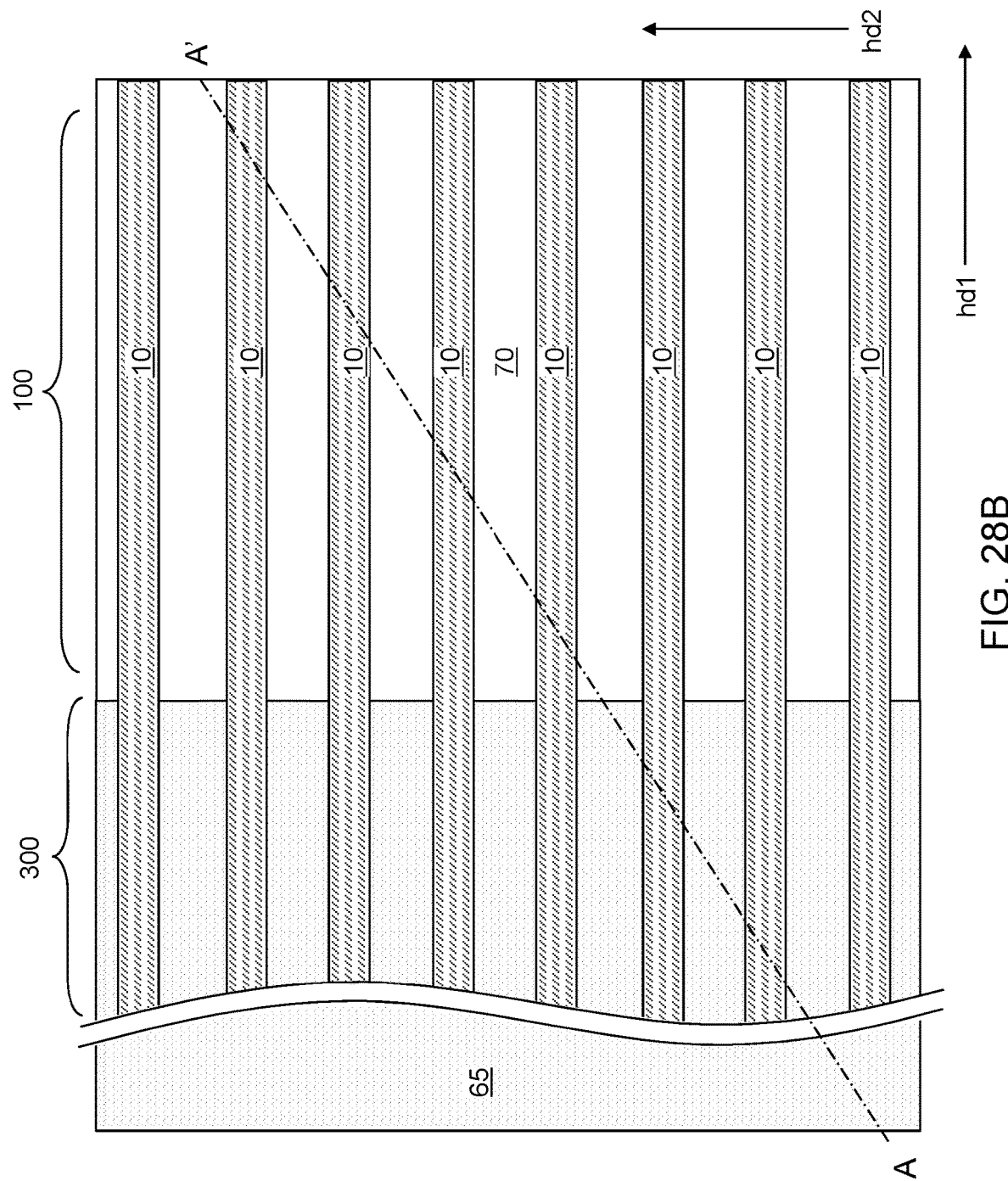
FIG. 28B is a top-down view of the second exemplary structure of FIG. 28A. The vertical plane A-A' is the plane of the cross-section for FIG. 28A.
Figure 29B:
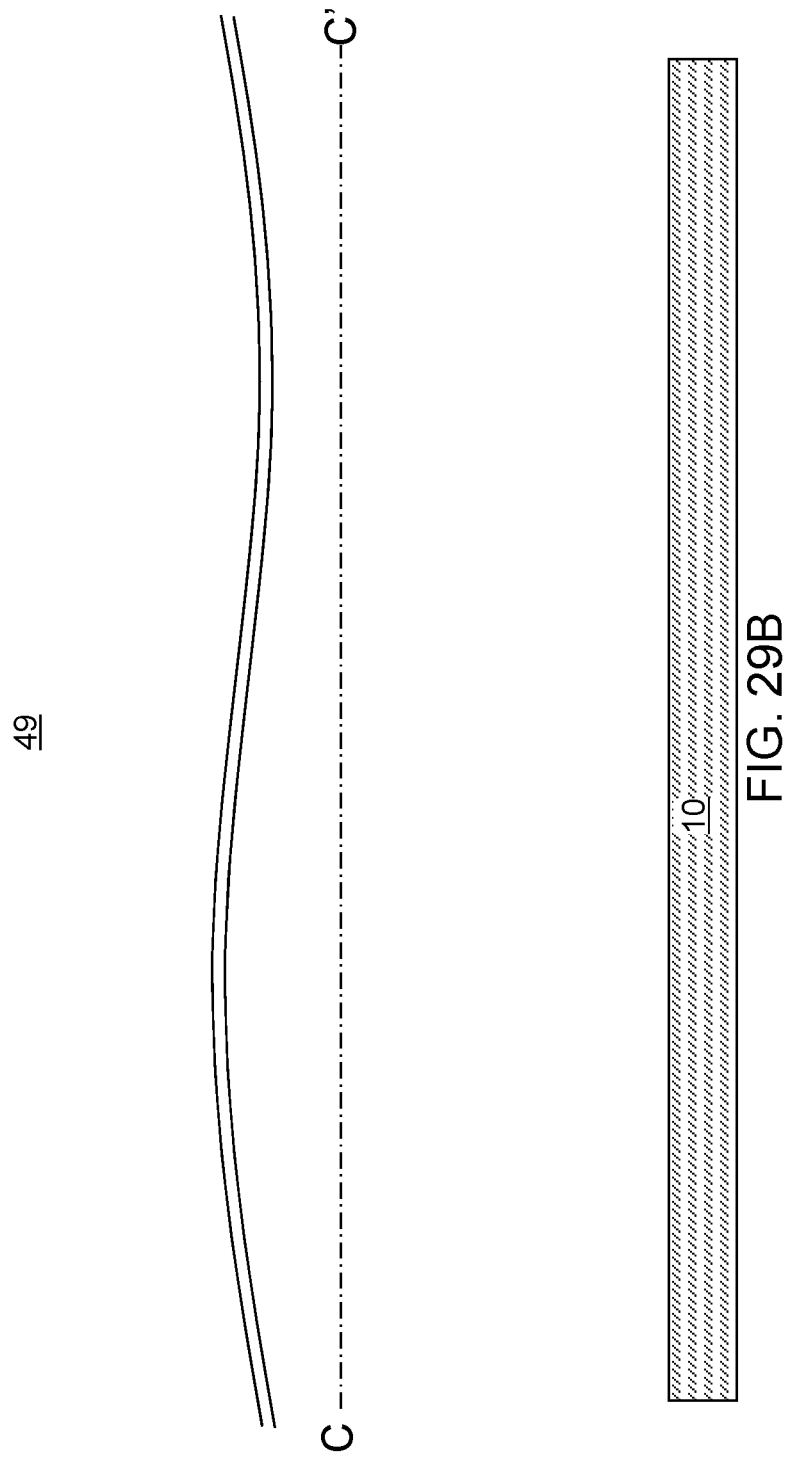
FIG. 29B is a second vertical cross-sectional view of the region of the second exemplary structure of FIG. 29A.
Figure 29C:
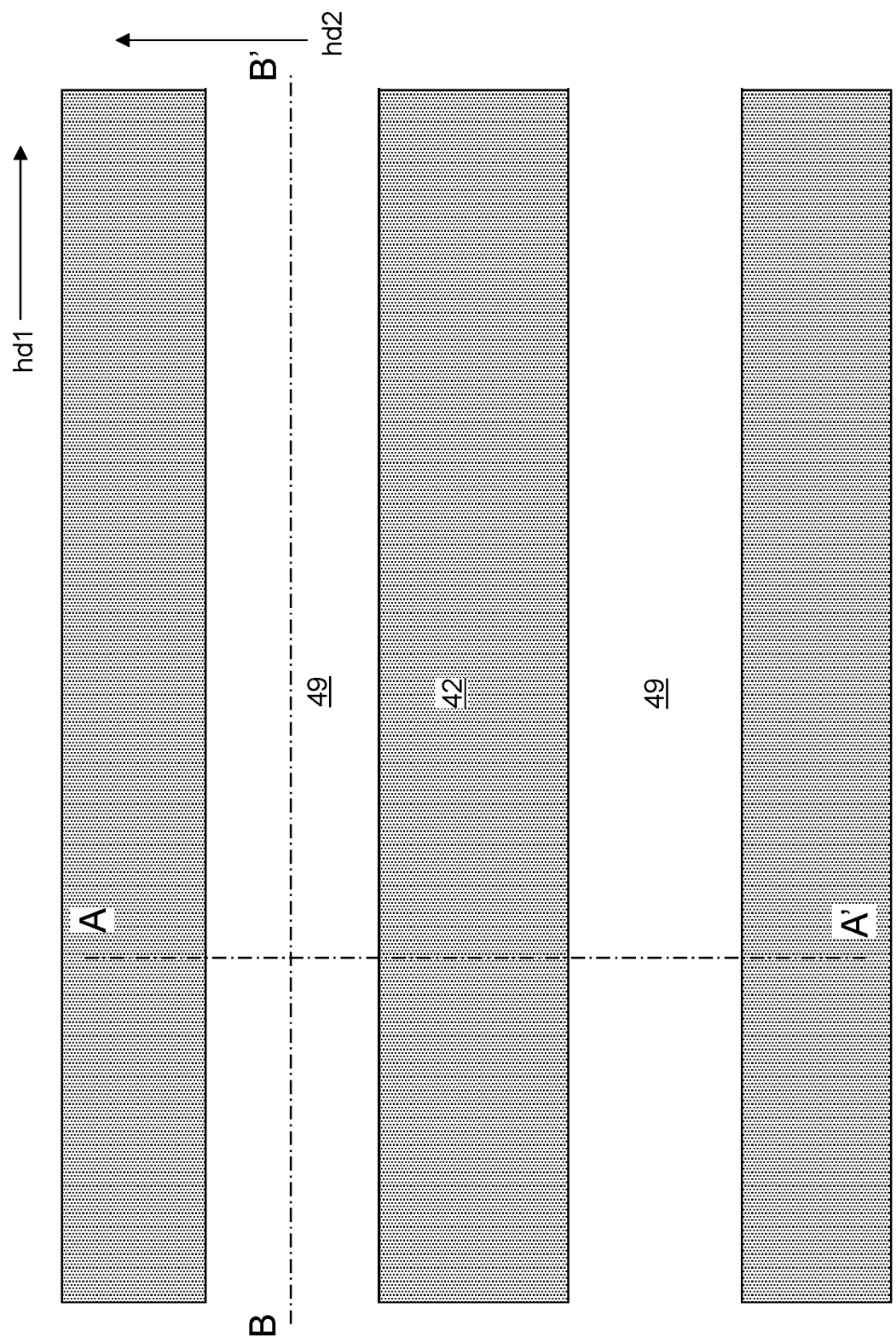
FIG. 29C is a horizontal cross-sectional view along the plane C-C' of FIGS. 29A and 29B. The vertical plane A-A' corresponds to the plane of the vertical cross-sectional view of FIG. 29A. The horizontal plane B-B' corresponds to the plane of the vertical cross-sectional view of FIG. 29B.

Referring to FIG. 27, the vertically alternating sequence of the insulating layers 32L and the spacer material layers (i.e., the sacrificial material layers 42L) may be patterned to form stepped surfaces that continuously extend from a bottommost layer of the vertically alternating sequence (32L, 42L) to a topmost layer of the alternating sequence (32L, 42L) in the contact region 300. A stepped cavity may be formed within the contact region 300 which may be located between the memory array region 100 and a peripheral device region (not shown) containing the at least one semiconductor device for the peripheral circuitry. The stepped cavity may have various stepped surfaces such that the horizontal cross-sectional shape of the stepped cavity changes in steps as a function of the vertical distance from the top surface of the substrate (9, 10). In one embodiment, the stepped cavity may be formed by repetitively performing a set of processing steps. The set of processing steps may include, for example, an etch process of a first type that vertically increases the depth of a cavity by one or more levels, and an etch process of a second type that laterally expands the area to be vertically etched in a subsequent etch process of the first type.

Stepped surfaces are formed at a peripheral portion of the vertically alternating sequence (32L, 42L) through formation of the stepped cavity. A terrace region is formed by patterning the vertically alternating sequence (32L, 42L). Each sacrificial material layer 42L other than a topmost sacrificial material layer 42L within the vertically alternating sequence (32L, 42L) laterally extends farther than any overlying sacrificial material layer 42L within the vertically alternating sequence (32L, 42L). The terrace region includes stepped surfaces of the vertically alternating sequence (32L, 42L) that continuously extend from a bottommost layer within the vertically alternating sequence (32L, 42L) to a topmost layer within the vertically alternating sequence (32L, 42L).

A retro-stepped dielectric material portion 65 (i.e., an insulating fill material portion) may be formed in the stepped cavity by deposition of a dielectric material therein. For example, a dielectric material such as silicon oxide may be deposited in the stepped cavity. Excess portions of the deposited dielectric material may be removed from above the top surface of the continuous insulating cap layer 70L, for example, by chemical mechanical planarization (CMP). The remaining portion of the deposited dielectric material filling the stepped cavity constitutes the retro-stepped dielectric material portion 65. If silicon oxide is used for the retro-stepped dielectric material portion 65, the silicon oxide of the retro-stepped dielectric material portion 65 may, or may not, be doped with dopants such as B, P, and/or F.

Referring to FIGS. 28A, 28B, and 29A-29C, a lithographic material stack (not shown) including at least a photoresist layer may be formed over the continuous insulating cap layer 70L and the retro-stepped dielectric material portion 65, and may be lithographically patterned to form line-shaped openings therein. The line-shaped openings laterally extend along a first horizontal direction hd1, and have a uniform width along a second horizontal direction hd2 that is perpendicular to the first horizontal direction hd1. The pattern in the lithographic material stack may be transferred through the continuous insulating cap layer 70L or the retro-stepped dielectric material portion 65, and through the vertically alternating sequence (32L, 42L) by at least one anisotropic etch that uses the patterned lithographic material stack as an etch mask. Portions of the vertically alternating sequence (32L, 42L) underlying the line-shaped openings in the patterned lithographic material stack are etched to form line trenches 49. As used herein, a "line trench" refers to a trench that has laterally extends straight along a horizontal direction.

The line trenches 49 laterally extend along the first horizontal direction hd1 through the vertically alternating sequence (32L, 42L). In one embodiment, the line trenches 49 have a respective uniform width that is invariant under translation along the first horizontal direction hd1. In one embodiment, the line trenches 49 may have the same width throughout, and the spacing between neighboring pairs of the line trenches 49 may be the same. In this case, the line trenches 49 may constitute a one-dimensional periodic array of line trenches 49 having a pitch along a second horizontal direction hd2 that is perpendicular to the first horizontal direction hd1. The width of the line trenches 49 along the second horizontal direction hd2 may be in a range from 30 nm to 500 nm, such as from 60 nm to 250 nm, although lesser and greater widths may also be used.

The line trenches 49 extend through each layer of the vertically alternating sequence (32L, 42L) and the retro-stepped dielectric material portion 65. The chemistry of the anisotropic etch process used to etch through the materials of the vertically alternating sequence (32L, 42L) may alternate to optimize etching of the first and second materials in the vertically alternating sequence (32L, 42L). The anisotropic etch may be, for example, a series of reactive ion etches. The sidewalls of the line trenches 49 may be substantially vertical, or may be tapered. The patterned lithographic material stack may be subsequently removed, for example, by ashing.

The line trenches 49 laterally extend through the entire memory array region 100, and laterally extend into the contact region 300. The line trenches 49 may laterally extend through the entire contact region 300 along the first horizontal direction hd1, or may laterally extend only through part of a width, but not the entire width along the first horizontal direction hd1, of the contact region 300. In one embodiment, an overetch into the semiconductor material layer 10 may be optionally performed after the top surface of the semiconductor material layer 10 is physically exposed at a bottom of each line trench 49. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth may be, for example, in a range from 1 nm to 50 nm, although lesser and greater recess depths may also be used. The overetch is optional, and may be omitted. If the overetch is not performed, the bottom surfaces of the line trenches 49 may be coplanar with the topmost surface of the semiconductor material layer 10 (or substrate semiconductor layer 9 in embodiments that do not use the semiconductor material layer 10).

Each of the line trenches 49 may include a sidewall (or a plurality of sidewalls) that extends substantially perpendicular to the topmost surface of the substrate. The substrate semiconductor layer 9 and the semiconductor material layer 10 collectively constitute a substrate (9, 10), which may be a semiconductor substrate. Alternatively, the semiconductor material layer 10 may be omitted, and the line trenches 49 may be extend to a top surface of the substrate semiconductor layer 9.

The vertically alternating sequence (32L, 42L) and the continuous insulating cap layer 70L are divided into discrete portions by the line trenches 49. Each remaining portion of the vertically alternating sequence (32L, 42L) between a pair of line trenches 49 constitutes an alternating stack of remaining portions of the insulating layers 32L and remaining portions of the sacrificial material layers 42L. Each remaining portion of the insulating layers 32L may have a rectangular strip shape that laterally extends along the first horizontal direction hd1 and has a uniform width along the second horizontal direction hd2, and is herein referred to as an insulating strip 32. Each remaining portion of the sacrificial material layers 42L may have a rectangular strip shape that laterally extends along the first horizontal direction hd1 and has a uniform width along the second horizontal direction hd2, and is herein referred to as a sacrificial material strip 42. An alternating stack of insulating strips 32 and sacrificial material strips 42 is formed between each neighboring pair of line trenches 49 over the substrate (9, 10). The alternating stacks (32, 42) are laterally spaced apart from one another by the line trenches 49, which laterally extend along the first horizontal direction hd1. Each remaining portion of the continuous insulating cap layer 70L is herein referred to as an insulating cap layer 70, which overlies a respective one of the alternating stacks (32, 42).

Figure 30A:
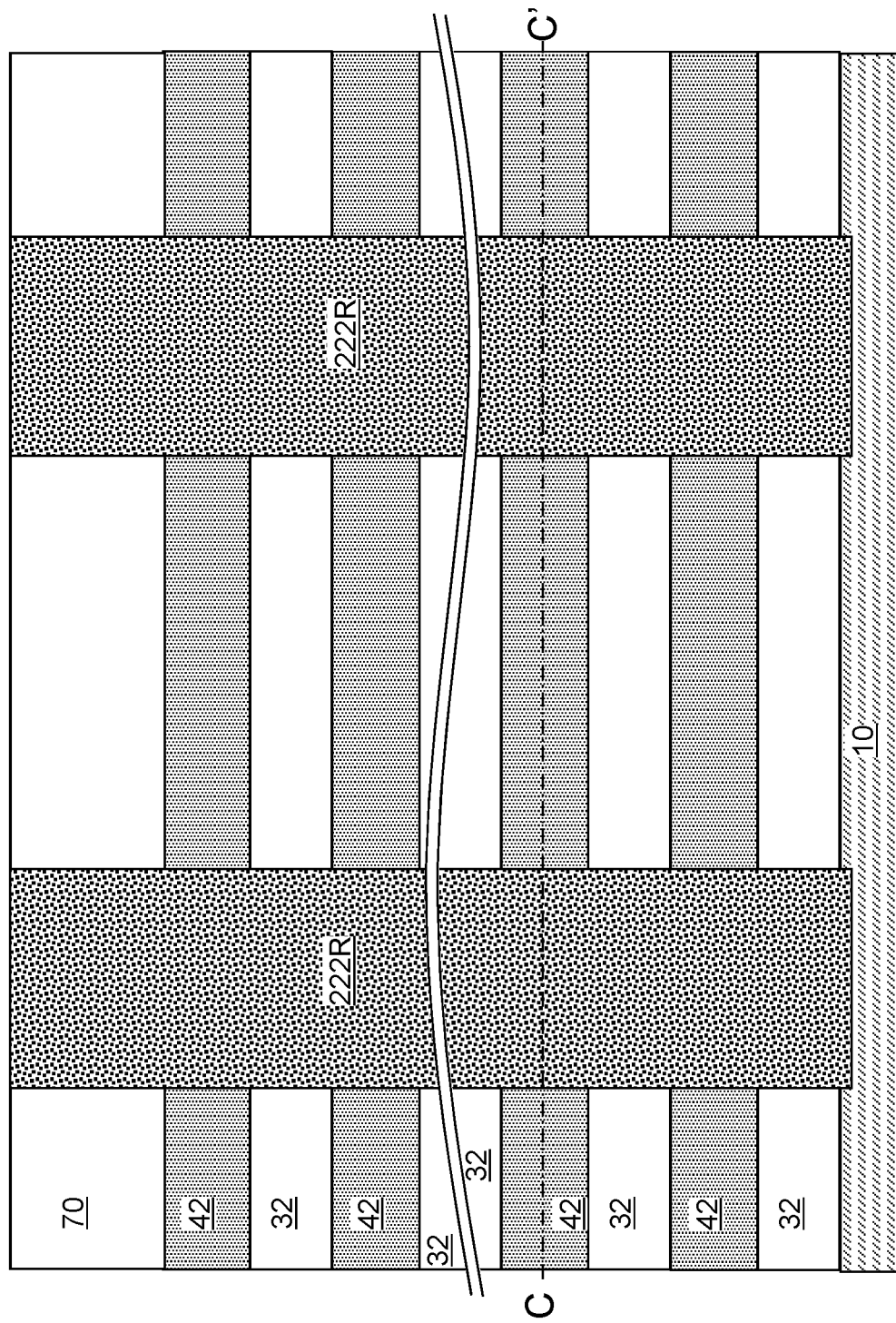
FIG. 30A is a first vertical cross-sectional view of a region of the second exemplary structure after formation of first masking rails according to the second embodiment of the present disclosure.
Figure 30C:
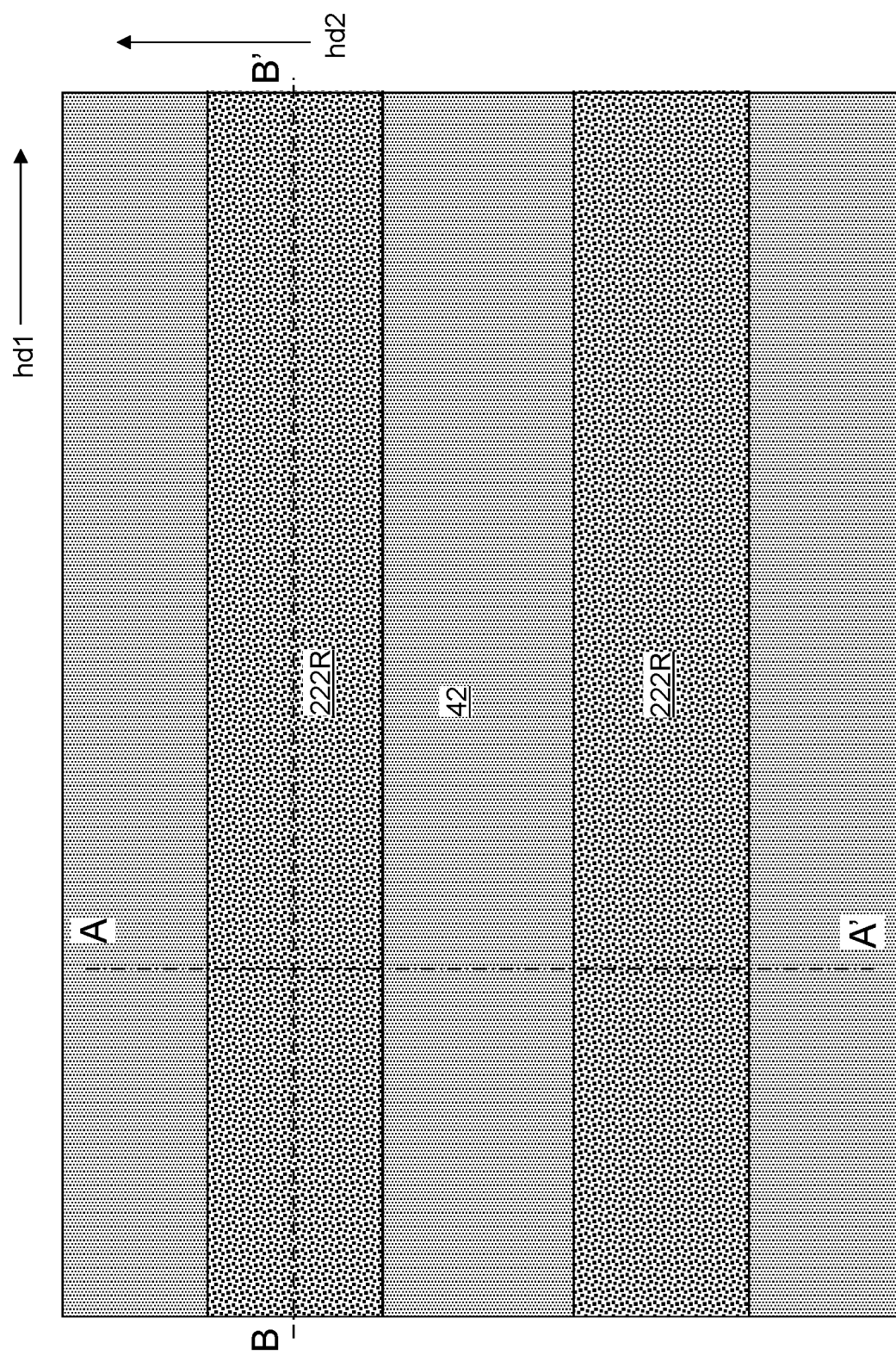
FIG. 30C is a horizontal cross-sectional view along the plane C-C' of FIGS. 30A and 30B. The vertical plane A-A' corresponds to the plane of the vertical cross-sectional view of FIG. 30A. The horizontal plane B-B' corresponds to the plane of the vertical cross-sectional view of FIG. 30B.

Referring to FIGS. 30A-30C, a masking material may be deposited in remaining volumes of the line trenches 49. Excess portions of the masking material may be removed from above the horizontal plane including top surfaces of the insulating cap layers 70. Remaining portions of the masking material in the line trenches 49 constitute first masking material rails 222R. In one embodiment, the first masking material rails 222R may have a uniform vertical cross-sectional shape within planes that are perpendicular to the lengthwise direction of the line trenches 49. In one embodiment, the vertical cross-sectional shapes of the first masking material rails 222R may be rectangular or trapezoidal with a greater width at top than at bottom. In one embodiment, the first masking material rails 222R may include a carbon-based material. In one embodiment, the first masking material rails 222R may include spin-on-carbon that may be applied by spin coating and subsequently dried.

Figure 31A:
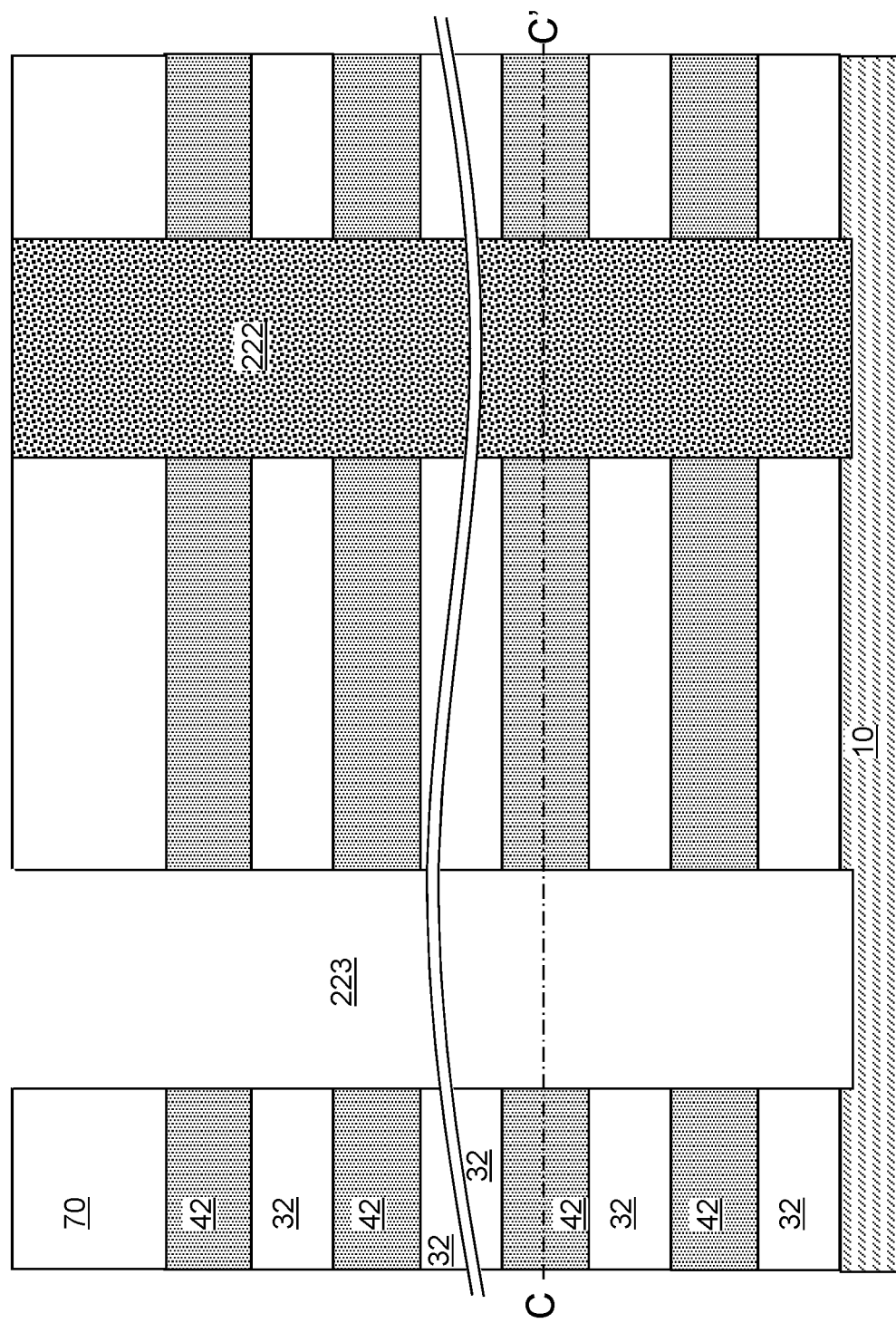
FIG. 31A is a first vertical cross-sectional view of a region of the second exemplary structure after formation of a two-dimensional array of masking material pillars according to the second embodiment of the present disclosure.
Figure 31B:
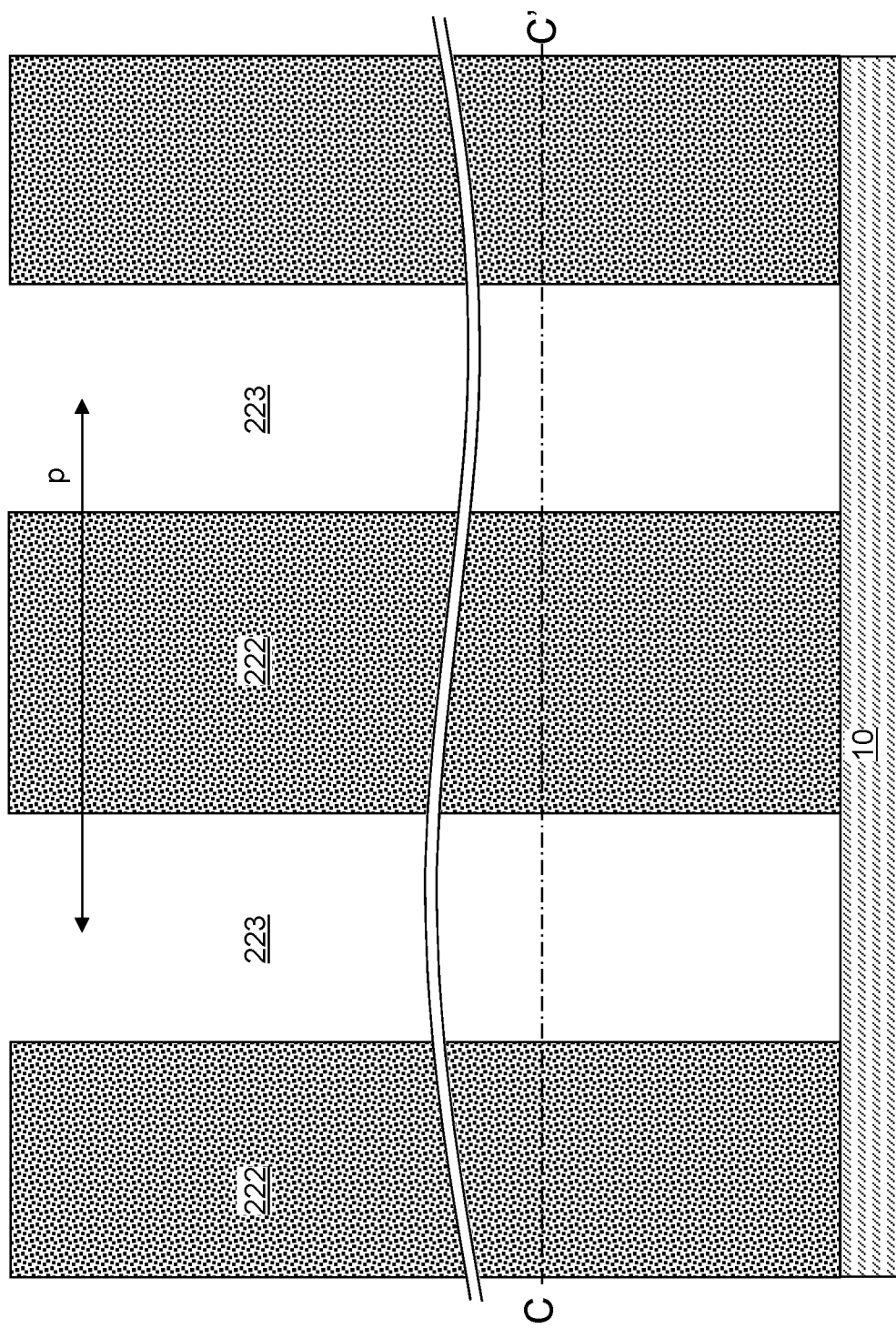
FIG. 31B is a second vertical cross-sectional view of the region of the second exemplary structure of FIG. 31A.
Figure 31C:
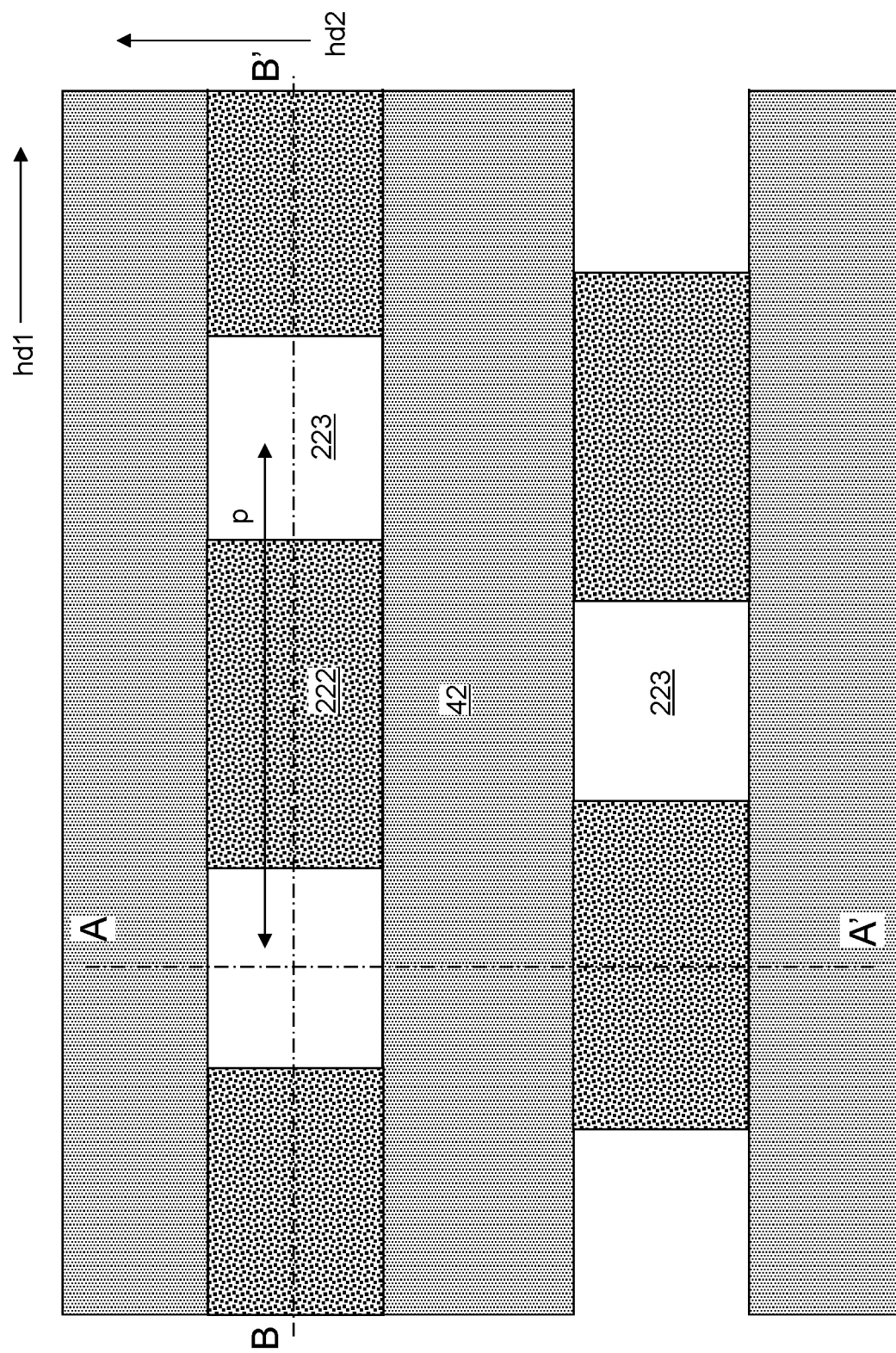
FIG. 31C is a horizontal cross-sectional view along the plane C-C' of FIGS. 31A and 31B. The vertical plane A-A' corresponds to the plane of the vertical cross-sectional view of FIG. 31A. The horizontal plane B-B' corresponds to the plane of the vertical cross-sectional view of FIG. 31B.

Referring to FIGS. 31A-31C, a photoresist layer (not shown) may be applied over the first exemplary structure and may be subsequently patterned to form an array of openings. In one embodiment, the array of openings in the photoresist layer may be a two-dimensional periodic array of discrete openings. In one embodiment, the two-dimensional periodic array of discrete openings may include rows of openings that overlie a respective one of the line trenches 49. The row-to-row pitch within the two-dimensional periodic array of discrete openings may be the same as the center-to-center pitch between the line trenches 49. Each row of openings may have a periodic one-dimensional array of openings with a regular pitch p, which is a center-to-center distance between neighboring pairs of openings in the photoresist layer. In one embodiment, the rows may be sequentially numbered with integers from one end to another end. Even numbered rows may be laterally offset relative to the odd-numbered rows by one-half of the regular pitch p in a top-down view.

An anisotropic etch process that etches the material of the first masking material rails 222R selective to the materials of the alternating stacks (32, 42) may be performed to transfer the pattern of the openings in the photoresist layer through the first masking material rails 222R. Each remaining portion of the first masking material rails 222R may have a rectangular pillar shape, and is herein referred to as a first masking material pillar 222. Neighboring pairs of first masking material pillars 222 in a line trench 49 are laterally spaced apart by a first pillar-shaped cavity 223. Each first pillar-shaped cavity 223 may have a rectangular horizontal cross-sectional shape. A two-dimensional array of first masking material pillars 222 is formed within the line trenches 49.

Figure 32A:
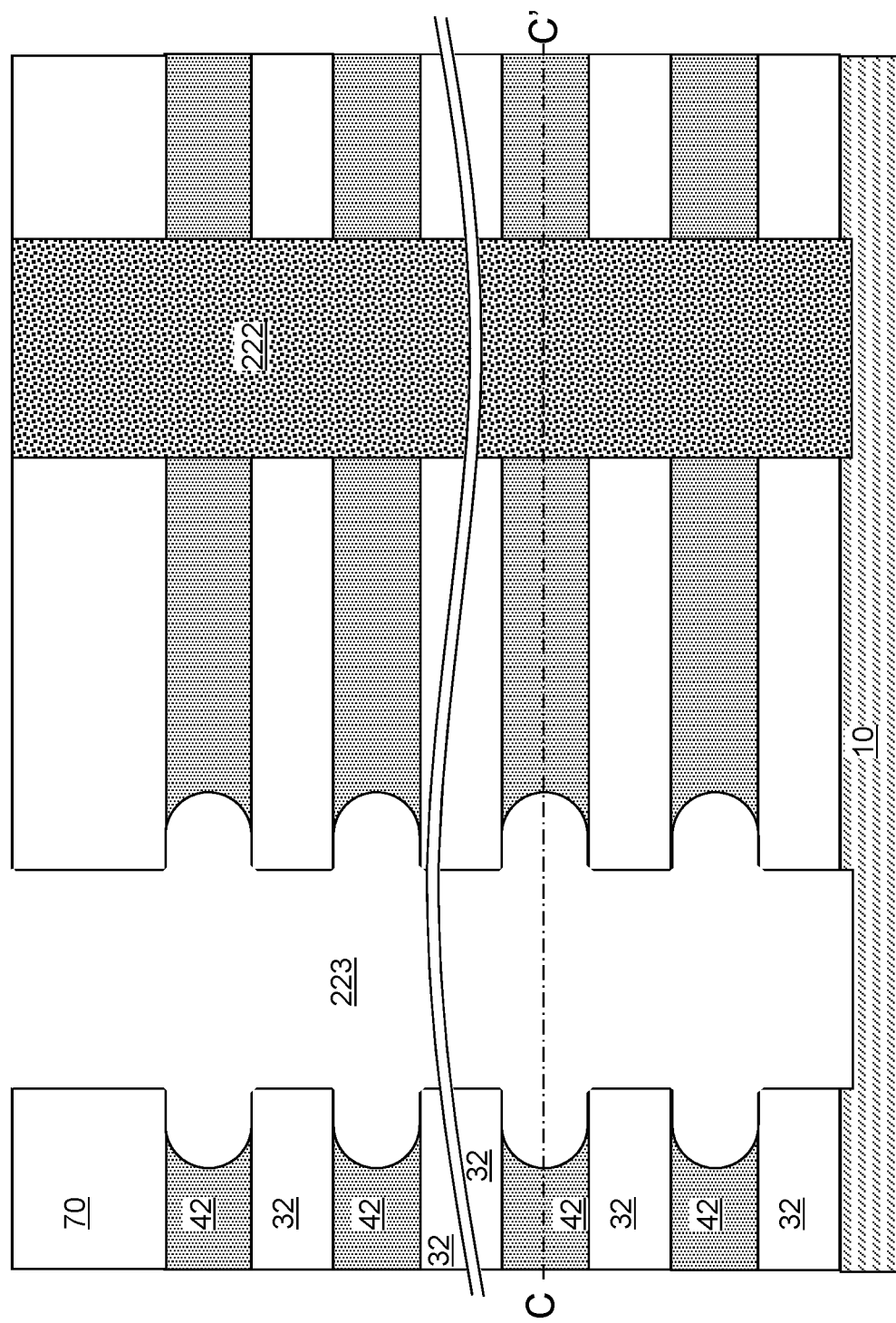
FIG. 32A is a first vertical cross-sectional view of a region of the second exemplary structure after formation of a two-dimensional array of lateral recesses on each sidewall of the line trenches according to the second embodiment of the present disclosure.
Figure 32C:
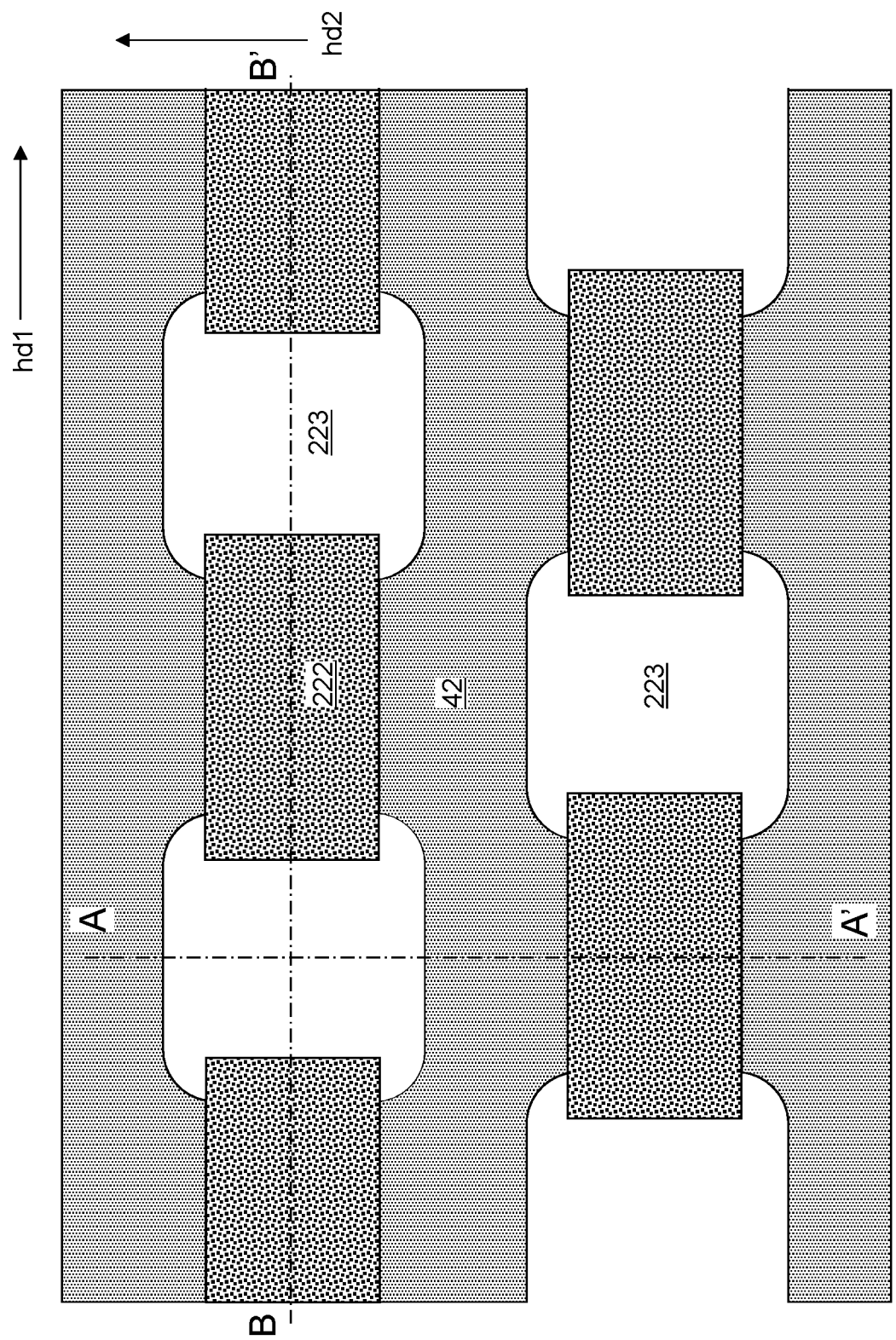
FIG. 32C is a horizontal cross-sectional view along the plane C-C' of FIGS. 32A and 32B. The vertical plane A-A' corresponds to the plane of the vertical cross-sectional view of FIG. 32A. The horizontal plane B-B' corresponds to the plane of the vertical cross-sectional view of FIG. 32B.

Referring to FIGS. 32A-32C, an isotropic etch process is performed to laterally recess physically exposed surfaces of the sacrificial material strips 42 selective to the materials of the insulating strips 32, the insulating cap layers 70, and the semiconductor material layer 10. The sacrificial material strips 42 are laterally recessed selective to the insulating strips 32 while the two-dimensional array of first masking material pillars 222 in the line trenches 49 is present within the line trenches 49, thereby blocking access of an isotropic etchant to masked portions of the sacrificial material strips 42. For example, if the sacrificial material strips 42 include silicon nitride, a wet etch process using hot phosphoric acid may be used to isotropically recess sidewalls of the sacrificial material strips 42 to form lateral recesses, i.e., regions in which a sidewall of a sacrificial material strip 42 is laterally recesses relative to a sidewall of an overlying or underlying insulating strip 32. A two-dimensional array of lateral recesses may be formed on each sidewall of the line trenches 49. The lateral recess distance between a recessed sidewall of a sacrificial material strip 42 and an overlying or underlying insulating strip 32 may be in a range from 3 nm to 60 nm, such as from 6 nm to 30 nm, although lesser and greater recess distances may also be used.

Figure 33A:
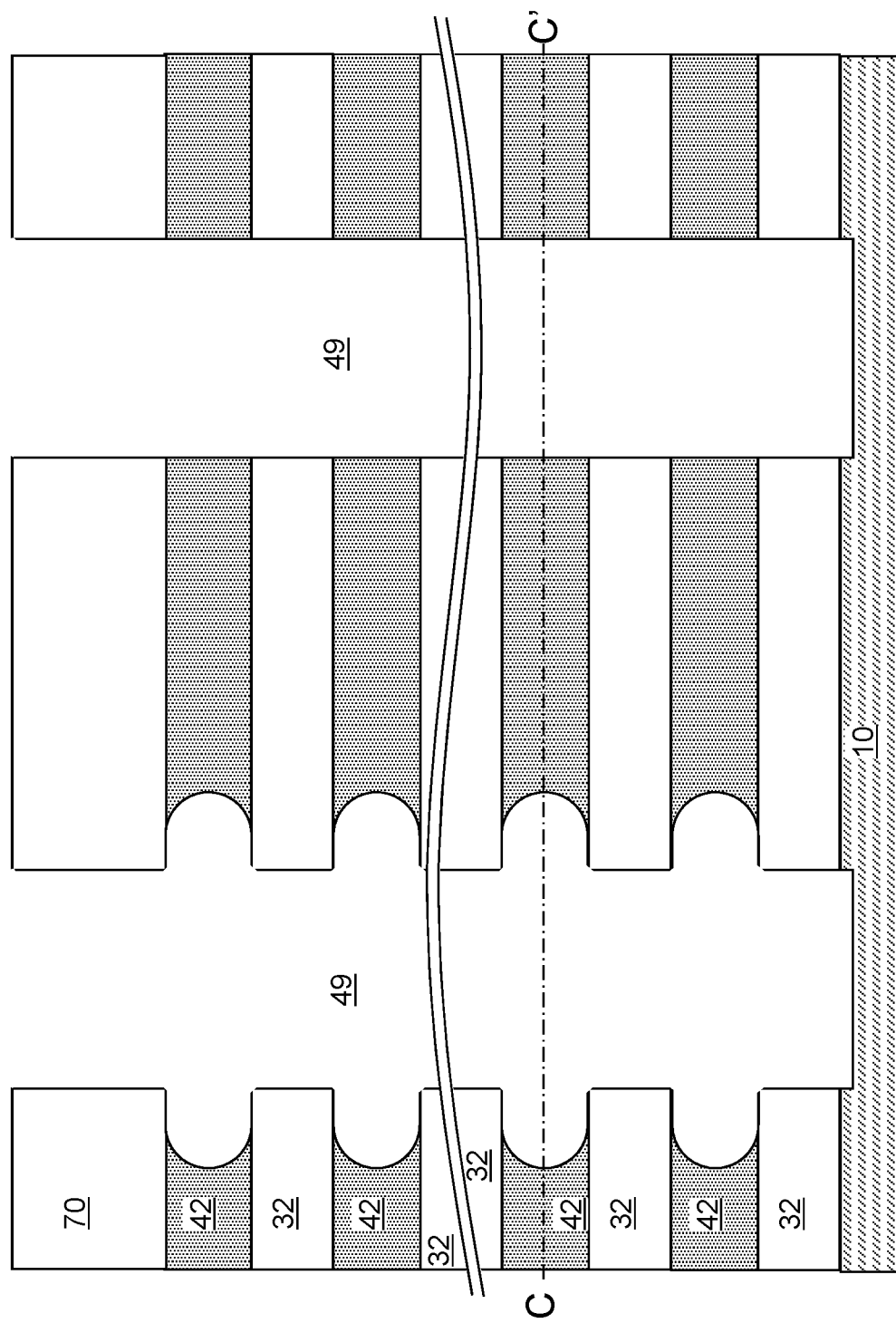
FIG. 33A is a first vertical cross-sectional view of a region of the second exemplary structure after removal of the two-dimensional array of masking material pillars according to the second embodiment of the present disclosure.
Figure 33C:
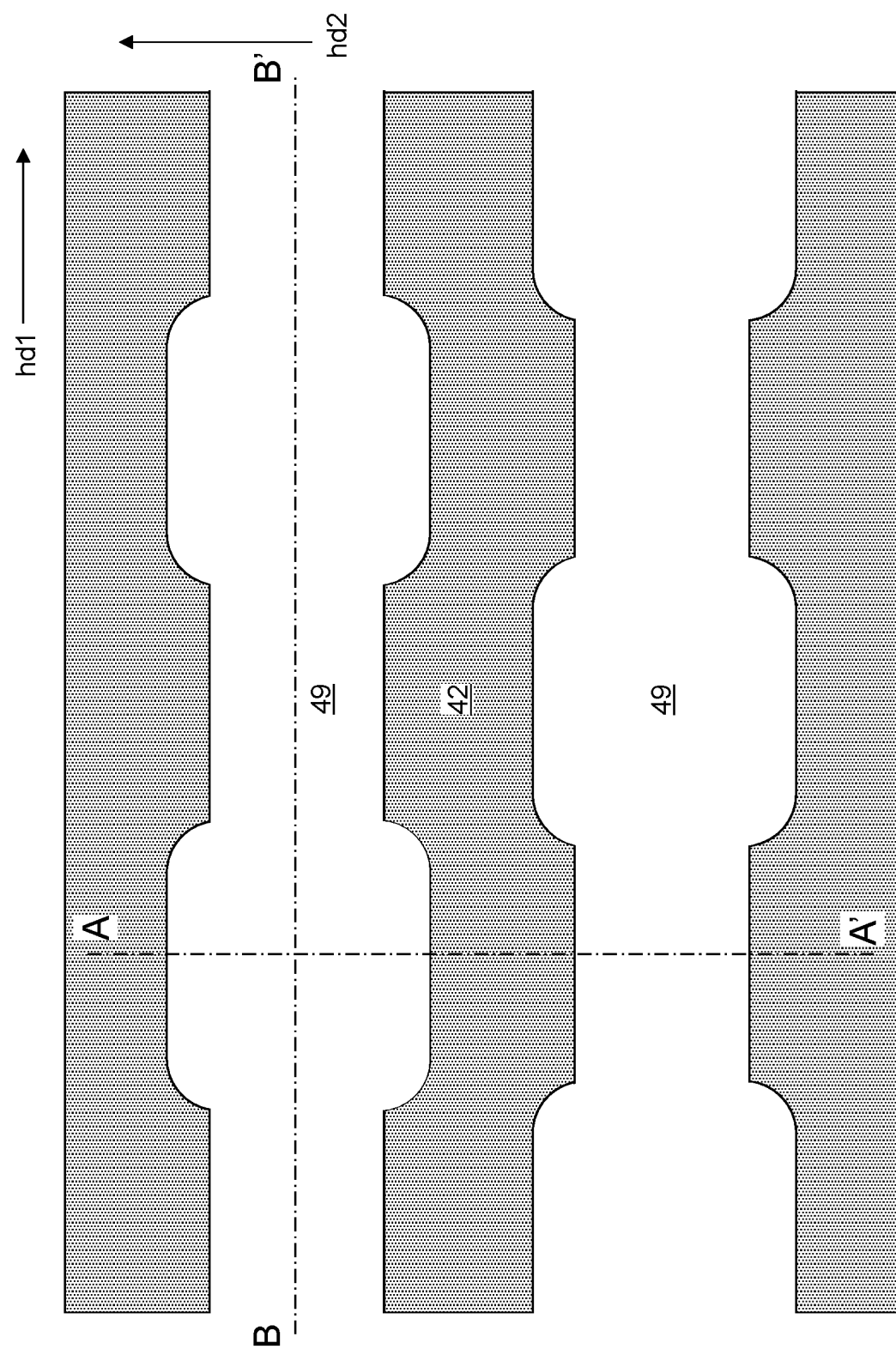
FIG. 33C is a horizontal cross-sectional view along the plane C-C' of FIGS. 33A and 33B. The vertical plane A-A' corresponds to the plane of the vertical cross-sectional view of FIG. 33A. The horizontal plane B-B' corresponds to the plane of the vertical cross-sectional view of FIG. 33B.

Referring to FIGS. 33A-33C, the first masking material pillar 222 may be removed selective to the alternating stacks (32, 42) and the insulating cap layers 70. For example, the first masking material pillars 222 may be removed by performing an ashing process. The line trenches 49 are modified to provide a two-dimensional array of lateral recesses on each sidewall of the line trenches 49. Each two-dimensional array of lateral recesses may be laterally bounded by a respective two-dimensional array of laterally-recessed surfaces of the sacrificial material strips 42. Each lengthwise sidewall of the line trenches 49 may include a two-dimensional array of lateral recesses.

Figure 34A:
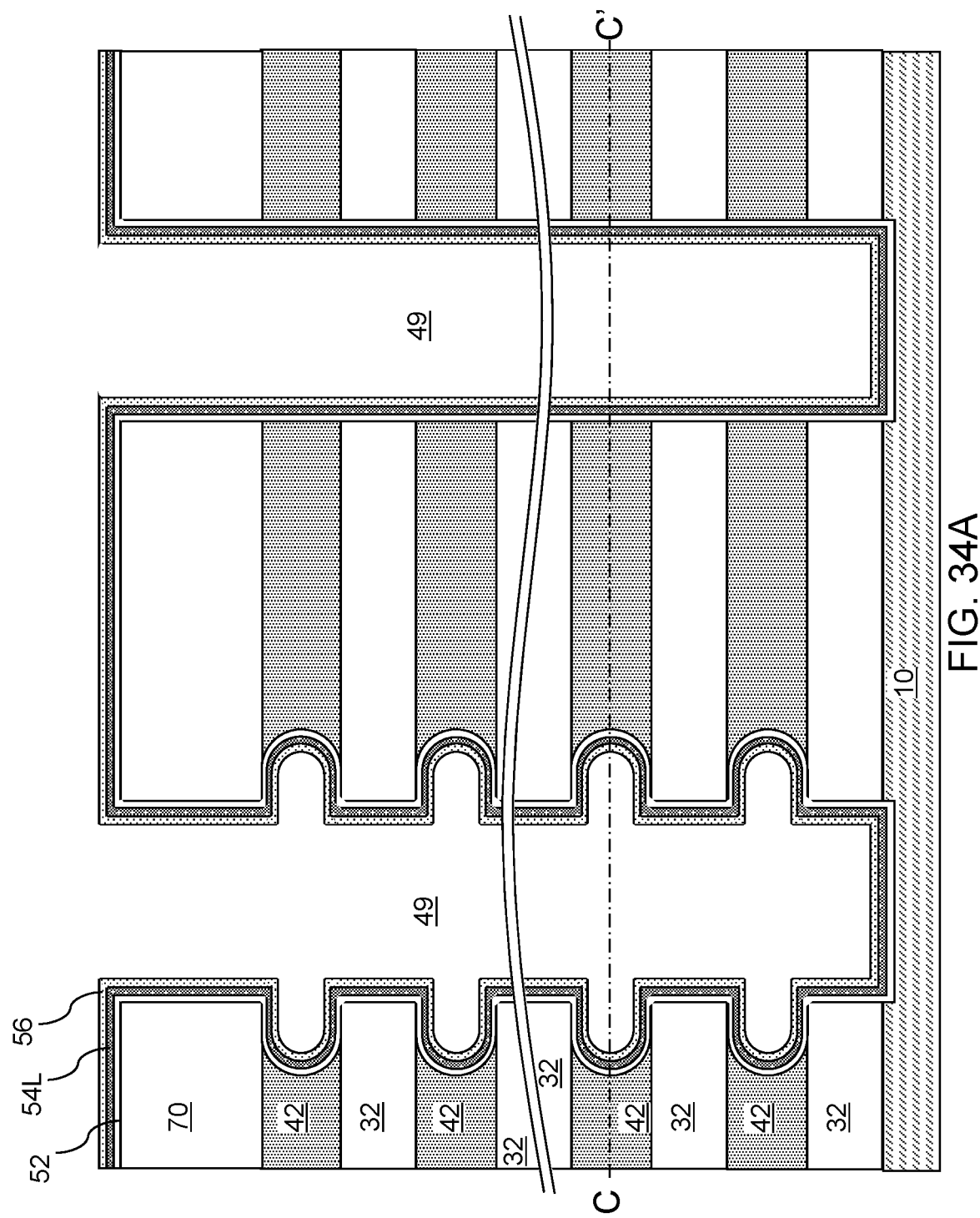
FIG. 34A is a first vertical cross-sectional view of a region of the second exemplary structure after formation of a continuous layer stack of a blocking dielectric layer, a charge storage material layer, and a tunneling dielectric layer according to the second embodiment of the present disclosure.
Figure 34C:
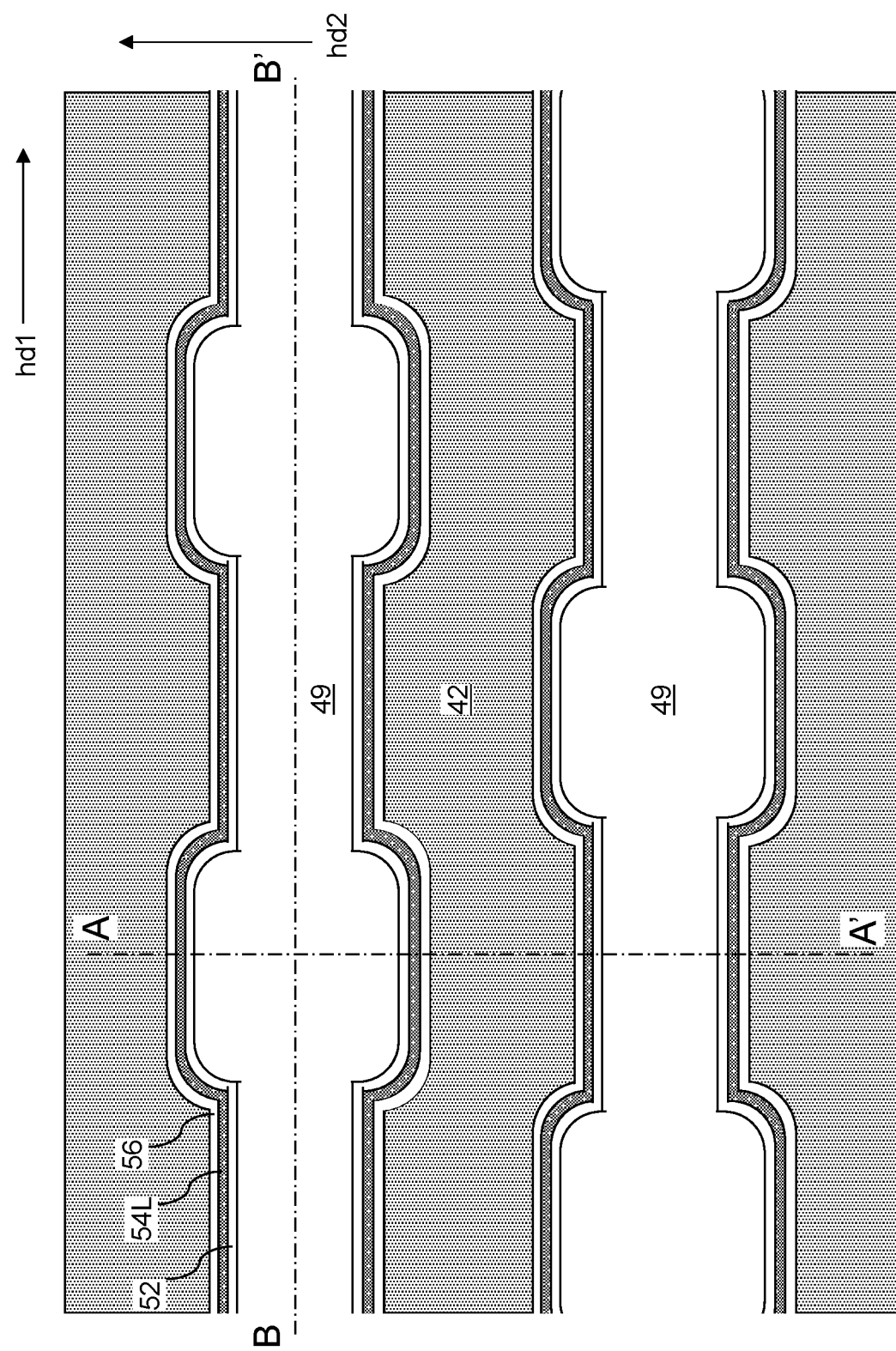
FIG. 34C is a horizontal cross-sectional view along the plane C-C' of FIGS. 34A and 34B. The vertical plane A-A' corresponds to the plane of the vertical cross-sectional view of FIG. 34A. The horizontal plane B-B' corresponds to the plane of the vertical cross-sectional view of FIG. 34B.

Referring to FIGS. 34A-34C, a continuous layer stack of a blocking dielectric layer 52, a charge storage material layer 54L, and a tunneling dielectric layer 56 may be formed on sidewalls of the line trenches 49. The blocking dielectric layer 52 is formed directly on sidewalls and bottom surfaces of the line trenches 49 by a conformal deposition process. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one other non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. Alternatively, or additionally, the blocking dielectric layer 52 may include a dielectric semiconductor compound such as silicon oxide, silicon oxynitride, silicon nitride, or a combination thereof. The thickness of blocking dielectric layer 52 may be in a range from 3 nm to 20 nm, although lesser and greater thicknesses may also be used.

Subsequently, the charge storage material layer 54L may be formed. The charge storage material layer 54L may be deposited over remaining portions of the alternating strips 42 after formation of the two-dimensional arrays of lateral recesses. In one embodiment, the charge storage material layer 54L may be a dielectric charge trapping material, which may be, for example, silicon nitride. The charge storage material layer 54L may be formed, for example, by chemical vapor deposition (CVD), atomic layer deposition (ALD), physical vapor deposition (PVD), or any suitable deposition technique for storing electrical charges therein. The thickness of the charge storage material layer 54L may be in a range from 2 nm to 20 nm, although lesser and greater thicknesses may also be used.

In an alternative embodiment, floating gate structures may be formed by anisotropically etching the charge storage material layer 54L. In this case, portions of the charge storage material layer 54L located within lateral recesses are not removed by the anisotropic etch process, and portions of the charge storage material layer 54L located outside the laterally recesses can be removed by the anisotropic etch process. A two-dimensional array of discrete floating gate structures can be formed within each two-dimensional array of lateral recesses located on each lengthwise sidewall of the line trenches 49. The set of all two-dimensional array of discrete floating gate structures constitutes a three-dimensional array of discrete floating gate structures.

The tunneling dielectric layer 56 is formed on the charge storage material layer 54L or the three-dimensional array of discrete floating gate structures. The tunneling dielectric layer 56 includes a dielectric material through which charge tunneling may be performed under suitable electrical bias conditions. The charge tunneling may be performed by Fowler-Nordheim tunneling. The tunneling dielectric layer 56 may include silicon oxide, silicon nitride, silicon oxynitride, dielectric metal oxides (such as aluminum oxide or hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used.

Figure 35A:
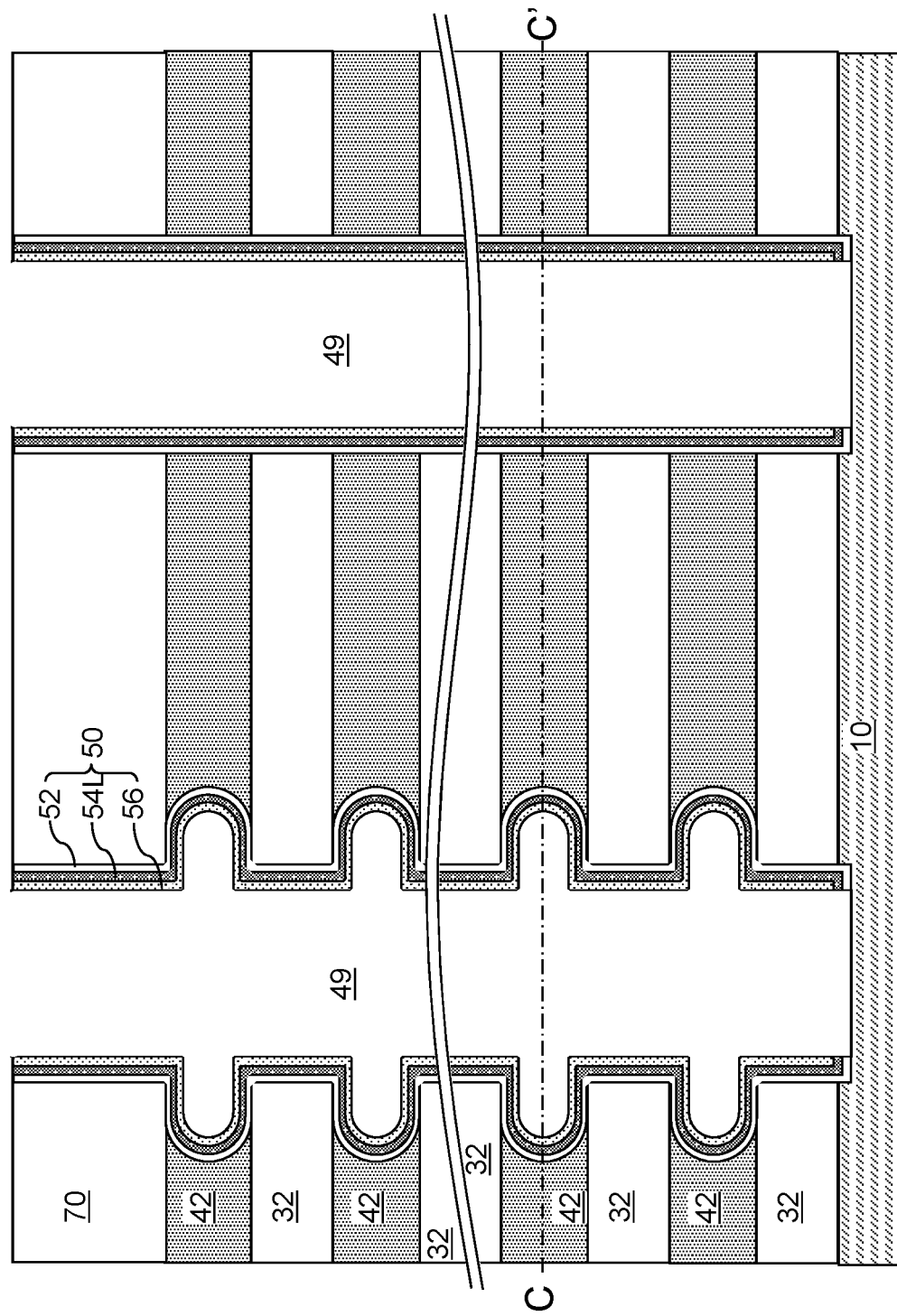
FIG. 35A is a first vertical cross-sectional view of a region of the second exemplary structure after anisotropically etching the continuous layer stack according to the second embodiment of the present disclosure.
Figure 35C:
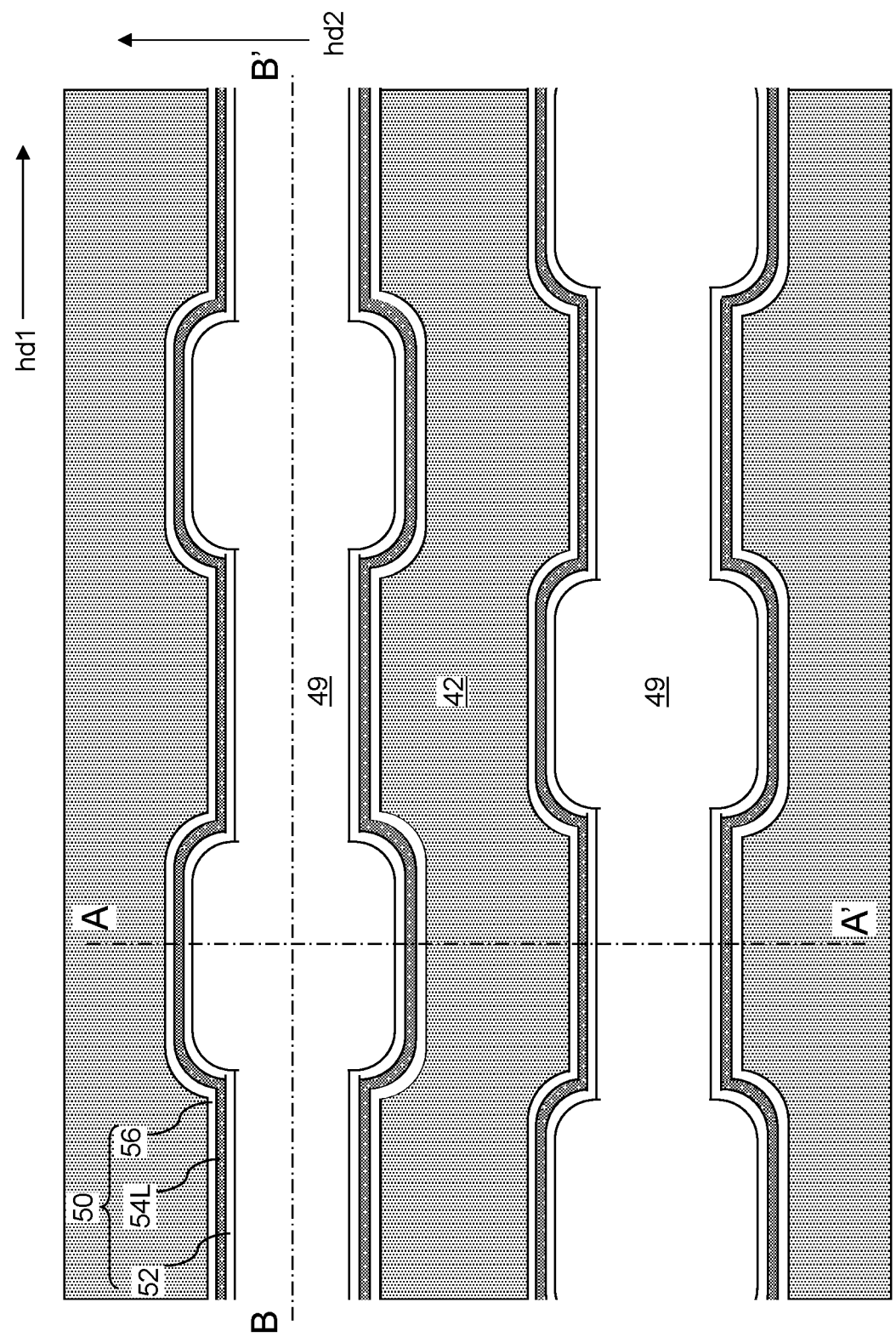
FIG. 35C is a horizontal cross-sectional view along the plane C-C' of FIGS. 35A and 35B. The vertical plane A-A' corresponds to the plane of the vertical cross-sectional view of FIG. 35A. The horizontal plane B-B' corresponds to the plane of the vertical cross-sectional view of FIG. 35B.

Referring to FIGS. 35A-35C, an anisotropic etch process may be performed to remove horizontal portions of the continuous layer stack of the blocking dielectric layer 52, the charge storage material layer 54L, and the tunneling dielectric layer 56. Horizontal portions of the continuous layer stack may be removed from the bottom of each line trench 49 and from above the insulating cap layers 70 during the anisotropic etch process. A top surface of the semiconductor material layer 10 may be physically exposed at the bottom of each line trench 49. Each layer in the continuous layer stack of the blocking dielectric layer 52, the charge storage material layer 54L, and the tunneling dielectric layer 56 is divided into multiple discrete portions. A layer stack of a blocking dielectric layer 52, a charge storage material layer 54L, and a tunneling dielectric layer 56 located on a lengthwise sidewall of a line trench 49 is herein referred to as a memory film 50.

Figure 36A:
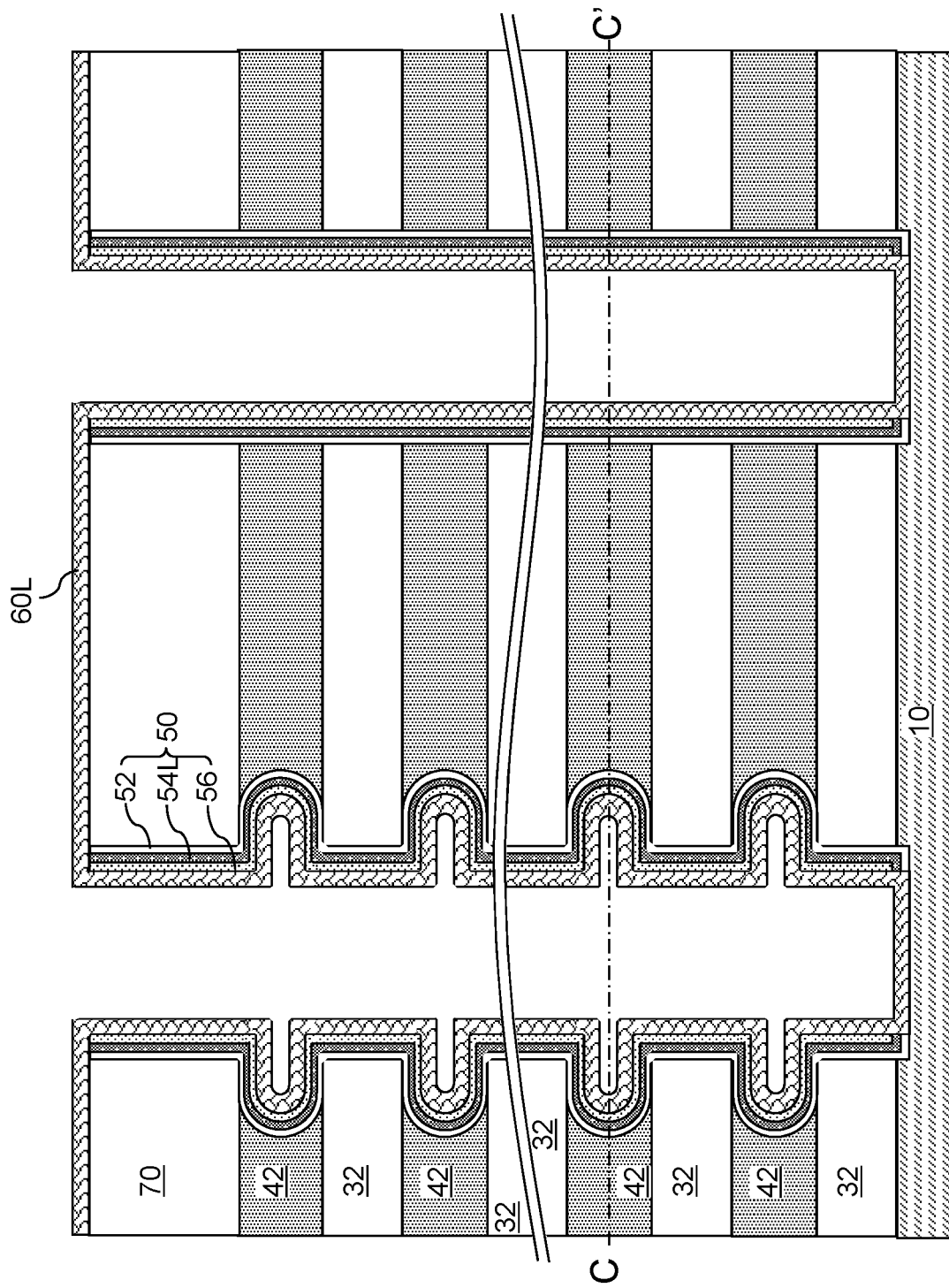
FIG. 36A is a first vertical cross-sectional view of a region of the second exemplary structure after formation of a semiconductor channel material layer according to the second embodiment of the present disclosure.
Figure 36C:
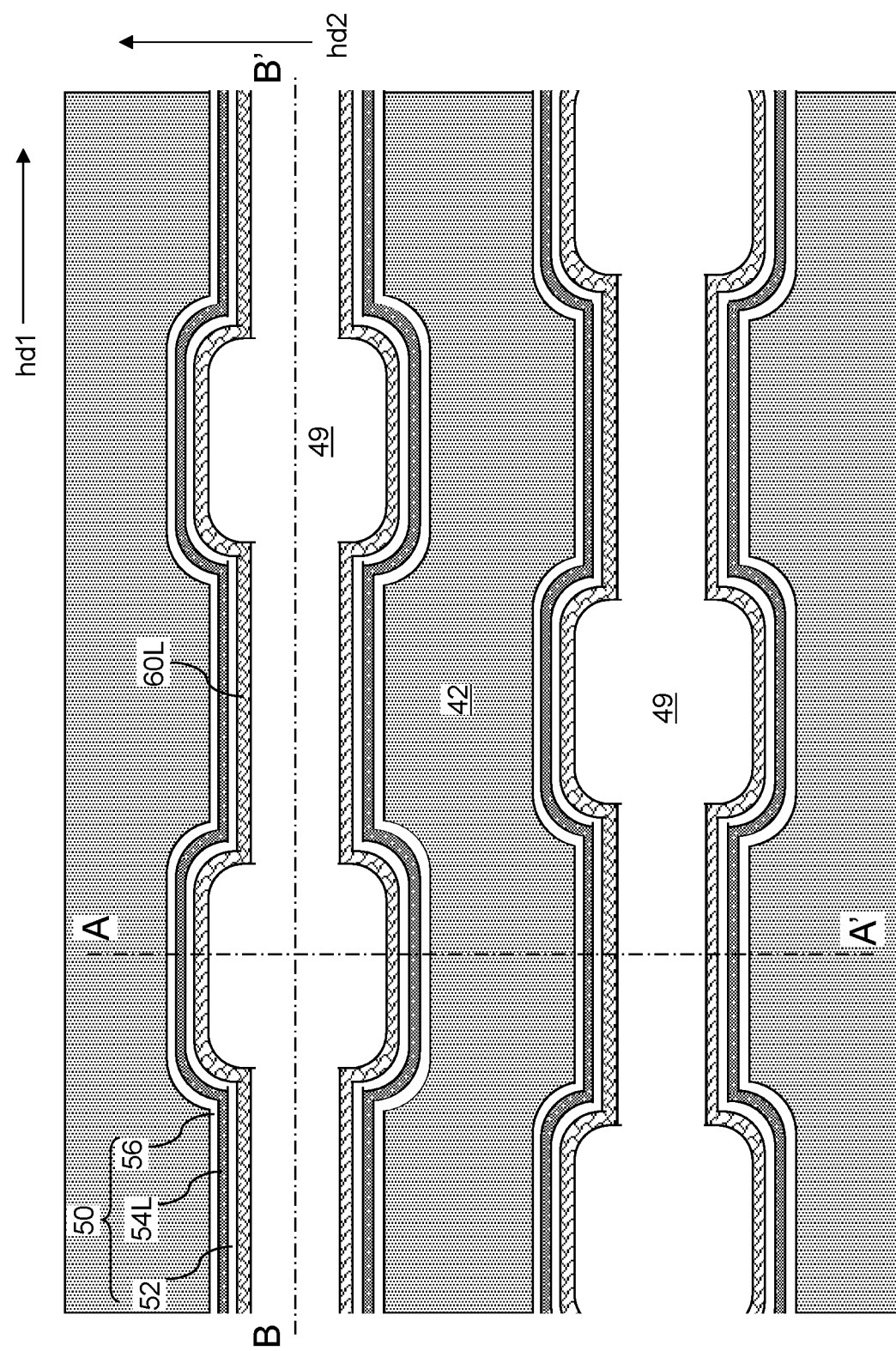
FIG. 36C is a horizontal cross-sectional view along the plane C-C' of FIGS. 36A and 36B. The vertical plane A-A' corresponds to the plane of the vertical cross-sectional view of FIG. 36A. The horizontal plane B-B' corresponds to the plane of the vertical cross-sectional view of FIG. 36B.

Referring to FIGS. 36A-36C, a semiconductor channel material layer 60L may be optionally formed on the memory films 50. The semiconductor channel material layer 60L may directly contact physically exposed top surfaces of the semiconductor material layer 10. The semiconductor channel material layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L includes amorphous silicon or polysilicon. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. In one embodiment, the semiconductor channel material layer 60L may have a doping of the first conductivity type, which is the same conductivity type as the conductivity type of the doping of the semiconductor material layer 10. In one embodiment, the semiconductor channel material layer 60L may comprise a semiconducting material including electrical dopants at an atomic concentration in a range from $1.0 \times 10^{14}/cm^3$ to $1.0 \times 10^{18}/cm^3$.

Figure 37A:
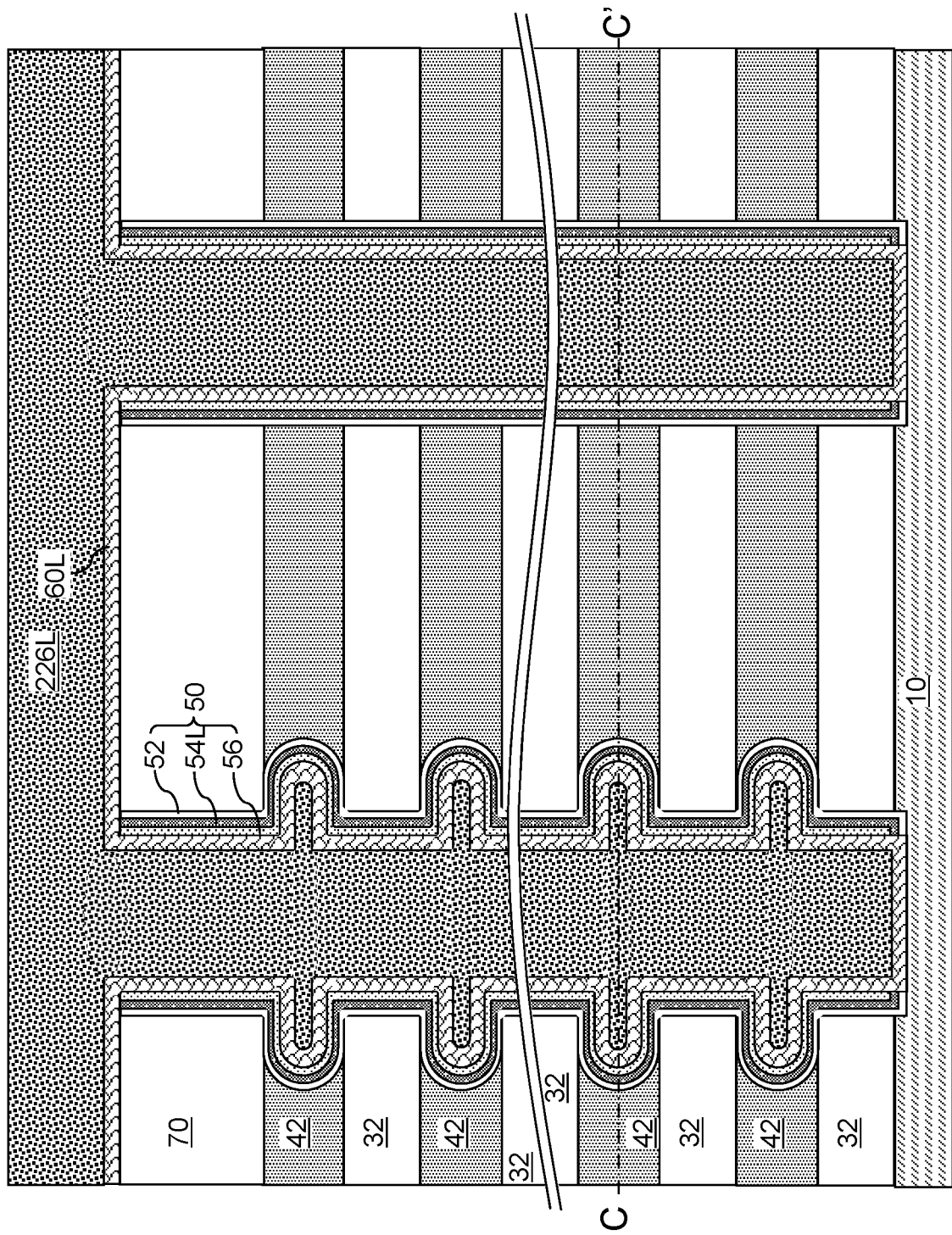
FIG. 37A is a first vertical cross-sectional view of a region of the second exemplary structure after formation of a masking material layer according to the second embodiment of the present disclosure.
Figure 37C:
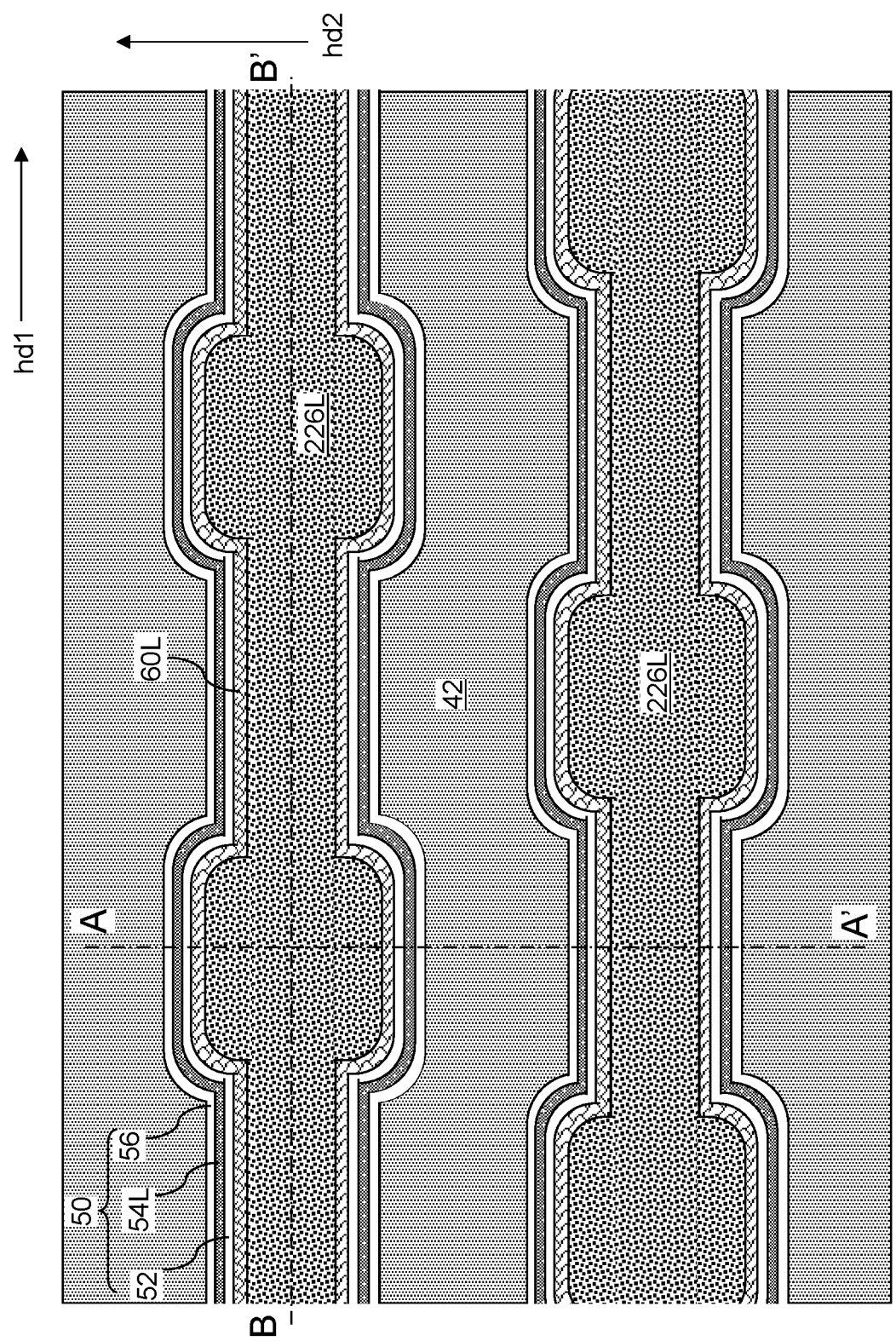
FIG. 37C is a horizontal cross-sectional view along the plane C-C' of FIGS. 37A and 37B. The vertical plane A-A' corresponds to the plane of the vertical cross-sectional view of FIG. 37A. The horizontal plane B-B' corresponds to the plane of the vertical cross-sectional view of FIG. 37B.

Referring to FIGS. 37A-37C, a masking material may be deposited in remaining volumes of the line trenches 49 to form a masking material layer 226L. In one embodiment, the masking material may include a carbon-based material. In one embodiment, the masking material may include spin-on-carbon that may be applied by spin coating and subsequently dried.

Figure 38A:
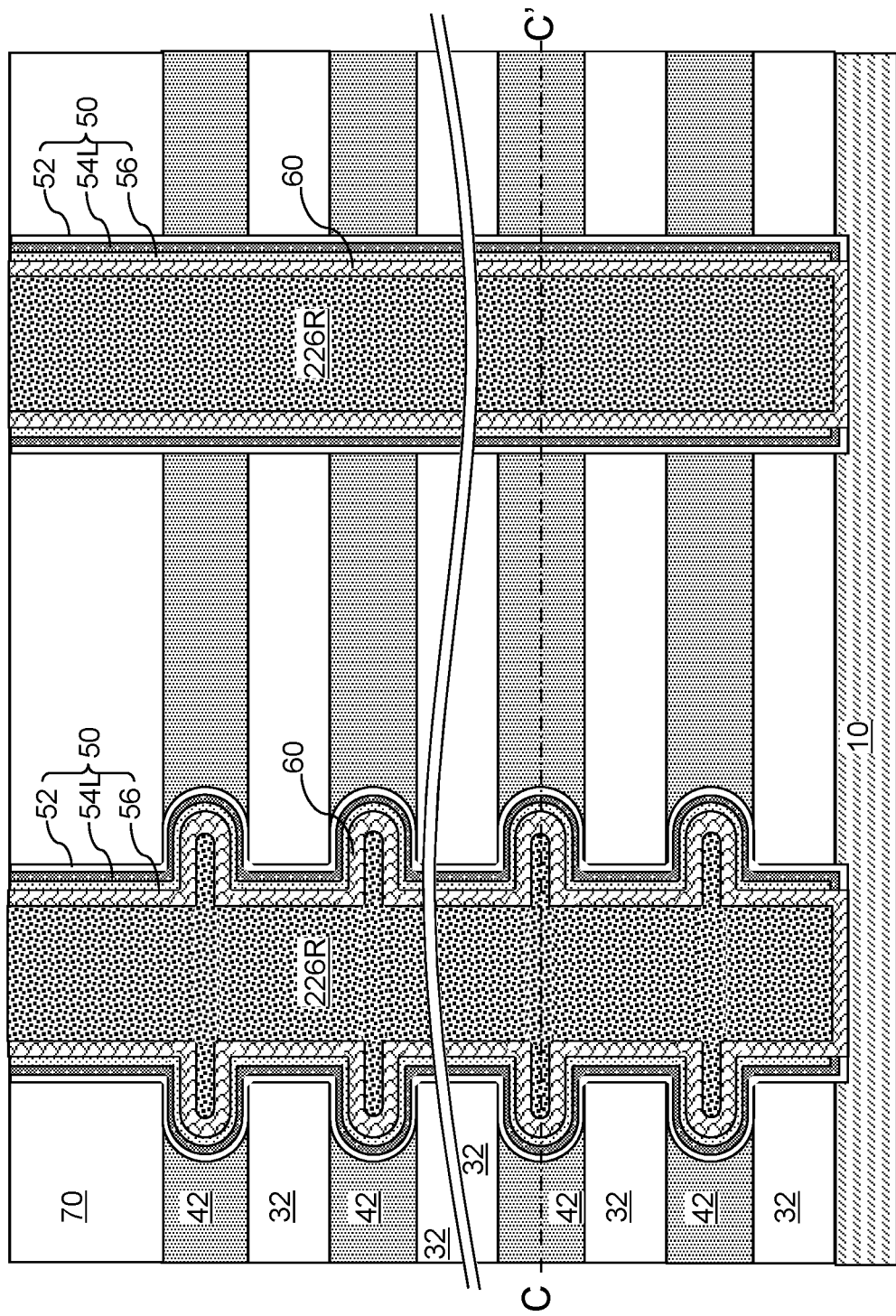
FIG. 38A is a first vertical cross-sectional view of a region of the second exemplary structure after formation of second masking rails according to the second embodiment of the present disclosure.
Figure 38B:
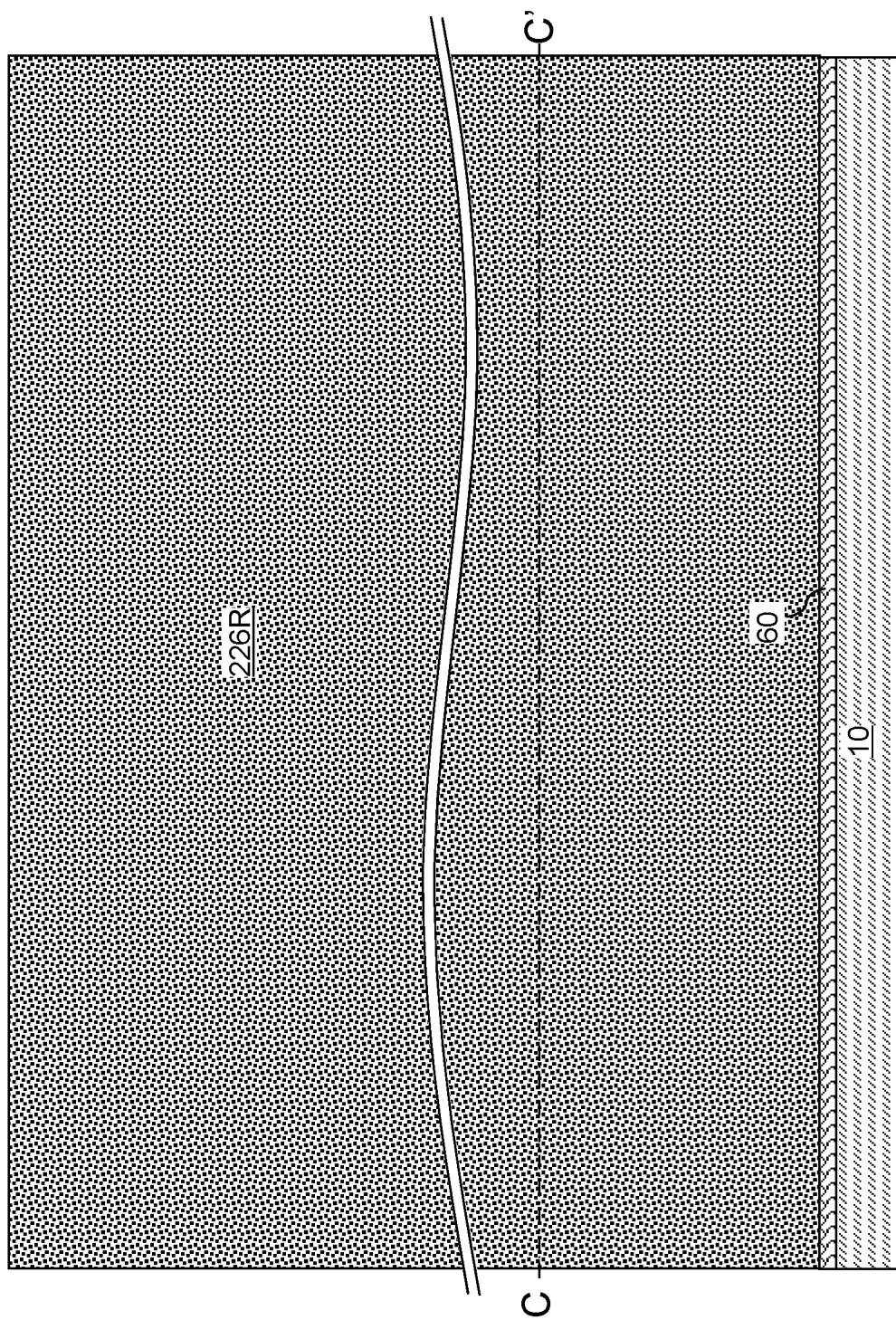
FIG. 38B is a second vertical cross-sectional view of the region of the second exemplary structure of FIG. 38A.
Figure 38C:
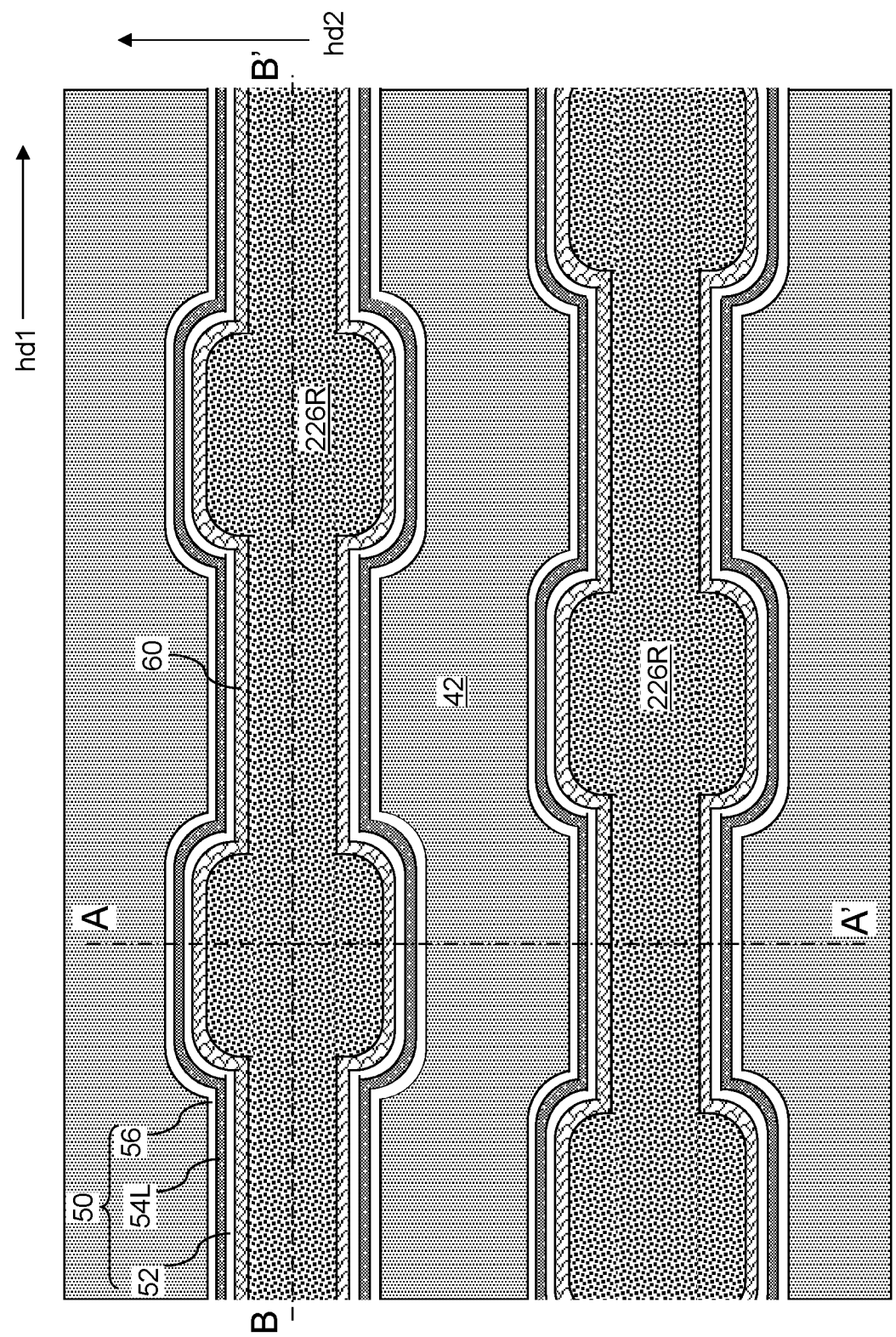
FIG. 38C is a horizontal cross-sectional view along the plane C-C' of FIGS. 38A and 38B. The vertical plane A-A' corresponds to the plane of the vertical cross-sectional view of FIG. 38A. The horizontal plane B-B' corresponds to the plane of the vertical cross-sectional view of FIG. 38B.

Referring to FIGS. 38A-38C, excess portions of the masking material may be removed from above the top surfaces of the insulating cap layers 70. Remaining portions of the masking material in the line trenches 49 constitute second masking material rails 226R. The second masking material rails 226R may have a laterally-modulating horizontal cross-sectional profile in horizontal cross-sectional views and a laterally-modulating vertical cross-sectional profile in vertical cross-sectional views that are perpendicular to the lengthwise direction of the second masking material rails 226R. Horizontal portions of the semiconductor channel material layer 60L overlying the insulating cap layers 70 may be subsequently removed, for example, by a recess etch.

Figure 39A:
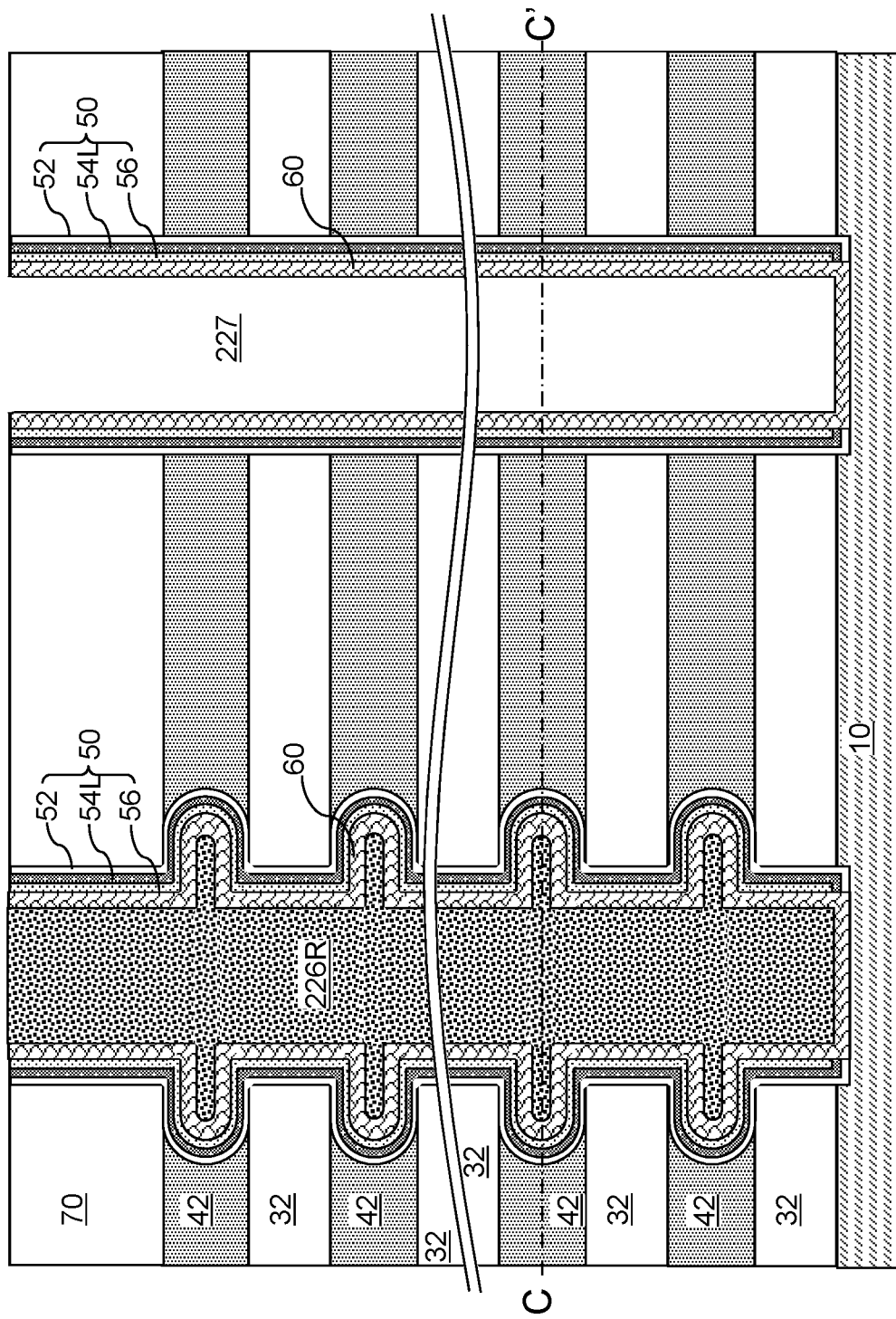
FIG. 39A is a first vertical cross-sectional view of a region of the second exemplary structure after formation of a two-dimensional array of masking material pillars according to the second embodiment of the present disclosure.
Figure 39B:
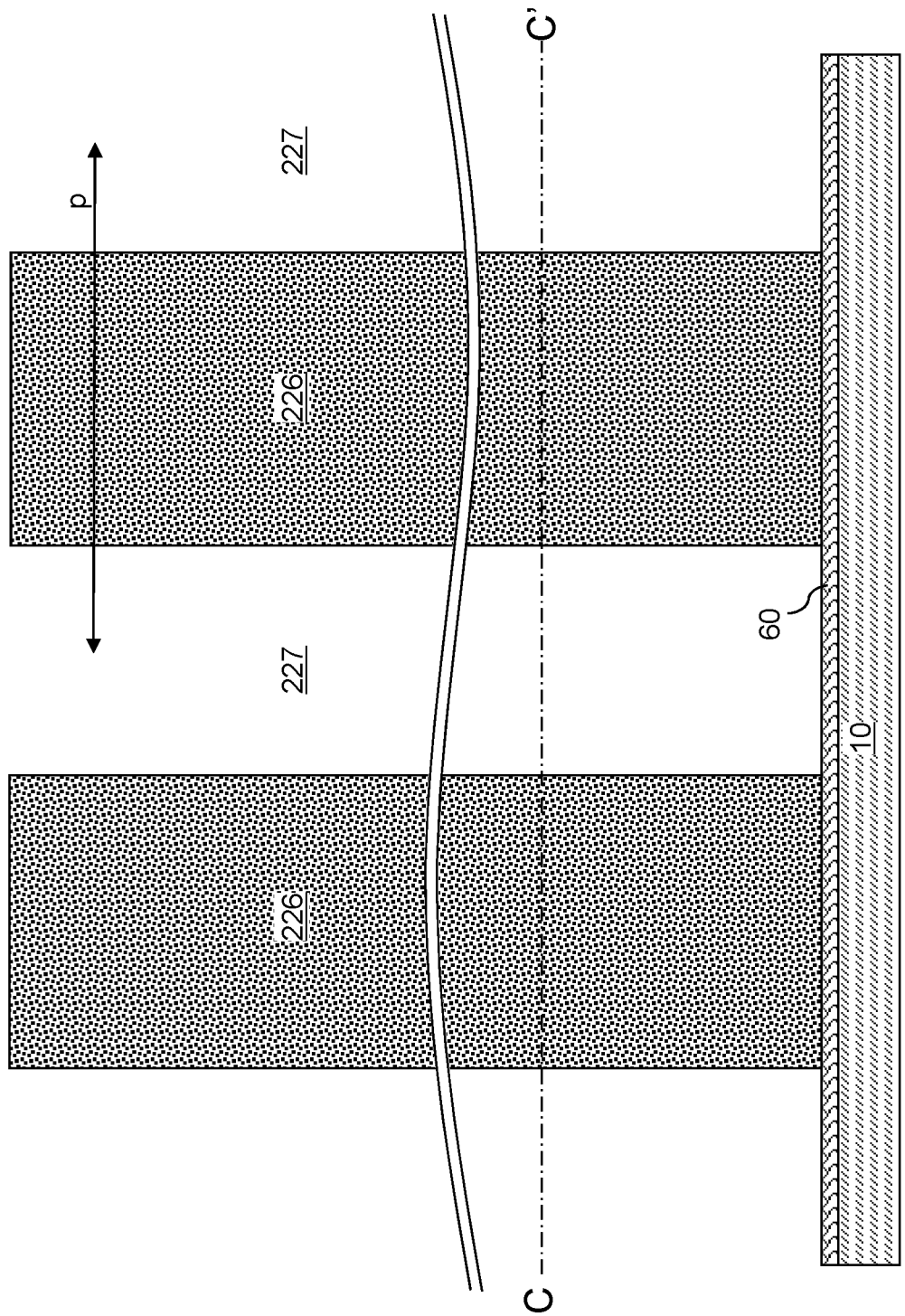
FIG. 39B is a second vertical cross-sectional view of the region of the second exemplary structure of FIG. 39A.
Figure 39C:
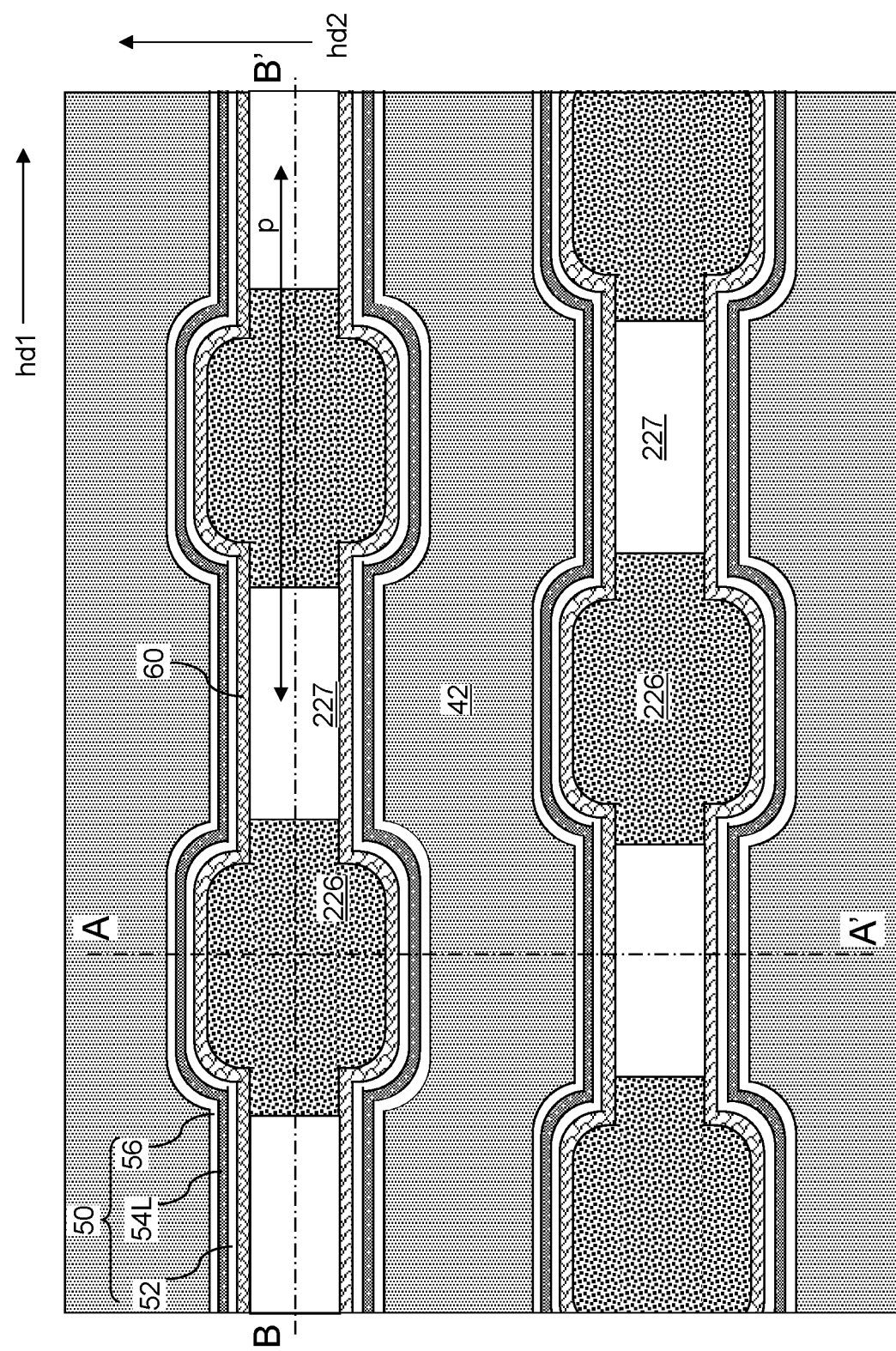
FIG. 39C is a horizontal cross-sectional view along the plane C-C' of FIGS. 39A and 39B. The vertical plane A-A' corresponds to the plane of the vertical cross-sectional view of FIG. 39A. The horizontal plane B-B' corresponds to the plane of the vertical cross-sectional view of FIG. 39B.

Referring to FIGS. 39A-39C, a photoresist layer (not shown) may be applied over the first exemplary structure and may be subsequently patterned to form an array of openings. In one embodiment, the array of openings in the photoresist layer may be a two-dimensional periodic array of discrete openings. In one embodiment, the two-dimensional periodic array of discrete openings may include rows of openings that overlie a respective one of the line trenches 49. The row-to-row pitch within the two-dimensional periodic array of discrete openings may be the same as the center-to-center pitch between the line trenches 49. Each row of openings may have a periodic one-dimensional array of openings with the regular pitch p, which is the lateral distance between center points of a two-dimensional array of lateral recesses within the sacrificial material strips 42 in an alternating stack (32, 42). In one embodiment, the locations of the openings in the photoresist layer may be laterally offset from the locations of opening in the photoresist layer used at the processing steps of FIGS. 31A-31C by one half of the regular pitch p.

An anisotropic etch process that etches the material of the second masking material rails 222R selective to the materials of the alternating stacks (32, 42), the memory film 50, and the semiconductor channel material layer 60L may be performed to transfer the pattern of the openings in the photoresist layer through the second masking material rails 226R. Each remaining portion of the second masking material rails 226R may have a rectangular pillar shape, and is herein referred to as a second masking material pillar 226. A two-dimensional array of second masking material pillars 226 may be formed. Neighboring pairs of second masking material pillars 226 in a line trench 49 are laterally spaced apart by a second pillar-shaped cavity 227. Each second pillar-shaped cavity 227 may have a rectangular horizontal cross-sectional shape. A row of second masking material pillars 226 is formed within each line trenches 49. Each row of second masking material pillars 226 is interlaced with a row of second pillar-shaped cavities 227 within a respective line trench 49. The second masking material pillars 226 may be formed in areas in which a pair of concave sidewalls of two second sacrificial material rails 42 facing a same line trench 49 is laterally spaced apart by a maximum lateral spacing. The second pillar-shaped cavities 227 may be formed in gap areas between neighboring pairs of unrecessed sidewalls of the sacrificial material strips 42.

Figure 40A:
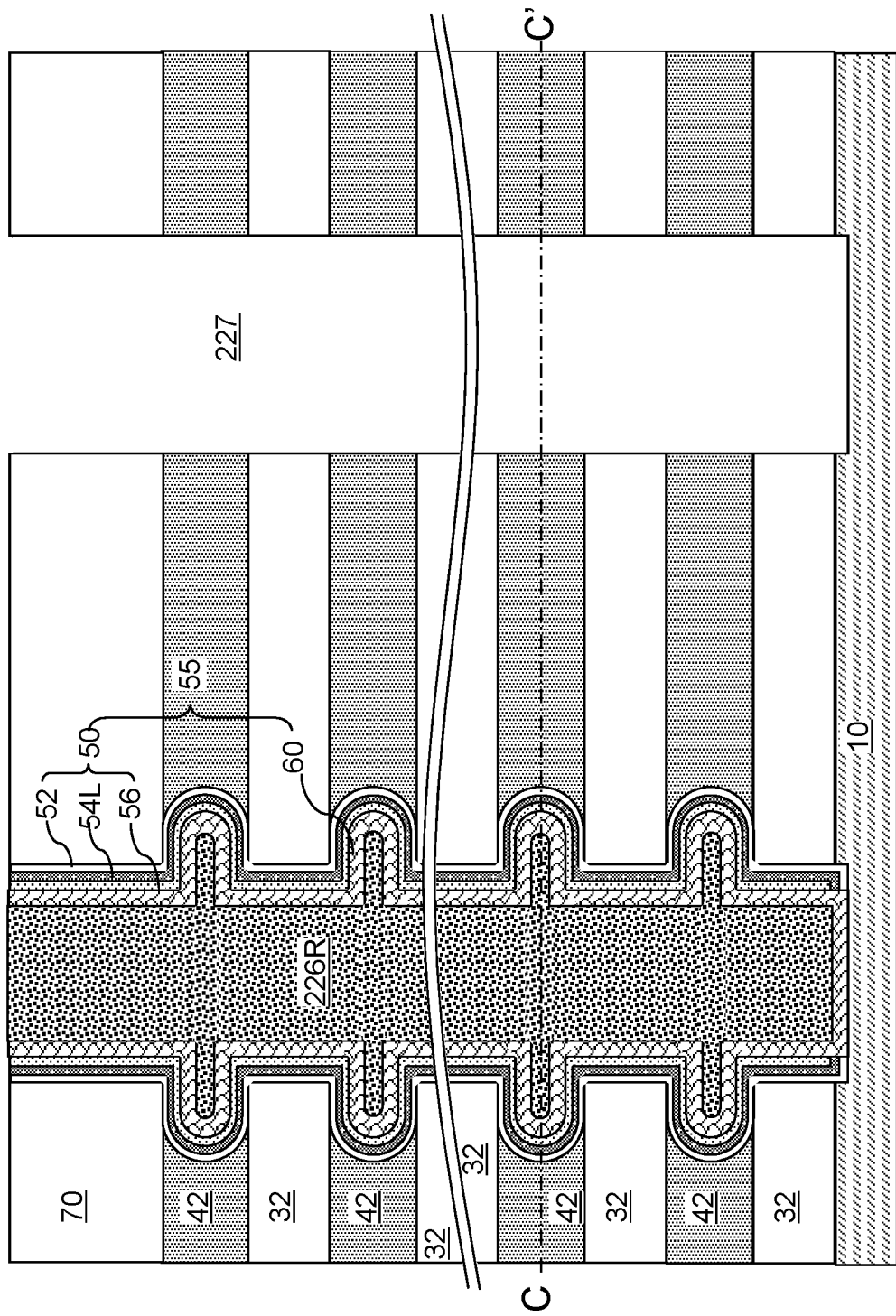
FIG. 40A is a first vertical cross-sectional view of a region of the second exemplary structure after formation of material stack strips that include a blocking dielectric layer, a charge storage material layer, a tunneling dielectric layer, and a vertical semiconductor channel according to the second embodiment of the present disclosure.
Figure 40C:
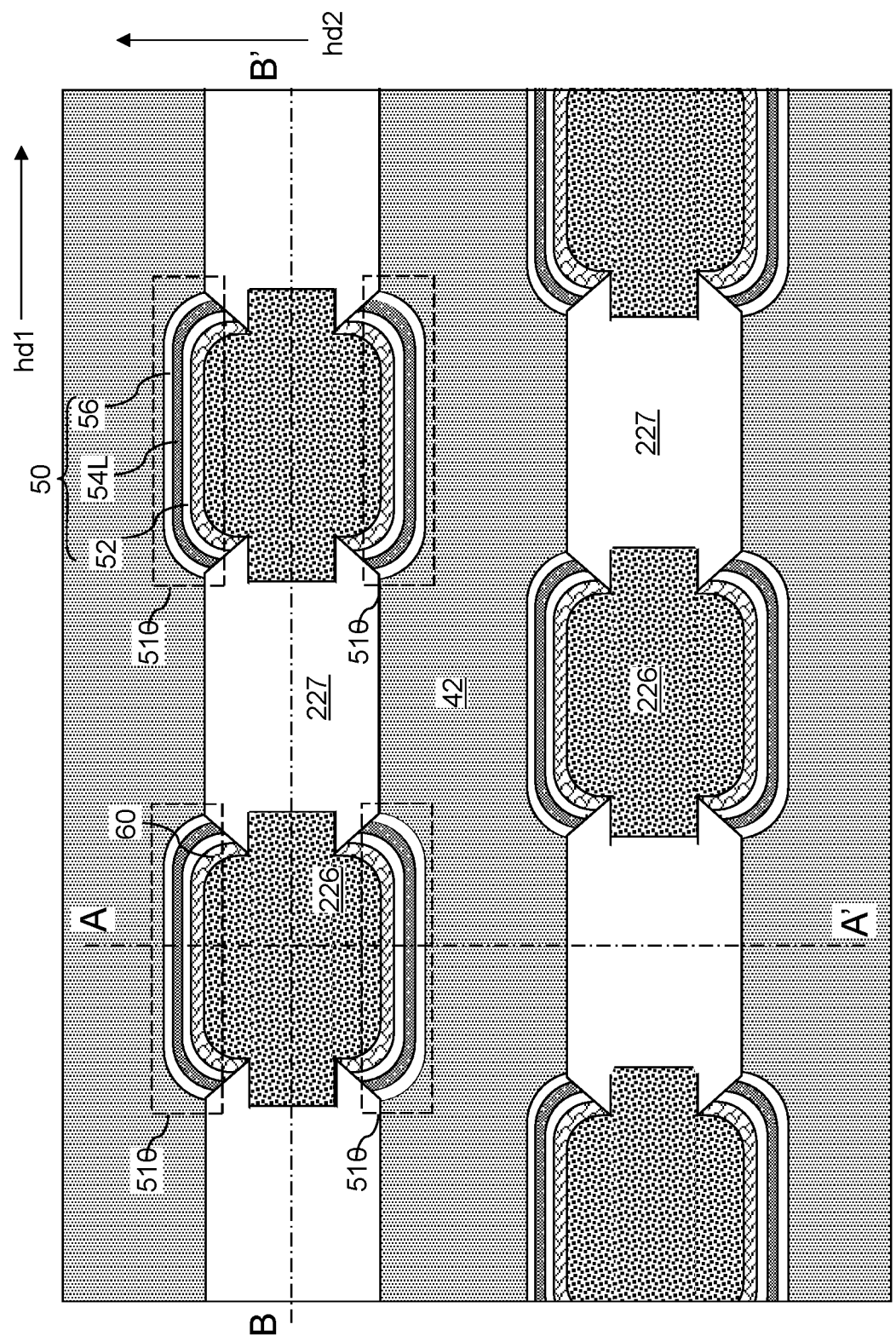
FIG. 40C is a horizontal cross-sectional view along the plane C-C' of FIGS. 40A and 40B. The vertical plane A-A' corresponds to the plane of the vertical cross-sectional view of FIG. 40A. The horizontal plane B-B' corresponds to the plane of the vertical cross-sectional view of FIG. 40B.

Referring to FIGS. 40A-40C, an isotropic etch process is performed to etch physically exposed portions of the semiconductor channel material layer 60L around each second pillar-shaped cavity 227. For example, a wet etch process using tetramethyl ammonium hydroxide (TMAH) may be performed to etch the semiconductor materials of the semiconductor channel material layer 60L. Each remaining portion of the semiconductor channel material layer 60L covered by the second masking material pillar 226 constitutes a vertical semiconductor channel 60. A row of vertical semiconductor channels 60 is formed over each tunneling dielectric layer 56. A two-dimensional array of lateral protrusion regions 510 is provided on each lengthwise sidewall of the line trenches 49.

At least one isotropic etch process is performed to etch unmasked portions of the memory films 50. For example, a series of wet etch processes may be used to sequentially etch unmasked portions of the tunneling dielectric layer 56, the charge storage material layer 54L, and the blocking dielectric layer 52 around each second pillar-shaped cavity 227. Portions of the memory films 50 that are not masked by the second masking material pillars 226 are isotropically etched. Remaining portions of the tunneling dielectric layer 56, the charge storage material layer 54L, and the blocking dielectric layer 52 have a respective strip shape, and is located adjacent to a respective one of the vertical semiconductor channels 60.

Remaining portions of the memory films 50 and the vertical semiconductor channels 60 constitute the material stack strips that extends over a vertical stack of lateral recesses into sacrificial material strips 42. Each of the material stack strips includes a blocking dielectric layer 52 that contacts insulating strips 32 within the respective one of the alternating stacks (32, 42), a charge storage material layer 54L contacting the blocking dielectric layer 52 and comprising a vertical stack of charge storage elements, a tunneling dielectric layer 56 contacting the charge storage material layer 54L, and a vertical semiconductor channel 60 contacting the tunneling dielectric layer 56. Each material stack strip is herein referred to as a memory stack structure 55, which includes a memory film 50 (as patterned into a strip shape) and a vertical semiconductor channel 60.

Each memory film 50 within a line trench 49 is divided into a row of memory films 50 that are laterally spaced apart. Each combination of a vertical semiconductor channel 60 and a memory film 50 constitutes a memory stack structure 55. Each memory stack structure 55 include a vertical stack of memory elements embodied as portions of a charge storage material layer 54L that are located at the levels of the sacrificial material strips 42. Each vertical semiconductor channel 60 laterally overlie a respective vertical stack of charge storage material layer 54L. Each line trench 49 may include two rows of material stack strips (comprises memory stack structures 55) that extend vertically and laterally overlie sidewalls of a respective one of the alternating stacks (32, 42). Each row of material stack strips includes a respective plurality of material stack strips that are laterally spaced apart along the first horizontal direction hd1. Each of the material stack strips comprises a respective charge storage material layer 54L including charge storage elements within each a respective vertical stack of lateral recesses selected from the two-dimensional arrays of lateral recesses.

Each charge storage element is embodied as a portion of a charge storage material layer 54L located at a level of a sacrificial material strip 42, and has a pair of concave inner sidewall segments connected by a straight inner sidewall segment as illustrated in FIG. 40C. The pair of concave inner sidewall segments of each charge storage element contacts a pair of convex outer sidewall segments of a vertical semiconductor channel 60. The straight inner sidewall segment of each charge storage element contacts a straight outer sidewall segment of a vertical semiconductor channel 60 as illustrated in FIG. 40C. Each charge storage element has a pair of convex outer sidewall segments having a respective horizontally convex profile in a horizontal cross-sectional view. The pair of convex outer sidewall segments may be connected to each other by a straight outer sidewall segment. The pair of convex outer sidewall segments of each charge storage element contacts a pair of concave inner sidewall segments of a blocking dielectric layer 52. The straight outer sidewall segment of each charge storage element contacts a straight inner sidewall segment of a blocking dielectric layer 52 as illustrated in FIG. 40C.

Figure 41A:
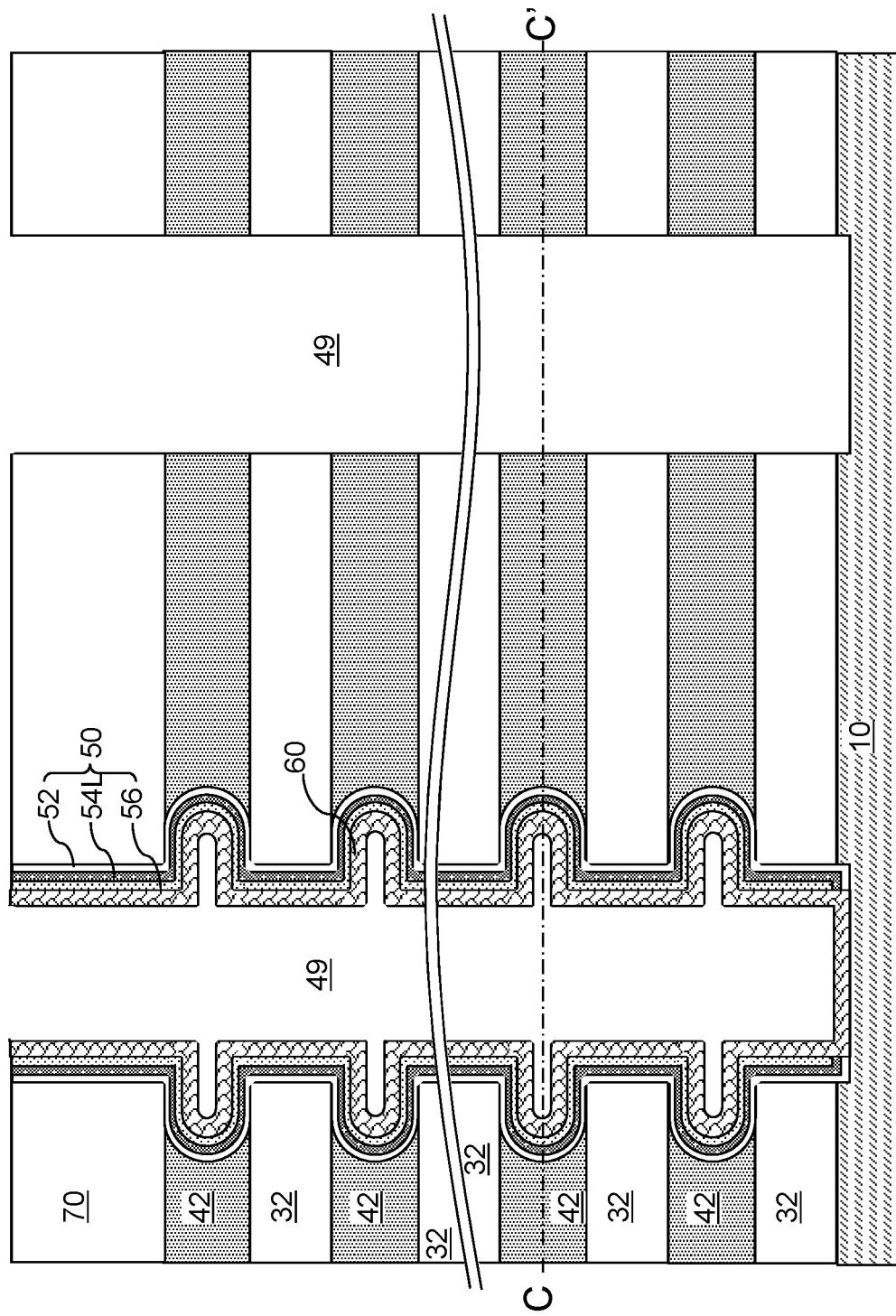
FIG. 41A is a first vertical cross-sectional view of a region of the second exemplary structure after removal of the two-dimensional array of masking material pillars according to the second embodiment of the present disclosure.
Figure 41C:
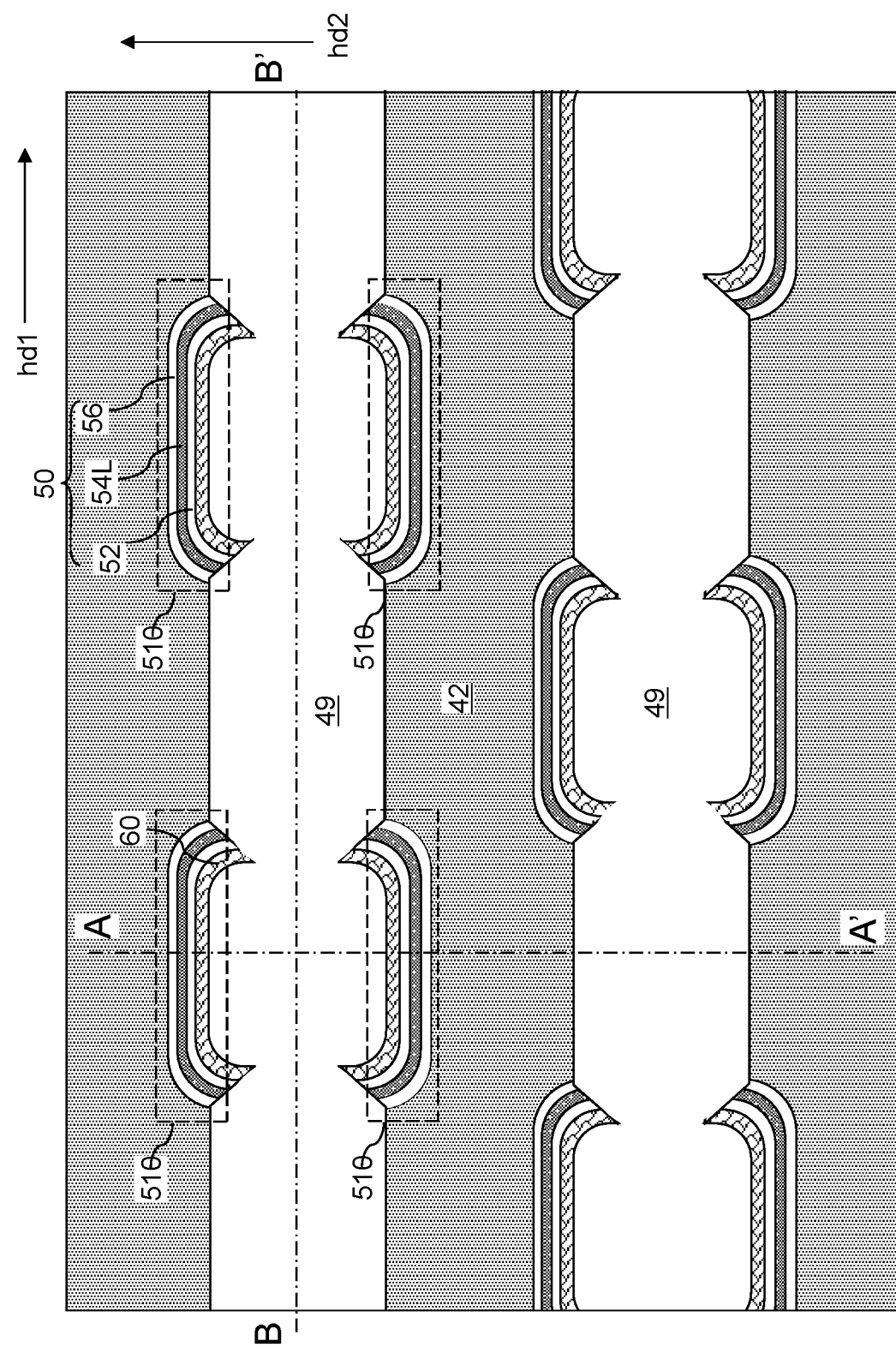
FIG. 41C is a horizontal cross-sectional view along the plane C-C' of FIGS. 41A and 41B. The vertical plane A-A' corresponds to the plane of the vertical cross-sectional view of FIG. 41A. The horizontal plane B-B' corresponds to the plane of the vertical cross-sectional view of FIG. 41B.

Referring to FIGS. 41A-41C, the second masking material pillar 226 may be removed selective to the vertical semiconductor channels 60 and the memory film 50. For example, the second masking material pillars 226 may be removed by ashing.

Figure 42A:
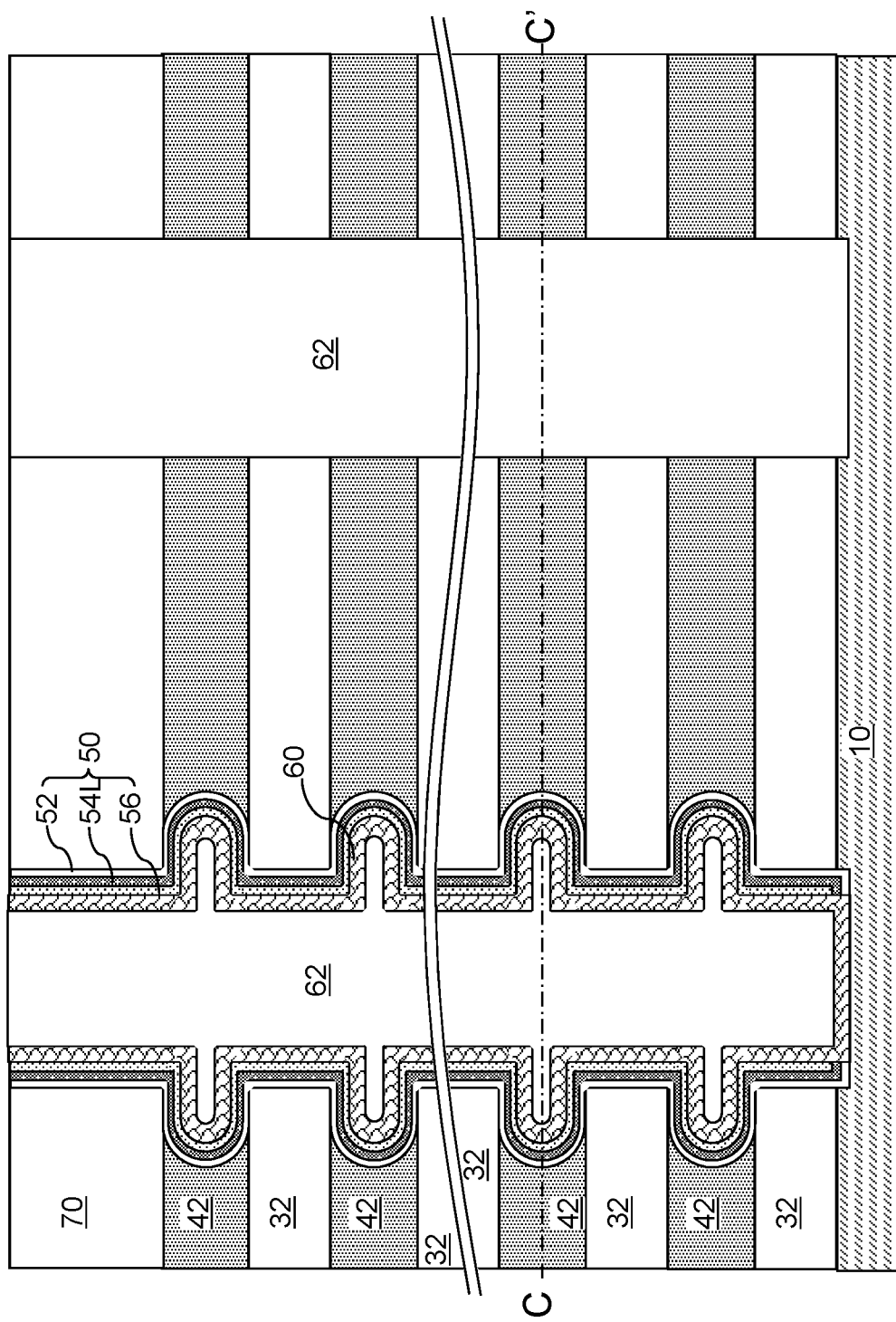
FIG. 42A is a first vertical cross-sectional view of a region of the second exemplary structure after formation of dielectric cores according to the second embodiment of the present disclosure.
Figure 42B:
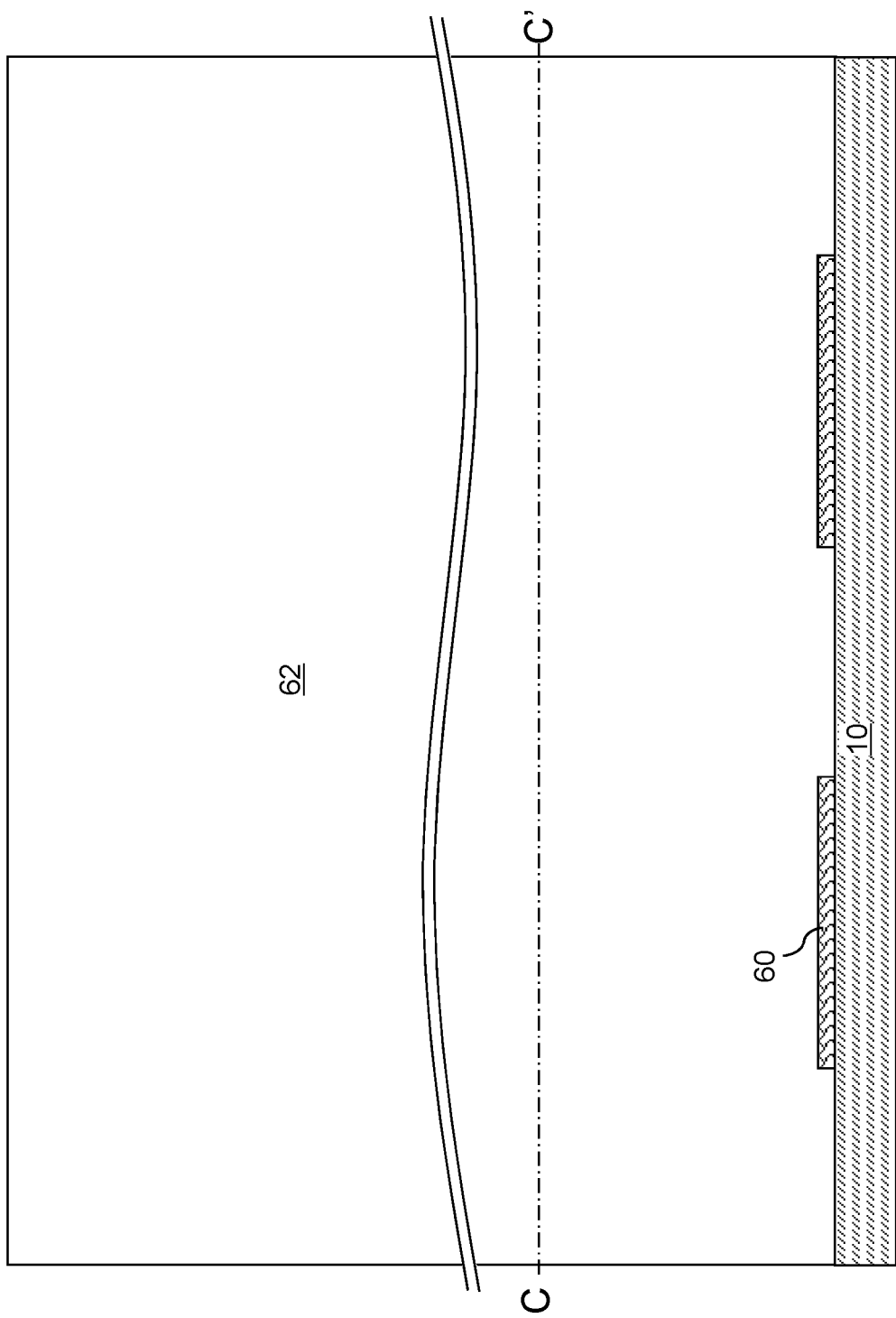
FIG. 42B is a second vertical cross-sectional view of the region of the second exemplary structure of FIG. 42A.
Figure 42C:
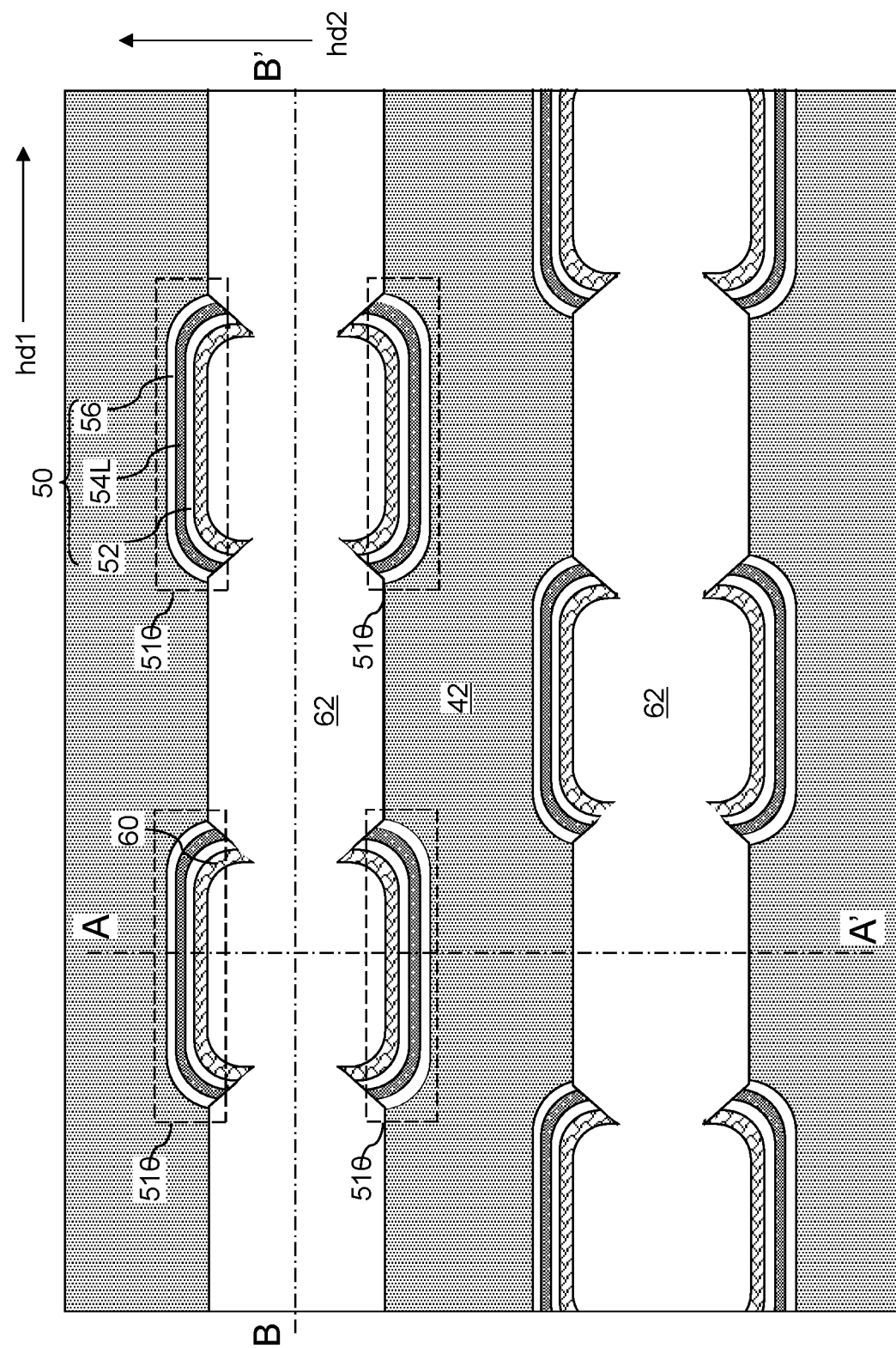
FIG. 42C is a horizontal cross-sectional view along the plane C-C' of FIGS. 42A and 42B. The vertical plane A-A' corresponds to the plane of the vertical cross-sectional view of FIG. 42A. The horizontal plane B-B' corresponds to the plane of the vertical cross-sectional view of FIG. 42B.
Figure 43A:
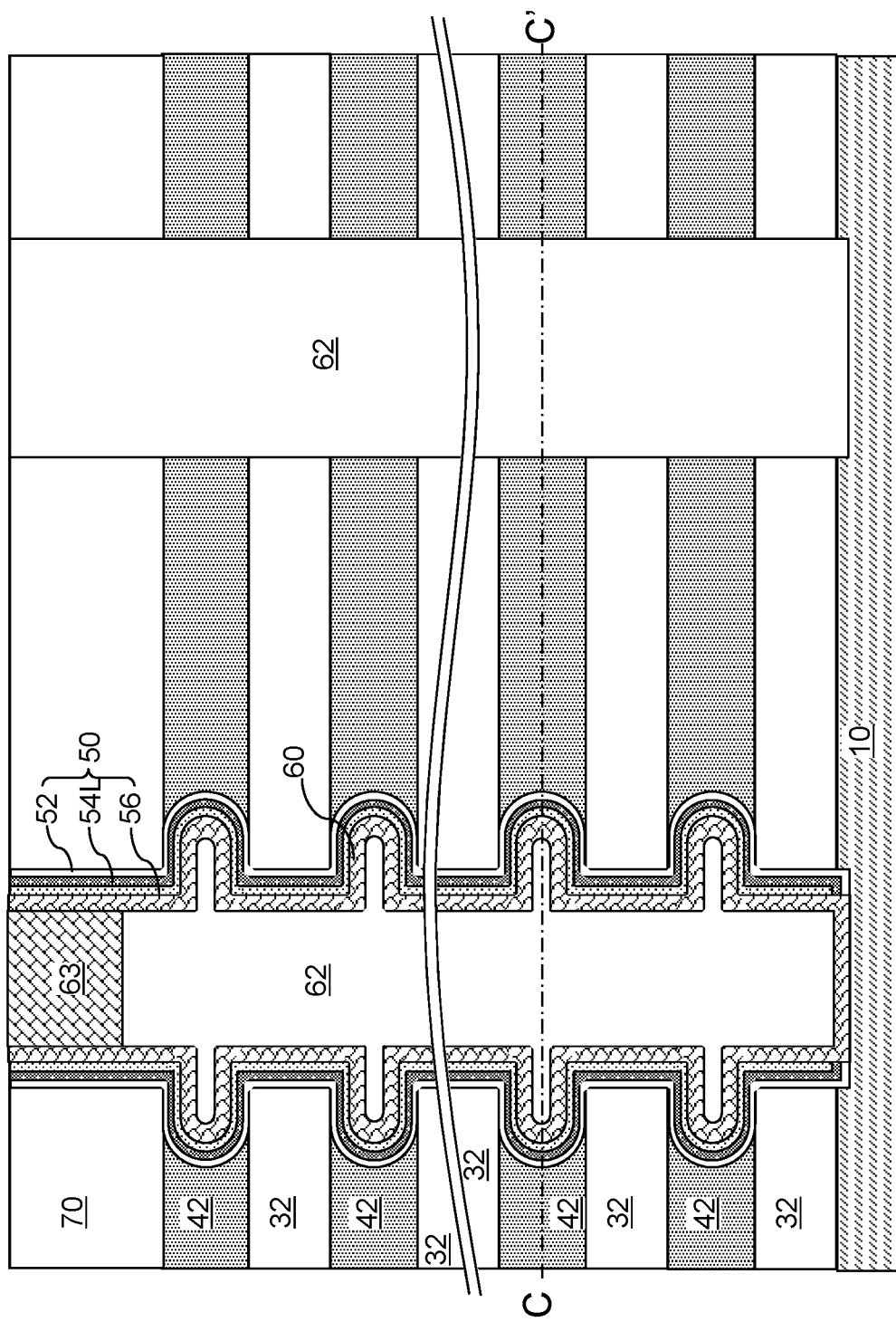
FIG. 43A is a first vertical cross-sectional view of a region of the second exemplary structure after formation of drain regions according to the second embodiment of the present disclosure.
Figure 43C:
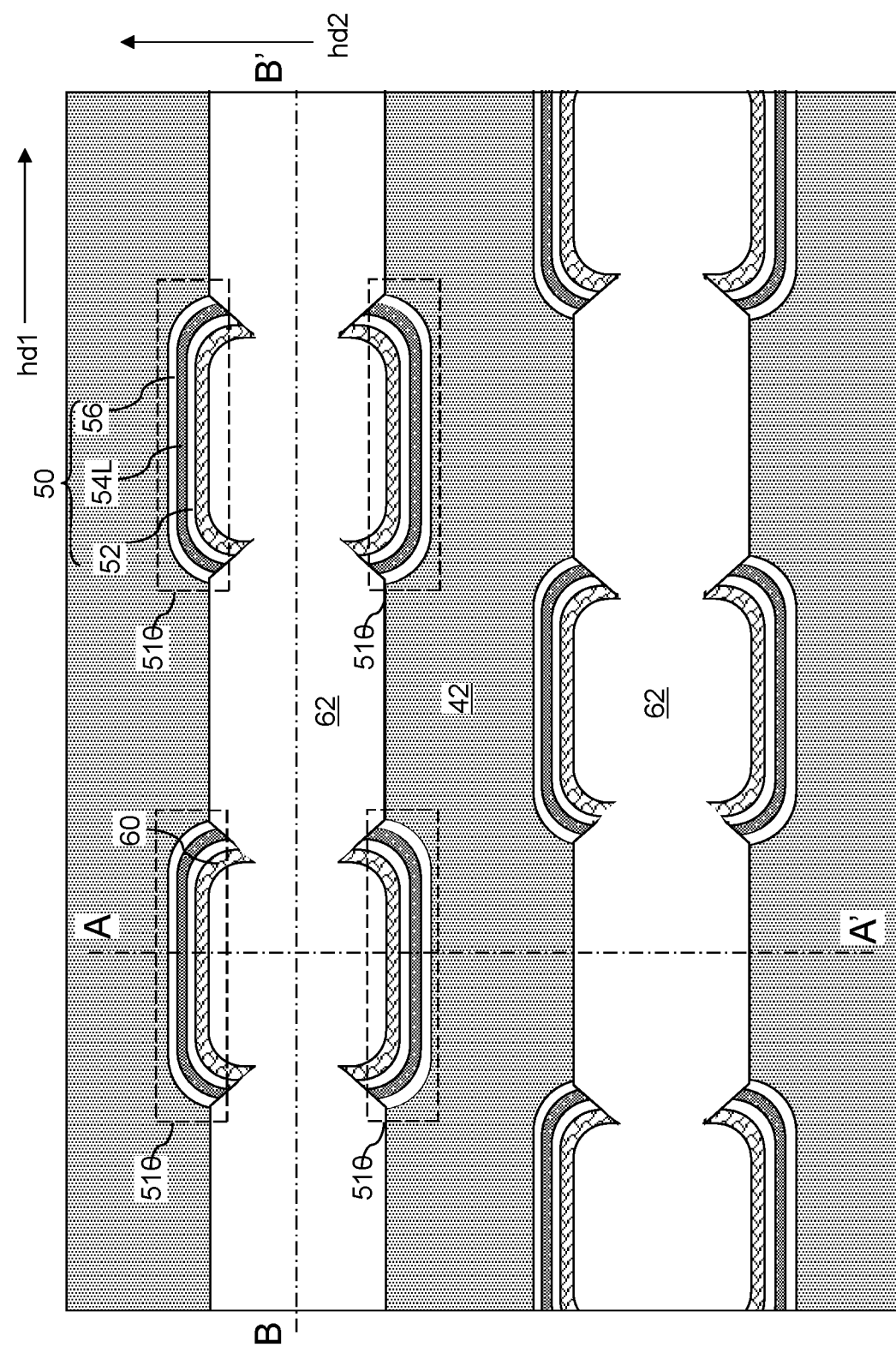
FIG. 43C is a horizontal cross-sectional view along the plane C-C' of FIGS. 43A and 43B. The vertical plane A-A' corresponds to the plane of the vertical cross-sectional view of FIG. 43A. The horizontal plane B-B' corresponds to the plane of the vertical cross-sectional view of FIG. 43B.
Figure 43D:
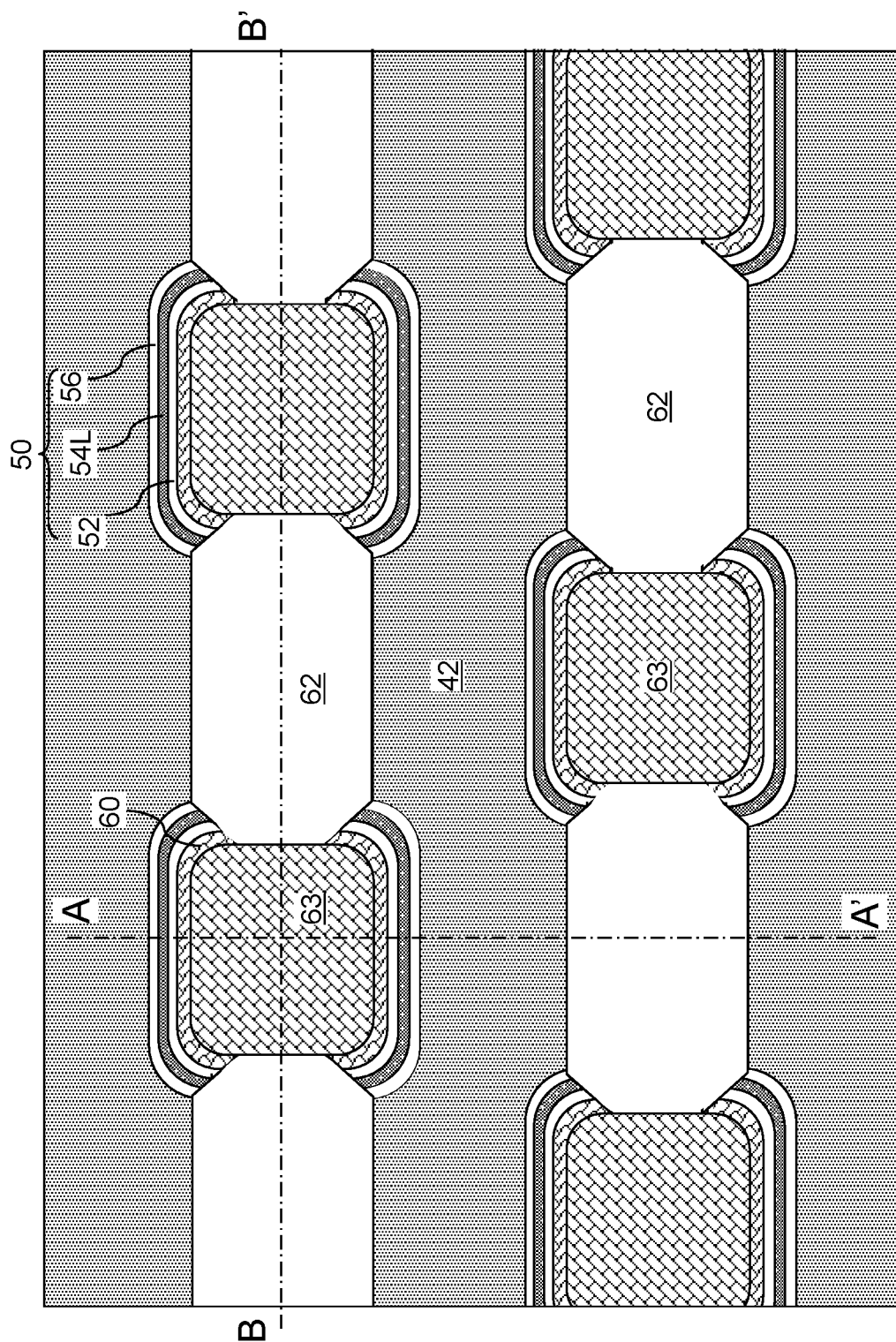
FIG. 43D is a top-down view of the region of the second exemplary structure of FIGS. 43A-43C.
Figure 44A:
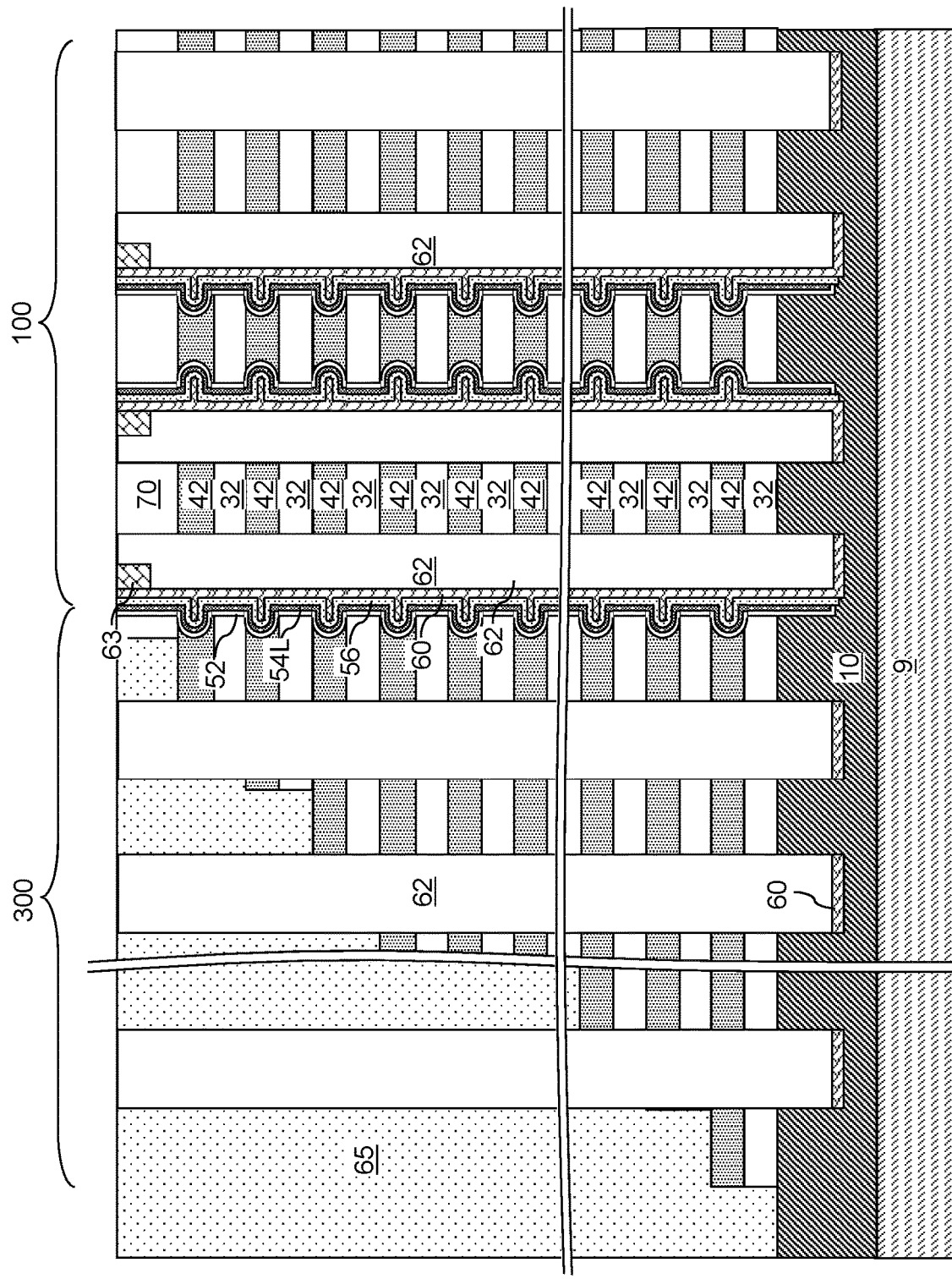
FIG. 44A is a vertical cross-sectional view of the second exemplary structure after the processing steps of FIGS. 43A-43D.
Figure 44B:
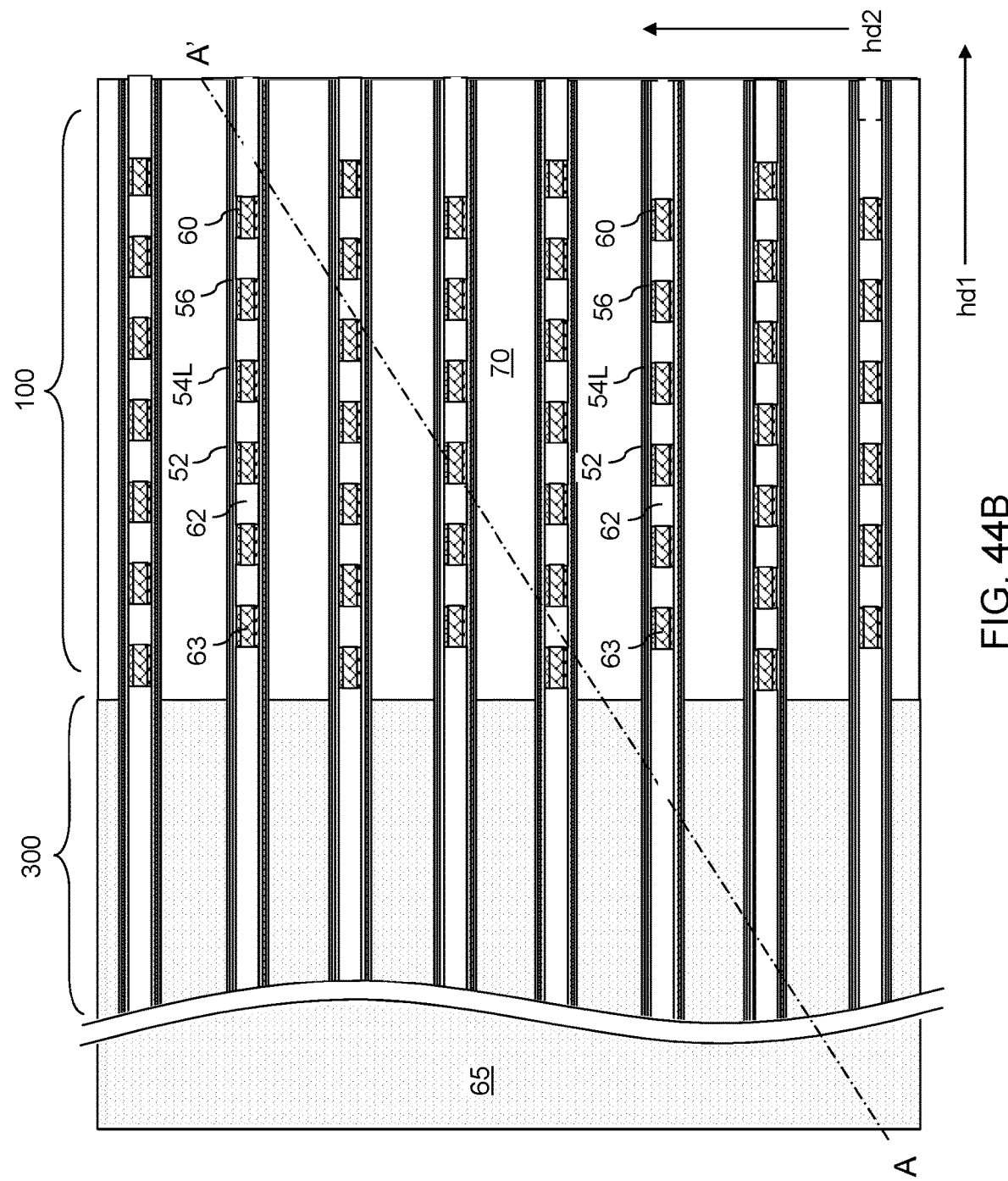
FIG. 44B is a top-down view of the second exemplary structure of FIG. 44A. The vertical plane A-A' is the plane of the cross-section for FIG. 44A.

Referring to FIGS. 42A-42C, a dielectric material such as undoped silicate glass or a doped silicate glass may be deposited in the remaining volumes of the line trenches 49. Excess portions of the dielectric material located above the horizontal plane including the insulating cap layers 70 may be removed by a planarization process such as a recess etch or chemical mechanical planarization. Each remaining portion of the dielectric material constitutes a dielectric core 62. In one embodiment, each dielectric core 62 contacts two rows of vertical semiconductor channels 60 and two tunneling dielectric layers 56.

In one embodiment, the dielectric cores 62 may be formed in unfilled volumes of the line trenches 49 after formation of the material stack strips. The dielectric cores 62 may be formed on physically exposed sidewall surfaces of the insulating strips 32 and the sacrificial material strips 42 that are located outside of the two-dimensional arrays of lateral recesses. The dielectric cores 62 contacts minor surfaces of the blocking dielectric layers 52, the charge storage material layers 54L, the tunneling dielectric layers 56, and the vertical semiconductor channels 60. As used herein, a minor surface of an element refers to a surface that includes less than 25% of the entire surface area of the element. In contrast, a major surface of an element refers to a surface that includes more than 25% of the entire surface area of the element. The dielectric cores 62 contact a major surface of each vertical semiconductor channel 60, and do not contact major surfaces of the blocking dielectric layers 52, the charge storage material layers 54L, and the tunneling dielectric layers 56. A major surface of each blocking dielectric layer 52 contacts a respective one of the alternating stacks (32, 42) of insulating strips 32 and sacrificial material strips 42.

Referring to FIGS. 43A-43D, 44A, and 44B, an upper end of each dielectric core 62 may be vertically recessed, for example, by application and patterning of a photoresist layer over the first exemplary structure to form openings that overlie the dielectric cores 62, and by performing an etch process, which may be an anisotropic etch process or an isotropic etch process. The photoresist layer may be removed, and a doped semiconductor material having a doping of a second conductivity type may be deposited in the recesses to form drain regions 63. The second conductivity type may be the opposite of the first conductivity type, and the atomic concentration of dopants of the second conductivity type in the drain regions 63 may be in a range from $5.0 \times 10^{19}/cm^3$ to $2.0 \times 10^{21}/cm^3$, although lesser and greater atomic concentrations may also be used.

Figure 45A:
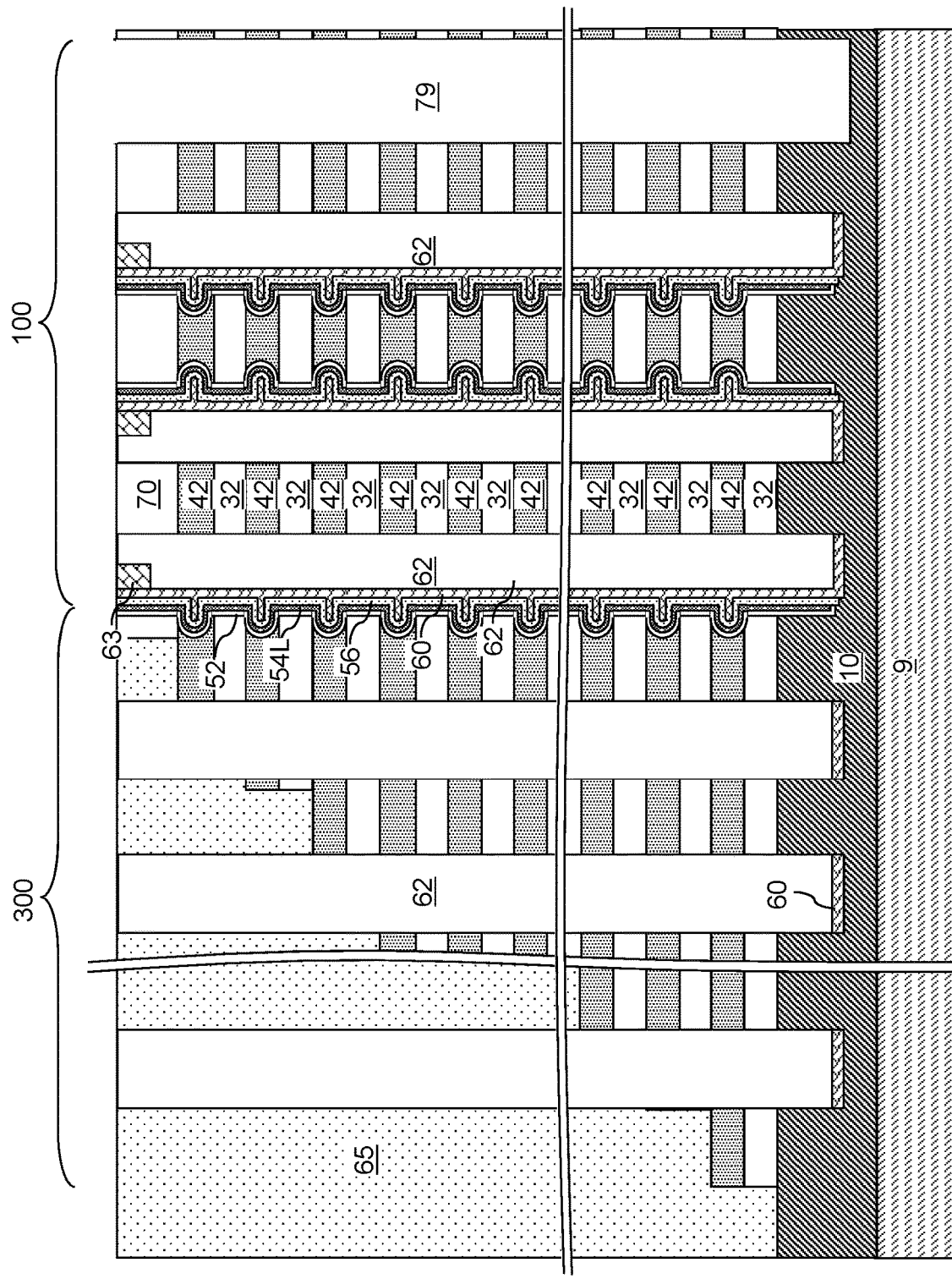
FIG. 45A is a vertical cross-sectional view of the second exemplary structure after formation of backside via cavities according to the second embodiment of the present disclosure.
Figure 45B:
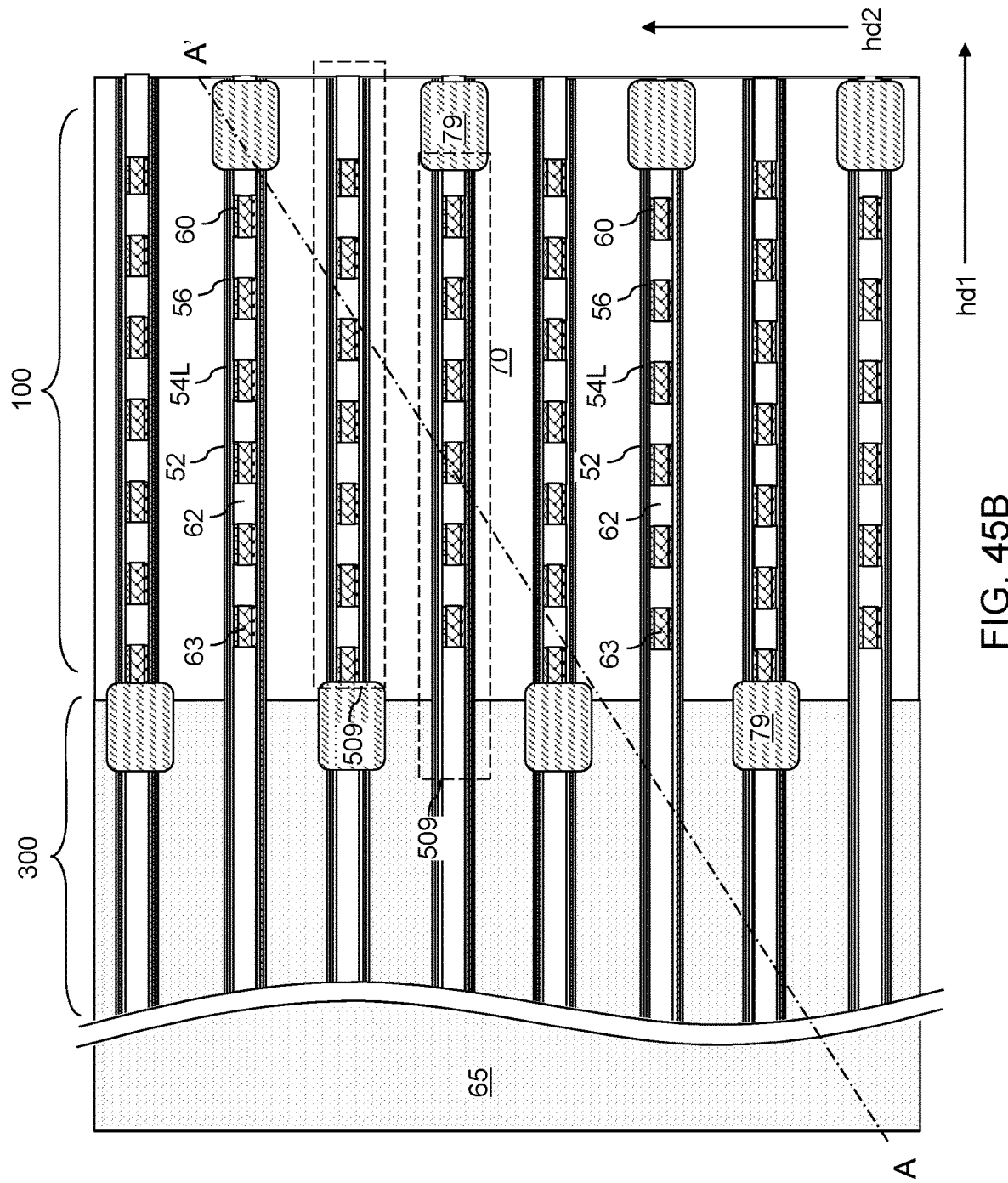
FIG. 45B is a top-down view of the second exemplary structure of FIG. 45A. The vertical plane A-A' is the plane of the cross-section for FIG. 45A.

Referring to FIGS. 45A and 45B, backside via cavities 79 may be formed through isolated regions of the dielectric cores 62 such that remaining material portions within each line trench 49 includes at least one memory stack assembly 509. Each memory stack assembly 509 includes two rows of vertical semiconductor channels 60 connected to a row of drain regions 63. The locations of the backside via cavities 79 may be selected such that each sacrificial material strip 42 contacts at least one of the backside via cavities 79. Further, the locations of the backside via cavities 79 may be selected such that each point within the sacrificial material strip 42 is laterally spaced from a most proximal one of the backside via cavities 79 by a lateral distance that does not exceed a lateral etch distance during a subsequent isotropic etch process.

The memory stack assemblies 509 are formed in each volume that includes a combination of a volume of a line trench 49 as originally formed and volumes of two adjoining two-dimensional arrays of lateral recesses formed over sidewalls of sacrificial material strips 42. Each of the memory stack assemblies 509 comprises two two-dimensional arrays of lateral protrusion regions 510, and each of the lateral protrusion regions 510 comprises a respective charge storage element, i.e., a discrete charge storage element 54. Each of the memory stack assemblies 509 comprises two rows of vertical semiconductor channels 60.

Figure 46:
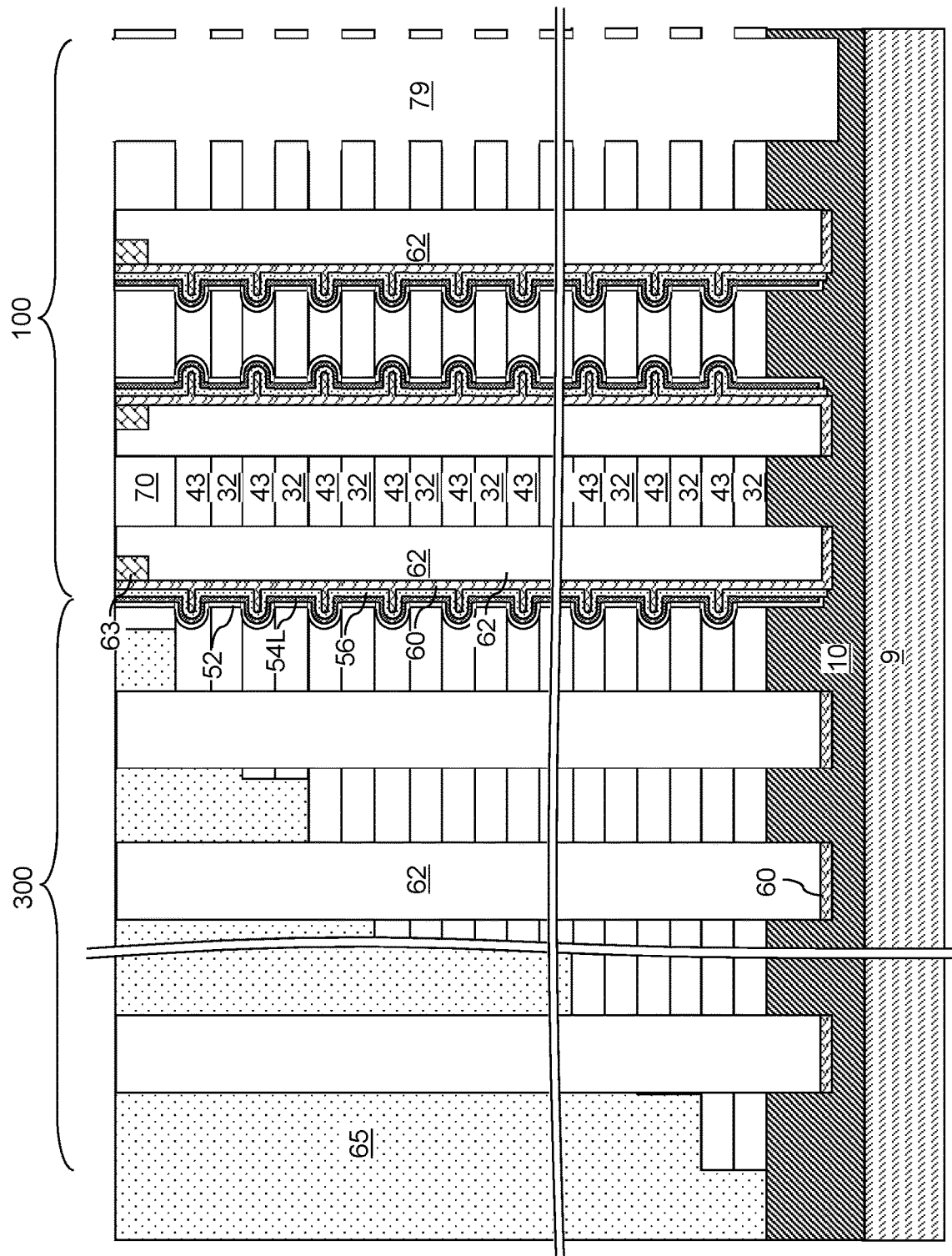
FIG. 46 is a schematic vertical cross-sectional view of the second exemplary structure after formation of backside recesses according to the second embodiment of the present disclosure.
Figure 47:
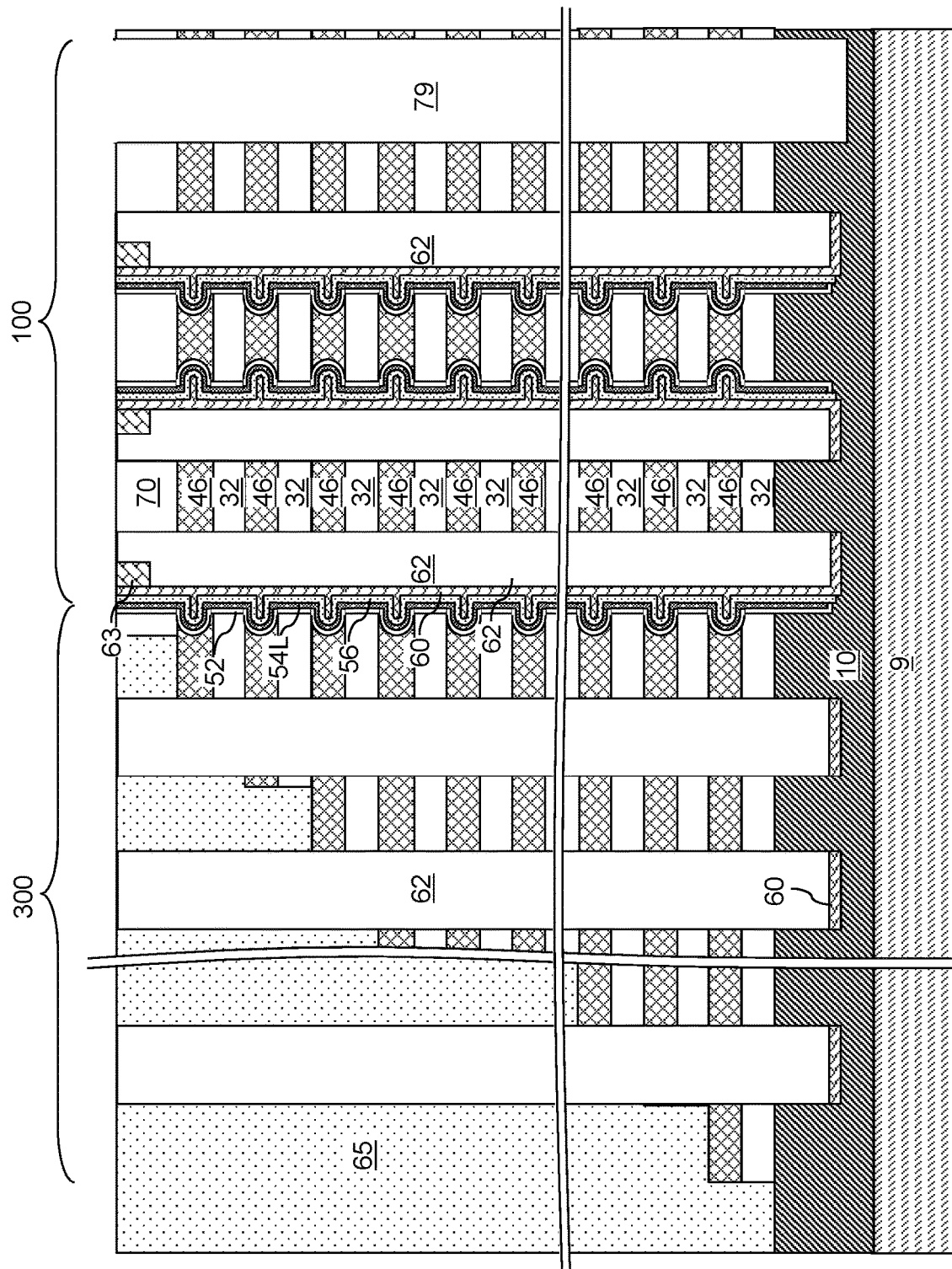
FIG. 47 is a schematic vertical cross-sectional view of the second exemplary structure after formation of electrically conductive strips in the backside recesses according to the second embodiment of the present disclosure.
Figure 48A:
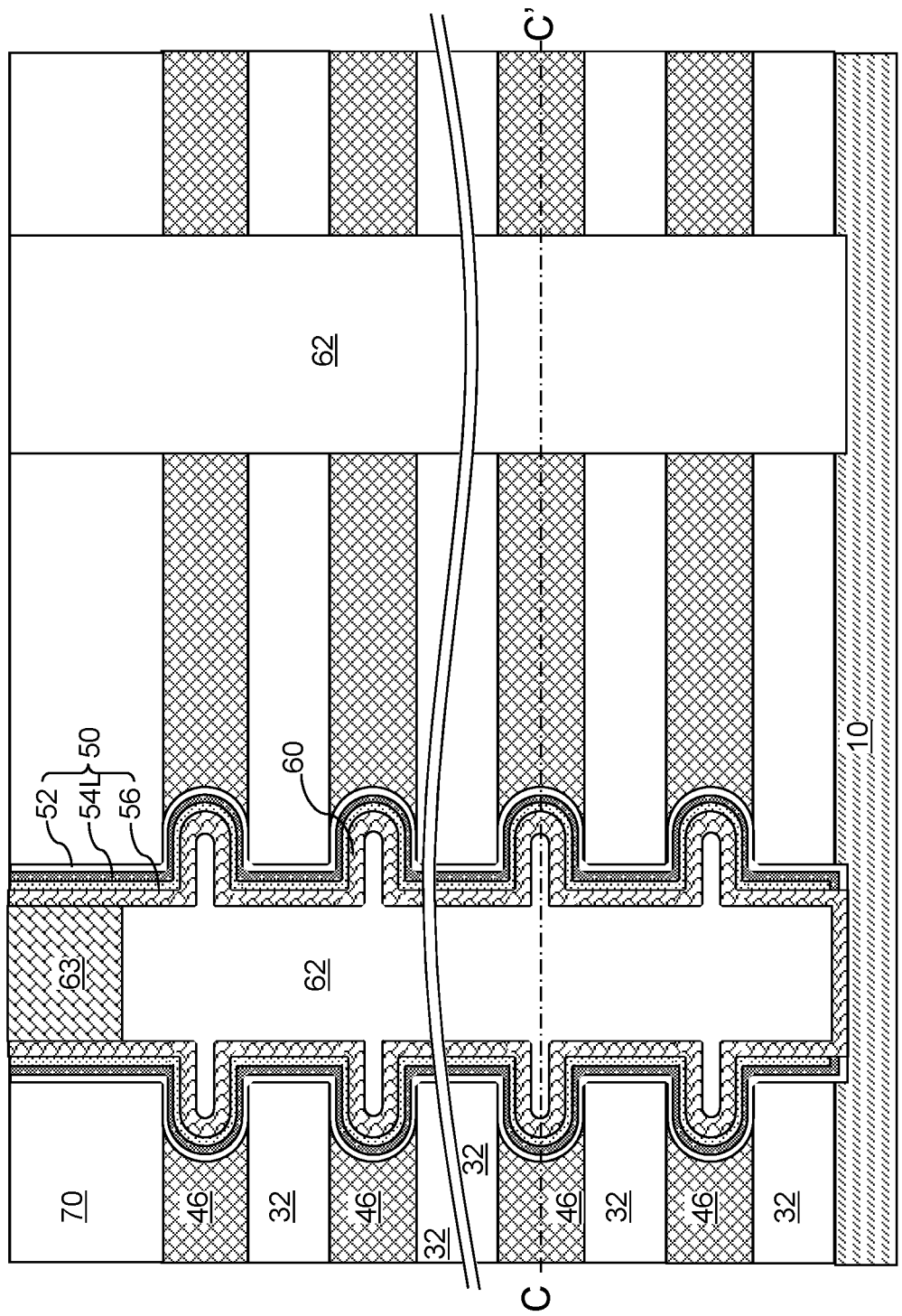
FIG. 48A is a first vertical cross-sectional view of a region of the second exemplary structure of FIG. 47.
Figure 48B:
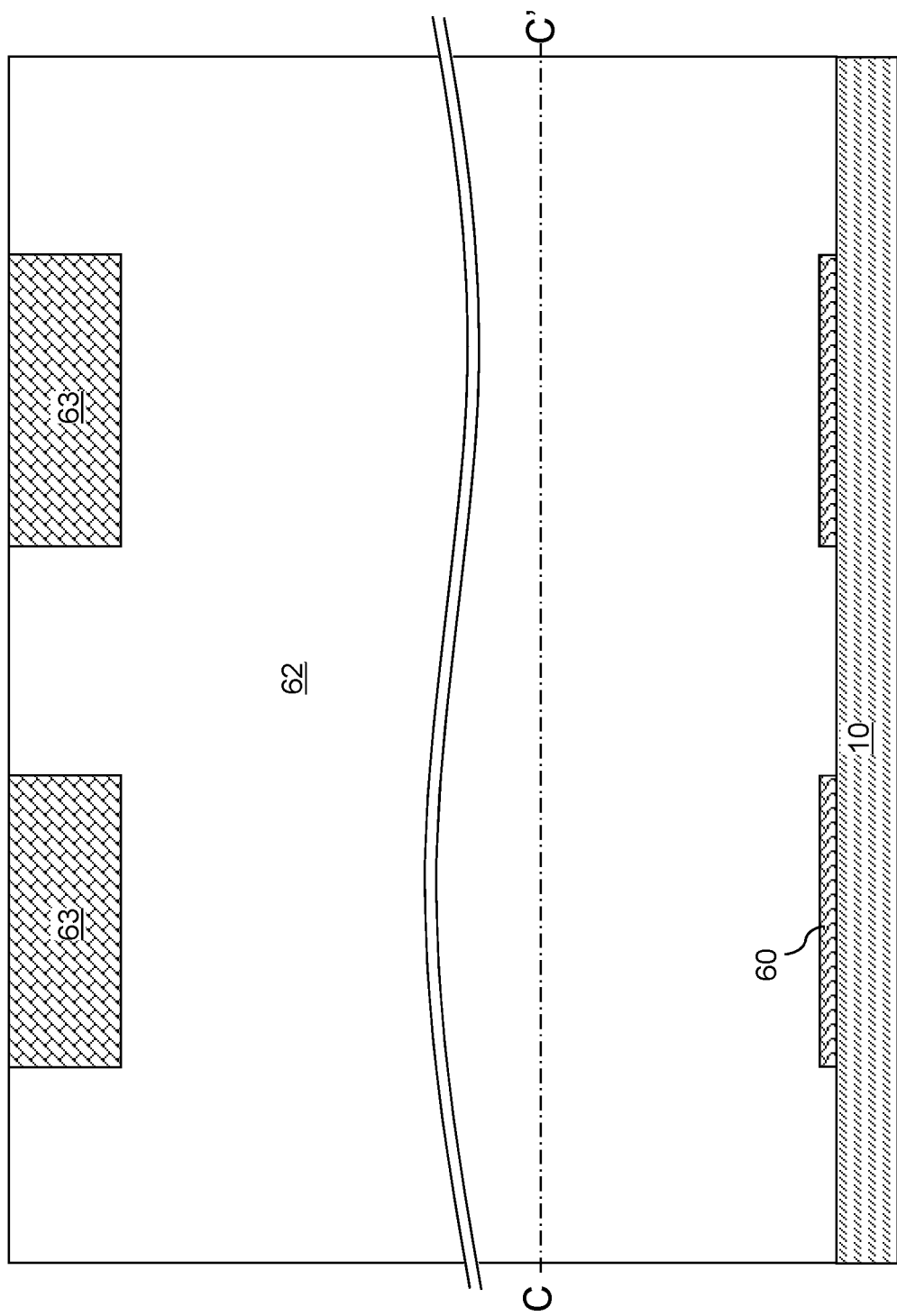
FIG. 48B is a second vertical cross-sectional view of the region of the second exemplary structure of FIG. 48A.
Figure 48C:
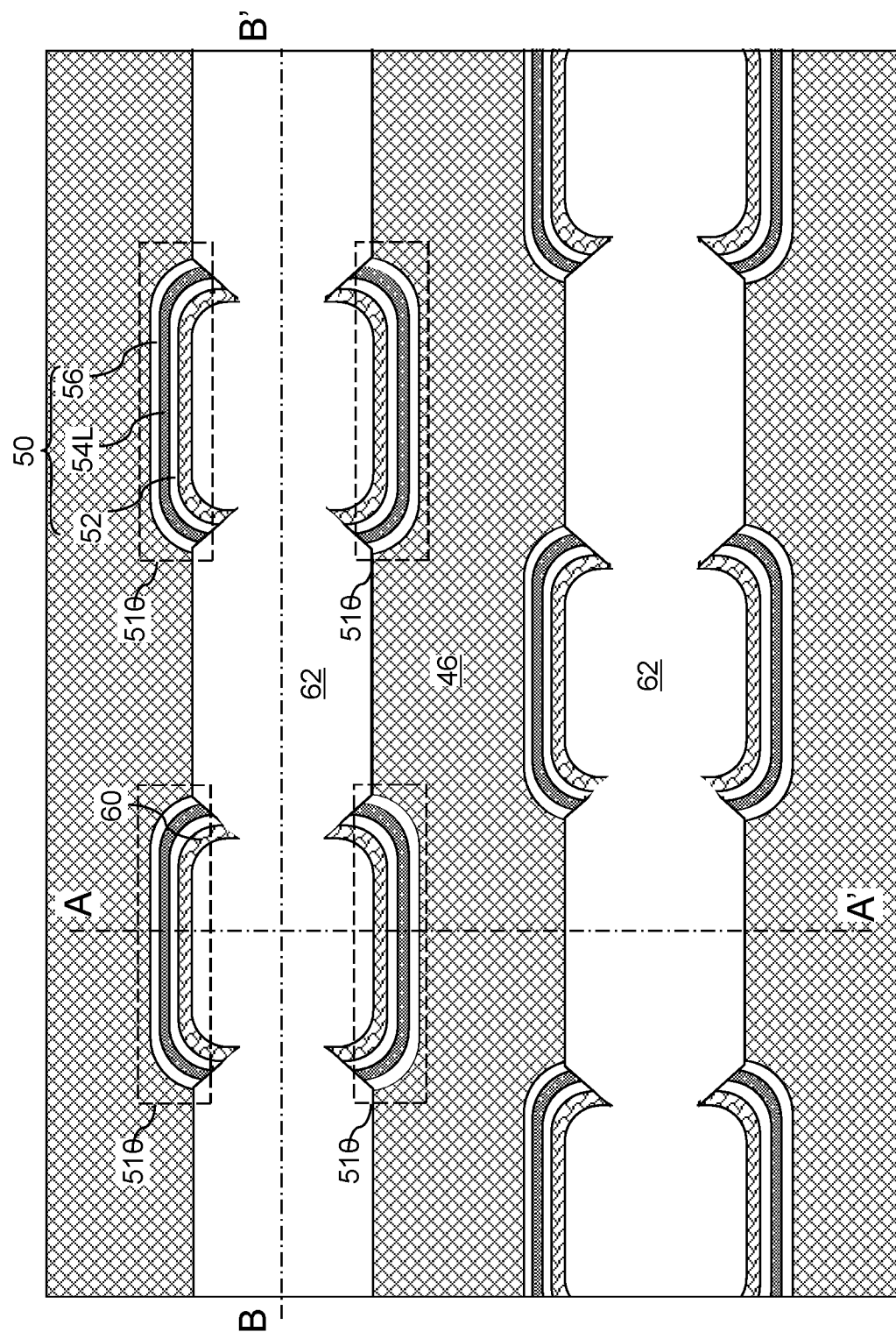
FIG. 48C is a horizontal cross-sectional view along the plane C-C' of FIGS. 48A and 48B. The vertical plane A-A' corresponds to the plane of the vertical cross-sectional view of FIG. 48A. The horizontal plane B-B' corresponds to the plane of the vertical cross-sectional view of FIG. 48B.

Referring to FIG. 46, an etchant that selectively etches the material of the sacrificial material strips 42 with respect to the material of the insulating strips 32, the blocking dielectric layers 52, and the dielectric cores 62 may be introduced into the backside via cavities 79, for example, using an isotropic etch process. Backside recesses 43 are formed in volumes from which the sacrificial material strips 42 are removed. In one embodiment, the sacrificial material strips 42 may include silicon nitride, and the materials of the insulating strips 32 may include silicon oxide. In this case, the isotropic etch process may include a wet etch process using hot phosphoric acid.

The duration of the isotropic etch process may be selected such that the sacrificial material strips 42 are completely removed from each alternating stack (32, 42) of insulating strips 32 and sacrificial material strips 42. Each backside recess 43 may be a laterally extending cavity having a lateral dimension that is greater than the vertical extent of the cavity. In other words, the lateral dimension of each backside recess 43 may be greater than the height of the backside recess 43.

In one embodiment, the memory array region 100 comprises an array of three-dimensional NAND strings having a plurality of device levels disposed above the substrate (9, 10). In this case, each backside recess 43 may define a space for receiving a respective word line of the array of monolithic three-dimensional NAND strings. Each of the plurality of backside recesses 43 may extend substantially parallel to the top surface of the substrate (9, 10). A backside recess 43 may be vertically bounded by a top surface of an underlying insulating strip 32 and a bottom surface of an overlying insulating strip 32. In one embodiment, each backside recess 43 may have a uniform height throughout. The memory stack assemblies 509 provide structural support to the first exemplary structure during formation of the backside recesses 43.

Referring to FIGS. 47 and 48A-48C, a backside blocking dielectric layer (not shown) may be optionally formed in the backside recesses 43 by a conformal deposition process. For example, the backside blocking dielectric layer may include a dielectric metal oxide such as aluminum oxide. The conformal deposition process may include, for example, an atomic layer deposition (ALD) process. The thickness of the backside blocking dielectric layer may be in a range from 1 nm to 6 nm, although lesser and greater thicknesses may also be used.

At least one conductive material may be deposited in remaining volumes of the backside recesses 43. For example, a metallic barrier layer may be deposited in the backside recesses 43 directly on the physically exposed surfaces of the backside blocking dielectric layer, or on the physically exposed surfaces of the blocking dielectrics 52 and the insulating strips 32 in case a backside blocking dielectric layer is not used. The metallic barrier layer includes an electrically conductive metallic material that may function as a diffusion barrier layer and/or adhesion promotion layer for a metallic fill material to be subsequently deposited. The metallic barrier layer may include a conductive metallic nitride material such as TiN, TaN, WN, or a stack thereof, or may include a conductive metallic carbide material such as TiC, TaC, WC, or a stack thereof. In one embodiment, the metallic barrier layer may be deposited by a conformal deposition process such as chemical vapor deposition (CVD) or atomic layer deposition (ALD). The thickness of the metallic barrier layer may be in a range from 2 nm to 8 nm, such as from 3 nm to 6 nm, although lesser and greater thicknesses may also be used. In one embodiment, the metallic barrier layer may consist essentially of a conductive metal nitride such as TiN.

A metallic fill material is deposited in remaining volumes of backside recesses 43, on the sidewalls of the at least one the backside via cavity 79, and over the insulating cap layers 70. The metallic fill material may be deposited by a conformal deposition method, which may be, for example, chemical vapor deposition (CVD), atomic layer deposition (ALD), electroless plating, electroplating, or a combination thereof. In one embodiment, the metallic fill material may consist essentially of at least one elemental metal. The at least one elemental metal of the metallic fill material may be selected, for example, from tungsten, cobalt, ruthenium, molybdenum titanium, and tantalum. In one embodiment, the metallic fill material may consist essentially of a single elemental metal. In one embodiment, the metallic fill material may be deposited using a fluorine-containing precursor gas such as $WF_6$. In one embodiment, the metallic fill material may include tungsten including a residual level of boron, fluorine or silicon atoms as impurities.

A plurality of electrically conductive strips 46 (i.e., electrically conductive strips having strip shapes) may be formed in the plurality of backside recesses 43, and a continuous metallic material layer may be formed on the sidewalls of each backside via cavity 79 and over the insulating cap layers 70. Each electrically conductive strip 46 includes a portion of the metallic barrier layer and a metallic fill material that are located between a vertically neighboring pair of insulating strips 32.

The deposited metallic material of the continuous electrically conductive material layer is etched back from the sidewalls of each backside via cavity 79 and from above the insulating cap layers 70, for example, by an isotropic wet etch, an anisotropic dry etch, or a combination thereof. Each remaining portion of the deposited metallic material in the backside recesses 43 constitutes an electrically conductive strip 46. Each electrically conductive strip 46 may be a conductive line structure. Thus, the sacrificial material strips 42 are replaced with the electrically conductive strips 46.

Each electrically conductive strip 46 may function as a combination of a plurality of control gate electrodes located at a same level and a word line electrically interconnecting, i.e., electrically shorting, the plurality of control gate electrodes located at the same level. The plurality of control gate electrodes within each electrically conductive strip 46 are the control gate electrodes for the NAND strings in the line trenches 49. In other words, each electrically conductive strip 46 may be a word line that functions as a common control gate electrode for the plurality of vertical memory devices. Each vertical semiconductor channel 60 has a laterally-undulating vertical cross-sectional profile, and includes a vertical stack of lateral bump portions located at levels of the electrically conductive strips 46 located within the lateral recesses into concave surfaces of the electrically conductive strips 46.

Figure 49A:
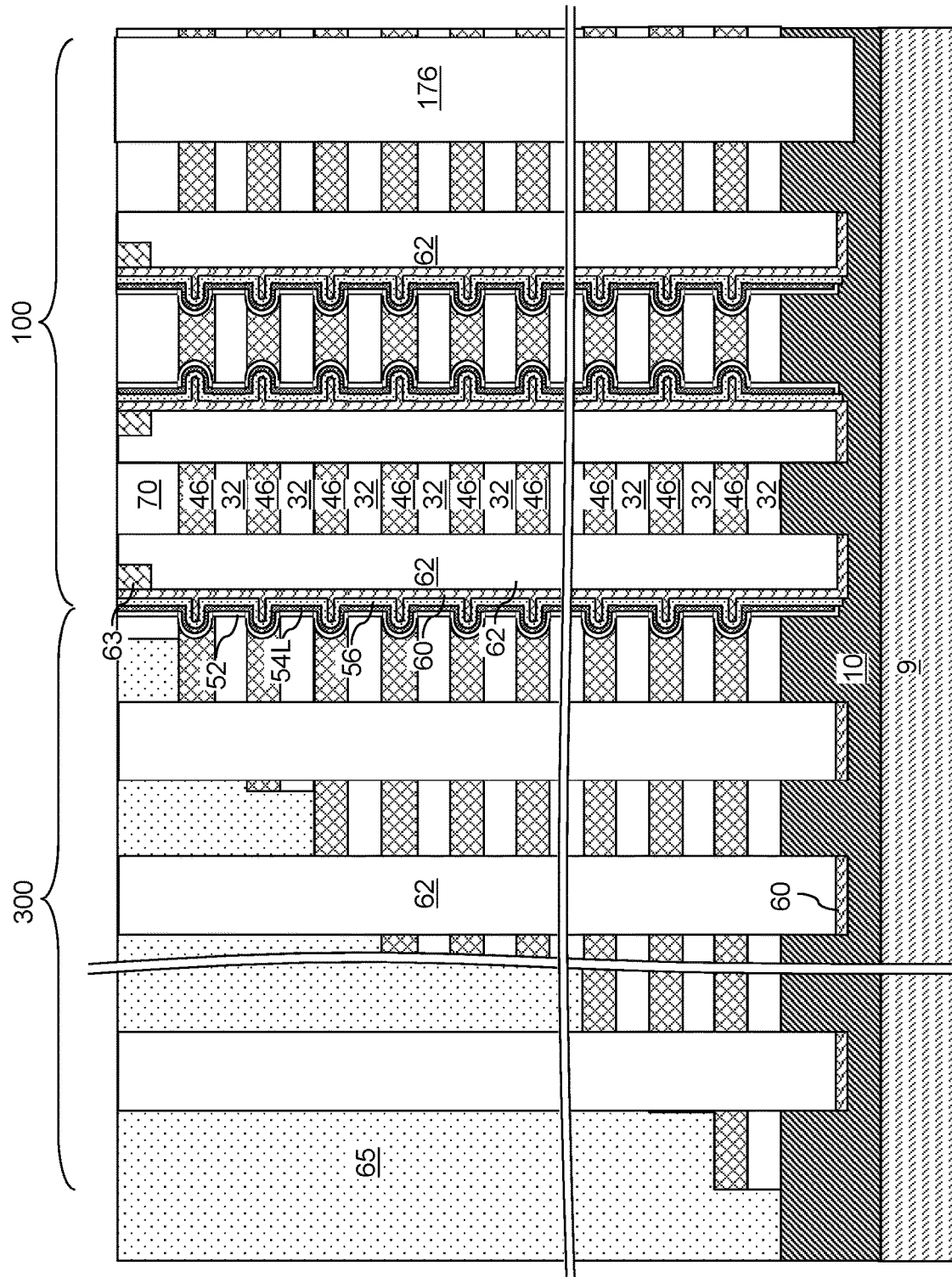
Figure 49B:
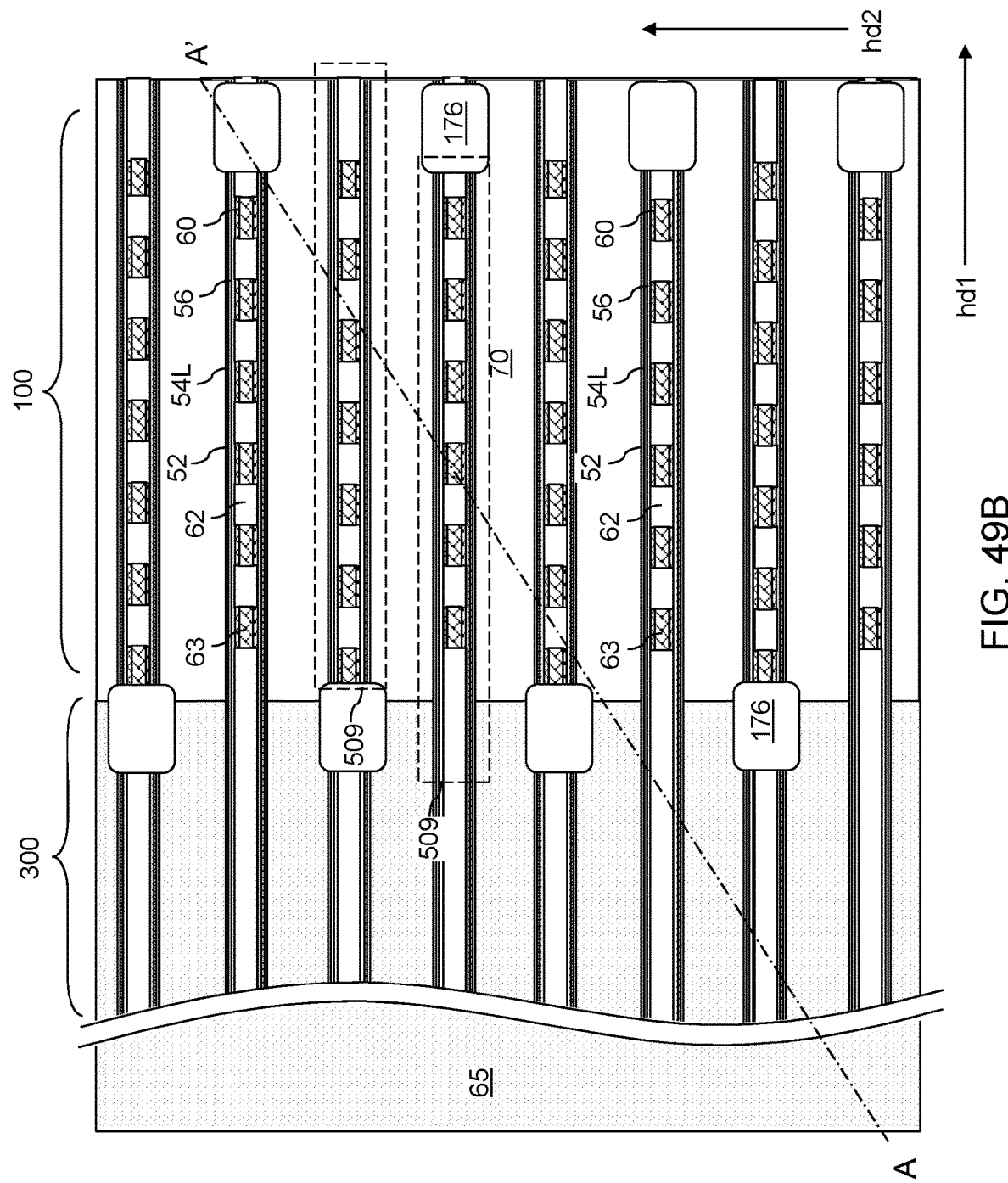

Referring to FIGS. 49A and 49B, a dielectric material such as silicon oxide is anisotropically deposited within the backside via cavities 79. The anisotropic deposition of the dielectric material may be performed by plasma enhanced chemical vapor deposition (PECVD) in which the dielectric material is directionally deposited. Excess portions of the deposited dielectric material may be removed from above the horizontal plane including the top surface of the retro-stepped dielectric material portion 65. Each portion of the deposited dielectric material in the backside via cavities 79 forms a dielectric pillar 176. Optionally, the dielectric pillars 176 may be air gap pillars including a respective void therein. The curvature of the elements shown in the preceding close-up figures is not shown in FIG. 49B because it is an expanded top-down view in which the curvature is not visible at the scale of the figure.

Referring to all drawings related to the second embodiment, a three-dimensional memory device is provided, which comprises: alternating stacks of electrically conductive strips 46 and insulating strips 32 located over a substrate (9, 10) and laterally spaced apart from one another by memory stack assemblies 509, wherein the memory stack assemblies 509 laterally extend along a first horizontal direction hd1 and are spaced apart from one another along a second horizontal direction hd2, wherein: each of the memory stack assemblies 509 comprises two two-dimensional arrays of lateral protrusion regions 510; each of the two two-dimensional arrays of lateral protrusion regions 510 includes a respective two-dimensional array of lateral protrusion regions 510 that laterally protrude outward from a respective vertical plane including interfaces between a memory stack assembly 509 and a subset of the insulating strips 32; and each of the lateral protrusion regions 510 comprises a respective charge storage element that has a pair of concave inner sidewall segments having a respective horizontally concave profile in a horizontal cross-sectional view and has a pair of convex outer sidewall segments having a respective horizontally convex profile in the horizontal cross-sectional view.

In one embodiment, the pair of concave inner sidewall segments is connected to each other by a straight inner sidewall segment, and the pair of convex outer sidewall segments is connected to each other by a straight outer sidewall segment.

In one embodiment, each of the memory stack assemblies 509 comprises two rows of charge storage material layers that extend over sidewalls of a respective one of the alternating stacks (32, 42); and each of the charge storage material layers 54L includes a respective vertical stack of charge storage elements that are portions of a respective charge storage material layer 54L that are located within a respective one of the two-dimensional arrays of lateral protrusion regions 510.

In one embodiment, each of the memory stack assemblies 509 comprises two rows of vertical semiconductor channels 60; and each vertical semiconductor channel within the two rows of vertical semiconductor channels 60 laterally overlies a respective vertical stack of charge storage elements. In one embodiment, each of the memory stack assemblies 509 comprises two tunneling dielectric layers 56; and each of the two tunneling dielectric layers 56 contacts a respective row of vertical semiconductor channels 60.

In one embodiment, each of the memory stack assemblies 509 comprises a dielectric core 62 that laterally extend along the first horizontal direction hd1 and contacting inner sidewalls of each vertical semiconductor channel 60 within two rows of vertical semiconductor channels 60 of a respective memory stack assembly 509.

In one embodiment, vertical semiconductor channels 60 within each row of vertical semiconductor channels 60 are laterally spaced apart along the first horizontal direction hd1 by vertically-extending areas in which a dielectric core 62 contacts insulating strips 32 of one of the alternating stacks.

In one embodiment, each charge storage material layer 54L within the two rows of charge storage material layers 54L has: a first major surface that contacts a respective vertical semiconductor channel 60; a second major surface that contacts a respective blocking dielectric layer 52; and a pair of minor surfaces that contacts a dielectric core 62. In one embodiment, the dielectric core 62 contacts two rows of vertical semiconductor channels 60 of a respective memory stack assembly 509.

In one embodiment, each of the memory stack assemblies 509 comprises two rows of material stack strips that extend vertically and laterally overlie sidewalls of a respective one of the alternating stacks (32, 46); and each material stack strip in the two rows of material stack strips comprises: a blocking dielectric layer 52 that contacts insulating strips 32 within the respective one of the alternating stacks (32, 46); a charge storage material layer 54L or floating gates contacting the blocking dielectric layer 52; a tunneling dielectric layer 56 contacting the charge storage material layer 54L or the floating gates; and a vertical semiconductor channel 60 contacting the tunneling dielectric layer 56.

In one embodiment, each of the blocking dielectric layer 52, the charge storage material layer 54L, the tunneling dielectric layer 56, and the vertical semiconductor channel 60 contacts a dielectric core 62. In one embodiment, each of the blocking dielectric layer 52, the charge storage material layer 54L, the tunneling dielectric layer 56, and the vertical semiconductor channel 60 has a laterally undulating vertical cross-sectional profile such that sidewalls of the blocking dielectric layer 52, the charge storage material layer 54L, the tunneling dielectric layer 56, and the vertical semiconductor channel 60 includes vertically straight segments at levels of the insulating strips 32 of the alternating stacks (32, 46) and curved laterally protruding segments at levels of the electrically conductive strips 46 of the alternating stacks (32, 46).

Laterally recessed regions having curvature provides a geometry in which the local electrical field strength increases. The curvature in the memory films 50 enhances concentration of electrical fields during programming and erasing, thereby lowering the operational voltage of the three-dimensional memory device. The three-dimensional memory device of various embodiments may provide lower programming voltages and lower erase voltage through local enhancement of electrical field line density, and thus, enhanced local electrical field strength. Power consumption of the three-dimensional memory device may be reduced through use of low voltage programming. Various embodiments are disclosed that provide laterally recessed regions having a curvature in multiple planes (e.g., xy-plane and zx-plane). By providing laterally recessed regions having a curvature in multiple planes, the resulting structure may enhance control gate performance as well as provide an improved channel corner effect. In addition, the stack layer may be minimized to reduce production costs.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a three-dimensional memory device, comprising:
    forming alternating stacks of first sacrificial material strips and second sacrificial material strips over a substrate, wherein the alternating stacks are laterally spaced apart from one another by line trenches laterally extending along a first horizontal direction;
    modifying the line trenches to provide a two-dimensional array of lateral recesses on each sidewall of the line trenches, wherein each two-dimensional array of lateral recesses is laterally bounded by a respective two-dimensional array of laterally-recessed surfaces of the second sacrificial material strips;
    forming memory stack assemblies in each volume that includes a combination of a volume of a line trench and volumes of two adjoining two-dimensional arrays of lateral recesses, wherein each of the memory stack assemblies comprises two two-dimensional arrays of lateral protrusion regions, and each of the lateral protrusion regions comprises a respective charge storage element;
    replacing remaining portions of the second sacrificial material strips with electrically conductive strips; and
    forming air gap strips by removing the first sacrificial material strips.

2. The method of claim 1, further comprising:
    forming diffusion barrier strips that extend vertically and laterally spaced from one another on each sidewall of the line trenches;
    oxidizing surface portions of the second sacrificial material strips at a faster oxidation rate than surfaces portions of the first sacrificial material strips; and
    removing the diffusion barrier strips, oxidized portions of the second sacrificial material strips, and oxidized portions of the first sacrificial material strips, wherein the two-dimensional arrays of laterally-recessed surfaces of the second sacrificial material strips are provided.

3. The method of claim 2, wherein:
    the diffusion barrier strips comprise silicon nitride;

the first sacrificial material strips comprise silicon; and the second sacrificial material strips comprise a silicon-germanium alloy including germanium at a higher atomic concentration than the first sacrificial material strips.

4. The method of claim 3, further comprising:

forming a diffusion barrier layer on each sidewall of the line trenches;

forming a two-dimensional array of masking material pillars within the line trenches after formation of the diffusion barrier layer; and isotropically etching physically exposed portions of the diffusion barrier layer that are not masked by the two-dimensional array of masking material pillars, wherein remaining portions of the diffusion barrier layer constitute the diffusion barrier strips.

5. The method of claim 1, further comprising:

depositing a charge storage material layer over remaining portions of the alternating strips after formation of the two-dimensional arrays of lateral recesses; and removing portions of the charge storage material layer located outside the two-dimensional arrays of lateral recesses using an anisotropic etch process, wherein remaining portions of the charge storage material layer in the two-dimensional arrays of laterally recesses constitute the charge storage elements.

6. The method of claim 5, further comprising:

forming a tunneling dielectric layer over each set of charge storage elements located within a respective two-dimensional array of lateral recesses; and forming a row of vertical semiconductor channels over each tunneling dielectric layer.

7. The method of claim 6, wherein:

each of the memory stack assemblies comprises two rows of vertical semiconductor channels; and each vertical semiconductor channel within the two rows of vertical semiconductor channels laterally overlie a respective vertical stack of charge storage elements.

8. The method of claim 7, further comprising forming a dielectric core in each remaining volume of the line trenches after formation of the vertical semiconductor channels, wherein each dielectric core contacts two rows of vertical semiconductor channels and two tunneling dielectric layers.

* * * * *